(12) United States Patent  
Smith

(10) Patent No.: US 9,164,679 B2  
(45) Date of Patent: *Oct. 20, 2015

(54) SYSTEM, METHOD AND COMPUTER PROGRAM PRODUCT FOR MULTI-THREAD OPERATION INVOLVING FIRST MEMORY OF A FIRST MEMORY CLASS AND SECOND MEMORY OF A SECOND MEMORY CLASS

(71) Applicant: P4TENTS1, LLC, Wilmington, DE (US)

(72) Inventor: Michael S Smith, Palo Alto, CA (US)

(73) Assignee: PATENTS1, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/589,931

(22) Filed: Jan. 5, 2015

(65) Prior Publication Data

US 2015/0143037 A1 May 21, 2015

Related U.S. Application Data

(63) Continuation-in-part of application No. 13/441,132, filed on Apr. 6, 2012, now Pat. No. 8,930,647.

(60) Provisional application No. 61/502,100, filed on Jun. 28, 2011, provisional application No. 61/472,558, filed on Apr. 6, 2011.

(51) Int. Cl.
*G06F 13/00* (2006.01)
*G06F 13/28* (2006.01)
(Continued)

(52) U.S. Cl.
CPC ............... *G06F 3/061* (2013.01); *G06F 3/065* (2013.01); *G06F 3/0659* (2013.01); *G06F 3/0679* (2013.01); *G06F 9/44557* (2013.01); *G06F 13/4234* (2013.01); *G06F 17/505* (2013.01); *G06F 17/5072* (2013.01); *G06F 2206/1014* (2013.01); *H01L 2224/16225* (2013.01);
(Continued)

(58) Field of Classification Search
CPC ........................... G06F 9/3814; G06F 12/0246
See application file for complete search history.

(56) References Cited

U.S. PATENT DOCUMENTS 3,524,169 A 8/1970 McAuliffe et al.
3,659,229 A 4/1972 Milton
(Continued)

FOREIGN PATENT DOCUMENTS

WO 2008131058 A2 10/2008
WO 2008131058 A3 10/2008
(Continued)

OTHER PUBLICATIONS

Li, J., "A Nanosensor Device for Cellphone Integration and Chemical Sensing Network," DHS Cell—All Phase II Workshop, Jul. 29, 2010, 22 pages.

(Continued)

*Primary Examiner* — Eric S Cardwell
(74) *Attorney, Agent, or Firm* — Patrick E. Caldwell, Esq.; The Caldwell Firm, LLC

(57) ABSTRACT

An apparatus, computer program product, and associated method/processing unit are provided for utilizing a memory subsystem including a first memory of a first memory class, and a second memory of a second memory class communicatively coupled to the first memory. In operation, data is fetched using a time between a plurality of threads.

20 Claims, 50 Drawing Sheets

(51) Int. Cl.
　　*G06F 3/06*　　　　(2006.01)
　　*G06F 13/42*　　　(2006.01)
　　*G06F 9/445*　　　(2006.01)
　　*G06F 17/50*　　　(2006.01)
(52) U.S. Cl.
　　CPC ............... *H01L2224/4824* (2013.01); *H01L 2224/48091* (2013.01); *H01L 2924/15311* (2013.01)

(56) References Cited

U.S. PATENT DOCUMENTS

| | | | |
|---|---|---|---|
| 4,067,060 A | | 1/1978 | Poussart et al. |
| 4,091,418 A | | 5/1978 | Ciciora |
| 4,152,649 A | | 5/1979 | Choquet |
| 4,197,580 A | * | 4/1980 | Chang et al. .............. 711/144 |
| 4,694,468 A | | 9/1987 | Cullum |
| 5,205,173 A | | 4/1993 | Allen |
| 5,257,413 A | | 10/1993 | Warner et al. |
| 5,285,474 A | | 2/1994 | Chow et al. |
| 5,371,760 A | | 12/1994 | Allen et al. |
| 5,483,557 A | | 1/1996 | Webb |
| 5,557,653 A | | 9/1996 | Paterson et al. |
| 5,581,505 A | | 12/1996 | Lee |
| 5,596,638 A | | 1/1997 | Paterson et al. |
| 5,687,733 A | | 11/1997 | McKown |
| 5,729,612 A | | 3/1998 | Abel et al. |
| 5,794,163 A | | 8/1998 | Paterson et al. |
| 5,805,950 A | | 9/1998 | Inglese et al. |
| 5,825,873 A | | 10/1998 | Duncan et al. |
| 5,859,522 A | | 1/1999 | Theobald |
| 5,884,191 A | | 3/1999 | Karpus et al. |
| 5,925,942 A | | 7/1999 | Theobald |
| 5,953,674 A | | 9/1999 | Hutchison, IV |
| 5,970,092 A | | 10/1999 | Currivan |
| 5,983,100 A | | 11/1999 | Johansson et al. |
| 6,012,105 A | | 1/2000 | Rubbmark et al. |
| 6,038,457 A | | 3/2000 | Barkat |
| 6,040,933 A | | 3/2000 | Khaleghi et al. |
| 6,045,512 A | | 4/2000 | Roteliuk et al. |
| 6,081,724 A | | 6/2000 | Wilson |
| 6,097,943 A | | 8/2000 | Nordwall |
| 6,119,022 A | | 9/2000 | Osborn et al. |
| 6,138,036 A | | 10/2000 | O'Cinneide |
| 6,138,245 A | | 10/2000 | Son et al. |
| 6,163,690 A | | 12/2000 | Lilja |
| 6,192,238 B1 | | 2/2001 | Piirainen |
| 6,259,729 B1 | | 7/2001 | Seki |
| 6,285,890 B1 | | 9/2001 | Panian |
| 6,330,247 B1 | | 12/2001 | Chang et al. |
| 6,366,530 B1 | | 4/2002 | Sluiter et al. |
| 6,371,923 B1 | | 4/2002 | Roteliuk et al. |
| 6,377,825 B1 | | 4/2002 | Kennedy et al. |
| 6,380,581 B1 | | 4/2002 | Noble et al. |
| 6,385,463 B1 | | 5/2002 | Lieberman et al. |
| 6,449,492 B1 | | 9/2002 | Kenagy et al. |
| 6,456,517 B2 | | 9/2002 | Kim et al. |
| 6,473,630 B1 | | 10/2002 | Baranowski et al. |
| 6,476,795 B1 | | 11/2002 | Derocher et al. |
| 6,477,390 B1 | | 11/2002 | Gum et al. |
| 6,480,149 B1 | | 11/2002 | Sutherland et al. |
| 6,496,854 B1 | | 12/2002 | Hagersten et al. |
| 6,523,124 B1 | | 2/2003 | Lunsford et al. |
| 6,529,744 B1 | | 3/2003 | Birkler et al. |
| 6,546,262 B1 | | 4/2003 | Freadman |
| 6,549,790 B1 | | 4/2003 | Rubbmark et al. |
| 6,564,285 B1 | | 5/2003 | Mills et al. |
| 6,603,986 B1 | | 8/2003 | Bozoukov |
| 6,636,749 B2 | | 10/2003 | Holmes et al. |
| 6,636,918 B1 | | 10/2003 | Aguilar et al. |
| 6,665,803 B2 | | 12/2003 | Lunsford et al. |
| 6,670,234 B2 | | 12/2003 | Hsu et al. |
| 6,714,802 B1 | | 3/2004 | Barvesten |
| 6,751,113 B2 | | 6/2004 | Bhakta et al. |
| 6,765,812 B2 | | 7/2004 | Anderson |
| 6,804,146 B2 | | 10/2004 | Johnson |
| 6,829,297 B2 | | 12/2004 | Xia et al. |
| 6,873,534 B2 | | 3/2005 | Bhakta et al. |
| 6,892,270 B2 | | 5/2005 | Roohparvar |
| 6,928,110 B2 | | 8/2005 | Ougi et al. |
| 6,928,299 B1 | | 8/2005 | Rinne et al. |
| 6,928,512 B2 | | 8/2005 | Ayukawa et al. |
| 6,930,900 B2 | | 8/2005 | Bhakta et al. |
| 6,930,903 B2 | | 8/2005 | Bhakta et al. |
| 6,954,495 B2 | | 10/2005 | Piirainen |
| 6,968,208 B2 | | 11/2005 | Kacines |
| 6,975,853 B2 | | 12/2005 | Fang et al. |
| 6,983,169 B2 | | 1/2006 | Vogel et al. |
| 6,990,044 B2 | | 1/2006 | Kang |
| 7,003,316 B1 | | 2/2006 | Elias et al. |
| 7,006,851 B2 | | 2/2006 | Holmes et al. |
| 7,010,325 B1 | | 3/2006 | Oh |
| 7,020,488 B1 | | 3/2006 | Bleile et al. |
| 7,024,230 B2 | | 4/2006 | Curtiss et al. |
| 7,031,670 B2 | | 4/2006 | May |
| 7,050,783 B2 | | 5/2006 | Curtiss et al. |
| 7,062,260 B2 | | 6/2006 | Vuori |
| 7,062,261 B2 | | 6/2006 | Goldstein et al. |
| 7,123,936 B1 | | 10/2006 | Rydbeck et al. |
| 7,149,511 B1 | | 12/2006 | Bachner, III et al. |
| 7,149,552 B2 | | 12/2006 | Lair |
| 7,155,254 B2 | | 12/2006 | Pinder |
| 7,171,239 B2 | | 1/2007 | Tan et al. |
| 7,184,794 B2 | | 2/2007 | Hess et al. |
| 7,190,720 B2 | | 3/2007 | Fimoff et al. |
| 7,224,992 B2 | | 5/2007 | Patino et al. |
| 7,240,836 B2 | | 7/2007 | Vrotsos et al. |
| 7,254,036 B2 | | 8/2007 | Pauley et al. |
| 7,269,708 B2 | | 9/2007 | Ware |
| 7,280,849 B1 | | 10/2007 | Bailey |
| 7,286,436 B2 | | 10/2007 | Bhakta et al. |
| 7,289,386 B2 | | 10/2007 | Bhakta et al. |
| 7,296,107 B2 | | 11/2007 | Lunsford et al. |
| 7,343,177 B2 | | 3/2008 | Seshadri et al. |
| 7,343,439 B2 | | 3/2008 | Mills et al. |
| 7,360,022 B2 | | 4/2008 | Tian et al. |
| 7,363,054 B2 | | 4/2008 | Elias et al. |
| 7,375,970 B2 | | 5/2008 | Pauley et al. |
| 7,386,656 B2 | | 6/2008 | Rajan et al. |
| 7,392,338 B2 | | 6/2008 | Rajan et al. |
| 7,398,105 B2 | | 7/2008 | Kalogeropoulos |
| 7,403,743 B2 | | 7/2008 | Welch |
| 7,424,312 B2 | | 9/2008 | Pinder et al. |
| 7,435,636 B1 | | 10/2008 | Hanafi |
| 7,442,050 B1 | | 10/2008 | Bhakta et al. |
| 7,472,220 B2 | | 12/2008 | Rajan et al. |
| 7,492,890 B2 | | 2/2009 | Mllani |
| 7,493,109 B2 | | 2/2009 | Munje et al. |
| 7,523,035 B2 | | 4/2009 | Rokusek et al. |
| 7,526,317 B2 | | 4/2009 | Pinder et al. |
| 7,529,872 B1 | | 5/2009 | Schubert et al. |
| 7,532,492 B2 | | 5/2009 | Dobyns et al. |
| 7,532,537 B2 | | 5/2009 | Solomon et al. |
| 7,555,318 B2 | | 6/2009 | Seshadri et al. |
| 7,558,130 B2 | | 7/2009 | Grunzke |
| 7,558,529 B2 | | 7/2009 | Seshadri et al. |
| 7,558,894 B1 | | 7/2009 | Lydon et al. |
| 7,565,179 B2 | | 7/2009 | Hyatt |
| 7,565,458 B2 | | 7/2009 | Thijssen et al. |
| 7,571,295 B2 | | 8/2009 | Sakarda et al. |
| 7,580,312 B2 | | 8/2009 | Rajan et al. |
| 7,581,127 B2 | | 8/2009 | Rajan et al. |
| 7,590,796 B2 | | 9/2009 | Rajan et al. |
| 7,598,607 B2 | | 10/2009 | Chung et al. |
| 7,603,148 B2 | | 10/2009 | Michalak |
| 7,609,567 B2 | | 10/2009 | Rajan et al. |
| 7,612,436 B1 | | 11/2009 | Lee et al. |
| 7,619,893 B1 | | 11/2009 | Yu |
| 7,619,912 B2 | | 11/2009 | Bhakta et al. |
| 7,620,433 B2 | | 11/2009 | Bodley |
| 7,622,365 B2 | | 11/2009 | Parekh |
| 7,622,895 B1 | | 11/2009 | Griffin |
| 7,623,667 B2 | | 11/2009 | Sander et al. |
| 7,627,128 B2 | | 12/2009 | Sander et al. |

(56) References Cited

U.S. PATENT DOCUMENTS

| | | |
|---|---|---|
| 7,627,307 B2 | 12/2009 | Droste et al. |
| 7,627,352 B2 | 12/2009 | Gauger, Jr. et al. |
| 7,630,202 B2 | 12/2009 | Pauley et al. |
| 7,633,963 B1 | 12/2009 | Anderson et al. |
| 7,636,274 B2 | 12/2009 | Solomon et al. |
| 7,643,642 B2 | 1/2010 | Patino et al. |
| 7,650,168 B2 | 1/2010 | Bailey |
| 7,680,490 B2 | 3/2010 | Bloebaum et al. |
| 7,680,514 B2 | 3/2010 | Cook et al. |
| 7,689,168 B2 | 3/2010 | House |
| 7,715,831 B2 | 5/2010 | Wakefield |
| 7,715,873 B1 | 5/2010 | Biere et al. |
| 7,716,411 B2 | 5/2010 | Panabaker et al. |
| 7,724,589 B2 | 5/2010 | Rajan et al. |
| 7,730,338 B2 | 6/2010 | Rajan et al. |
| 7,761,724 B2 | 7/2010 | Rajan et al. |
| 7,762,818 B2 * | 7/2010 | Hoang ................... 439/62 |
| 7,769,187 B1 | 8/2010 | Farrar et al. |
| 7,777,581 B2 | 8/2010 | Pfaff et al. |
| 7,778,601 B2 | 8/2010 | Seshadri et al. |
| 7,779,185 B2 | 8/2010 | Schubert et al. |
| 7,796,652 B2 | 9/2010 | Reitlingshoefer et al. |
| 7,811,097 B1 | 10/2010 | Bhakta et al. |
| 7,813,715 B2 | 10/2010 | McKillop et al. |
| 7,814,287 B2 | 10/2010 | Pratt |
| 7,818,036 B2 | 10/2010 | Lair et al. |
| 7,818,037 B2 | 10/2010 | Lair et al. |
| 7,826,318 B2 | 11/2010 | Holden et al. |
| 7,835,809 B2 | 11/2010 | Griffin, Jr. |
| 7,839,643 B1 | 11/2010 | Yu |
| 7,839,645 B2 | 11/2010 | Pauley et al. |
| 7,840,617 B2 * | 11/2010 | Ito ................... 707/822 |
| 7,855,931 B2 | 12/2010 | LaBerge et al. |
| 7,857,225 B2 | 12/2010 | Challa et al. |
| 7,864,627 B2 | 1/2011 | Bhakta et al. |
| 7,869,608 B2 | 1/2011 | Sander et al. |
| 7,881,150 B2 | 2/2011 | Solomon et al. |
| 7,889,786 B2 | 2/2011 | Lapointe |
| 7,902,886 B2 | 3/2011 | Pfaff et al. |
| 7,916,574 B1 | 3/2011 | Solomon et al. |
| 7,940,839 B2 | 5/2011 | Lapointe et al. |
| 7,941,591 B2 | 5/2011 | Aviles |
| 7,978,721 B2 | 7/2011 | Jeddeloh et al. |
| 8,001,434 B1 | 8/2011 | Lee et al. |
| 8,018,723 B1 | 9/2011 | Yu et al. |
| 8,019,589 B2 | 9/2011 | Rajan et al. |
| 8,033,836 B1 | 10/2011 | Bhakta et al. |
| 8,041,881 B2 | 10/2011 | Rajan et al. |
| 8,055,833 B2 | 11/2011 | Danilak et al. |
| 8,060,774 B2 | 11/2011 | Smith et al. |
| 8,072,837 B1 | 12/2011 | Solomon et al. |
| 8,077,535 B2 | 12/2011 | Schakel et al. |
| 8,081,474 B1 | 12/2011 | Zohni et al. |
| 8,081,535 B2 | 12/2011 | Bhakta et al. |
| 8,081,536 B1 | 12/2011 | Solomon et al. |
| 8,081,537 B1 | 12/2011 | Bhakta et al. |
| 8,081,677 B2 | 12/2011 | Badalone |
| 8,089,795 B2 | 1/2012 | Rajan et al. |
| 8,090,897 B2 | 1/2012 | Rajan et al. |
| 8,093,702 B2 | 1/2012 | Lua et al. |
| 8,103,928 B2 | 1/2012 | Hargan |
| 8,106,491 B2 | 1/2012 | Corisis et al. |
| 8,106,520 B2 | 1/2012 | Keeth et al. |
| 8,111,534 B2 | 2/2012 | Walker |
| 8,111,566 B1 | 2/2012 | Wang et al. |
| 8,112,266 B2 | 2/2012 | Rajan et al. |
| 8,115,291 B2 | 2/2012 | Baek et al. |
| 8,120,044 B2 | 2/2012 | Cho et al. |
| 8,122,207 B2 | 2/2012 | Rajan et al. |
| 8,127,185 B2 | 2/2012 | Jeddeloh |
| 8,127,204 B2 | 2/2012 | Hargan |
| 8,130,527 B2 | 3/2012 | Keeth |
| 8,130,560 B1 | 3/2012 | Rajan et al. |
| 8,131,912 B2 * | 3/2012 | Ozawa et al. ................... 711/103 |
| 8,134,378 B2 | 3/2012 | Keeth |
| 8,135,900 B2 | 3/2012 | Kunimatsu et al. |
| 8,143,710 B2 | 3/2012 | Cho |
| 8,148,763 B2 | 4/2012 | Kim et al. |
| 8,148,807 B2 | 4/2012 | Lee et al. |
| 8,154,901 B1 | 4/2012 | Lee et al. |
| 8,154,935 B2 | 4/2012 | Rajan et al. |
| 8,158,967 B2 | 4/2012 | Tang et al. |
| 8,169,233 B2 | 5/2012 | Ferolito et al. |
| 8,169,841 B2 | 5/2012 | Johnson et al. |
| 8,173,507 B2 | 5/2012 | Lim et al. |
| 8,174,105 B2 | 5/2012 | Kwang et al. |
| 8,174,115 B2 | 5/2012 | Chung |
| 8,180,954 B2 | 5/2012 | Kilzer et al. |
| 8,181,048 B2 | 5/2012 | Rajan et al. |
| 8,185,778 B2 | 5/2012 | Kilzer et al. |
| 8,187,901 B2 | 5/2012 | Sheen |
| 8,189,328 B2 | 5/2012 | Kanapathippillai et al. |
| 8,193,646 B2 | 6/2012 | Wood et al. |
| 8,209,479 B2 | 6/2012 | Rajan et al. |
| 8,218,705 B2 | 7/2012 | Yousefi Moghaddam et al. |
| 8,244,971 B2 | 8/2012 | Rajan et al. |
| 8,261,041 B2 | 9/2012 | Kunimatsu |
| 8,264,903 B1 | 9/2012 | Lee et al. |
| 8,279,690 B1 | 10/2012 | Wang et al. |
| 8,280,714 B2 | 10/2012 | Rajan et al. |
| 8,287,291 B1 | 10/2012 | Bhakta et al. |
| 8,296,496 B2 | 10/2012 | Mogul et al. |
| 8,301,833 B1 | 10/2012 | Chen et al. |
| 8,315,349 B2 | 11/2012 | Badalone |
| 8,327,104 B2 | 12/2012 | Smith et al. |
| 8,340,953 B2 | 12/2012 | Rajan et al. |
| 8,345,427 B2 | 1/2013 | Pauley et al. |
| 8,359,187 B2 | 1/2013 | Rajan et al. |
| 8,359,501 B1 | 1/2013 | Lee et al. |
| 8,359,600 B2 | 1/2013 | Kang et al. |
| 8,370,566 B2 | 2/2013 | Danilak et al. |
| 8,386,833 B2 | 2/2013 | Smith et al. |
| 8,387,045 B2 | 2/2013 | Yasutaka et al. |
| 8,397,013 B1 | 3/2013 | Rosenband et al. |
| 8,407,412 B2 | 3/2013 | Rajan et al. |
| 8,417,870 B2 | 4/2013 | Lee et al. |
| 8,446,781 B1 | 5/2013 | Rajan et al. |
| 8,452,917 B2 | 5/2013 | Amer et al. |
| 8,458,436 B2 | 6/2013 | Kunimatsu et al. |
| 8,473,670 B2 | 6/2013 | Sareen et al. |
| 8,488,325 B1 | 7/2013 | Yu |
| 8,489,837 B1 | 7/2013 | Lee |
| 8,516,185 B2 | 8/2013 | Lee et al. |
| 8,516,187 B2 | 8/2013 | Chen et al. |
| 8,516,188 B1 | 8/2013 | Solomon et al. |
| 8,566,505 B2 | 10/2013 | Kilzer et al. |
| 8,566,516 B2 | 10/2013 | Schakel et al. |
| 8,566,556 B2 | 10/2013 | Rajan et al. |
| 8,589,639 B2 | 11/2013 | Nakai et al. |
| 8,595,419 B2 | 11/2013 | Rajan et al. |
| 8,599,634 B1 | 12/2013 | Lee et al. |
| 8,601,204 B2 | 12/2013 | Rajan et al. |
| 8,607,003 B2 | 12/2013 | Bland et al. |
| 8,611,123 B2 | 12/2013 | Koh |
| 8,615,679 B2 | 12/2013 | Smith et al. |
| 8,619,452 B2 | 12/2013 | Rajan et al. |
| 8,631,193 B2 | 1/2014 | Smith et al. |
| 8,631,220 B2 | 1/2014 | Smith et al. |
| 8,667,312 B2 | 3/2014 | Rajan et al. |
| 8,671,243 B2 | 3/2014 | Chen et al. |
| 8,671,244 B2 | 3/2014 | Rajan et al. |
| 8,675,429 B1 | 3/2014 | Wang et al. |
| 8,677,060 B2 | 3/2014 | Chen et al. |
| 8,689,064 B1 | 4/2014 | Lee et al. |
| 8,700,834 B2 | 4/2014 | Horn et al. |
| 8,705,239 B1 | 4/2014 | Yu et al. |
| 8,707,104 B1 | 4/2014 | Jean |
| 8,710,862 B2 | 4/2014 | Ferolito et al. |
| 8,713,357 B1 | 4/2014 | Jean et al. |
| 8,713,379 B2 | 4/2014 | Takefman et al. |
| 8,738,851 B2 | 5/2014 | Kunimatsu et al. |
| 8,738,853 B2 | 5/2014 | Amer et al. |
| 8,745,321 B2 | 6/2014 | Rajan et al. |
| 8,751,732 B2 | 6/2014 | Danilak et al. |

(56) References Cited

U.S. PATENT DOCUMENTS

| | | |
|---|---|---|
| 8,756,364 B1 | 6/2014 | Bhakta et al. |
| 8,760,936 B1 | 6/2014 | Rajan et al. |
| 8,773,937 B2 | 7/2014 | Schakel et al. |
| 8,782,350 B2 | 7/2014 | Lee et al. |
| 8,787,060 B2 | 7/2014 | Lee |
| 2002/0002662 A1 | 1/2002 | Olarig et al. |
| 2005/0018495 A1 | 1/2005 | Bhakta et al. |
| 2005/0027928 A1 | 2/2005 | Avraham et al. |
| 2005/0094465 A1 | 5/2005 | Gervasi et al. |
| 2005/0102444 A1 | 5/2005 | Cruz |
| 2005/0128853 A1 | 6/2005 | Ayukawa et al. |
| 2005/0182893 A1 | 8/2005 | Suh |
| 2005/0204091 A1 | 9/2005 | Kilbuck et al. |
| 2005/0251617 A1 | 11/2005 | Sinclair et al. |
| 2005/0270037 A1 | 12/2005 | Haynes et al. |
| 2006/0075402 A1 | 4/2006 | Neiger et al. |
| 2006/0138630 A1 | 6/2006 | Bhakta |
| 2006/0203899 A1 | 9/2006 | Gee |
| 2006/0294295 A1 | 12/2006 | Fukuzo |
| 2007/0192563 A1 | 8/2007 | Rajan et al. |
| 2007/0204075 A1 | 8/2007 | Rajan et al. |
| 2007/0236584 A1* | 10/2007 | Frost-Ruebling et al. ........................ 348/231.99 |
| 2008/0010435 A1 | 1/2008 | Smith et al. |
| 2008/0025108 A1 | 1/2008 | Rajan et al. |
| 2008/0025122 A1 | 1/2008 | Schakel et al. |
| 2008/0025123 A1 | 1/2008 | Rajan et al. |
| 2008/0025124 A1 | 1/2008 | Rajan et al. |
| 2008/0025136 A1 | 1/2008 | Rajan et al. |
| 2008/0025137 A1 | 1/2008 | Rajan et al. |
| 2008/0027697 A1 | 1/2008 | Rajan et al. |
| 2008/0027702 A1 | 1/2008 | Rajan et al. |
| 2008/0027703 A1 | 1/2008 | Rajan et al. |
| 2008/0028135 A1 | 1/2008 | Rajan et al. |
| 2008/0028136 A1 | 1/2008 | Schakel et al. |
| 2008/0028137 A1 | 1/2008 | Schakel et al. |
| 2008/0031030 A1 | 2/2008 | Rajan et al. |
| 2008/0031072 A1 | 2/2008 | Rajan et al. |
| 2008/0037353 A1 | 2/2008 | Rajan et al. |
| 2008/0056014 A1 | 3/2008 | Rajan et al. |
| 2008/0062773 A1 | 3/2008 | Rajan et al. |
| 2008/0082763 A1 | 4/2008 | Rajan et al. |
| 2008/0103753 A1 | 5/2008 | Rajan et al. |
| 2008/0104314 A1 | 5/2008 | Rajan et al. |
| 2008/0104344 A1 | 5/2008 | Shimozono et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0109629 A1 | 5/2008 | Karamcheti et al. |
| 2008/0115006 A1 | 5/2008 | Smith et al. |
| 2008/0120443 A1 | 5/2008 | Rajan et al. |
| 2008/0123459 A1 | 5/2008 | Rajan et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126692 A1 | 5/2008 | Rajan et al. |
| 2008/0133825 A1 | 6/2008 | Rajan et al. |
| 2008/0239857 A1 | 10/2008 | Rajan et al. |
| 2008/0239858 A1 | 10/2008 | Rajan et al. |
| 2008/0240223 A1 | 10/2008 | Badalone |
| 2008/0250408 A1 | 10/2008 | Tsui et al. |
| 2008/0272478 A1 | 11/2008 | Anderson et al. |
| 2008/0290435 A1 | 11/2008 | Oliver et al. |
| 2008/0298113 A1 | 12/2008 | Liu et al. |
| 2008/0308946 A1 | 12/2008 | Pratt |
| 2009/0014876 A1 | 1/2009 | Youn et al. |
| 2009/0024789 A1 | 1/2009 | Rajan et al. |
| 2009/0026600 A1 | 1/2009 | Koon et al. |
| 2009/0039492 A1 | 2/2009 | Kang et al. |
| 2009/0045489 A1 | 2/2009 | Koon et al. |
| 2009/0052218 A1 | 2/2009 | Kang |
| 2009/0065948 A1 | 3/2009 | Wang |
| 2009/0067256 A1 | 3/2009 | Bhattacharyya et al. |
| 2009/0085225 A1 | 4/2009 | Park |
| 2009/0085608 A1 | 4/2009 | Alzheimer |
| 2009/0090950 A1 | 4/2009 | Forbes et al. |
| 2009/0091962 A1 | 4/2009 | Chung et al. |
| 2009/0103675 A1 | 4/2009 | Yousefi Moghaddam et al. |
| 2009/0127668 A1 | 5/2009 | Choi |
| 2009/0128991 A1 | 5/2009 | Mauritzson |
| 2009/0166846 A1 | 7/2009 | Pratt et al. |
| 2009/0180257 A1 | 7/2009 | Park et al. |
| 2009/0197394 A1 | 8/2009 | Parekh |
| 2009/0206431 A1 | 8/2009 | Bolken et al. |
| 2009/0224822 A1 | 9/2009 | Alzheimer et al. |
| 2009/0237970 A1 | 9/2009 | Chung |
| 2009/0255705 A1 | 10/2009 | Pratt |
| 2009/0259806 A1 | 10/2009 | Kilzer et al. |
| 2009/0261457 A1 | 10/2009 | Pratt |
| 2009/0285031 A1 | 11/2009 | Rajan et al. |
| 2009/0300314 A1 | 12/2009 | LaBerge et al. |
| 2009/0300444 A1 | 12/2009 | Jeddeloh |
| 2009/0302484 A1 | 12/2009 | Lee et al. |
| 2009/0309142 A1 | 12/2009 | Akram |
| 2009/0319703 A1 | 12/2009 | Chung |
| 2009/0321861 A1 | 12/2009 | Oliver et al. |
| 2009/0321947 A1 | 12/2009 | Pratt |
| 2009/0323206 A1 | 12/2009 | Oliver et al. |
| 2010/0110748 A1 | 5/2010 | Best |
| 2010/0191896 A1 | 7/2010 | Yang et al. |
| 2010/0257304 A1 | 10/2010 | Rajan et al. |
| 2010/0271888 A1 | 10/2010 | Rajan et al. |
| 2010/0281280 A1 | 11/2010 | Rajan et al. |
| 2010/0332635 A1 | 12/2010 | Rogel et al. |
| 2011/0016250 A1 | 1/2011 | Lee et al. |
| 2011/0035540 A1 | 2/2011 | Fitzgerald et al. |
| 2011/0066790 A1 | 3/2011 | Mogul et al. |
| 2011/0095783 A1 | 4/2011 | Ferolito et al. |
| 2011/0110047 A1 | 5/2011 | Pauley et al. |
| 2011/0113208 A1 | 5/2011 | Jouppi et al. |
| 2011/0252263 A1* | 10/2011 | Cho ............................... 713/400 |
| 2012/0008436 A1 | 1/2012 | Rajan et al. |
| 2012/0011310 A1 | 1/2012 | Rajan et al. |
| 2012/0011386 A1 | 1/2012 | Rajan et al. |
| 2012/0018871 A1 | 1/2012 | Lee et al. |
| 2012/0037878 A1 | 2/2012 | Liu |
| 2012/0038045 A1 | 2/2012 | Lee |
| 2012/0042204 A1 | 2/2012 | Smith et al. |
| 2012/0059976 A1 | 3/2012 | Rosenband et al. |
| 2012/0059978 A1 | 3/2012 | Rosenband et al. |
| 2012/0063194 A1 | 3/2012 | Baek et al. |
| 2012/0069647 A1 | 3/2012 | Kramer et al. |
| 2012/0070973 A1 | 3/2012 | Sandhu et al. |
| 2012/0074584 A1 | 3/2012 | Lee et al. |
| 2012/0077314 A1 | 3/2012 | Park et al. |
| 2012/0106228 A1 | 5/2012 | Lee |
| 2012/0109621 A1 | 5/2012 | Rajan et al. |
| 2012/0124281 A1 | 5/2012 | Rajan et al. |
| 2012/0126883 A1 | 5/2012 | Juengling |
| 2012/0127685 A1 | 5/2012 | Corisis et al. |
| 2012/0135567 A1 | 5/2012 | Akram et al. |
| 2012/0135569 A1 | 5/2012 | Corisis |
| 2012/0138927 A1 | 6/2012 | Kang |
| 2012/0140583 A1 | 6/2012 | Chung |
| 2012/0147684 A1 | 6/2012 | Schakel et al. |
| 2012/0180043 A1 | 7/2012 | Tsirkin et al. |
| 2012/0201088 A1 | 8/2012 | Rajan et al. |
| 2012/0203958 A1 | 8/2012 | Jones et al. |
| 2012/0203993 A1 | 8/2012 | Virgin et al. |
| 2012/0204079 A1 | 8/2012 | Takefman et al. |
| 2012/0206165 A1 | 8/2012 | Ferolito et al. |
| 2012/0226924 A1 | 9/2012 | Rajan et al. |
| 2012/0239874 A1 | 9/2012 | Lee et al. |
| 2012/0250386 A1 | 10/2012 | Lee et al. |
| 2012/0254500 A1* | 10/2012 | Cho et al. ........................ 711/103 |
| 2012/0254519 A1 | 10/2012 | Ellis |
| 2012/0271990 A1 | 10/2012 | Chen et al. |
| 2012/0317433 A1 | 12/2012 | Ellis et al. |
| 2013/0007399 A1 | 1/2013 | Smith et al. |
| 2013/0019076 A1 | 1/2013 | Amidi et al. |
| 2013/0054881 A1 | 2/2013 | Ellis et al. |
| 2013/0060994 A1 | 3/2013 | Higgins et al. |
| 2013/0061019 A1 | 3/2013 | Fitzpatrick et al. |

(56) References Cited

U.S. PATENT DOCUMENTS

| | | |
|---|---|---|
| 2013/0061101 A1 | 3/2013 | Fitzpatrick et al. |
| 2013/0086309 A1 | 4/2013 | Lee et al. |
| 2013/0103377 A1 | 4/2013 | Rajan et al. |
| 2013/0103897 A1 | 4/2013 | Rajan et al. |
| 2013/0132661 A1 | 5/2013 | Schakel et al. |
| 2013/0132779 A1 | 5/2013 | Smith et al. |
| 2013/0188424 A1 | 7/2013 | Rajan et al. |
| 2013/0191585 A1 | 7/2013 | Rajan et al. |
| 2013/0205102 A1 | 8/2013 | Jones et al. |
| 2013/0238849 A1 | 9/2013 | Amer et al. |
| 2013/0254456 A1 | 9/2013 | Chen et al. |
| 2013/0254497 A1 | 9/2013 | Chen et al. |
| 2013/0275795 A1 | 10/2013 | Ellis et al. |
| 2013/0282962 A1 | 10/2013 | Rub et al. |
| 2013/0332796 A1 | 12/2013 | Ellis |
| 2014/0040568 A1 | 2/2014 | Lee et al. |
| 2014/0040569 A1 | 2/2014 | Solomon et al. |
| 2014/0095769 A1 | 4/2014 | Borkenhagen |
| 2014/0156919 A1 | 6/2014 | Chen et al. |
| 2014/0156920 A1 | 6/2014 | Chen et al. |

FOREIGN PATENT DOCUMENTS

| | | |
|---|---|---|
| WO | WO 2010 111694 | 9/2010 |
| WO | 2011126893 A2 | 8/2011 |
| WO | 2011100444 A2 | 10/2011 |

OTHER PUBLICATIONS

Pering, T. et al., "The PSI Board: Realizing a Phone-Centric Body Sensor Network," 4th International Workshop on Wearable and Implantable Body Sensor Networks, Mar. 2007, pp. 1-6.
Wang, Z. et al., "Exploiting Smart-Phone USB Connectivity for Fun and Profit," ACSAC '10, Dec. 6-10, 2010, 10 pages.
Welte, H., "Anatomy of contemporary GSM cellphone hardware," Apr. 16, 2010, pp. 1-11.
Arora, A., "Sensing by the people, for the people & of the people," Apr. 21, 2008, 48 pages.
Opdenacker, M., "Linux USB drivers," Sep. 15, 2009, pp. 1-95.
U.S. Appl. No. 11/226,061.
Takefman, M. L. et al., U.S. Appl. No. 61/457,233, filed Feb. 8, 2011.
U.S. Appl. No. 11/449,435.
Intel, "Intel PXA27x Processor Family," Memory Subsystem, Jul. 2004, pp. 1-138.
Maxim, "1Gbps to 12.5Gbps; Passive Equalizer for Backplanes and Cables," MAX3787, 19-0406, Rev. 1, Dec. 2005, pp. 1-15.
Wang, B. et al., "6b9b Encoding Scheme for Improving Single-Ended Interface Bandwidth and Reducing Power Consumption without Pin Count Increase," IEEE, 2007, pp. 25-28.
Chen, Y.-H., "Ad-STAC & 3DIC Technology of ITRI," 2010, pp. 1-14.
Schrader, J.H.R et al., "CMOS Transmitter using Pulse-Width Modulation Pre-Emphasis achieving 33dB Loss Compensation at 5-Gb/s," 2005 Symposium on VLSI Circuits Digest of Technical Papers, pp. 388-391.
Garlepp, B. W. et al., "A Portable Digital DLL for High-Speed CMOS Interface Circuits," IEEE Journal of Solid-State Circuits, vol. 34, No. 5, May 1999, pp. 632-644.
D'Ambrosia, J. et al. "40 Gigabit Ethernet and 100 Gigabit Ethernet Technology Overview," Nov. 2008, pp. 1-16.
"The International Technology Roadmap for Semiconductors," Interconnect, 2009, pp. 1-89.
Gustlin, M., "40 and 100 Gigabit Ethernet PCS and PMA Overview," Ethernet Summit, Feb. 2010, pp. 1-15.
Intel, "Intel® GW80314 I/O Companion Chip," Datasheet, Order No. 273757-003US, Nov. 2004, pp. 1-88.
Gondi, S. et al., "A 10-Gb/s CMOS Merged Adaptive Equalizer/CDR Circuit for Serial-Link Receivers," 2006 Symposium on VLSI Circuits Digest of Technical Papers, IEEE, 2006, pp. 1-2.

Gondi, S. et al., "A 10Gb/s CMOS Adaptive Equalizer for Backplane Applications," 2005 IEEE International Solid-State Circuits Conference, 2005, pp. 1-3.
Lin, X. et al., A 2.5- to 3.5-Gb/s Adaptive FIR Equalizer With Continuous-Time Wide-Bandwidth Delay Line in 0.25-?m CMOS, IEEE Journal of Solid-State Circuits, vol. 41, No. 8, Aug. 2006, pp. 1908-1918.
Chandramouli, S., "A Broadband Passive Delay Line Structure in 0.18 Micron CMOS for a Gigabit Feed Forward Equalizer," Thesis, 2004, pp. 1-52.
Stojanovic, V. et al., "Adaptive Equalization and Data Recovery in a Dual-Mode (PAM2/4) Serial Link Transceiver," 2004, pp. 1-4.
Sun, R. et al., "A Low-Power 20-Gb/s Continuous-Time Adaptive Passive Equalizer," Thesis, 2005, pp. 1-71.
Altera, "Using Pre-Emphasis and Equalization with Stratix GX," White Paper, Sep. 2003, ver. 1.0, pp. 1-11.
AMP, "DDR2 DIMM 25 Degree 1mm CL 240 position," DDR2 DIMM 25 Degree 240—Solder tail, 2005, p. 1.
AMP, "DDR2 DIMM Socket 1mm CL 240 position," DDR2 DIMM 240—Solder tail, 1998, p. 1.
Ramesh, G., "Design of De-Emphasis and Equalization Circuits for Gigabit Serial Interconnects," An Applications Workshop for High-Performance Design, Sep. 2005, pp. 1-28.
Bar-Niv, A., "Balanced equalization: The 10GBASE-KX4 formula for error-free transmission over backplanes," Networking Solutions, Mar. 2005, pp. 1-4.
Barr, T. W. et al., "Translation Caching: Skip, Don't Walk (the Page Table)," ISCA'10, Jun. 19-23, 2010, pp. 1-12.
AMD, "BIOS and Kernel Developer's Guide (BKDG) for AMD Family 14h Models 00h-0Fh Processors," BKDG for AMD Family 14h Models 00h-0Fh Processors, Feb. 16, 2011, Rev. 3.04, pp. 1-403.
Stojanovic, V., "Channel-Limited High-Speed Links: Modeling, Analysis and Design," Dissertation, Sep. 2004, pp. 1-180.
Hollis, T. M., "Circuit and Modeling Solutions for High-Speed Chip-To-Chip Communication," Dissertation, Apr. 2007, pp. 1-225.
Kloster, J. F. et al., "On the Feasibility of Memory Sharing," Jun. 2006, pp. 1-132.
Grundy, K. et al., "Designing Scalable 10G Backplane Interconnect Systems Utilizing Advanced Verification Methodologies," DesignCon 2006, pp. 1-20.
Shafer, M. et al., "Connector and Chip Vendors Unite to Produce a High-Performance 10 Gb/s NRZ-Capable Serial Backplane," DesignCon 2003; High-Performance System Design Conference, 2003, pp. 1-19.
Vrazel, M. G. et al., "Overcoming Signal Integrity Issues with Wideband Crosstalk Cancellation Technology," DesignCon 2006, pp. 1-25.
Liu, C. Y. et al., "Comparison of Signaling and Equalization Schemes in High Speed SerDes (10-25Gbps)," DesignCon 2007, pp. 1-23.
Chen, J. et al., "High Speed Signaling Design: from 1 Gbps to 10 Gbps," DesignCon East 2004, pp. 1-17.
Buckwalter, J. F., "Deterministic Jitter in Broadband Communication," Thesis, 2006, pp. 1-220.
Lee, C. J. et al., "DRAM-Aware Last-Level Cache Writeback: Reducing Write-Caused Interference in Memory Systems," Apr. 2010, pp. 1-21.
Cook, H. et al., "Virtual Local Stores: Enabling Software-Managed Memory Hierarchies in Mainstream Computing Environments," Technical Report No. UCB/EECS-2009-131, Sep. 24, 2009, pp. 1-24.
Hur, Y. S. et al., "Equalization and Near-End Crosstalk (NEXT) Noise Cancellation for 20-Gbit/sec 4 PAM Backplane Serial I/O Interconnections," Dissertation, Dec. 2005, pp. 1-143.
Liu, J. et al., "Equalization in High-Speed Communication Systems," IEEE Circuits and Systems Magazine, 2004, pp. 1-14.
Buchali, F. et al., "Fast Eye Monitor for 10 Gbit/s and its Application for Optical PMD Compensation," 2000 Optical Society of America, pp. 1-4.
Fujitsu, "125Gbps Parallel CDR Transceiver (0.18um)," 2002, pp. 1-2.
Dhiman, G. et al., "PDRAM: A Hybrid PRAM and DRAM Main Memory System," DAC '09, Jul. 26-31, 2009, pp. 1-6.

(56) References Cited

OTHER PUBLICATIONS

Avissar, O. et al., "Heterogeneous Memory Management for Embedded Systems," Cases'01, Nov. 16-17, 2001, pp. 1-10.
Sidiropoulos, S., "High Performance Inter-Chip Signalling," Technical Report No. CSL-TR-98-760, Apr. 1998, pp. 1-139.
Huang, H. et al., "Design and Implementation of Power-Aware Virtual Memory," 2003, pp. 1-14.
Ye, D. et al., "Prototyping a Hybrid Main Memory Using a Virtual Machine Monitor," Oct. 2008, 15 slides.
Wilton, S. J. E., "Implementing Logic in FPGA Memory Arrays: Heterogeneous Memory Architectures," 2002, pp. 1-6.
Intel, "Intel® 64 and IA-32 Architectures Software Developer's Manual," vol. 2A: Instruction Set Reference, A-M, Order No. 253666-037US, Jan. 2011, pp. 1-848.
Intel, "Intel® 64 and IA-32 Architectures Software Developer's Manual," vol. 3A: System Programming Guide, Part 1, Order No. 253668-037US, Jan. 2011, pp. 1-842.
Intel, "Intel® 64 and IA-32 Architectures Software Developer's Manual," vol. 3B: System Programming Guide, Part 2, Order No. 253669-034US, Mar. 2010, pp. 1-936.
Intel, "Intel® 64 and IA-32 Architectures Software Developer's Manual," vol. 1: Basic Architecture, Order No. 253665-037US, Jan. 2011, pp. 1-540.
"International Technology Roadmap for Semiconductors," 2009 Edition, Assembly and Packaging, pp. 1-70.
"IMIS™—Intimate Memory Interface Specification," Revision 1.0, Jun. 1, 2008 , pp. 1-33.
Hynix, "I/O Interface Design Technology Using ADS," 2005, 41 slides.
Stachhouse, B. et al., "A 65 nm 2-Billion Transistor Quad-Core Itanium Processor," IEEE Journal of Solid-State Circuits, vol. 44, No. 1, Jan. 2009, pp. 18-31.
JEDEC Standard, DDR3 SDRAM Standard, JESD79-3D, Revision of JESD79-3C, Nov. 2008, Sep. 2009, pp. 1-220.
Balakrishnan, H., "Background: Single-Link Communication," Fall 2001, Sep. 5, 2001, pp. 1-6.
Micron, "NAND Flash Memory," 16Gb, 32Gb, 64Gb, 128Gb Asynchronous/Synchronous NAND Features, 2009, pp. 1-158.
Maxim, "Designing a Simple, Small, Wide-band and Low-Power Equalizer for FR4 Copper Links (Featuring the MAX3785, 1Gbps to 6.4Gbps Equalizer)," DesignCon 2003, HFTA-06.0, 2003, pp. 1-14.
Foster, G., "Measurements of Pre-Emphasis on Altera® Stratix® GX with the BERTScope 12500A," Ver. 1, Jun. 2005, pp. 1-7.
Sudan, K. et al., "Micro-Pages: Increasing DRAM Efficiency with Locality-Aware Data Placement," ASPLOS'10, Mar. 13-17, 2010, pp. 1-12.
Hollis, T. M. et al., "Mitigating ISI Through Self-Calibrating Continuous-Time Equalization," IEEE Transactions on Circuits and Systems—I: Regular Papers, vol. 53, No. 10, Oct. 2006, pp. 2234-2245.
Phadke, S. et al., "MLP Aware Heterogeneous Memory System," 2011 EDAA, pp. 1-6.
National Semiconductor, "EQ50F100—2.5 to 6.125 Gbps fixed equalizer; for 10 Gigabit Ethernet, storage and telecom backplanes," 2004, pp. 1-2.
Turudic, A. et al., "Pre-Emphasis and Equalization Parameter Optimization with Fast, Worst-Case/Multibillion-Bit Verification," DesignCon 2007, Jan. 2007, pp. 1-28.
Hiraishi, A. et al., "Preferable Improvements and Changes to FB-DiMM High-Speed Channel for 9.6Gbps Operation," ELPIDA, Jan. 26, 2007, pp. 1-35.
Ye, D. et al., "Prototyping a Hybrid Main Memory Using a Virtual Machine Monitor," 2008, pp. 1-8.
Schrader, J.H.R et al., Pulse-Width Modulation Pre-Emphasis Applied in a Wireline Transmitter, Achieving 33 dB Loss Compensation at 5-Gb/s in 0.13-?m CMOS, IEEE Journal of Solid-State Circuits, vol. 41, No. 4, Apr. 2006, pp. 990-999.
Toms, T. R., QUALCOMM, CDMA Technologies,"An Assessment of 3D Interconnect, Equipment Readiness and ITRS 3D," Jul. 16, 2008, pp. 1-23.
Ousterhout, J. et al., "The Case for RAMClouds: Scalable High-Performance Storage Entirely in DRAM," SIGOPS Operating Systems Review, vol. 43, No. 4, Dec. 2009, pp. 92-105.
Bien, F., "Reconfigurable Equalization for 10-Gb/sec Serial Data Links in a 0.18-?m CMOS Technology," Dissertation, Dec. 2006, pp. 1-121.
Hollis, T. et al., "Reduction of Duty Cycle Distortion through Band-Pass Filtering," 2005, pp. 1-4.
Grozing, M. et al., "Sampling Receive Equalizer with Bit-Rate Flexible Operation up to 10 Gbit/s," IEEE, 2006, pp. 516-519.
Hollis, T. M. et al., "Self-Calibrating Continuous-Time Equalization Targeting Inter-symbol Interference," 2006, pp. 1-4.
Analui, B., "Signal Integrity Issues in High-Speed Wireline Links: Analysis and Integrated System Solutions," Thesis, 2005, pp. 1-194.
Suchitha V, "Simulation methodology using SigXp 15.1 (SPB) for enabling DDR2-533 memory interface based on Intel® 945GMS design," Session No. 6.10, Intel, pp. 1-36.
Lin, M. et al., "Testable Design for Advanced Serial-Link Transceivers," 2007, pp. 1-6.
Shao, J. et al., "The Bit-reversal SDRAM Address Mapping," 2005, pp. 1-8.
Texas Instruments, "DC to 4-GBPS Dual 1:2 Multiplexer/Repeater/Equalizer," SN65LVCP40, SLLS623D—September 2004—Revised Feb. 2006, pp. 1-22.
Tiruvuru, R. et al., "Transmission Line based FIR Structures for High Speed Adaptive Equalization," ISCAS 2006, IEEE, 2006, pp. 1051-1054.
Park, H.-J., "Signal Integrity for High Speed Circuit Design," Tutorial 9 (ISSCC 2006), pp. 1-91.
CIS 501: Introduction to Computer Architecture, Unit 4: Memory Hierarchy II: Main Memory, CIS 501 (Martin/Roth): Main Memory, pp. 1-12.
Galloway, P. et al., "Using Creative Silicon Technology to Extend the Useful Life of Backplane and Card Substrates at 3.125 Gbps and Beyond," DesignCon 2001, 2001 High-Performance System Design Conference, pp. 1-7.
"3D Packing" Newsletter on 3D IS, TSV, WLP & Embedded Technologies, Dec. 2009, pp. 1-16.
Hoe, J. C., "18-447 Lecture 21: Virtual Memory: Page Tables and TLBs," Apr. 13, 2009, pp. 1-11.
Kishan, "Virtual Memory Exercises," Windows Internals Course, University of Tokyo, Jul. 2003, pp. 1-3.
Schrader, J. H. R., "Wireline Equalization using Pulse-Width Modulation," 2007, pp. 1-152.
Schrader, J. H. R., "Wireline Equalization using Pulse-Width Modulation," IEEE 2006 Custom Intergrated Circuits Conference (CICC), 2006, pp. 591-598.
"Micron Technology Announces SyncflashTM Memory, A New Flash Technology," 1999, pp. 1.
Markatos, E., "On Using Network RAM as a non-volatile Buffer," Aug. 1998, pp. 1-15.
Hong, Seongcheol, "NAND Flash-based Disk Cache Using SLC/MLC Combined Flash Memory," SNAPI 2010, 25pgs.
Office Action Summary in U.S. Appl. No. 13/441,132 dated Apr. 3, 2014.
Office Action Summary in U.S. Appl. No. 13/441,132 dated Aug. 18, 2014.
Bornstein, D., "Android—Dalvik VM Internals," 58 pages, Nov. 2011.
Pering, T., "Intel and Personal Wellness," 22 pages, Aug. 2009.
Klare, B. et al., "Assessment of H.264 Video Compression on Automated Face Recognition Performance in Surveillance and Mobile Video Scenarios," 8 pages, Apr. 2010.
U.S. Appl. No. 11/226,061, filed Sep. 13, 2005.
U.S. Appl. No. 11/449,435, filed Jun. 7, 2006.
"Memory Management" 55 slides, CSE 451: Operating Systems Winter 2007, University of Washington, Jan. 28, 2007.
Yuen, R. et al., "A 5Gb/s Transmitter with Reflection Cancellation for Backplane Transceivers," pp. 1-4, Sep. 2006.
Ryu, W. H. et al., "High-Frequency Simultaneous Switching Output Noise (SSO) Simulation Methodology for a DDR333/400 Data Interface," pp. 1-6, Jun. 27, 2002.

(56) References Cited

OTHER PUBLICATIONS

Burdach, M., "Physical Memory Forensics," 53 slides, Black Hat USA (2006), Aug. 1, 2006.
Buchali, S. et al., "Fast eye monitor for 10 Gbit/s and its application for optical PMD compensation", Conf. Opt. Fiber Commun. (OFC) 2001, vol. 2, Mar. 2001.
Hollis, T. M., "Inter-symbol Interference in Manchester Encoded Data," pp. 1-7, Oct. 2006.
Encoding—116 slides, University of Illinois, Urbana Champaign, Course CS 438, Mar. 2008.
Hollis, T., "Mitigating ISI through Self-Calibrating Continuous-Time Equalization," 36 slides, Oct. 2006.
Stojanovic, V. et al., "Modeling and Analysis of High-Speed Links," pp. 1-49, Mar. 2003.
"Understanding the Linux Virtual Memory Manager," Chapter 3: Page Table Management, pp. 33-52, Mel Gorman, Apr. 2004.
Karthick, A. R., "Memory Management and RMAP VM of 2.6," 14 slides, Jan. 2004.
Suchitha V, "Simulation methodology using SigXp 15.1 (SPB) for enabling DDR2-533 memory interface based on Intel® 945GMS design," Session No. 6.10, Intel, pp. 1-36, Sep. 2006.
Witt, K. et al., "Test & Simulation Results in Support of SAS-2," Vitesse, 17 slides, Jan. 2006.
CIS 501: Introduction to Computer Architecture, Unit 4: Memory Hierarchy II: Main Memory, CIS 501 (Martin/Roth): Main Memory, pp. 1-12, Sep. 2005.
US 7,965,578, 06/2011, Bhakta et al. (withdrawn)
US 7,965,579, 06/2011, Solomon et al. (withdrawn)

\* cited by examiner $d2 = RL$ $WL = RL - 1$          (DDR2)

$RLD = RL + d1 + d3$ $WL = WLD + d3 - d4$ $WLD = RLD - 1$ $d4 = 2d3 + d1$ $WL = RL - K$          (DDR3)

$d4 = 2d3 + dL + (K-1)$

SYSTEM, METHOD AND COMPUTER PROGRAM PRODUCT FOR MULTI-THREAD OPERATION INVOLVING FIRST MEMORY OF A FIRST MEMORY CLASS AND SECOND MEMORY OF A SECOND MEMORY CLASS

CROSS-REFERENCE TO RELATED APPLICATIONS

The present application is a continuation-in-part of, and claims priority to U.S. patent application Ser. No. 13/441,332, filed Apr. 6, 2012, entitled "MULTIPLE CLASS MEMORY SYSTEMS," which claims priority to U.S. Prov. App. No. 61/472,558 that was filed Apr. 6, 2011 and entitled "MULTIPLE CLASS MEMORY SYSTEM" and U.S. Prov. App. No. 61/502,100 that was filed Jun. 28, 2011 and entitled "SYSTEM, METHOD, AND COMPUTER PROGRAM PRODUCT FOR IMPROVING MEMORY SYSTEMS," all of which are incorporated herein by reference in their entirety for all purposes. If any definitions (e.g. figure reference signs, specialized terms, examples, data, information, etc.) from any related material (e.g. parent application, other related application, material incorporated by reference, material cited, extrinsic reference, etc.) conflict with this application (e.g. abstract, description, summary, claims, etc.) for any purpose (e.g. prosecution, claim support, claim interpretation, claim construction, etc.), then the definitions in this application shall apply to the description that follows the same.

BACKGROUND

Field of the Invention

Embodiments of the present invention generally relate to memory systems and, more specifically, to memory systems that include different memory technologies.

BRIEF SUMMARY

An apparatus, computer program product, and associated method/processing unit are provided for utilizing a memory subsystem including a first memory of a first memory class, and a second memory of a second memory class communicatively coupled to the first memory. In operation, data is fetched using a time between a plurality of threads.

BRIEF DESCRIPTION OF THE SEVERAL VIEWS OF THE DRAWINGS

So that the features of various embodiments of the present invention can be understood, a more detailed description, briefly summarized above, may be had by reference to various embodiments, some of which are illustrated in the accompanying drawings. It is to be noted, however, that the accompanying drawings illustrate only embodiments and are therefore not to be considered limiting of the scope of the invention, for the invention may admit to other effective embodiments. The following detailed description makes reference to the accompanying drawings that are now briefly described.

Figure 1A:
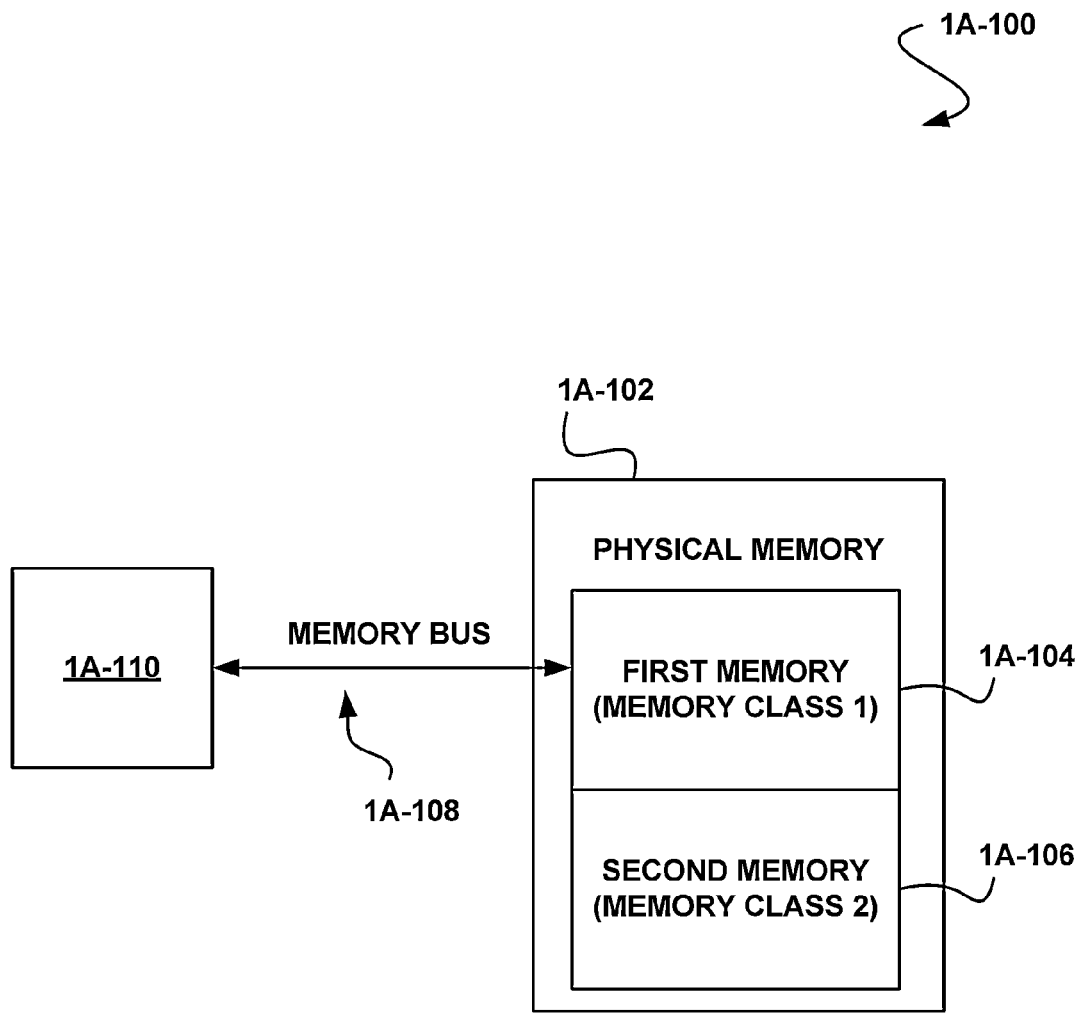
FIG. 1A shows a multi-class memory apparatus for receiving instructions via a single memory bus, in accordance with one embodiment.

While the invention is susceptible to various modifications, combinations, and alternative forms, various embodiments thereof are shown by way of example in the drawings and will herein be described in detail. It should be understood, however, that the accompanying drawings and detailed description are not intended to limit the invention to the particular form disclosed, but on the contrary, the intention is to cover all modifications, combinations, equivalents and alternatives falling within the spirit and scope of the present invention as defined by the relevant claims.

DETAILED DESCRIPTION

Glossary Terms/Definitions and Description of Exemplary Embodiments (Where Applicable)

A physical memory (PM) is memory including physical objects (e.g. chips, packages, multi-chip packages, etc.) or memory components (e.g. semiconductor memory cells). PM may, in exemplary embodiments, include various forms of solid-state (e.g. semiconductor, magnetic, etc.) memory (e.g. NAND flash, MRAM, PRAM, etc.), solid-state disk (SSD), or other disk, magnetic media, etc. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, MRAM, PRAM, etc.), a solid-state disk (SSD) or other disk, magnetic media, and/or any other physical memory that meets the above definition.

A virtual memory (VM) is a memory address space, independent of how the underlying PM is constructed (if such PM exists). Note that while VM is the normal abbreviation for virtual memory, VMy will be used as an abbreviation to avoid confusion with the abbreviation "VM," which is used for virtual machine.

A memory system is a system using one or more classes of physical memory. In various embodiments, the memory system may or may not use one or more VMys. In different embodiments, a memory system may comprise one or more VMys; may comprise one or more PMs; or may comprise one or more VMys and one or more PMs. A VMy may comprise one more classes of PM. A PM may comprise one more VMy structures (again structures are used and the use of a term such as VMy types is avoided, to avoid possible confusion).

A storage system includes a memory system that comprises magnetic media or other storage devices (e.g. a hard-disk drive (HDD) or solid-state disk (SSD) or just disk). If the storage devices include SSDs that include NAND flash, that may also be used as memory for example, definitions of storage versus memory may become ambiguous. If there is the possibility of ambiguity or confusion, it may be noted when, for example, an SSD is being used for memory (e.g. log file, or cache, etc) or when, for example, memory is being used for disk (e.g. RAM disk, etc.).

In various embodiments, the storage system may or may not comprise one or more physical volumes (PVs). A PV may comprise one or more HDDs, HDD partitions, or logical unit numbers (LUNs) of a storage device.

A partition is a logical part of a storage device. For example, an HDD partition is a logical part of an HDD. A LUN is a number used to identify a logical unit (LU), which is that part of storage device addressed by a storage protocol. Examples of storage protocols include: SCSI, SATA, Fibre Channel (FC), iSCSI, etc.

Volume management treats PVs as sequences of chunks called physical extents (PEs). Volume managers may have PEs of a uniform size or of variable size PEs that can be split and merged.

Normally, PEs map one-to-one to logical extents (LEs). With mirroring of storage devices (multiple copies of data, e.g. on different storage devices), multiple PEs map to each LE. PEs are part of a physical volume group (PVG), a set of same-sized PVs that act similarly to hard disks in a RAID1 array. PVGs are usually stored on different disks and may also be on separate data buses to increase redundancy.

A system may pool LEs into a volume group (VG). The pooled LEs may then be joined or concatenated together in a logical volume (LV). An LV is a virtual partition. Systems may use an LV as a raw block device (also known as raw device, or block device) as though it was a physical partition. For example a storage system may create a mountable file system on an LV, or use an LV as swap storage, etc.

In this description, where the boundary and differences between a memory system and a storage system may be blurred, an LV may comprise one or more PMs and a PM may comprise one or more LVs. If there is the possibility of ambiguity or confusion, it may be noted when, for example, an LV comprises one or more PMs and when, for example, a PM may comprise one or more LVs.

Communicatively coupled means coupled in a way that functions to allow a signal (e.g. a data signal, a control signal, a bus, a group of signals, or other electric signal) to be communicated between the communicatively coupled items.

As used herein, memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, chemical, biological or other means. Dynamic memory device types may include FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs, DDR2, DDR3, DDR4, or any of the expected follow-on devices and related technologies such as Graphics RAMs, Video RAMs, LP RAM (Low Power DRAMs) which are often based on the fundamental functions, features and/or interfaces found on related DRAMs.

Memory devices may include chips (die) and/or single or multi-chip or multi-die packages of various types, assemblies, forms, and configurations. In multi-chip packages, the memory devices may be packaged with other device types (e.g. other memory devices, logic chips, CPUs, hubs, buffers, intermediate devices, analog devices, programmable devices, etc.) and may also include passive devices (e.g. resistors, capacitors, inductors, etc.). These multi-chip packages may include cooling enhancements (e.g. an integrated heat sink, heat slug, fluids, gases, micromachined structures, micropipes, capillaries, combinations of these, etc.) that may be further attached to the carrier or another nearby carrier or other heat removal or cooling system.

Although not necessarily shown in all the Figures, memory module support devices (e.g. buffer(s), buffer circuit(s), buffer chip(s), register(s), intermediate circuit(s), power supply regulation, hub(s), re-driver(s), PLL(s), DLL(s), non-volatile memory, SRAM, DRAM, logic circuits, analog circuits, digital circuits, diodes, switches, LEDs, crystals, active components, passive components, combinations of these and other circuits, etc.) may be comprised of multiple separate chips (e.g. die, dice, integrated circuits, etc.) and/or components, may be combined as multiple separate chips onto one or more substrates, may be combined into a single package (e.g. using die stacking, multi-chip packaging, etc.) or even integrated onto a single device based on tradeoffs such as: technology, power, space, weight, cost, etc.

One or more of the various passive devices (e.g. resistors, capacitors, inductors, etc.) may be integrated into the support chip packages, or into the substrate, board, PCB, or raw card itself, based on tradeoffs such as: technology, power, space, cost, weight, etc. These packages may include an integrated heat sink or other cooling enhancements (e.g. such as those described above, etc.) that may be further attached to the carrier or another nearby carrier or other heat removal or cooling system.

Memory devices, intermediate devices and circuits, hubs, buffers, registers, clock devices, passives and other memory support devices etc. and/or other components may be attached (e.g. coupled, connected, etc.) to the memory subsystem and/or other component(s) via various methods including solder interconnects, conductive adhesives, socket structures, pressure contacts, electrical/mechanical/optical and/or other methods that enable communication between two or more devices (e.g. via electrical, optical, or alternate means, etc.).

The one or more memory modules (or memory subsystems) and/or other components/devices may be electrically/optically connected to the memory system, CPU complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining and/or closure mechanism) and/or one or more of various other communication and power delivery methods. The interconnection(s) may be disposed along one or more edges of the memory assembly and/or placed a distance from an edge of the memory subsystem depending on such application requirements as ease of upgrade, ease of repair, available space and/or volume, heat transfer constraints, component size and shape and other related physical, electrical, optical, visual/physical access, requirements and constraints, etc. Electrical interconnections on a memory module are often referred to as contacts, pins, connection pins, tabs, etc. Electrical interconnections on a connector are often referred to as contacts or pins.

As used herein, a page is a fixed-length block of memory that is contiguous in virtual memory.

As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices, in addition to any associated interface and/or timing/control circuitry and/or memory buffer(s), register (s), hub device(s) or switch(es), assembled into substrate(s), package(s), carrier(s), card(s), module(s) or related assembly, which may also include connector(s) or similar means of electrically attaching the memory subsystem with other circuitry. The memory modules described herein may also be referred to as memory subsystems because they include one or more memory device(s), register(s), hub(s) or similar devices.

The integrity, reliability, availability, serviceability, performance etc. of the communication path, the data storage contents, and all functional operations associated with each element of a memory system or memory subsystem may be improved by using one or more fault detection and/or correction methods. Any or all of the various elements of a memory system or memory subsystem may include error detection and/or correction methods such as CRC (cyclic redundancy code, or cyclic redundancy check), ECC (error-correcting code), EDC (error detecting code, or error detection and correction), LDPC (low-density parity check), parity, checksum or other encoding/decoding methods suited for this purpose. Further reliability enhancements may include operation re-try (e.g. repeat, re-send, etc.) to overcome intermittent or other faults such as those associated with the transfer of information, the use of one or more alternate, stand-by, or replacement communication paths to replace failing paths and/or lines, complement and/or re-complement techniques or alternate methods used in computer, communication, and related systems.

The use of bus termination is common in order to meet performance requirements on buses that form transmission lines, such as point-to-point links, multi-drop buses, etc. Bus termination methods include the use of one or more devices (e.g. resistors, capacitors, inductors, transistors, other active devices, etc. or any combinations and connections thereof, serial and/or parallel, etc.) with these devices connected (e.g. directly coupled, capacitive coupled, AC connection, DC connection, etc.) between the signal line and one or more termination lines or points (e.g. a power supply voltage, ground, a termination voltage, another signal, combinations of these, etc.). The bus termination device(s) may be part of one or more passive or active bus termination structure(s), may be static and/or dynamic, may include forward and/or reverse termination, and bus termination may reside (e.g. placed, located, attached, etc.) in one or more positions (e.g. at either or both ends of a transmission line, at fixed locations, at junctions, distributed, etc.) electrically and/or physically along one or more of the signal lines, and/or as part of the transmitting and/or receiving device(s). More than one termination device may be used for example if the signal line comprises a number of series connected signal or transmission lines (e.g. in daisy chain and/or cascade configuration(s), etc.) with different characteristic impedances.

The bus termination(s) may be configured (e.g. selected, adjusted, altered, set, etc.) in a fixed or variable relationship to the impedance of the transmission line(s) (often but not necessarily equal to the transmission line(s) characteristic impedance), or configured via one or more alternate approach (es) to maximize performance (e.g. the useable frequency, operating margins, error rates, reliability or related attributes/metrics, combinations of these, etc.) within design constraints (e.g. cost, space, power, weight, performance, reliability, other constraints, combinations of these, etc.).

Additional functions that may reside local to the memory subsystem and/or hub device include write and/or read buffers, one or more levels of memory cache, local pre-fetch logic, data encryption and/or decryption, compression and/or decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same assembly (e.g. substrate, base, board, package, structure, etc.) onto which the memory device(s) are attached (e.g. mounted, connected, etc.) to a separate substrate (e.g. interposer, spacer, layer, etc.) also produced using one or more of various materials (e.g. plastic, silicon, ceramic, etc.) that include communication paths (e.g. electrical, optical, etc.) to functionally interconnect the support device(s) to the memory device(s) and/or to other elements of the memory or computer system.

Transfer of information (e.g. using packets, bus, signals, wires, etc.) along a bus, (e.g. channel, link, cable, etc.) may be completed using one or more of many signaling options. These signaling options may include such methods as single-ended, differential, time-multiplexed, encoded, optical or other approaches, with electrical signaling further including such methods as voltage or current signaling using either single or multi-level approaches. Signals may also be modulated using such methods as time or frequency, multiplexing, non-return to zero (NRZ), phase shift keying (PSK), amplitude modulation, combinations of these, and others. Voltage levels are expected to continue to decrease, with 1.8V, 1.5V, 1.35V, 1.2V, 1V and lower power and/or signal voltages of the integrated circuits.

One or more clocking methods may be used within the memory system, including global clocking, source-synchronous clocking, encoded clocking or combinations of these and/or other methods. The clock signaling may be identical to that of the signal lines, or may use one of the listed or alternate techniques that are more conducive to the planned clock frequency or frequencies, and the number of clocks planned within the various systems and subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the memory subsystem, or may be based on a clock that is derived from the clock related to the signal(s) being transferred to and from the memory subsystem (such as that associated with an encoded clock). Alternately, a unique clock may be used for the signal(s) transferred to the memory subsystem, and a separate clock for signal(s) sourced from one (or more) of the memory subsystems. The clocks themselves may operate at the same or frequency multiple of the communication or functional frequency, and may be edge-aligned, center-aligned or placed in an alternate timing position relative to the signal(s).

Signals coupled to the memory subsystem(s) include address, command, control, and data, coding (e.g. parity, ECC, etc.), as well as other signals associated with requesting or reporting status (e.g. retry, etc.) and/or error conditions (e.g. parity error, etc.), resetting the memory, completing memory or logic initialization and other functional, configuration or related information etc. Signals coupled from the memory subsystem(s) may include any or all of the signals coupled to the memory subsystem(s) as well as additional status, error, control etc. signals, however generally will not include address and command signals.

Signals may be coupled using methods that may be consistent with normal memory device interface specifications (generally parallel in nature, e.g. DDR2, DDR3, etc.), or the signals may be encoded into a packet structure (generally serial in nature, e.g. FB-DIMM etc.), for example, to increase communication bandwidth and/or enable the memory subsystem to operate independently of the memory technology by converting the received signals to/from the format required by the receiving memory device(s).

Memory devices (e.g. memory modules, memory circuits, memory integrated circuits, etc.) are used in many applications (e.g. computer systems, calculators, cellular phones, etc.). The packaging (e.g. grouping, mounting, assembly, etc.) of memory devices varies between these different applications. A memory module is a common packaging method that uses a small circuit board (e.g. PCB, raw card, card, etc.) often comprised of random access memory (RAM) circuits on one or both sides of the memory module with signal and/or power pins on one or both sides of the circuit board. A dual in-line memory module (DIMM) comprises one or more memory packages (e.g. memory circuits, etc.). DIMMs have electrical contacts (e.g. signal pins, power pins, connection pins, etc.) on each side (e.g. edge etc.) of the module. DIMMs are mounted (e.g. coupled etc.) to a printed circuit board (PCB) (e.g. motherboard, mainboard, baseboard, chassis, planar, etc.). DIMMs are designed for use in computer system applications (e.g. cell phones, portable devices, hand-held devices, consumer electronics, TVs, automotive electronics, embedded electronics, lap tops, personal computers, workstations, servers, storage devices, networking devices, network switches, network routers, etc.). In other embodiments different and various form factors may be used (e.g. cartridge, card, cassette, etc.).

The number of connection pins on a DIMM varies. For example: a 240 connector pin DIMM is used for DDR2 SDRAM, DDR3 SDRAM and FB-DIMM DRAM; a 184 connector pin DIMM is used for DDR SDRAM.

Example embodiments described in this disclosure include computer system(s) with one or more central processor units (CPU) and possibly one or more I/O unit(s) coupled to one or more memory systems that contain one or more memory controllers and memory devices. In example embodiments, the memory system(s) includes one or more memory controllers (e.g. portion(s) of chipset(s), portion(s) of CPU(s), etc.). In example embodiments the memory system(s) include one or more physical memory array(s) with a plurality of memory circuits for storing information (e.g. data, instructions, etc.).

The plurality of memory circuits in memory system(s) may be connected directly to the memory controller(s) and/or indirectly coupled to the memory controller(s) through one or more other intermediate circuits (or intermediate devices e.g. hub devices, switches, buffer chips, buffers, register chips, registers, receivers, designated receivers, transmitters, drivers, designated drivers, re-drive circuits, etc.).

Intermediate circuits may be connected to the memory controller(s) through one or more bus structures (e.g. a multi-drop bus, point-to-point bus, etc.) and which may further include cascade connection(s) to one or more additional intermediate circuits and/or bus(es). Memory access requests are transmitted by the memory controller(s) through the bus structure(s). In response to receiving the memory access requests, the memory devices may store write data or provide read data. Read data is transmitted through the bus structure (s) back to the memory controller(s).

In various embodiments, the memory controller(s) may be integrated together with one or more CPU(s) (e.g. processor chips, multi-core die, CPU complex, etc.) and supporting logic; packaged in a discrete chip (e.g. chipset, controller, memory controller, memory fanout device, memory switch, hub, memory matrix chip, northbridge, etc.); included in a multi-chip carrier with the one or more CPU(s) and/or supporting logic; or packaged in various alternative forms that match the system, the application and/or the environment. Any of these solutions may or may not employ one or more bus structures (e.g. multidrop, multiplexed, point-to-point, serial, parallel, narrow/high speed links, etc.) to connect to one or more CPU(s), memory controller(s), intermediate circuits, other circuits and/or devices, memory devices, etc.

A memory bus may be constructed using multi-drop connections and/or using point-to-point connections (e.g. to intermediate circuits, to receivers, etc.) on the memory modules. The downstream portion of the memory controller interface and/or memory bus, the downstream memory bus, may include command, address, write data, control and/or other (e.g. operational, initialization, status, error, reset, clocking, strobe, enable, termination, etc.) signals being sent to the memory modules (e.g. the intermediate circuits, memory circuits, receiver circuits, etc.). Any intermediate circuit may forward the signals to the subsequent circuit(s) or process the signals (e.g. receive, interpret, alter, modify, perform logical operations, merge signals, combine signals, transform, store, re-drive, etc.) if it is determined to target a downstream circuit; re-drive some or all of the signals without first modifying the signals to determine the intended receiver; or perform a subset or combination of these options etc.

The upstream portion of the memory bus, the upstream memory bus, returns signals from the memory modules (e.g. requested read data, error, status other operational information, etc.) and these signals may be forwarded to any subsequent intermediate circuit via bypass or switch circuitry or be processed (e.g. received, interpreted and re-driven if it is determined to target an upstream or downstream hub device and/or memory controller in the CPU or CPU complex; be re-driven in part or in total without first interpreting the information to determine the intended recipient; or perform a subset or combination of these options etc.).

In different memory technologies portions of the upstream and downstream bus may be separate, combined, or multiplexed; and any buses may be unidirectional (one direction only) or bidirectional (e.g. switched between upstream and downstream, use bidirectional signaling, etc.). Thus, for example, in JEDEC standard DDR (e.g. DDR, DDR2, DDR3, DDR4, etc.) SDRAM memory technologies part of the address and part of the command bus are combined (or may be considered to be combined), row address and column address are time-multiplexed on the address bus, and read/write data uses a bidirectional bus.

In alternate embodiments, a point-to-point bus may include one or more switches or other bypass mechanism that results in the bus information being directed to one of two or more possible intermediate circuits during downstream communication (communication passing from the memory controller to a intermediate circuit on a memory module), as well as directing upstream information (communication from an intermediate circuit on a memory module to the memory controller), possibly by way of one or more upstream intermediate circuits.

In some embodiments the memory system may include one or more intermediate circuits (e.g. on one or more memory modules etc.) connected to the memory controller via a cascade interconnect memory bus, however other memory structures may be implemented (e.g. point-to-point bus, a multi-drop memory bus, shared bus, etc.). Depending on the constraints (e.g. signaling methods used, the intended operating frequencies, space, power, cost, and other constraints, etc.) various alternate bus structures may be used. A point-to-point bus may provide the optimal performance in systems requiring high-speed interconnections, due to the reduced signal degradation compared to bus structures having branched signal lines, switch devices, or stubs. However, when used in systems requiring communication with multiple devices or subsystems, a point-to-point or other similar bus will often result in significant added cost (e.g. component cost, board area, increased system power, etc.) and may reduce the potential memory density due to the need for intermediate devices (e.g. buffers, re-drive circuits, etc.). Functions and performance similar to that of a point-to-point bus can be obtained by using switch devices. Switch devices and other similar solutions offer advantages (e.g. increased memory packaging density, lower power, etc.) while retaining many of the characteristics of a point-to-point bus. Multi-drop bus solutions provide an alternate solution, and though often limited to a lower operating frequency can offer a cost/performance advantage for many applications. Optical bus solutions permit significantly increased frequency and bandwidth potential, either in point-to-point or multi-drop applications, but may incur cost and space impacts.

Although not necessarily shown in all the Figures, the memory modules or intermediate devices may also include one or more separate control (e.g. command distribution, information retrieval, data gathering, reporting mechanism, signaling mechanism, register read/write, configuration, etc.) buses (e.g. a presence detect bus, an I2C bus, an SMBus, combinations of these and other buses or signals, etc.) that may be used for one or more purposes including the determination of the device and/or memory module attributes (generally after power-up), the reporting of fault or other status information to part(s) of the system, calibration, temperature monitoring, the configuration of device(s) and/or memory subsystem(s) after power-up or during normal operation or for other purposes. Depending on the control bus characteristics, the control bus(es) might also provide a means by which the valid completion of operations could be reported by devices and/or memory module(s) to the memory controller (s), or the identification of failures occurring during the execution of the main memory controller requests, etc.

As used herein the term buffer (e.g. buffer device, buffer circuit, buffer chip, etc.) refers to an electronic circuit that includes temporary storage and logic In some embodiments, a buffer may receive signals at one rate (e.g. frequency) and deliver signals at another rate. In some embodiments, a buffer is a device that may also provide compatibility between two signals (e.g., changing voltage levels or current capability, changing logic function, etc.).

As used herein, hub is a device containing multiple ports that may be capable of being connected to several other devices. The term hub is sometimes used interchangeably with the term buffer. A port is a portion of an interface that serves an I/O function (e.g., a port may be used for sending and receiving data, address, and control information over one of the point-to-point links, or buses). A hub may be a central device that connects several systems, subsystems, or networks together. A passive hub may simply forward messages, while an active hub (e.g. repeater, amplifier, etc.) may also modify the stream of data which otherwise would deteriorate over a distance. The term hub, as used herein, refers to a hub that may include logic (hardware and/or software) for performing logic functions.

As used herein, the term bus refers to one of the sets of conductors (e.g., signals, wires, traces, and printed circuit board traces or connections in an integrated circuit) connecting two or more functional units in a computer. The data bus, address bus and control signals may also be referred to together as constituting a single bus. A bus may include a plurality of signal lines (or signals), each signal line having two or more connection points that form a main transmission line that electrically connects two or more transceivers, transmitters and/or receivers. The term bus is contrasted with the term channel that may include one or more buses or sets of buses.

As used herein, the term channel (e.g. memory channel etc.) refers to an interface between a memory controller (e.g. a portion of processor, CPU, etc.) and one of one or more memory subsystem(s). A channel may thus include one or more buses (of any form in any topology) and one or more intermediate circuits.

As used herein, the term daisy chain (e.g. daisy chain bus etc.) refers to a bus wiring structure in which, for example, device (e.g. unit, structure, circuit, block, etc.) A is wired to device B, device B is wired to device C, etc. In some embodiments the last device may be wired to a resistor, terminator, or other termination circuit etc. In alternative embodiments any or all of the devices may be wired to a resistor, terminator, or other termination circuit etc. In a daisy chain bus, all devices may receive identical signals or, in contrast to a simple bus, each device may modify (e.g. change, alter, transform, etc.) one or more signals before passing them on.

A cascade (e.g. cascade interconnect, etc.) as used herein refers to a succession of devices (e.g. stages, units, or a collection of interconnected networking devices, typically hubs or intermediate circuits, etc.) in which the hubs or intermediate circuits operate as logical repeater(s), permitting for example data to be merged and/or concentrated into an existing data stream or flow on one or more buses.

As used herein, the term point-to-point bus and/or link refers to one or a plurality of signal lines that may each include one or more termination circuits. In a point-to-point bus and/or link, each signal line has two transceiver connection points, with each transceiver connection point coupled to transmitter circuits, receiver circuits or transceiver circuits.

As used herein, a signal (or line, signal line, etc.) refers to one or more electrical conductors or optical carriers, generally configured as a single carrier or as two or more carriers, in a twisted, parallel, or concentric arrangement, used to transport at least one logical signal. A logical signal may be multiplexed with one or more other logical signals generally using a single physical signal but logical signal(s) may also be multiplexed using more than one physical signal.

Conventions

Terms that are special to the field of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization, by itself, should not be construed as somehow limiting such terms: beyond any given definition, and/or to any specific embodiments disclosed herein, etc.

In this description there may be multiple figures that depict similar structures with similar parts or components. Thus, as an example, to avoid confusion an Object in FIG. 1 may be labeled "Object (1)" and a similar, but not identical, Object in FIG. 2 is labeled "Object (2)", etc. Again, it should be noted that use of such protocol, by itself, should not be construed as somehow limiting such terms: beyond any given definition, and/or to any specific embodiments disclosed herein, etc.

In the following detailed description and in the accompanying drawings, specific terminology and images are used in order to provide a thorough understanding. In some instances, the terminology and images may imply specific details that are not required to practice all embodiments. Similarly, the embodiments described and illustrated are representative and should not be construed as precise representations, as there are prospective variations on what is disclosed that may be obvious to someone with skill in the art. Thus this disclosure is not limited to the specific embodiments described and shown but embraces all prospective variations that fall within its scope. For brevity, not all steps may be detailed, where such details will be known to someone with skill in the art having benefit of this disclosure.

This description focuses on improvements to memory systems and in particular to memory systems that include different memory technologies.

Electronic systems and computing platforms may use several different memory technologies: faster local memory based on semiconductor memory (e.g. SDRAM) with access times measured in first units (e.g. nanoseconds); flash memory (e.g. NAND flash) with access times measured in second units (e.g. microseconds); and magnetic media (disk drives) with access times measured in third units (e.g. milliseconds). In some embodiments, systems may use higher-speed memory (e.g. SDRAM, etc.) on a dedicated high-speed memory bus (e.g. DDR4, etc.) and lower speed memory (e.g. NAND flash, etc.) and/or disk storage (e.g. disk drive, etc.) on a separate slower I/O bus (e.g. PCI-E, etc.).

In this description several implementations of memory systems are presented that use different memory technologies in combination (e.g. SDRAM with NAND flash, SRAM with SDRAM, etc.). In this description each different memory technology is referred to as a different class of memory in order to avoid any confusion with other terms. For example, the term class is used, in this context, instead of the term memory type (or type of memory) since memory type is used, in some contexts, as a term related to caching.

The use of multiple memory classes may, in some embodiments, allow different trade-offs to be made in system design. For example, in the 2011 timeframe, the cost per bit of DRAM is greater than the cost per bit of NAND flash, which is greater than the cost per bit of disk storage. For this reason system designers often design systems that use a hierarchical system of memory and storage. However, even though a CPU may be connected to one or more classes of memory (e.g. SDRAM, NAND flash, disk storage), systems may use a dedicated memory bus for the fastest memory technology and only one class of memory may be connected to that memory bus. The memory connected to a dedicated memory bus is called main memory. The term main memory will be used, which in this description may actually be comprised of multiple classes of memory, to distinguish main memory from other memory located on a different bus (e.g. USB key, etc.), or other memory (e.g. storage, disk drive, etc.) that is not used as main memory (memory that is not main memory may be secondary storage, tertiary storage or offline storage, for example). The term main memory is used, in this context, instead of the term primary storage to avoid confusion with the general term storage that is used in several other terms and many other contexts.

In order to build a system with a large amount of memory, systems may use a collection of different memory classes that may behave as one large memory. In some embodiments, the collection of different memory classes may involve a hierarchy that includes some or all of the following, each using different classes of memory: main memory (or primary storage), which may be closest to the CPU, followed by secondary storage, tertiary storage, and possibly offline storage. One possible feature of this approach is that different buses are sometimes used for the different classes of memory. Only the fastest memory class can use the fast dedicated memory bus and be used as main memory, for example. When the system needs to access the slower memory classes, using a slower I/O bus for example, this slower memory access can slow system performance (and may do so drastically), which is very much governed by memory bandwidth and speed.

There may be other reasons that system designers wish to use multiple memory classes. For example, multiple memory classes may be used to achieve the fastest possible access speed for a small amount of fast, local (to the CPU) cache; to achieve the highest bandwidth per pin (since pin packages drive the cost of a system); or to achieve a certain overall system price, performance, cost, power, etc.

For these and/or other reasons it may be advantageous for a system designer to design a system that uses more than one memory class for main memory on a memory bus. Of course, it is contemplated that, in some embodiments, such use of multiple memory classes may not necessarily exhibit one or more of the aforementioned advantages and may even possibly exhibit one or more of the aforementioned disadvantages.

Figure 2:
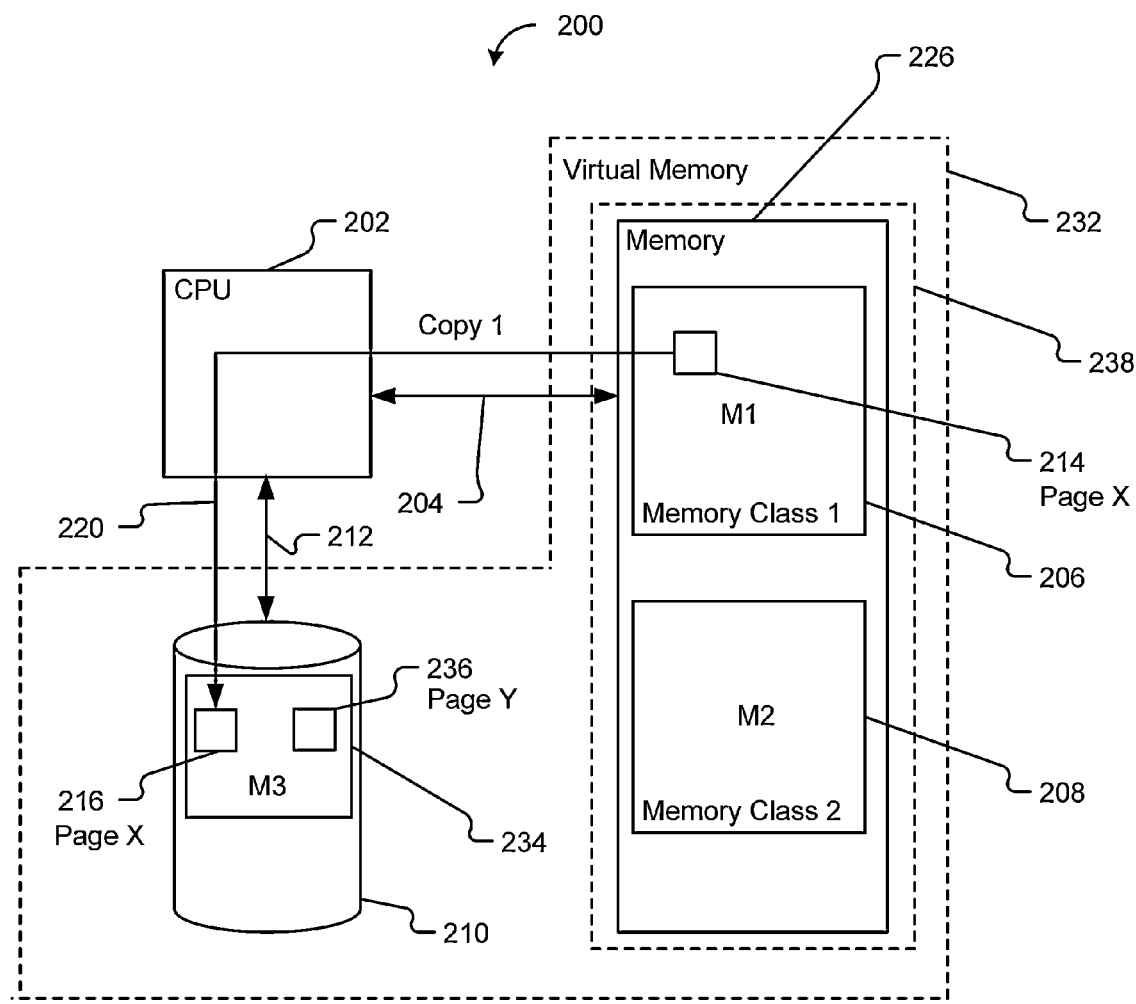
FIG. 2 shows a page write in a system using main memory with multiple memory classes, in accordance with another embodiment.

FIG. 1A shows a multi-class memory apparatus 1A-100 for receiving instructions via a single memory bus, in accordance with one embodiment. As an option, the apparatus 1A-100 may be implemented in the context of any subsequent Figure(s). Of course, however, the apparatus 1A-100 may be implemented in the context of any desired environment.

As shown, a physical memory sub-system 1A-102 is provided.

Additionally, in various embodiments, the physical memory sub-system 1A-102 may include a monolithic memory circuit, a semiconductor die, a chip, a packaged memory circuit, or any other type of tangible memory circuit. In one embodiment, the physical memory sub-system 1A-102 may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), and/or any other DRAM or similar memory technology.

As shown, the physical memory sub-system 1A-102 includes a first memory 1A-104 of a first memory class and a second memory 1A-106 of a second memory class. In the context of the present description, as set forth earlier, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory 1A-104 or the second memory 1A-106 may include RAM (e.g. DRAM, SRAM, embedded RAM, etc.) and the other one of the first memory 1A-104 or the second memory 1A-106 may include NAND flash (or other nonvolatile memory, other memory, etc.). In another embodiment, one of the first memory 1A-104 or the second memory 1A-106 may include RAM (e.g. DRAM, SRAM, etc.) and the other one of the first memory 1A-104 or the second memory 1A-106 may include NOR flash (or other nonvolatile memory, other memory, etc.). Of course, in various embodiments, any number (e.g. 2, 3, 4, 5, 6, 7, 8, 9, or more, etc.) of combinations of memory classes may be utilized.

The second memory 1A-106 is communicatively coupled to the first memory 1A-104. In the context of the present description, being communicatively coupled refers to being coupled in any way that functions to allow any type of signal (e.g. a data signal, a control signal, a bus, a group of signals, other electric signal, etc.) to be communicated between the communicatively coupled items. In one embodiment, the second memory 1A-106 may be communicatively coupled to the first memory 1A-104 via direct contact (e.g. a direct connection, link, etc.) between the two memories. Of course, being communicatively coupled may also refer to indirect connections, connections with intermediate connections therebetween, etc. In another embodiment, the second memory 1A-106 may be communicatively coupled to the first memory 1A-104 via a bus. In yet another embodiment, the second memory 1A-106 may be communicatively coupled to the first memory 1A-104 utilizing a through-silicon via (TSV).

As another option, the communicative coupling may include a connection via a buffer device (logic chip, buffer chip, FPGA, programmable device, ASIC, etc.). In one embodiment, the buffer device may be part of the physical memory sub-system 1A-102. In another embodiment, the buffer device may be separate from the physical memory sub-system 1A-102.

In one embodiment, the first memory 1A-104 and the second memory 1A-106 may be physically separate memories that are communicatively coupled utilizing through-silicon via technology. In another embodiment, the first memory 1A-104 and the second memory 1A-106 may be physically separate memories that are communicatively coupled utilizing wire bonds. Of course, any type of coupling (e.g. electrical, optical, etc.) may be implemented that functions to allow the second memory 1A-106 to communicate with the first memory 1A-104.

The apparatus 1A-100 is configured such that the first memory 1A-104 and the second memory 1A-106 are capable of receiving instructions via a single memory bus 1A-108. The memory bus 1A-108 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, etc; I/O protocols such as PCI, PCI-E, HyperTransport, InfiniBand, QPI, etc; networking protocols such as Ethernet, TCP/IP, iSCSI, etc; storage protocols such as NFS, SAMBA, SAS, SATA, FC, etc; and other protocols (e.g. wireless, optical, etc.); etc.).

In one embodiment, the physical memory sub-system 1A-102 may include a three-dimensional integrated circuit.

In the context of the present description, a three-dimensional integrated circuit refers to any integrated circuit comprised of stacked wafers and/or dies (e.g. silicon wafers and/or dies, etc.), which are interconnected vertically (e.g. stacked, compounded, joined, integrated, etc.) and are capable of behaving as a single device.

For example, in one embodiment, the physical memory sub-system 1A-102 may include a three-dimensional integrated circuit that is a wafer-on-wafer device. In this case, a first wafer of the wafer-on-wafer device may include the first memory 1A-104 of the first memory class, and a second wafer of the wafer-on-wafer device may include the second memory 1A-106 of the second memory class.

In the context of the present description, a wafer-on-wafer device refers to any device including two or more semiconductor wafers (or die, dice, or any portion or portions of a wafer, etc.) that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding, created in the stack after bonding, or built by other means, etc.

In another embodiment, the physical memory sub-system 1A-102 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit.

In another embodiment, the physical memory sub-system 1A-102 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer.

In yet another embodiment, the physical memory sub-system 1A-102 may include a three-dimensional integrated circuit that is a die-on-die device. In the context of the present description, a die-on-die device refers to a device including two or more aligned dies in a die-on-die configuration. Additionally, in one embodiment, the physical memory sub-system 1A-102 may include a three-dimensional package. For example, the three-dimensional package may include a system in package (SiP) or chip stack MCM.

In operation, the apparatus 1A-100 may be configured such that the first memory 1A-104 and the second memory 1A-106 are capable of receiving instructions from a device 1A-110 via the single memory bus 1A-108. In one embodiment, the device 1A-110 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit (e.g. logic outside or excluding one or more cores, etc.); etc.). In this case, the apparatus 1A-100 may be configured such that the first memory 1A-104 and the second memory 1A-106 are be capable of receiving instructions from the CPU via the single memory bus 1A-108.

More illustrative information will now be set forth regarding various optional architectures and features with which the foregoing techniques discussed in the context of any of the figure(s) may or may not be implemented, per the desires of the user. For instance, various optional examples and/or options associated with the configuration/operation of the physical memory sub-system 1A-102, the configuration/operation of the first and second memories 1A-104 and 1A-106, the configuration/operation of the memory bus 1A-108, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

Figure 1B:
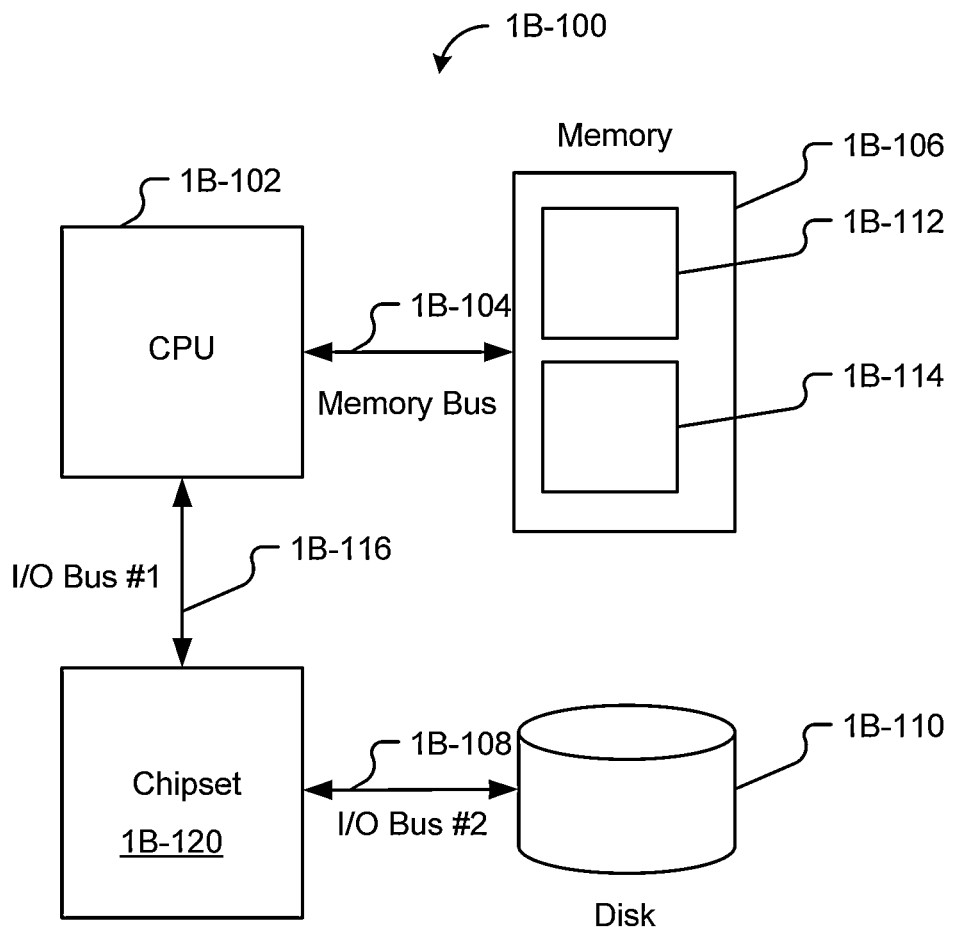
FIG. 1B shows an exemplary system using main memory with multiple memory classes, in accordance with another embodiment.

FIG. 1B shows an exemplary system using main memory with multiple memory classes, in accordance with another embodiment. As an option, the exemplary system of FIG. 1B may be implemented in the context of the architecture and environment of FIG. 1A, or any subsequent Figure(s). Of course, however, the exemplary system of FIG. 1B may be implemented in the context of any desired environment.

In FIG. 1B, System 1B-100 comprises a CPU 1B-102 connected (e.g. coupled, etc.) to Memory 1B-106 using a single Memory Bus 1B-104, and connected (e.g. coupled, etc.) to Chipset 1B-120 using I/O Bus #1 1B-116. In FIG. 1B Chipset 1B-120 is coupled to Disk 1B-110 using I/O Bus #2 1B-108. In FIG. 1B, Memory 1B-106 comprises memory class 1 1B-112 and memory class 2 1B-114. In FIG. 1B, Memory 1B-106 may also be the main memory for System 1B-100. In FIG. 1B, memory class 1 1B-112 and memory class 2 1B-114 may comprise different memory technologies. In FIG. 1B, Disk 1B-110 may be secondary storage for System 1B-100.

In various different embodiments, with reference to FIG. 1B and other figures referenced below and other embodiments described below, different system components (e.g. system blocks, chips, packages, etc.) may be constructed (e.g. physically, logically, arranged, etc.) in different ways; the coupling (e.g. logical and/or physical connection via buses, signals, wires, etc.) may be arranged in different ways; and the architectures may be arranged in different ways (e.g. operations performed in different ways, different split (e.g. partitioning, sectioning, assignment, etc.) of functions between hardware and/or software and/or firmware, etc.); but these various differences may not affect the basic descriptions (e.g. functions, operations, theory of operations, advantages, etc.) provided below for each embodiment.

Where appropriate for each embodiment, examples of alternative implementations, options, variations, etc. may be described, for example, where new concepts, elements, etc. may be introduced in an embodiment. However, these alternative implementations are not necessarily repeated for each and every embodiment though application of alternative implementations may be equally possible to multiple embodiments. For example, it may be initially explained that a memory component may be constructed from a package that may contain one die or one or more stacked die. These alternative memory component implementations may not be repeatedly explained for each and every embodiment that uses memory components. Therefore, the description of each embodiment described here may optionally be viewed as cumulative with respect to the various implementation options, alternatives, other variations, etc. in that each new or different etc. alternative implementation that may be applied to other embodiments should be viewed as having being described as such.

For example, in various embodiments, memory class 1 and memory class 2 may each be physically constructed (e.g. assembled, constructed, processed, manufactured, packaged, etc.) in several ways: from one or more memory components; from multi-chip packages; from stacked memory devices; etc. In various embodiments, memory class 1 and memory class 2 may be: integrated on the same die(s); packaged separately or together in single die package(s) or multi-chip package(s); stacked separately or together in multi-chip packages; stacked separately or together in multi-chip packages with one or more other chip(s); as discrete memory components; etc.

In different embodiments, Memory 1B-106 may be physically constructed (e.g. assembled, manufactured, packaged, etc.) in many different ways: as DIMM(s); as component(s); on a motherboard or other PCB; as part of the CPU or other system component(s); etc.

In one embodiment, Memory 1B-106 may comprise more than two memory classes, which may also be physically constructed in the various ways just described.

In one embodiment, there may be more than one CPU 1B-102. Additionally, in one embodiment, there may or may not be a Disk 1B-110. In another embodiment, CPU 1B-102 may be connected directly to Disk 1B-110 (e.g. there may or may not be a separate Chipset 1B-120, the function of Chipset 1B-120 may be integrated with the CPU 1B-102, etc.). In yet another embodiment, one or more CPU(s) may connect (e.g. couple, etc.) to more than one Memory 1B-106.

In various embodiments, Memory Bus 1B-104 may be: a standard memory bus (e.g. DDR3, DDR4 etc.); other standard bus (e.g. QPI, ARM, ONFi, etc.); a proprietary bus (e.g. ARM, packet switched, parallel, multidrop, point-to-point, serial, etc.); or even an I/O bus used for memory (e.g. PCI-E, any variant of PCI-E, Light Peak, etc.).

Additionally, in different embodiments, I/O Bus #1 1B-116 that couples CPU 1B-102 to Chipset 1B-120 may be: a standard I/O bus (e.g. PCI, PCI-E, ARM, Light Peak, USB, etc.); a proprietary bus (e.g. ARM, packet switched, parallel, multidrop, point-to-point, serial, etc.); or even a memory bus used, modified, altered, re-purposed etc. for I/O (e.g. I/O, chipset coupling, North Bridge to South Bridge coupling, etc.) purposes (e.g. low-power DDR, etc.). Of course, Chipset 1B-120 [or the functions (protocol conversion, etc.) of Chipset 1B-120] may be integrated with (e.g. combined with, part of, performed by, etc.) CPU 1B-102 etc.

Further, in various embodiments, I/O Bus #2 1B-108 that couples Chipset 1B-120 with Disk 1B-110 may be: a standard I/O or storage bus (e.g. SATA, SAS, PCI, PCI-E, ARM, Light Peak, USB, InfiniBand, etc.); a bus used to interface directly with solid-state storage (e.g. NAND flash, SSD, etc.) such as ONFi 1.0, ONFi 2.0, ONFi 3.0, OneNAND, etc; a proprietary bus (e.g. ARM, packet switched, parallel, multidrop, point-to-point, serial, etc.); a modified bus and/or bus protocol (e.g. lightweight version of a storage protocol bus for use with NAND flash, etc.); a networking bus and/or networking protocol (e.g. Ethernet, Internet, LAN, WAN, TCP/IP, iSCSI, FCoE, etc.); a networked storage protocol (e.g. NAS, SAN, SAMBA, CIFS, etc.); a wireless connection or coupling (e.g. 802.11, Bluetooth, ZigBee, LTE, etc.); a connection or coupling to offline storage (e.g. cloud storage, Amazon EC3, Mozy, etc.); a combination of buses and protocols (e.g. PCI-E over Ethernet, etc.); or even a memory bus used, modified, altered, re-purposed etc. for I/O purposes (e.g. low-power DDR, DDR2, etc.).

In different embodiments, for systems similar to, based on, or using that shown in FIG. 1B, any of the buses, protocols, standards etc. operable for I/O Bus #2 1B-108 may be used for I/O Bus #1 1B-116; and any of the buses, protocols, standards etc. operable for I/O Bus #1 1B-116 may be used for I/O Bus #2 1B-108.

Further, in various embodiments, Memory Bus 1B-104 and/or I/O Bus #1 1B-116 and/or I/O Bus #2 1B-108 may comprise: one or more buses connected in serial, one or more buses connected in parallel, one or more buses connected in combinations of serial and/or parallel; one or more buses in series or parallel plus control signals; one or more different buses in series plus control signals; and many other series/parallel data/address/control/etc. bus combinations with various series/parallel control signal combinations, etc.

In different embodiments, Memory Bus 1B-104 and/or I/O Bus #1 1B-116 and/or I/O Bus #2 1B-108 may comprise: one or more buses using different protocols; different bus standards; different proprietary bus and/or protocol formats; combinations of these, etc.

In different embodiments, Memory Bus 1B-104 and/or I/O Bus #1 1B-116 and/or I/O Bus #2 1B-108 may comprise: a point to point bus; a multidrop bus; a parallel bus; a serial bus; a split transaction bus; one or more high-speed serial links; combinations of these; etc.

For example, in one embodiment, Memory Bus 104 may be a standard JEDEC (e.g. DDR2, DDR3, DDR4 etc.) memory bus that comprises a parallel combination of: a data bus [e.g. 64-bits of data, 72-bits (e.g. data plus ECC, etc.), etc.], an address bus, and control signals.

In another embodiment, Memory Bus 1B-104 may be a standard JEDEC (e.g. DDR2, DDR3, DDR4 etc.) memory bus or other memory bus that comprises a parallel combination of: a data bus [e.g. 64-bits of data, 72-bits (e.g. data plus ECC, etc.), etc.], an address bus, and non-standard control signals (e.g. either in addition to and/or instead of standard control signals, etc.). In one embodiment, control signals may time-multiplexed with existing standard control signals. In another embodiment, control signals may re-use existing control signals, or may re-purpose existing control signals, etc. Of course, in various embodiments, control signals may also be viewed as data, address, etc. signals. Equally, in one embodiment, address, data, etc. signals that may be part of a bus may also be used as control signals etc. In addition, in one embodiment, data signals may be used for control signals or address signals etc. For example, in some embodiments, a Bank Address signal (or signals) in a DDR protocol may be viewed and/or used as a control signal as well as an address signal. In other embodiments, one or more Chip Select signals in a DDR protocol may be used as one or more control signals and adapted to be used as one or more address signals, etc.

In another embodiment, I/O Bus #2 1B-108 may comprise a wireless connection to offline storage via a combination (e.g. series, series/parallel, parallel, combination of series and parallel, etc.) of different: buses (e.g. I/O bus, storage bus, etc); protocols (e.g. SATA, 802.11, etc.), adapters (wireless controllers, storage controllers, network interface cards, etc.); and different standards; and combinations of these, etc. For example, in some embodiments I/O Bus #2 1B-108 may be a wireless 802.11 connection that may be coupled to (e.g. chained with, in series with, connected to, etc.) a cell phone connection that is in turn coupled (e.g. in series with, coupled to, etc.) an Ethernet WAN connection etc. Of course, in various embodiments, these connections may be in any order or of any type.

In different embodiments, two or more of Memory Bus 1B-104 and/or I/O Bus #1 1B-116 and/or I/O Bus #2 1B-108 may share [e.g. through time-multiplexing, through switching, through multiplexing (e.g. other than time, etc.), through packet switching, etc.] some or all of the same connections (e.g. wires, signals, control signals, data buses, address buses, unidirectional signals, bidirectional signals, PCB traces, package pins, socket pins, bus traces, connections, logical connections, physical connections, electrical connections, optical connections, etc.).

In different embodiments, one or more of the bus(es) that comprise Memory Bus 104 and/or I/O Bus #1 1B-116 and/or I/O Bus #2 1B-108 may be wireless (e.g. LTE, 802.11, Wi-Max, etc.). Thus, for example, in a system that includes a mobile phone (e.g. a cellular phone, etc.), the mobile phone may have some memory (e.g. solid-state memory, disk storage, etc.) located remotely using a wireless connection (in which case one system may be viewed as being the cell phone, and another system as being the cell phone plus remote storage).

In different embodiments, one or more of the bus(es) that comprise Memory Bus 1B-104 and/or I/O Bus #1 1B-116 and/or I/O Bus #2 1B-108 may be optical (e.g. Fibre Channel, Light Peak, use optical components, etc.). Thus, for example, in a system that comprises a server with a requirement for large amounts of high-speed memory and having a large power budget etc, the CPU may have memory connected via optical cable (e.g. optical fiber, fibre channel, optical coupling, etc.).

Of course, any technique of coupling (e.g. connecting logically and/or physically, using networks, using switches, using MUX and deMUX functions, encoding multiple functions on one bus, etc.) may be used for any (or all) of the buses and to connect any (or all) of the components that may be coupled.

In different embodiments, the multiple memory classes in Memory 1B-106 and Memory Bus 1B-104 may be connected (e.g. coupled, etc.) to each other in several different ways depending on the architecture of Memory 1B-106. Various embodiments of the architecture of Memory 1B-106 and the rest of the system are described in detail in exemplary embodiments that follow. It should be noted now, however, that in order to allow Memory 1B-106 to contain multiple memory classes and connect (e.g. couple, etc.) to CPU 1B-102, other components (e.g. chips, passive components, active components, etc.) may be part of Memory 1B-106 (or otherwise connected (e.g. coupled, joined, integrated etc.) with the multiple memory classes). Some other components, their functions, and their interconnection(s), which, in various embodiments, may be part of Memory 1B-106, are described in detail below. It should be noted that these other components, their functions, and their interconnection(s), which may be part of Memory 1B-106, may not necessarily be included or be shown in all figures.

Figure 1C:
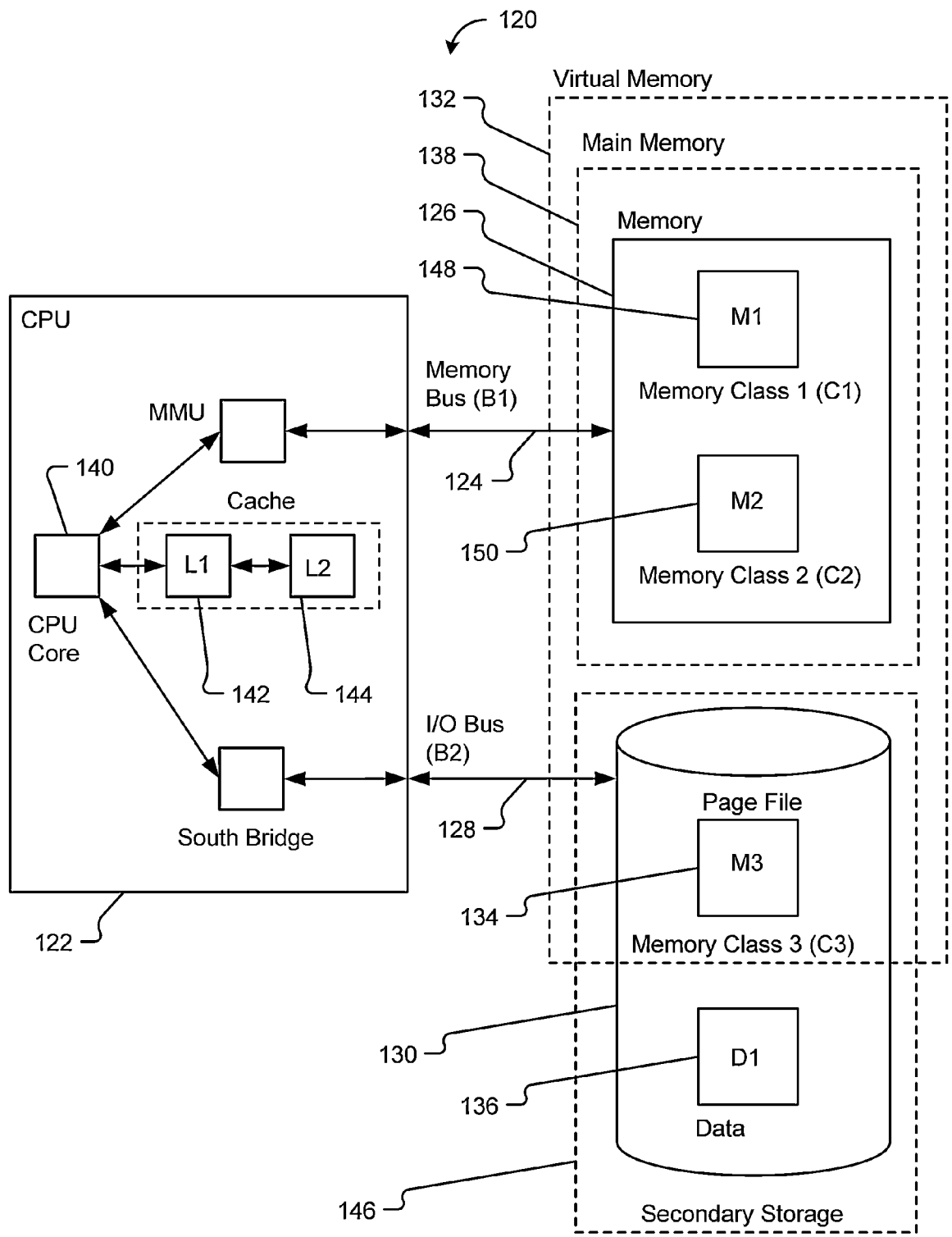
FIG. 1C shows a virtual memory (VMy) in an example of a computer system using a main memory with multiple memory classes, in accordance with another embodiment.

FIG. 1C shows a virtual memory (VMy) in an example of a computer system using a main memory with multiple memory classes, in accordance with another embodiment. As an option, the exemplary system of FIG. 1C may be implemented in the context of the architecture and environment of the previous Figure(s), or any subsequent Figure(s). Of course, however, the exemplary system of FIG. 1C may be implemented in the context of any desired environment.

A VMy may contain pages that may be either located (e.g. resident, stored, etc) in main memory or in a page file (also called a swap file). In FIG. 1C, a System 120 includes a CPU 122 coupled to Memory 126 using Memory Bus 124, and coupled to Disk 130 using I/O Bus 128. The system of FIG. 1C is similar to FIG. 1B except that the Disk 130 is coupled directly to CPU 122 in FIG. 1C.

In some high-end CPUs the function of chipset, South Bridge, disk controller, etc. may be integrated, but in some low-end systems (and consumer devices, for example), it may not be integrated. It should be noted that in any of the embodiments shown or described herein a chipset, South Bridge, disk controller, I/O controller, SATA controller, ONFi controller, PCI-E controller, etc. may or may not be connected to the CPU and/or may or may not be integrated with the CPU.

In FIG. 1C, memory class 1 148, memory class 2 150 and memory class 3 134 located on Disk 130 may together form VMy 132. In FIG. 1C, memory class 1 148 and memory class 2 150 may form the Main Memory 138. In FIG. 1C, memory class 3 134 located on Disk 130 may contain the Page File. In FIG. 1C, memory class 3 134 is not part of main memory (but in other embodiments it may be). In FIG. 1C, the Data 136 of Disk 130 may be used for data storage and is not part of VMy 132 (but in other embodiments it may be).

In one embodiment, memory class 1 148, memory class 2 150 and memory class 3 134 may be composed of (e.g. logically comprise, etc.) multiple different classes of PM (e.g. selected from: SRAM, SDRAM, NAND flash, embedded DRAM, PCRAM, MRAM, combinations of these and/or other memory types, etc.).

In FIG. 1B, all of Memory 106, which included multiple memory classes, may be main memory for System 100. In FIG. 1C regions of memory are labeled as memory, main memory, and virtual memory. In FIG. 1C, the regions labeled memory and main memory are the same; but this is not always so in other embodiments and thus may stretch the precision of the current terminology. Therefore, in FIG. 1C, system components are labeled using a taxonomy that will help explain embodiments that contain novel aspects for which current terminology may be inadequate. In this case, elements of CPU cache terminology are borrowed. Thus, in FIG. 1C, the CPU Core 140 is shown as coupled to L1 Cache 142 and (indirectly, hierarchically) to L2 Cache 144. The L1 Cache and L2 Cache form a hierarchical cache with L1 Cache being logically closest to the CPU. Using a similar style of labeling in FIG. 1C for the VMy components, memory class 1 148 is labeled as M1 Memory, memory class 2 150 as M2 Memory and memory class 3 134 as M3 Memory (M1, M2, M3 may generally be used, but it should be understood that this is a short abbreviation, L1 Cache as just will be referred to L1). M1 may also be referred to as primary memory, M2 as secondary memory, M3 as tertiary memory, etc.

The logical labels for CPU cache, L1 and L2 etc, say nothing about the physical technology (e.g. DRAM, embedded DRAM, SRAM, etc.) used to implement each CPU cache. In the context of the present description, there is a need to distinguish between memory technologies used for VMy components M1, M2 etc. because the technology used affects such things as system architecture, buses, protocols, packaging, etc. Thus, following a similar style of labeling to the VMy components in FIG. 1C, memory class 1 is labeled as C1, memory class 2 as C2, and memory class 3 as C3. Note that number assigned to memory class and the number assigned to the logical position of the class are not necessarily the same. Thus, both M1 and M2 may be built from memory class 1 (e.g. where memory class 1 might be SDRAM, etc.). For example, a component of memory may be referred to as M2.C1, which refers to M2 composed of memory class 1.

In FIG. 1C buses are also labeled as B1 (for Memory Bus) and B2 (for I/O Bus). Memory bus technologies and I/O bus technologies are deliberately not distinguished because the embodiments described herein may blur, merge, and combine, etc. those bus technologies (and to a great extent various embodiments remove the distinctions between I/O bus technologies and memory bus technologies). The concept of hierarchy in bus technologies may be maintained. Thus, when it is convenient, B1 and B2 may be used to point out that B1 may be closer to the CPU than B2. It should be noted that in many situations (e.g. architectures, implementations, embodiments, etc.) it is sometimes hard to define what closer to the CPU means with a bus technology. Nevertheless in FIG. 1C for example B1 is regarded as being closer (e.g. lower latency in this case) to the CPU than bus B1. Thus, B1 may be referred to as the primary bus, B2 as the secondary bus, etc. The Page File in FIG. 1C may be referred to as being memory B2.M3.C3, e.g. tertiary memory M3 is constructed of memory class 3 technology and is located on secondary bus B2.

In general, though not necessarily always, M1 may be logically closest to the CPU, M2 next, and so on. If there is a situation in which, for example, M1 and M2 are not in that logical position and there is possible confusion, this may be pointed out. It may not be obvious why the distinction between M1 and M2 might not be clear, thus, some embodiments may be described where the distinction between M1 and M2 (or M2 and M3, M1 and M3, etc.) is not always clear.

In one embodiment, for example, memory may be composed of M1 and M2 with two different technologies (e.g. C1 and C2), but both connected to the same bus (e.g. at the same logical distance from the CPU); in that case it may be the case that both technologies are M1 (and thus there may be M1.C1 and M1.C2 for example) or it may be the case that if one technology has lower latency, for example C1, than that faster technology is M1 because it is closer to the CPU in the sense of lower latency and thus there is M1.C1 (with the other, slower technology C2, being M2 and thus M2.C2).

In another embodiment, a technology C1 used for M1 may be capable of operating in different modes and is used in a memory system together with technology C2 used as M2. Suppose, for example, mode 1 of C1 is faster than C2, but mode 2 of C1 is slower than M2. In that case, the roles of C1 and C2 used as M1 and M2, for example, may be reversed in different modes of operation of C1. In this case, where the fastest memory is defined as being closer to the CPU, terminology may be used to express that memory is composed of M1.C1 and M2.C2 when C1 is in mode 1 and memory is composed of M1.C2 and M2.C1 when C1 is in mode 2.

In FIG. 1C, that portion of Disk 130 and Secondary Storage 146 that is used for Data 136 as labeled as D1. This notation may be helpful in certain embodiments where the distinction between, for example, page file regions of a disk (or memory) and data regions of a disk (or memory) needs to be clear. Although not labeled in FIG. 3, if the data region uses memory class 3 (disk technology in FIG. 1C), the data region of the disk may be labeled as B2.C3.D1 in FIG. 1C for example (and the page file, labeled memory class 3 134 in FIG. 1C may be more accurately referred to as B2.C3.M3).

In some embodiments, different memory technologies (e.g. solid-state, RAM, DRAM, SDRAM, SRAM, NAND flash, MRAM, etc.) as well as storage technologies (e.g. disk, SSD, etc.) all have individual and different physical, logical, electrical and other characteristics, and thus each technology may, for example, have its own interface signaling scheme, protocol, etc. For example, DRAM memory systems may use extremely fast (e.g. 1 GHz clock frequency or higher, etc.) and reliable (e.g. ECC protected, parity protected, etc.) memory bus protocols that may be industry standards: e.g. JEDEC standard DDR2, DDR3, DDR4, protocols etc. Disks (e.g. mechanical, SSD, etc.) may use fast, reliable and easily expandable storage device protocols that may be industry standards: e.g. ANSI/INCITS T10, T11 and T13 standards such as SCSI, SATA, SAS protocols, etc. and may be attached (e.g. coupled, connected, etc. via a controller, storage controller, adapter, host-bus adapter, HBA etc.) to I/O bus protocols that may also be industry standards: e.g. PCI-SIG standards such as PCI-Express, PCI, etc.

The following definitions and the following explanation of the operation of a VMy are useful in the detailed description of different and various embodiments of the memory system below.

To create the illusion of a large memory using a small number of expensive memory components together with other cheaper disk components a system may employ VMy. The information (e.g. data, code, etc.) stored in memory is a memory image. The system (e.g. OS, CPU, combination of the OS and CPU, etc.) may divide (e.g. partition, split, etc.) a memory image into pages (or virtual pages), and a page of a memory image can at any moment in time exist in (fast but expensive) main memory or on (slower but much cheaper) secondary storage (e.g. disk, SSD, NAND flash, etc.), or both (e.g. main memory and secondary storage). A page may be a continuous region of VMy in length (a standard length or size is 4,096 byte, 4 kB, the page size). A page may be page-aligned, that is the region (e.g. portion, etc.) of a page starts at a virtual address (VA) evenly (e.g. completely, exactly, etc.) divisible by the page size. Thus, for example, a 32-bit VA may be divided into a 20-bit page number and a 12-bit page offset (or just offset).

System 120 may contain an operating system (OS). For an OS that uses VMy, every process may work with a memory image that may appear to use large and contiguous sections of PM. The VMy may actually be divided between different parts of PM, or may be stored as one or more pages on a secondary storage device (e.g. a disk). When a process requests access to a memory image, the OS may map (or translate) the VA provided by the process to the physical address (PA, or real address). The OS may store the map of VA to PA in a page table.

A memory management unit (MMU) in the CPU may manage memory and may contain a cache of recently used VA to PA maps from the page table. This cache may be the translation lookaside buffer (TLB). When a VA in VMy needs to be translated to a PA, the TLB may be searched (a TLB lookup) for the VA. If the VA is found (a TLB hit), the corresponding PA may be returned and memory access may continue. If the VA is not found (a TLB miss), a handler may look up the address map in the page table to see whether the map exists by performing page table lookup or page walk. If the map exists in the page table, the map may be written to the TLB. The instruction that caused the TLB miss may then be restarted. The subsequent VA to PA translation may result in a TLB hit, and the memory access may continue.

A page table lookup may fail (a page miss) for two reasons. The first reason for a page miss is if there is no map available for the VA, and the memory access to that VA may thus be invalid (e.g. illegal, erroneous, etc.). An invalid access should be a rare event and may occur because of a programming error etc, and the operating system may then send a segmentation fault to the process, and this may be a fatal event. The second and normal reason for a page miss is if the requested page is not resident (e.g. present, stored, etc.) in PM. Such a page miss may happen when the requested page (e.g. page 1) has been moved out of PM and written to the page file, e.g. disk, normally in order to make room for another page (e.g. page 2). The usual term for this process is swapping (hence the term swap file) and it may be said that the pages (e.g. page 1 and page 2) have been swapped. When this page miss happens the requested page needs to be read (often referred to as fetched) from the page file on disk and written back into PM. This action is referred to a page being swapped out (from main memory to disk and the page file) and/or swapped in (from the disk and page file to main memory).

There are two situations to consider on a page miss: the PM is not full and PM full. When the PM is not full, the requested page may be fetched from the page file, written back into PM, the page table and TLB may be updated, and the instruction may be restarted. When the PM is full, one or more pages in the PM may be swapped out to make room for the requested page. A page replacement algorithm may then choose the page(s) to swap out (or evict) to the page file. These evicted page(s) may then be written to the page file. The page table may then be updated to mark the evicted page(s) that were previously in PM as now in the page file. The requested page may then be fetched from the page file and written to the PM. The page table and TLB may then be updated to mark the requested page that was in the page file as now in the PM. The TLB may then be updated by removing reference(s) to the evicted page(s). The instruction may then be restarted.

FIG. 2 shows a page write in a system using main memory with multiple memory classes, in accordance with another embodiment. As an option, the exemplary system of FIG. 2 may be implemented in the context of the architecture and environment of the previous Figure(s), or any subsequent Figure(s). Of course, however, the exemplary system of FIG. 2 may be implemented in the context of any desired environment.

In FIG. 2, a System 200 includes a CPU 202 coupled to Memory 226 using Memory Bus 204, and coupled to Disk 210 using I/O Bus 212. In FIG. 2, memory class 1 206 (M1), memory class 2 208 (M2) and memory class 3 234 (M3) located on Disk 210 together form VMy 232. In FIG. 2, memory class 1 206 and memory class 2 208 form the Main Memory 238. In FIG. 2, memory class 3 234 located on Disk 210 contains the page file. In FIG. 2, memory class 3 234 is not part of Main Memory 238 (but in other embodiments it may be).

In FIG. 2, a page of memory (for example Page X 214) is located in memory class 1 206, but is not immediately needed by the CPU 202. In some embodiments memory class 1 206 may be small and fast but expensive memory (e.g. SDRAM, SRAM, etc.). In this case, Page X may be fetched from memory class 1 206 and copied to a location on larger, slower but cheaper secondary storage (e.g. Page X 216). In order to complete the transfer of Page X from memory class 1 206 to Disk 210, the data comprising Page X may be copied (e.g. transferred, moved. etc.) as Copy 1 220 over Memory Bus 204, through CPU 202, through I/O Bus 212, to the location of Page X 216 on Disk 210. This process of Copy 1 220 may, in some embodiments, free up precious resources in memory class 1 206. However, one possible result is that the process of Copy 1 220 may consume time and may also consume various other resources including bandwidth (e.g. time, delay, etc.) on Memory Bus 204, bandwidth (e.g. time, delay, etc.) on I/O Bus 208, bandwidth (e.g. time, delay, etc.) and write latency (e.g. delay, cycles, etc.) of Disk 210, and possibly also resources (e.g. cycles, etc.) from the CPU 202. In addition another possible result may be that power is consumed in all these operations.

In different embodiments, the Copy 1 220 may be part of a page swap, a page move, a write to disk, etc. If Copy 1 220 is part of a page swap then the next operation may be to copy Page Y 236 to memory class 1 206 in order to replace Page X 214.

In some embodiments, the system designer may accept the trade-offs just described and design a system having the memory architecture shown in FIG. 2. In other embodiments that are described below, some of these trade-offs just described may be changed, improved or otherwise altered etc. by changing the architecture of the memory system.

In other embodiments, based on that shown in FIG. 2 and/or based on other similar embodiments described elsewhere, Disk 210 may be: remote storage using e.g. SAN; NAS; using a network such as Ethernet etc. and a protocol such as iSCSI, FCoE, SAMBA, CIFS, PCI-E over Ethernet, InfiniBand, USB over Ethernet, etc; cloud storage using wired or wireless connection(s); RAID storage; JBOD; SSD; combinations of these, etc. and where the storage may be disk(s), SSD, NAND flash, SDRAM, RAID system(s), combinations of these, etc.

Figure 3:
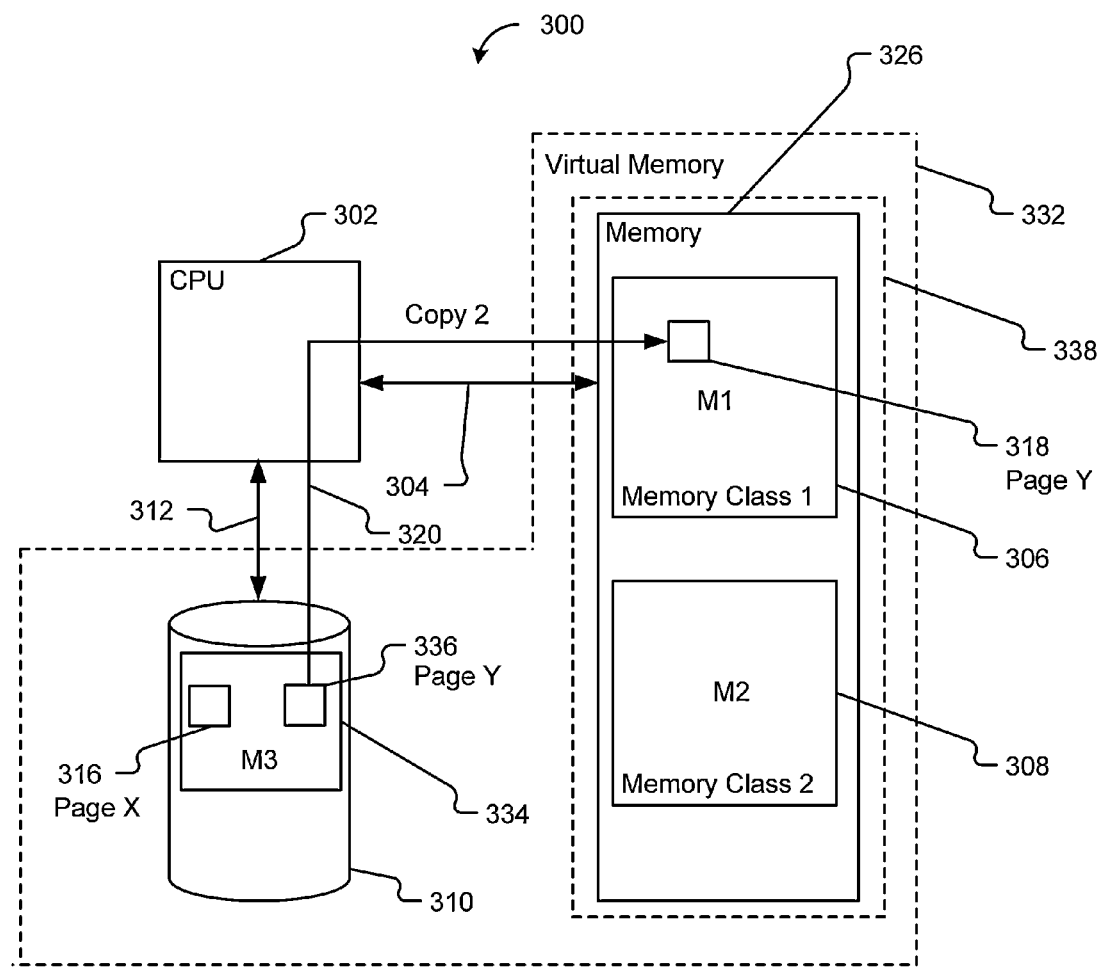
FIG. 3 shows a page read in a system using main memory with multiple memory classes, in accordance with another embodiment.

FIG. 3 shows a page read in a system using main memory with multiple memory classes, in accordance with another embodiment. As an option, the exemplary system of FIG. 3 may be implemented in the context of the architecture and environment of the previous Figure(s), or any subsequent Figure(s). Of course, however, the exemplary system of FIG. 3 may be implemented in the context of any desired environment.

In FIG. 3, a System 300 includes a CPU 302 coupled to Memory 326 using Memory Bus 304, and coupled to Disk 310 using I/O Bus 312. In FIG. 3, memory class 1 306 (M1), memory class 2 308 (M2) and memory class 3 334 (M3) located on Disk 310 together form VMy 332. In FIG. 3, memory class 1 306 and memory class 2 306 form the Main Memory 338. In FIG. 3, memory class 3 334 located on Disk 310 contains the page file. In FIG. 3, memory class 3 334 is not part of Main Memory 338 (but in other embodiments it may be).

In FIG. 3, a page of memory (e.g. Page Y 318, etc.) is located on Disk 310, but is immediately needed by the CPU 302, In some embodiments, memory class 1 306 may be small and fast but expensive memory (e.g. SDRAM, SRAM, etc.). In this case, Page Y located on larger, slower but cheaper secondary storage (e.g. Page Y 336) may be fetched from and copied to a location in memory class 1 306. In order to complete the transfer of Page Y from Disk 310 to memory class 1 306, the data comprising Page Y is copied (e.g. transferred, moved. etc.) as Copy 2 320 through I/O Bus 212, through CPU 302, over Memory Bus 304, to the location of Page X 318 to memory class 1 306. This process of Copy 2 320 may, in some embodiments, allow for providing CPU 302 faster access to Page Y. However, the process of Copy 2 320 may, in some embodiments, allow for consuming time and may also consume various other resources including bandwidth (e.g. time, delay, etc.) on Memory Bus 304, bandwidth (e.g. time, delay, etc.) on I/O Bus 308, bandwidth (e.g. time, delay, etc.) and write latency (e.g. delay, cycles, etc.) of Disk 310, and possibly also resources (e.g. cycles, etc.) from the CPU 302. In addition, power is consumed in all these operations.

The operations in the systems of FIG. 2 and FIG. 3 are described separately above, but it should be noted that that if the operations (e.g. steps, actions, etc.) shown in FIG. 2 are performed (e.g. Copy 1 220, copying Page X from main memory to the swap file, etc.) followed by the operations shown in FIG. 3 (e.g. Copy 2 320, copying Page Y from the swap file to main memory, etc.) in a system Page X (shown as Page X 316 in FIG. 3) and Page Y are swapped in main memory; with the final result being as shown in FIG. 3. These page swapping operations are a sequence of operations that may be performed via a virtual memory manager (VMM) or in virtual memory management. The time, power and efficiency of these VMM operations, including page swapping, are an element of system design and architecture.

In some embodiments, memory class 1 206 in FIG. 2 and memory class 1 306 in FIG. 3 may be small and fast but expensive memory (e.g. SDRAM, SRAM, etc.) as described above. In certain embodiments, memory class 1 206 in FIG. 2 and memory class 1 306 in FIG. 3 may be faster than memory class 2 208 in FIG. 2 and memory class 2 308 in FIG. 3. In these embodiments, the page eviction and page fetch are from (for eviction) and to (for fetch) the faster part of main memory.

In other embodiments, it may be desirous (e.g. for reasons of cost, power, performance, etc.) for memory class 1 206 in FIG. 2 and memory class 1 306 in FIG. 3 to be slower than memory class 2 208 in FIG. 2 and memory class 2 308 in FIG. 3. In these embodiments the page eviction and page fetch are from and to the slower part of main memory.

Of course, there may be possible trade-offs in the design of systems similar to those shown in FIG. 2 and FIG. 3 (e.g. portable consumer devices, servers, laptops, cell phones, tablet PCs, etc.). For example, in some embodiments, it may be desirous to perform swapping to and from a memory class that has one or more of the following properties relative to other memory classes in main memory: consumes less power (e.g. LPDDR rather than DDR, low-voltage memory, etc.); is more reliable (e.g. uses ECC protection, LDPC protection, parity protection, etc.); is removable (e.g. USB key, ReadyBoost, etc.); can be remotely connected more easily (e.g. SAN, NAS, etc.); is more compact (e.g. embedded DRAM rather than SRAM, flash rather than SRAM, etc.); is cheaper (e.g. flash rather than SDRAM, disk rather than SDRAM, etc.); can be more easily integrated with other component(s) (e.g. uses the same protocol, uses compatible process technology, etc.); has a more suitable protocol (e.g. ONFi, DDR, etc.); is easier to test (e.g. standard DDR SDRAM with built-in test (BIST, etc.), etc.); is faster (e.g. SRAM rather than flash, etc.); has higher bandwidth (e.g. DDR3 rather than DDR2, higher bus widths, etc.); can be stacked more easily (e.g. appropriate relative die sizes for stacking (for TSV stacking, wirebond, etc.), using TSVs with compatible process technologies, etc; can be packaged more easily (e.g. NAND flash with relatively low clock speeds may be wirebonded, etc.); can be cooled more easily (e.g. lower power NAND flash, low-power SDRAM, LPDDR, etc.); and/or any combinations of these; etc.

In other embodiments, the decision to swap pages to/from a certain memory class may be changed (e.g. by configuration; by the system, CPU, OS, etc; under program control; etc.). For example, a system may have main memory comprising memory class 1 and memory class 2 and suppose memory class 1 is faster than memory class 2, but memory class 1 consumes more power than memory class 2. In one embodiment, the system may have a maximum performance mode for which the system (e.g. CPU, OS, etc.) may use memory class 1 to swap to/from. The system may then have a maximum battery life mode in which the system may use memory class 2 to swap to/from.

In FIG. 2 the process of page eviction in a VMy system is described, but the process of page eviction may be similar to a data write from main memory to disk. In FIG. 3 the process of page fetch in a VMy system is described, but the process of page fetch may be similar to a data read from disk to main memory. Thus, the same issues, trade-offs, alternative embodiments, system architectures etc. that was described with regard to the systems in FIG. 2 and FIG. 3 (and systems similar to those systems) are relevant and may be used in systems that do not use a VMy architecture, but that may still benefit from the use of main memory with multiple memory classes. Thus, the descriptions and concepts may be broadened and therefore implement a variety of embodiments described to the physical memory sub-system general I/O and data movement rather than just the page operations involved in VMM. Of course, general I/O and data movement may involve copying, moving, shifting, replicating etc. different sizes of data other than a page.

In some embodiments, the system (e.g. OS, CPU, etc.) may track (e.g. with modified page table(s), etc.) which pages are located in which memory class in main memory. Descriptions of various embodiments that follow describe how the system (e.g. OS, CPU, etc.) may communicate (e.g. signal, command, send control information, receive status, etc.) with the memory to, for example, transfer (e.g. copy, move, DMA, etc.) data (e.g. pages, cache lines, blocks, contiguous or non-contiguous data structures, words, bytes, any portion of memory or storage, etc.) between multiple memory classes.

In other embodiments, the main memory system may autonomously (e.g. without knowledge of the CPU, OS etc.) decide which pages are located in which memory class in main memory. For example, data may be moved from one memory class to another due to constraints such as: power, performance, reliability (e.g. NAND flash wear-out, etc.), available memory space, etc. Such an embodiment may be opted for because (since the CPU and/or OS are oblivious that anything has changed) an implementation may require minimal changes to CPU and/or OS, etc. For example, suppose a system has main memory comprising memory class 1 and memory class 2. Suppose that a page (or any other form, portion, group, etc. of data; a page will be used for simplicity of explanation here and subsequently) is moved from memory class 1 to memory class 2. There may be a need for some way to hide this page move from the CPU. One reason that the use of a VMy system in FIG. 1B and the process of page swapping in FIG. 2 and FIG. 3 is described is that in some embodiments, the memory management systems (e.g. VMM in CPU, MMU in CPU, software in OS, combinations of these possibly with new hardware and/or software, etc.) may be used to allow the main memory to hide (either partially or completely from the CPU and/or OS) the fact that there are multiple memory classes present.

In some embodiments, the system designer may accept the trade-offs just described and design a system with (or similar to) the architecture shown in FIG. 2 and in FIG. 3, that may include some form of secondary storage for paging. In other embodiments, the slower speeds of disk I/O and secondary storage may lead to the functions of disk and secondary storage being moved to one or more of the memory classes in main memory. Such optional embodiments are described in more detail below.

In various embodiments, the page swap functions and memory reads/writes may still involve some form of secondary storage but be more complex than that described already. For example, page eviction (to make room for another page) may occur using a copy from one memory class in main memory (the eviction class) to another memory class (but still in main memory rather than secondary storage), possibly followed by a copy to secondary storage (e.g. disk, etc.). In another embodiment, page fetch may be a copy from secondary storage to one memory class in main memory (the fetch class, not necessarily the same as the eviction class) and then another copy to a second memory class in main memory.

In different embodiments, page files (or any other data, page files are used for simplicity of explanation) may exist just in secondary storage, just in main memory, in more than one memory class in main memory, or using combinations of these approaches (and such combinations may change in time). Copies of page files (or any other data, page files are used for simplicity of explanation) may be kept in various memory classes in main memory under configuration and/or system control, etc. Further and more detailed explanations of such optional embodiments are described below.

In different embodiments, the fetch class, the eviction class, the class (or classes) assigned to each of the fetch class and the eviction class may be changed in various ways: dynamically, at start up, at boot time, via configuration, etc.

Of course, as already discussed, a page fetch operation may be analogous to a disk (or other I/O) read; and a page eviction may be analogous to a disk (or other I/O) write; thus the preceding description of alternative architectures and logical structures for a system that does use VMy (with main memory using multiple memory classes) and page swapping applies equally to systems that do not use VMy but still perform disk (or other) I/O.

The systems in FIG. 2 and FIG. 3 have been described in terms of a VMy system, but the concept of swapping regions of the memory image in and out of main memory is a more general one. For example, machines without dedicated VMy support in the CPU may use overlays in order to expand main memory, in still other possible embodiments.

In general, using overlays (or overlaying) may involve replacement of a block (e.g. region, portion, page, etc.) of information stored in a memory image (e.g. instructions, code, data, etc.) with a different block. The term blocks is used for overlays to avoid confusion with pages for a VMy, but they may be viewed as similar [e.g. though page size(s) and block size(s), etc. may be different; there may be variable overlay block sizes; software and hardware used to manipulate pages and blocks may be different, etc.]. Overlaying blocks allows programs to be larger than the CPU main memory. Systems such as embedded systems, cell phones, etc. may use overlays because of the very limited size of PM (e.g. due to cost, space, etc.). Other factors that may make the use of overlays in systems such as those shown in FIG. 2 and FIG. 3 more attractive than VMy may include one or more of the following: the PM may be integrated (or packaged with, die stacked, etc.) a system-on-chip (e.g. SoC, CPU, FPGA, etc.) further limiting the PM size; any CPU if used may not have a VMy MMU; any OS if used may be a real-time OS (RTOS) and the swapping of overlay blocks may be more deterministic than page swapping in VMy; any OS used may not support VMy; etc. For the same reasons that one may opt for use of main memory with multiple memory classes for a VMy system, one may also opt to use main memory with multiple memory classes for an overlay system (or any other system that may require more main memory than PM available). Thus, even though the use of VMy may be described in a particular embodiment, any embodiment may equally use overlays or other techniques.

In some embodiments, one may opt to use overlays even if the system supports (e.g. is capable of using, uses, etc.) VMy. For example, in some systems using VMy, overlays may be used for some components (e.g. software, programs, code, data, database, bit files, other information, etc.) that may then be loaded as needed. For example, overlays may be kept in memory class 2 and swapped in and out of memory class 1 as needed.

Of the time-consuming (e.g. high delay, high latency, etc.) operations mentioned above, the most time-consuming (highest latency) operations may be those operations involving access to the disk(s) (e.g. with rotating magnetic media, etc.). Disk access times (in 2011) may be 10's of milliseconds (ms, $10^{-3}$ seconds) or 10 million times slower compared to the access times for DRAM of a few nanoseconds (ns, $10^{-9}$ seconds) or faster. Though caching may be employed in systems where faster access times are required there is a performance penalty for using disk (or other secondary storage separate from main memory, etc.) in a system with VMy, overlays, etc. Thus, in mobile consumer devices for example, one embodiment may eliminate the use of a disk (or other secondary storage separate from main memory, etc.) for paging, etc. A potential replacement technology for disk is NAND flash. A simple approach would be to replace the rotating disk used as secondary storage on the I/O bus with a faster SSD based on NAND flash technology. For reasons explained in the embodiments described below, one may opt to integrate technologies such as NAND flash (or other similar memory types, etc.) into main memory. The next several embodiments describe how the integration of different memory technologies into main memory may be achieved.

Figure 4:
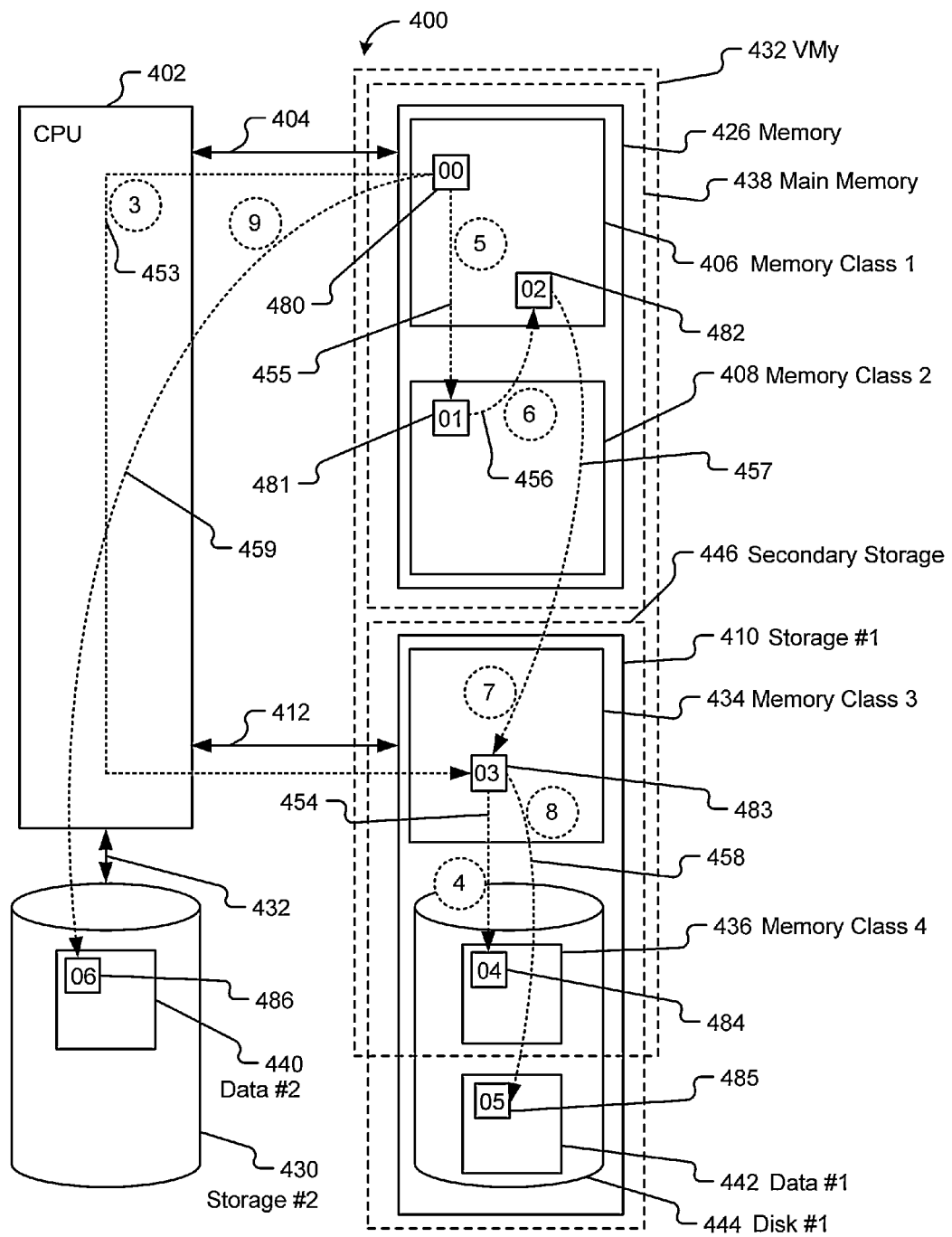
FIG. 4 shows copy operations corresponding to memory reads in a system using main memory with multiple memory classes, in accordance with another embodiment.

FIG. 4 shows copy operations corresponding to memory reads in a system using main memory with multiple memory classes, in accordance with another embodiment. As an option, the exemplary system of FIG. 4 may be implemented in the context of the architecture and environment of the previous Figure(s), or any subsequent Figure(s). Of course, however, the exemplary system of FIG. 4 may be implemented in the context of any desired environment.

In explaining the copy operations corresponding to memory reads in the context of FIG. 4, optional features that may be achieved using multiple classes in main memory will be described. In FIG. 4, a System 400 includes a CPU 402 coupled to Memory 426 using Bus #1 404, coupled to Storage #1 410 using Bus #2 412, and coupled to Storage #2 430 using Bus #3 432. In FIG. 4 Storage #1 contains Data #1 442. In FIG. 4 Storage #2 430 contains Data #2 440. In FIG. 4, memory class 1 406, memory class 2 408, with memory class 3 434 and memory class 4 436 (both located on Storage #1 410) together form VMy 432. In FIG. 4, memory class 1 406 and memory class 2 408 form the Main Memory 438. In FIG. 4, memory class 3 434 forms a cache for Storage #1 410 and Disk #1 444. In FIG. 4, memory class 4 436 located on Storage #1 410 contains the page file. In FIG. 4, memory class 3 434 and memory class 4 436 are not part of Main Memory 438 (but in other embodiments they may be).

FIG. 4 is intended to be a representative example of a system while still showing various features that may be present in multiple embodiments. Thus, for example, not all systems may have Storage #2 430, but it has been included in the system architecture diagram of FIG. 4 to show, as just one example, that some systems may be coupled to a remote storage via a wireless connection (e.g. such that at least part of Bus #3 432 may be a wireless connection in some embodiments, etc.). As another example, Bus #2 412 (e.g. part, or all, etc.) may be a remote connection (e.g. wireless or other network, etc.) allowing paging to be performed to/from remote storage. As another example, not all systems may have memory class 3 434 that may act as a cache for Storage #1 410. As another example, Storage #1 410 may not be a rotating disk but may be a solid-state disk (SSD) and possibly integrated with one or more other solid-state memory components shown in FIG. 4 that may be part of Memory 426.

In FIG. 4, various alternative copy operations (Copy 3 453, Copy 4 454, Copy 5 455, Copy 6 456, Copy 7 457, Copy 8 458, Copy 9 459) have been diagrammed. These copy operations perform on various pages (Page 00 480, Page 01 481, Page 02 482, Page 03 483, Page 04 484, Page 05 485, Page 06 486).

It should be noted that the term copy should be broadly construed in that each copy may, in various embodiments, be: (a) a true copy (e.g. element 1 in location 1 before a copy operation and two elements after a copy operation: element 1 in location 1 and element 2 in location 2, with element 2 being an exact copy of element 1); (b) a move (e.g. element 1 in location 1 before the copy operation, and element 1 in location 2 after the copy operation); (c) copy or move using pointers or other indirection; (d) copy with re-location (element 1 in location 1 before the copy operation and two elements after the copy operation: element 1 in location 2 and element 2 in location 3, with element 2 being an exact copy of element 1, but locations 1, 2, and 3 being different); (e) combinations of these and/or other move and/or copy operations, etc.

In some embodiments, a copy of types (a)-(e) may result, for example, from software (or other algorithm, etc.) involved that may not be described in each and every embodiment and that, in general, may or may not be implemented in any particular embodiment.

The copy operations shown in FIG. 4 will be now described.

Copy 3 453 shows a copy from memory class 1 to memory class 3. This copy may be part of a page eviction or a write, for example. Copy 3 uses Bus #1 and Bus #2 as well as CPU resources. The lines of Copy 3 in FIG. 4 have been drawn as straight lines next to (parallel with) the bus(es) that is/are being used during the copy, but the lines have not necessarily been drawn representing the other copies in a similar fashion.

Copy 4 454 may follow Copy 3. For example, suppose that memory class 3 may act as a cache for Storage #1 410 then Copy 4 shows a next action following Copy 3. In the case of Copy 4 the write completes to memory class 4. Supposing that memory class 4 436 located on Storage #1 410 contains the page file then Copy 3 and Copy 4 together represent a page eviction.

Copy 5 455 may be an alternative to Copy 3. For various reasons, one may opt to perform Copy 5 instead of Copy 3. For example, Copy 3 may take longer than the time currently available; Copy 3 may consume CPU resources that are not currently available; Copy 3 may require too much power at the present time, etc. Copy 5 copies from memory class 1 to memory class 2 within Main Memory 438. For example, in the case of page eviction, a page is evicted to memory class 2 instead of to the page file on Storage #1 410. In some embodiments, two page files may be maintained, one on Storage #1 410 and one in memory class 2 (for example memory class 2 may contain more frequently used pages, etc.). In other embodiments, Copy 5 may be treated as a temporary page eviction and complete the page eviction (or data write in the case of a data write) to Storage #1 410 at a later time. Note that, in contrast to Copy 3, and depending on how the Main Memory is constructed, Copy 5 may not require Bus #1 or CPU resources (or may at least greatly decrease demands on these resources) and alternative embodiments and architectures will be described for Main Memory that have such resource-saving features below. These features may accompany using main memory with multiple memory classes. In different embodiments, the page eviction (or data write) may be completed in different ways, two examples of which are described next.

Copy 6 456 shows the first part of the case (e.g. represents an action performed) in which, for example, a temporary page eviction is reversed (or page eviction completed, etc.). Suppose, for example, that Copy 5 has been performed (and Copy 5 is treated as a temporary eviction) and following Copy 5 (possibly after a controlled delay, etc.), it is desired to complete a page eviction (or write in the case of a data write) to Storage #1 410. Depending on how the system is capable of writing to Storage #1 410, Copy 6 may be performed next that may reverse the page eviction from memory class 1. In some cases, actions such as Copy 5 followed by Copy 6 may not necessarily not copy a page back to its original (source)

memory location but to a newly released and different (target) location, as shown in FIG. 4 (and thus the temporary eviction may not be necessarily exactly reversed, even though it may help to think of the action as a reversal). In the case that the system always writes pages to memory class 3 (and thus Storage #1 410) from memory class 1 (e.g. due to main memory bus architecture, DMA architecture, etc.), Copy 6 should be performed before a copy such as Copy 7 is performed to complete the page eviction (similarly for a data write). Note that Copy 6, as was the case for Copy 5, may, in certain embodiments, not require Bus #1 and CPU resources.

Copy 7 457 shows the second part of the case (e.g. represents an action performed) in which, for example, a temporary page eviction is reversed (or page eviction completed, etc.). Copy 7 completes a page eviction (or data write) using a copy of an evicted page from memory class 1 to memory Class 3 (and thus to Storage #1 410). In other embodiments, copies directly from memory class 2 to memory class 3 (and thus to Storage #1 410) may be performed and in that case Copy 6 and Copy 7 may be combined into one operation and avoid the need to request or consume etc. any space in memory class 1.

Copy 8 458 is the equivalent to Copy 4 but corresponds to (or performs) a data write to Storage #1 410 rather than a page eviction. In the case of the page eviction, the write (Copy 4) completes to memory class 4 (which is part of VMy 432 and contains the page file) on Storage #1 410. In the case of a data write (Copy 8) the write completes to Storage #1 410 in a region that is outside the VMy.

Copy 9 459 shows the copy of a page to Storage #2 430. Copy 9 may correspond to a data write since in FIG. 4 Storage #2 430 is not part of the VMy (though in other embodiments it may be). In the same way that Copy 5 etc. was used to delay, postpone etc. Copy 3 (applied to a page eviction) the same technique(s) may be used to delay a data write. Thus, for example, instead of performing Copy 9 immediately, the following actions (e.g. under program control, direction of the CPU, direction of the OS, direction of the main memory, in a configurable or dynamic fashion, etc.) may be performed: first perform a Copy 5, second perform a Copy 6, third perform a Copy 9.

Such a delay (or other similar write manipulation, etc.) might be opted for in many situations. For example, in the case described above where Storage #2 430 is remote, possibly on a wireless connection that may be unreliable (e.g. intermittent, etc.) or consumes more power than presently available etc, one may, in some embodiments, opt to temporarily store writes that may then be completed at a later time etc.

In one embodiment, such delayed data writes may be used with techniques such as performing the writes to log files etc. to allow interruptions of connectivity, avoid data corruption, etc.

In another embodiment, data writes may be aggregated (e.g. multiple writes combined into a single write, etc.). Write aggregation may exhibit various optional features including but not limited to: improved bandwidth; reduced power; reduced wear in NAND flash, etc.

In another embodiment, data writes may be combined (e.g. multiple writes to the same location are collapsed together, resulting in many fewer writes). Write combining offers several possible features including but not limited to: reduced NAND flash write amplification (e.g. the tendency of a single data write to an SSD, which may use NAND flash for example, to generate multiple writes internally to the SSD leading to rapid wear out of the NAND flash, etc.); reduced power, improved bandwidth and performance, etc.

Figure 5:
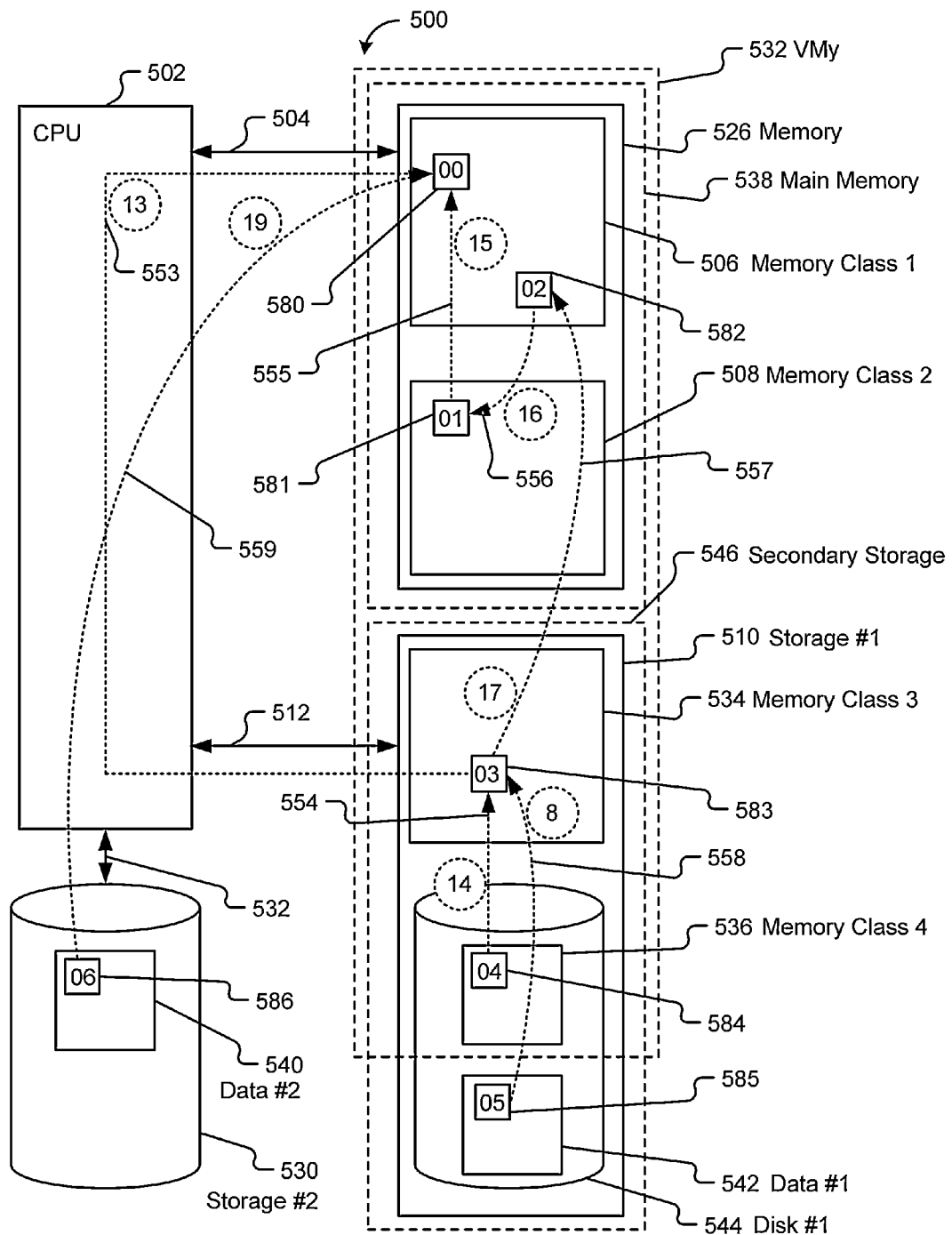
FIG. 5 shows copy operations corresponding to memory writes in a system using main memory with multiple memory classes, in accordance with another embodiment.

FIG. 5 shows copy operations corresponding to memory writes in a system using main memory with multiple memory classes, in accordance with another embodiment. As an option, the exemplary system of FIG. 5 may be implemented in the context of the architecture and environment of the previous Figure(s), or any subsequent Figure(s). Of course, however, the exemplary system of FIG. 5 may be implemented in the context of any desired environment.

In explaining the copy operations corresponding to memory writes in the context of FIG. 5, optional features will be described that may be achieved using multiple classes in main memory. In FIG. 5, a System 500 includes a CPU 502 coupled to Memory 526 using Bus #1 504, coupled to Storage #1 510 using Bus #2 512, and coupled to Storage #2 530 using Bus #3 532. In FIG. 5 Storage #1 contains Data #1 542. In FIG. 4 Storage #2 530 contains Data #2 540. In FIG. 5, memory class 1 506, memory class 2 508, with memory class 3 534 and memory class 4 536 both located on Storage #1 510 together form VMy 532. In FIG. 5, memory class 1 506 and memory class 2 508 form the Main Memory 538. In FIG. 5, memory class 3 534 forms a cache for Storage #1 510 and Disk #1 544. In FIG. 5, memory class 4 536 located on Storage #1 510 contains the page file. In FIG. 5, memory class 3 534 and memory class 4 536 are not part of Main Memory 538 (but in other embodiments they may be).

In general the copy operations shown in FIG. 5 correspond to operations that generally write to (e.g. in the direction towards, or complete at, etc.) memory class 1 and are thus opposite in their direction to those similar copy operations shown in FIG. 4.

In FIG. 5 various alternative copy operations (Copy 13 553, Copy 14 554, Copy 15 555, Copy 16 556, Copy 17 557, Copy 18 558, Copy 19 559) have been diagrammed. These copy operations perform on various pages (Page 00 580, Page 01 581, Page 02 582, Page 03 583, Page 04 584, Page 05 585, Page 06 586).

It should be noted that, as in the description of FIG. 4, each copy may be: (a) a true copy (e.g. element 1 in location 1 before a copy operation and two elements after a copy operation: element 1 in location 1 and element 2 in location 2, with element 2 being an exact copy of element 1) (b) a move (e.g. element 1 in location 1 before the copy operation, and element 1 in location 2 after the copy operation) (c) copy or move using pointers or other indirection (d) copy with re-location (element 1 in location 1 before the copy operation and two elements after the copy operation: element 1 in location 2 and element 2 in location 3, with element 2 being an exact copy of element 1, but locations 1, 2, and 3 being different).

In some embodiments, a copy of types (a)-(d) may result, for example, from software (or other algorithm, etc.) involved that may not be described in each and every embodiment and that in general may not be relevant to the embodiment description.

These copy operations shown in FIG. 5 will be now described.

Copy 13 553 shows a copy from memory class 3 to memory class 1. This copy could be part of a page fetch or a read for example. Copy 13 uses Bus #1 and Bus #2 as well as CPU resources.

Copy 14 normally precedes Copy 13, but may not always do so. For example, suppose that memory class 3 may act as a cache for Storage #1 510 then Copy 14 may not be required if the page requested is in cache. In the case of Copy 14 the read is from memory class 4. Supposing that memory class 4 536 located on Storage #1 510 contains the page file then Copy 14 and Copy 13 together represent a page fetch. In one embodiment, all pages (or most frequently used pages, etc.) may be kept in memory class 4 536.

Copy 15 copies from memory class 1 to memory class 2 within Main Memory 538. In some embodiments, two page files may be maintained, one on Storage #1 510 and one in memory class 2 (for example memory class 2 may contain more frequently used pages, etc.). In this case, Copy 15 may represent a page fetch from memory class 2. Note that, in contrast to Copy 13, and depending on how the Main Memory is constructed, Copy 15 may not require Bus #1 or CPU resources (or may at least greatly decrease demands on these resources) and alternative embodiments and architectures will be described for Main Memory that have such resource-saving features below.

Copy 16 shows the second part of the case (e.g. represents an action performed) in which, for example, a page is fetched. Depending on how the system is capable of reading from Storage #1 510, Copy 17 may be performed before Copy 16 is performed. Thus in the case that the system always reads pages from memory class 3 (and thus Storage #1 510) to memory class 1 (e.g. due to main memory bus architecture, DMA architecture, etc.) then Copy 17 is performed before a copy such as Copy 16 is performed to complete the page fetch (similarly for a data read). Note that Copy 16, as was the case for Copy 15, exhibits an optional feature, that in certain embodiments the copy may not require Bus #1 and CPU resources.

Copy 17 shows the first part of the case (e.g. represents an action performed) in which, for example, a page is fetched. Copy 17 performs a page fetch using a copy of a requested page from memory class 3 to memory Class 1 (and thus from Storage #1 510). In other embodiments a copy may be performed directly to memory class 2 from memory class 3 (and thus from Storage #1 510) and in that case Copy 16 and Copy 17 may be combined into one operation and the need to request or consume etc. any space in memory class 1 may be avoided.

Copy 18 is the equivalent to Copy 14 but corresponds to (or performs) a data read from Storage #1 510 rather than a page fetch. In the case of the page fetch, the read (Copy 14) reads from memory class 4 (which is part of VMy 532 and contains the page file). In the case of a data read (Copy 18) the read is from Storage #1 510 in a region that is outside the VMy.

Copy 19 shows the copy of a page from Storage #2 530. Copy 19 may correspond to a data read since in FIG. 5 Storage #2 530 is not part of the VMy (though in other embodiments it may be). In the case described above where Storage #2 530 is remote, possibly on a wireless connection that may be unreliable (e.g. intermittent, etc.) or consumes more power than presently available etc, one may, in some embodiments, opt to temporarily (or permanently, for a certain period of time, etc.) store data in memory class 2 that would otherwise need to be read over an unreliable link. In one embodiment such caching may be used with techniques such as monitoring data use etc. to allow interruptions of connectivity, avoid data corruption, etc. For example, suppose a user fetches maps on a cell phone via a wireless connection. This would involve operations such as Copy 19. The map data may then be stored (using copy operations already described in FIG. 4 for example) in memory class 2. If the wireless connection is interrupted, map data may then be read from memory class 2 (using operations such as Copy 15 for example). In other embodiments data may also be stored (or instead be stored, in a configurable manner be stored, dynamically be stored, under program control be stored, etc.) in Storage #1 510.

Figure 6:
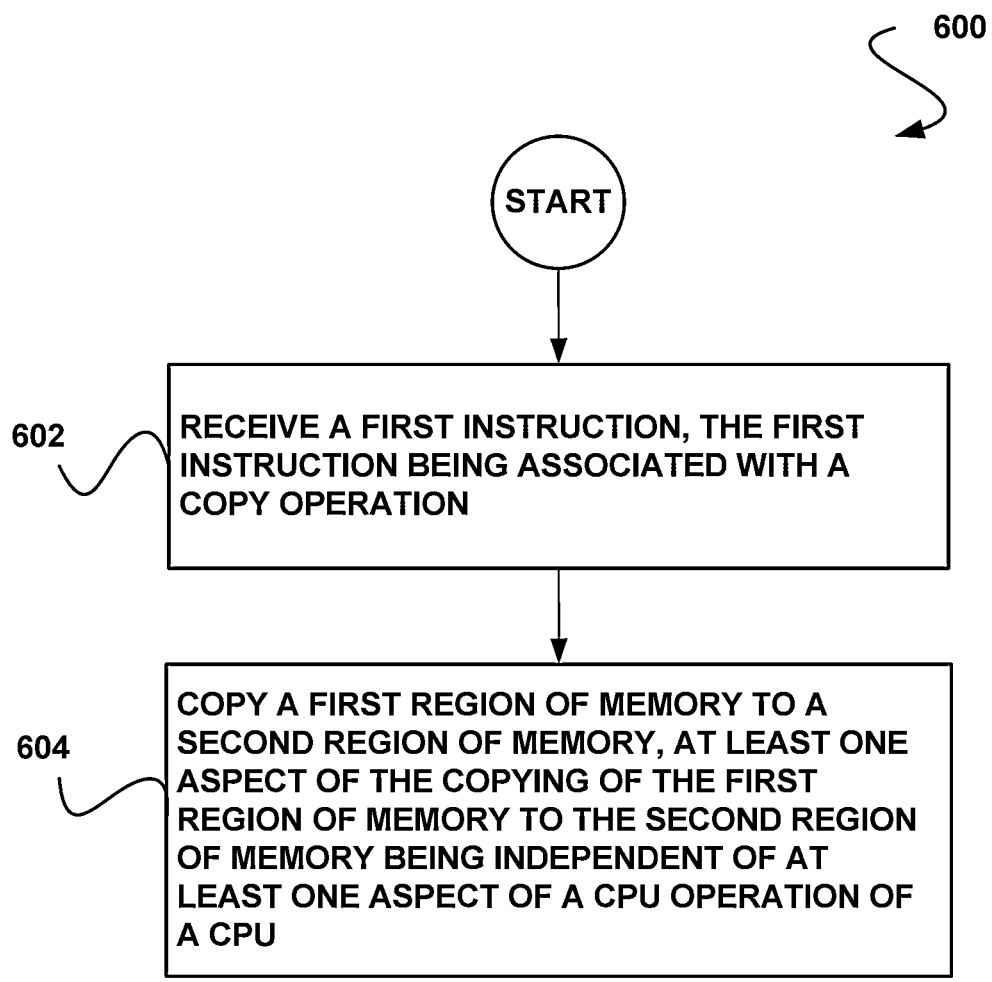
FIG. 6 shows a method for copying a page between different classes of memory, independent of CPU operation, in accordance with another embodiment.

FIG. 6 shows a method 600 for copying a page between different classes of memory, independent of CPU operation, in accordance with another embodiment. As an option, the method 600 may be implemented in the context of the architecture and environment of the previous Figures, or any subsequent Figure(s). Of course, however, the method 600 may be carried out in any desired environment. It should also be noted that the aforementioned definitions may apply during the present description.

As shown, a first instruction is received, the first instruction being associated with a copy operation. See operation 602. The first instruction may include any instruction or instructions associated with a copy command or being capable of initiating a copy command or operation. For example, in various embodiments, the first instruction may include one or more copy operations, one or more read instructions associated with at least one copy command, one or more write commands associated with at least one copy operation, various other instructions, and/or any combination thereof.

In response to receiving the first instruction, a first page of memory is copied to a second page of memory, where at least one aspect of the copying of the first page of memory to the second page of memory is independent of at least one aspect of a CPU operation of a CPU. See operation 604. In the context of the present description, a page of memory refers to any fixed-length block of memory that is contiguous in virtual memory.

In operation, an apparatus including a physical memory sub-system may be configured to receive the first instruction and copy the first page of memory to the second page of memory. In one embodiment, the first page of memory may be copied to the second page of memory while the CPU is communicatively isolated from the physical memory sub-system. In the context of the present description, being communicatively isolated refers to the absence of a signal (e.g. an electrical signal, a control and/or data signal, etc.) at a given time. In one embodiment, the apparatus may be configured such that the communicative isolation includes electrical isolation (e.g. disconnect, switched out, etc.).

In another embodiment, the physical memory sub-system may include logic for executing the copying of the first page of memory to the second page of memory, independent of at least one aspect of the CPU operation. For example, the first page of memory may be copied to the second page of memory, independent of one or more CPU copy operations. As another example, the first page of memory may be copied to the second page of memory, independent of one or more CPU write operations. In still another embodiment, the first page of memory may be independently copied to the second page of memory, by accomplishing the same without being initiated, controlled, and/or completed with CPU instructions.

In still another embodiment, the physical memory sub-system may include at least two classes of memory. As an option, the first page of memory may be resident on a first memory of a first memory class, and the second page of memory may be resident on a second memory of a second memory class. In this case, the logic may be resident on the first memory of the first memory class and/or on the second memory of the second memory class. In another embodiment, the logic may be resident on a buffer device separate from the first memory and the second memory.

As noted, in one embodiment, a first page of memory may be copied to a second page of memory, where at least one aspect of the copying of the first page of memory to the second page of memory being independent of at least one aspect of a central processing unit (CPU) operation of a CPU. In various embodiments, different aspects of the copying may be independent from the CPU operation. For example, in one embodiment, reading of the first page of memory may be independent of a CPU operation. In another embodiment, a writing of the second page of memory may be independent of a CPU operation. In either case, as an option, the at least one aspect of the CPU operation may include any operation subsequent to an initiating instruction of the CPU that initiates the copying.

The copying may be facilitated in different ways. For example, in one embodiment, a buffer device (e.g. logic chip, buffer chip, etc.) may be configured to participate with the copying. The buffer device may be part of the physical memory sub-system or separate from the physical memory sub-system.

In one embodiment, the first instruction may be received via a single memory bus. For example, the physical memory sub-system 1A-102 of FIG. 1A may include the first page of memory and the second page of memory. In this case, the first instruction may be received via the single memory bus 1A-108.

More illustrative information will now be set forth regarding various optional architectures and features with which the foregoing techniques discussed in the context of any of the present or previous figure(s) may or may not be implemented, per the desires of the user. For instance, various optional examples and/or options associated with the operation 602, the operation 604, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

Figure 7:
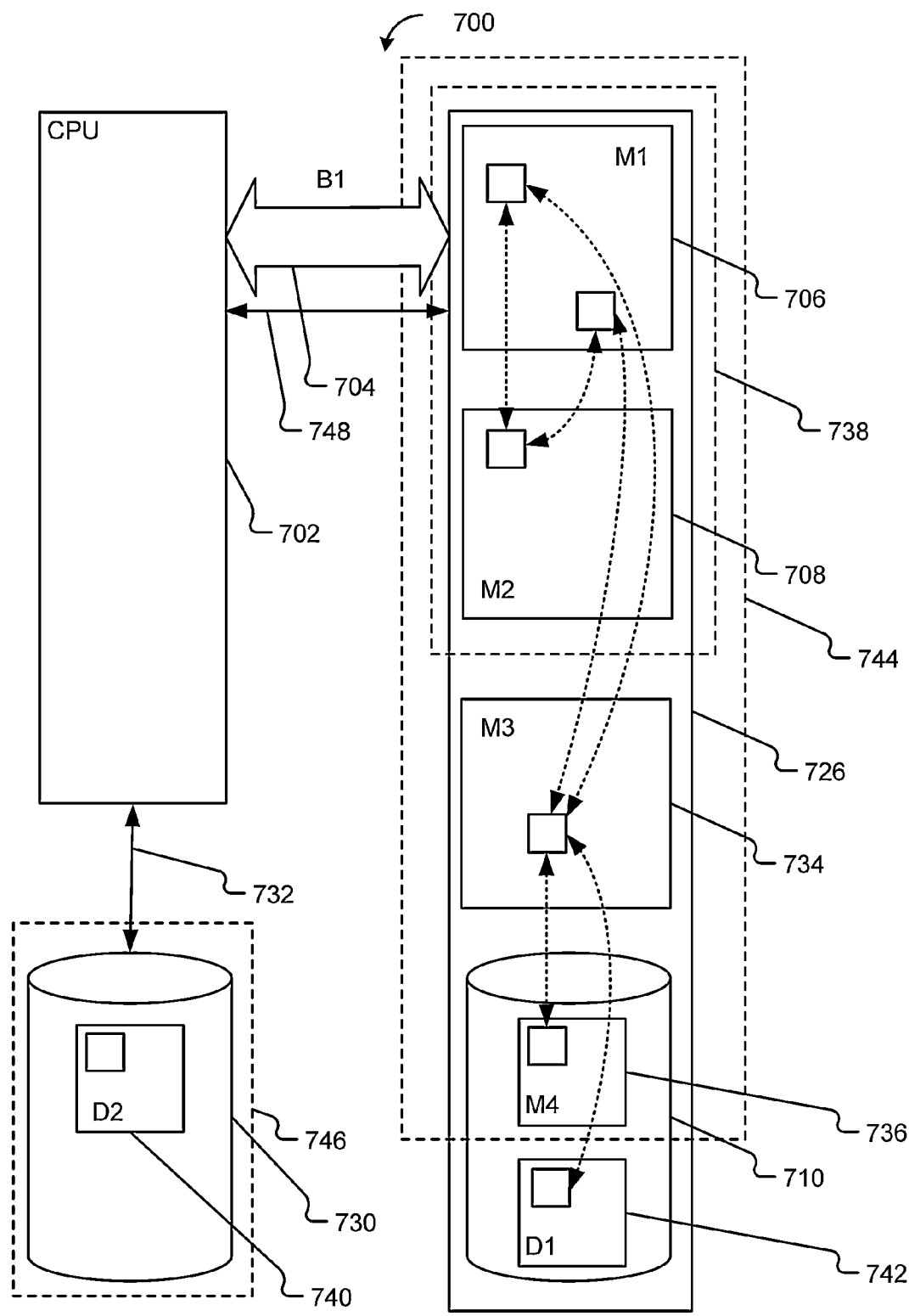
FIG. 7 shows a system using with multiple memory classes, where all memory is on one bus, in accordance with another embodiment.

FIG. 7 shows a system using with multiple memory classes, where all memory is on one bus, in accordance with another embodiment. As an option, the exemplary system of FIG. 7 may be implemented in the context of the architecture and environment of the previous Figure(s), or any subsequent Figure(s). Of course, however, the exemplary system of FIG. 7 may be implemented in the context of any desired environment.

In FIG. 7, a System 700 includes a CPU 702 coupled to Memory 726 and coupled to Storage #1 710 using Bus #1 704. In FIG. 7, memory class 1 706, memory class 2 708, with memory class 3 734 and memory class 4 736 both located on Storage #1 710 together form VMy 744. In FIG. 7, memory class 3 734 forms a cache for Storage #1 710. In FIG. 7, memory class 4 736, located on Storage #1 710, contains the page file.

In one embodiment, the copy operations shown in FIG. 7 may, in one embodiment, correspond to operations shown in FIG. 4 and in FIG. 5. Note that the copy operations in FIG. 7 use double-headed arrows to simplify the diagram, but any single copy operation may perform its operation in one direction.

In FIG. 7 there is just one single bus, Bus #1 704, for the CPU to access the entire VMy. In FIG. 7 there may be other changes to memory and main memory.

In FIG. 4 and in FIG. 5, main memory and memory were equivalent. In FIG. 7 they may not necessarily be equivalent. In FIG. 7, Memory 726 includes Main Memory 738 as a subset. In FIG. 7, Memory 726 includes VMy 744 as a subset.

In one embodiment, main memory (e.g. primary memory, primary storage, internal memory, etc.) may include memory that is directly accessible to the CPU. In FIG. 7, for example, memory class 3 734 and memory class 4 736 (which may be part of secondary storage in various alternative embodiments) may now be considered part of main memory (and thus not as drawn in FIG. 7). In the context of the present description, this may be refer to as "Embodiment A" of main memory. In FIG. 7, in Embodiment A, main memory would then comprise memory class 1 706, memory class 2 708, memory class 3 734 and memory class 4 736. In FIG. 7, in the context of Embodiment A, VMy 744 would then be the same as main memory.

In an alternative Embodiment B of main memory, the role of memory class 3 734 in FIG. 7 may be considered as cache, and memory class 4 736 in FIG. 7 as storage, and thus not part of Main Memory 738. In Embodiment B, Main Memory 738 comprises memory class 1 706 and memory class 2 708.

In an alternative Embodiment C of main memory, one could take into consideration the fact that main memory is equivalent to primary storage and thus reason that anything equivalent to secondary storage is not main memory. With this thinking, main memory may, in one embodiment, include M1 only, and M2 is equivalent to secondary storage. In Embodiment C, only memory class 1 706 in FIG. 7 would be main memory.

In FIG. 7, Embodiment B is adopted. FIG. 7 has been used to point out the difficulty of using the term main memory in systems such as that shown in FIG. 7. In embodiments where there is the possibility of confusion, use of the term main memory has been avoided.

In one embodiment, memory may include the PM coupled to the CPU. In such embodiment of FIG. 7, Memory 726 is the memory coupled to the CPU 702. Note that in some embodiments not all memory classes that make up Memory 726 may be equally coupled to the CPU (e.g. directly connected, on the same bus, etc.), but they may be. Thus, Memory 736 in FIG. 7 comprises: memory class 1 706 (M1); memory class 2 708 (M2); memory class 3 734 (M3); memory class 4 736 (M4); and Data #1 742 (D1).

In one embodiment, VMy 744 may include the memory space available to the CPU. In such embodiment (in the context of FIG. 7), VMy 744 may be the memory space available to the CPU 702.

Note that in some embodiments CPU 702 may be coupled to Storage #2 730 using Bus #2 732 as shown in FIG. 7. In FIG. 7, Storage #2 730 contains Data #2 740. In FIG. 7 Storage #2 730 may now be the only Secondary Storage 746, since now Storage #1 710 is part of Memory 726.

In one embodiment, Storage #2 730 may be used to store various Data #2 740 (e.g. overlays, code, software, database, etc.). In some embodiments, System 700 may be a consumer device, Bus #2 732 may include a wireless connection, Storage #2 730 may be cloud storage used to store data (e.g. overlays, code, software, database, etc.). For example, information (e.g. data, program code, overlay blocks, data, database, updates, other software components, security updates, patches, OS updates, etc.) may be fetched remotely from Storage #2 730 [e.g. as an application (e.g. from an application store, operating in demo mode, purchased but accessed remotely, rented, monitored, etc.); as a transparent download; via a push model; via a push model; etc.].

If Storage #2 730 (if present) is detached, then all CPU I/O may then performed over Bus #1 704. The basic model of VMy 744 with storage and data has not changed, and thus may require little change to software (e.g. OS, applications, etc.) and/or CPU (and/or CPU components, e.g. MMU, page tables, TLB, etc.). This is one possible feature of the system architecture when implemented as that shown and described in the embodiment of FIG. 7. There are other possible features, as well. One example is that the elimination of one or more CPU, I/O or other buses may provide cost savings in a system (e.g. through reducing pins per package and thus cost, reducing package size and thus package cost, reduced PCB area and thus cost, reduced PCB density and thus cost, etc.), power (e.g. through reduced numbers of high-power bus drivers and receivers, etc.), and space savings (e.g. through smaller packages, smaller PCB, less wiring, etc.). Yet another possible feature is that System 700 now may only need to handle read/write data traffic between CPU and Main Memory on Bus #1 704. All other data traffic (e.g. paging, overlay, caching and other data transfer functions in VMy etc.) may be handled independently, thus freeing resources required by Bus #1 704 and CPU 702. As shown in FIG. 7, none of the arrows representing data traffic (e.g. move, copy etc.) involve I/O Bus #1 704. This offers further savings in cost by potentially decreasing demands on a critical part of the system (e.g. Bus #1 704 and CPU 702, etc.). It should be noted now that in a system where the memory components may be specially designed and packaged etc. (e.g. for consumer electronics, cell phones, media devices, etc.) it may be cheaper (and easier) to perform these functions in the memory system (e.g. design in, integrate, co-locate, etc.) than to use expensive CPU resources, increase CPU die area, add extra CPU pins, create larger CPU packages, etc.

In FIG. 7, Bus #1 704 is drawn to diagrammatically suggest and logically represent embodiments that include, but are not limited to, the following alternatives: (a) Bus #1 704 may be a JEDEC standard memory bus (large arrow) with possibly modified control signals drawn separately as Bus #1 Control 748 (small arrow). The control signals in Bus #1 Control 748 may be JEDEC standard signals, modified JEDEC standard signals, multiplexed signals, additional signals (e.g. new signals, extra signals, multiplexed signals, etc.), re-used or re-purposed signals, signals logically derived from JEDEC standard signals, etc; (b) Bus #1 704 may be wider than a standard JEDEC memory bus (e.g. 128, 256, or 512 bits etc. of data, wider address bus, etc.). This type of embodiment, with high-pin count data buses, makes sense because one or more I/O buses may not be present, for example in systems that package main memory with CPU; (c) Bus #1 704 may be a combination of I/O bus and memory bus, and may share data and/or address signals between buses and may use shared, separate, or new control signals (including JEDEC standard signals, signals derived from JEDEC standard signals, or non-standard signals, etc.) for different memory classes. In the context of the present description, this bus may be referred to as a hybrid bus; (d) Bus #1 704 may be a new standard or proprietary bus that may be customized for an application (e.g. stacked CPU and memory die in a cell phone etc.). For example, a packet-switched bus, a split-transaction bus, etc; (e) combinations of these.

Note that though, in FIG. 7, Bus #1 704 is shown separately from Bus #1 Control 748, various terms such as the bus, or the memory bus, or Bus #1, etc. may refer to Bus #1 704 although all elements of Bus #1 may be included, including the control signals, Bus #1 Control 748, for example. In some embodiments, components of the bus may be called out individually, such as when one component of the bus (e.g. data, address, etc.) may be standard (e.g. JEDEC, etc.) but another component of the bus (e.g. control, etc.) may be modified (e.g. non-standard, etc.).

Figure 8:
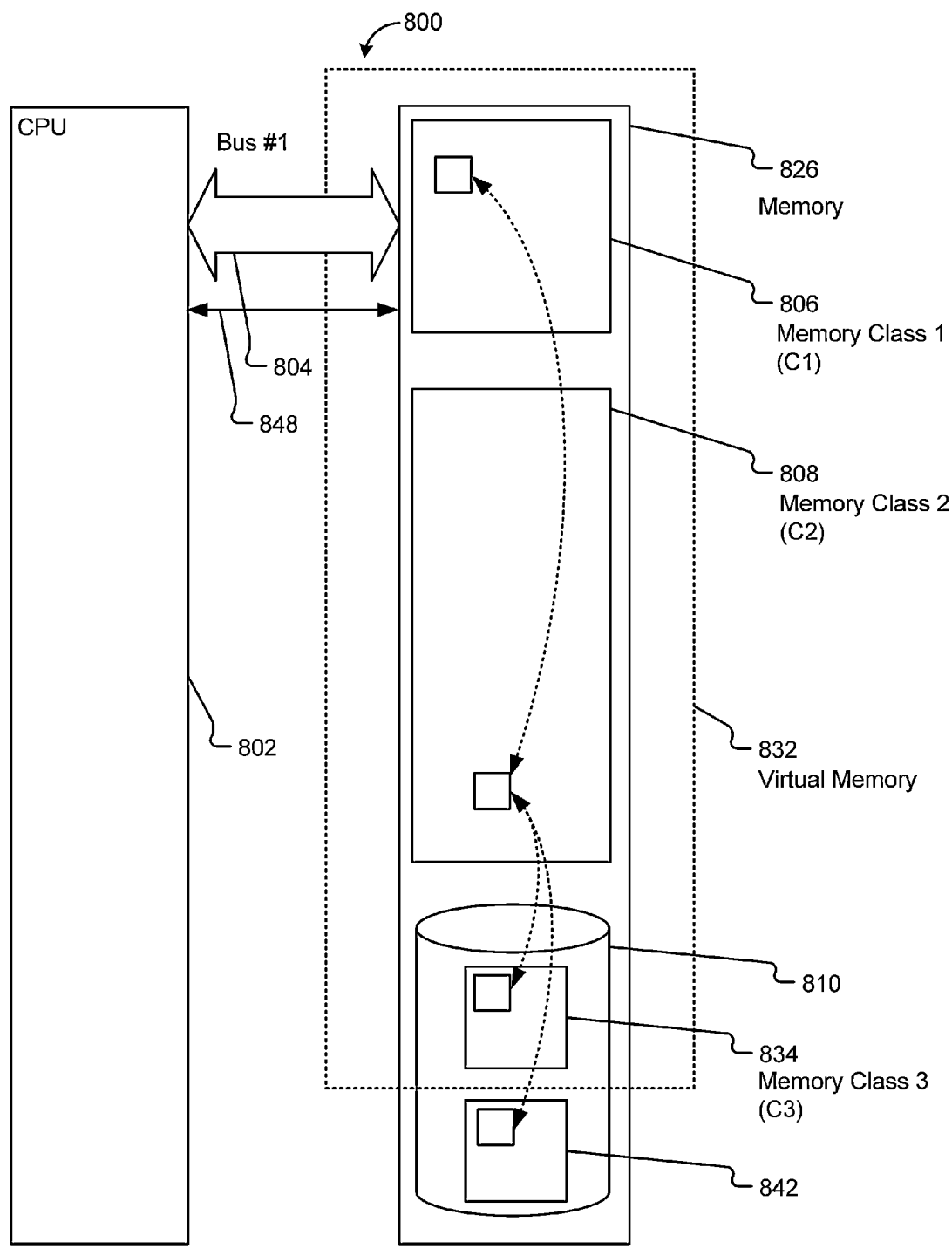
FIG. 8 shows a system with three classes of memory on one bus, in accordance with another embodiment.

FIG. 8 shows a system with three classes of memory on one bus, in accordance with another embodiment. As an option, the exemplary system of FIG. 8 may be implemented in the context of the architecture and environment of the previous Figure(s), or any subsequent Figure(s). Of course, however, the exemplary system of FIG. 8 may be implemented in the context of any desired environment.

In FIG. 8, a System 800 includes a CPU 802 coupled to Memory 826 and coupled to Storage #1 810 using Bus #1 804 and Bus # Control 848. In FIG. 8, memory class 1 806 (M1), memory class 2 808 (M2), with memory class 3 834 (M3) located on Storage #1 810 together form VMy 832. In FIG. 8, Storage #1 810 contains Data #1 842. Note that there is just one bus, Bus #1 804, for the CPU to access the entire VMy. In FIG. 8, memory class 3 834, located on Storage #1 810, contains the page file. In one embodiment, the copy operations shown in FIG. 8 may correspond to copy operations shown in and described with regard to FIG. 4 and FIG. 5, and that were also shown in FIG. 7. In the embodiment of FIG. 8 there is no secondary storage shown, though in different embodiments there may be secondary storage.

Figure 9:
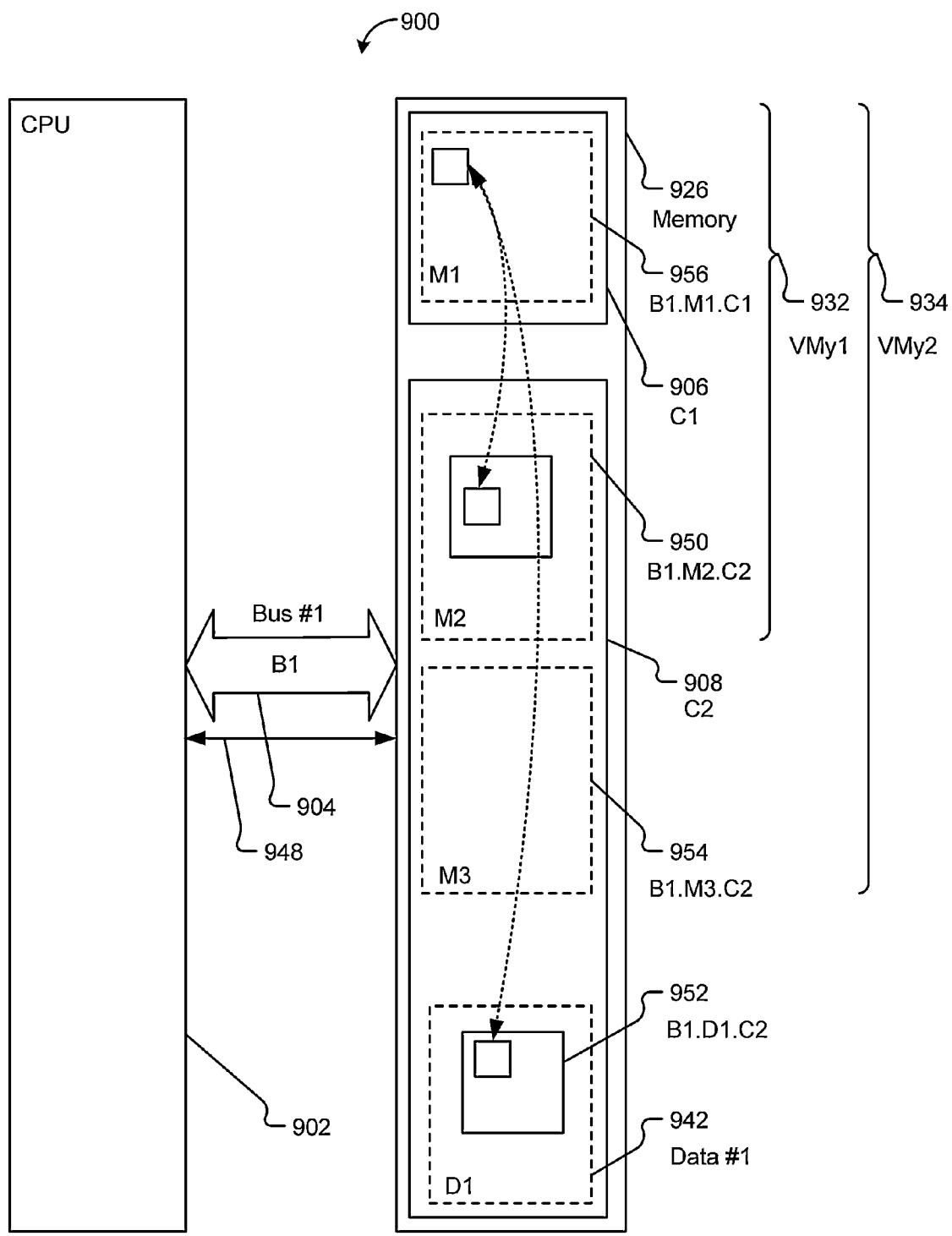
FIG. 9 shows a system with multiple classes and multiple levels of memory on one bus, in accordance with another embodiment.

FIG. 9 shows a system with multiple classes and multiple levels of memory on one bus, in accordance with another embodiment. As an option, the exemplary system of FIG. 9 may be implemented in the context of the architecture and environment of the previous Figure(s), or any subsequent Figure(s). Of course, however, the exemplary system of FIG. 9 may be implemented in the context of any desired environment.

In FIG. 9, a System 900 includes a CPU 902 coupled to Memory 926 using Bus #1 904 and Bus #1 Control 948. In the embodiment of FIG. 9, there may not be secondary storage, though in different embodiments there may be secondary storage.

There are some differences in the block diagram of the embodiment shown in FIG. 9 from previous embodiments even though the functions of previous embodiments are still present: (a) there is no distinction in memory class C2 908 between cache, storage, etc. (b) In FIG. 9, both M2 and M3 are shown present in the same class of memory. The term levels of memory will be used to describe the functionality. For example, it may be said that level M2 and level M3 are both present in the same class (c) The VMy is not explicitly shown in FIG. 9. Instead, the boundary of VMy is capable of changing. For example, at one point in time VMy may be equal to VMy1 932, at another point in time VMy may be equal to VMy2 934, etc.

In FIG. 9, VMy1 932 comprises memory level B1.M.C1 956 in memory class C1 906 plus memory level B1.M2.C2 950 in memory class C2 908.

In FIG. 9, VMy2 934 comprises memory level B1.M.C1 956 in memory class C1 906 plus memory level B1.M2.C2 950 in memory class C2 908 plus memory level B1.M3.C2 954 in memory class C2 908.

In other embodiments the VMy may be extended between classes. Thus, for example, although M3 is shown as being in C2 for simplicity (and perhaps no real difference between M2 and M3 as far as technology is concerned in FIG. 9), it can be seen that in other embodiments M3 may be in another memory class, C3 for example (not shown in FIG. 9).

In other embodiments, VMy may be moved between classes. For example, in FIG. 9, VMy2 is shown as being VMy1 (which is M1 plus M2) plus an additional portion of C2 (or plus an additional portion of C3 as just described etc.). Similarly, VMy3 may be M1 plus M3. Thus, changing between VMy1 and VMy3 moves a portion of VMy from M2 to M3. If M3 is a different memory class from M2, the change from VMy1 to VMy3 is equivalent to moving a portion of VMy between memory classes.

In FIG. 9, a portion of memory class C2 908 contains Data #1 942, where that portion is B1.D1.C2 952. Of course, in other embodiments, different levels of data (e.g. D2, D3, etc.) may be present in a similar fashion to the different levels of memory (e.g. M1, M2, M3, etc.). However, in the current embodiment, the distinction between memory and data is just that of the difference between format that data is normally stored in a memory system and the format that data is normally stored in a storage system (e.g. on disk using a filesystem, etc.).

In FIG. 9, memory class C2 908 may contain the page file. In one embodiment, the copy operations shown in FIG. 9 may correspond to copy operations shown in and described with regard to FIG. 4 and FIG. 5, and that were also shown in FIG. 7 and FIG. 8. In the embodiment, there may be no secondary storage, although in different embodiments there may be secondary storage.

Figure 10:
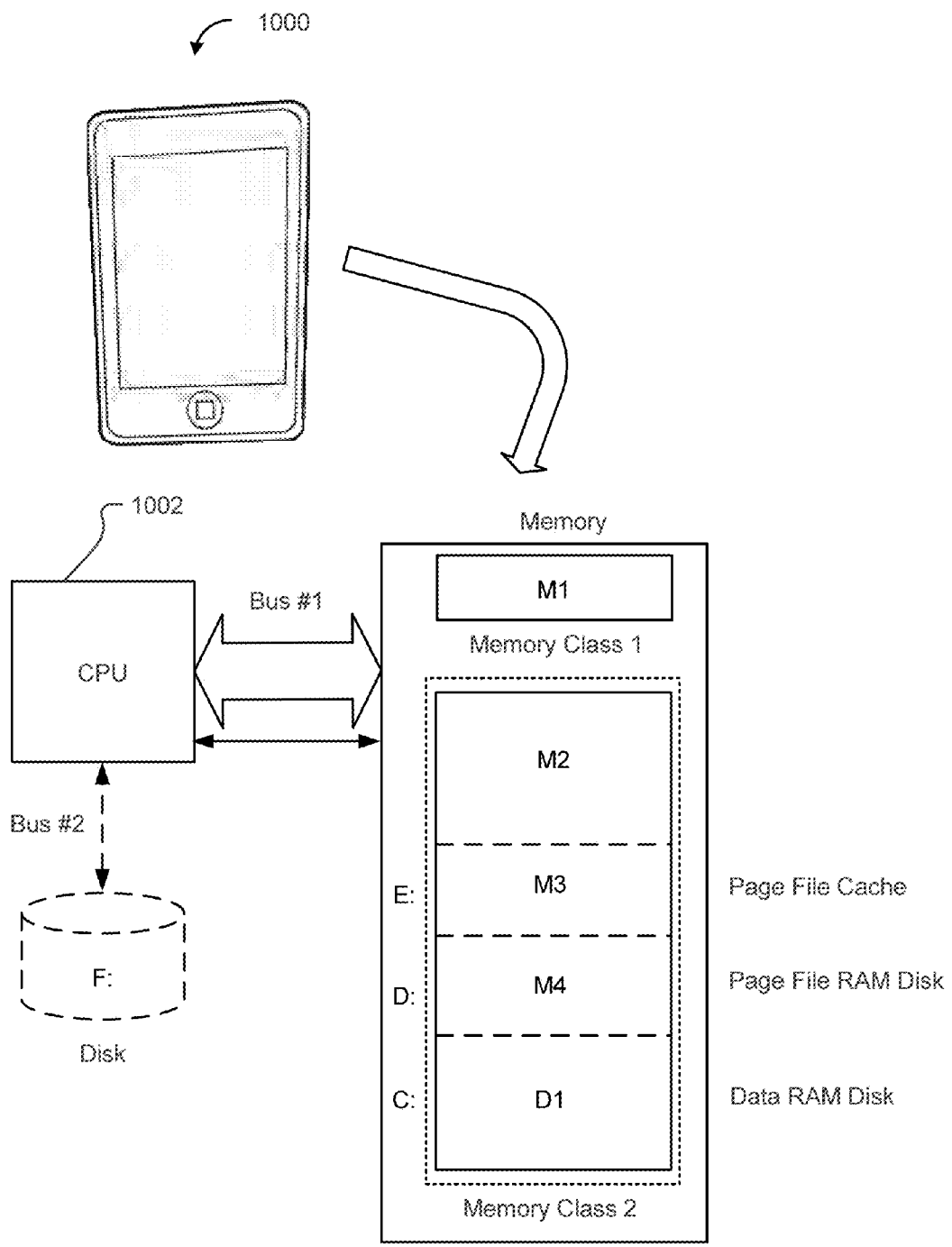
FIG. 10 shows a system with integrated memory and storage using multiple memory classes, in accordance with another embodiment.

FIG. 10 shows a system with integrated memory and storage using multiple memory classes, in accordance with another embodiment. As an option, the exemplary system of FIG. 10 may be implemented in the context of the architecture and environment of the previous Figure(s), or any subsequent Figure(s). Of course, however, the exemplary system of FIG. 10 may be implemented in the context of any desired environment.

One aspect of embodiments such as that shown in FIG. 10 is the reduction of the number of wasted I/O accesses requiring the memory bus. In those embodiments where memory may perform many, most or all system I/O functions, performance is greatly enhanced. Thus, in FIG. 10, the embodiment of System 1000 moves more I/O functions into memory. In this way, traffic over the high-speed memory bus is reduced, e.g. reduced to just the essential traffic between CPU and memory, etc.

Another aspect of embodiments such as that shown in FIG. 10 is that all VMy functions are now contained in a single memory.

In FIG. 10, system 1000 contains a CPU 1002. In FIG. 10, CPU 1002 is coupled to Memory (in FIG. 10) using Bus #1 (in FIG. 10). In FIG. 10 CPU 1002 is optionally coupled to Disk (in FIG. 10) using Bus #2 (in FIG. 10). In FIG. 10, the Memory comprises memory class 1 (in FIG. 10) and memory class 2 (in FIG. 10). In FIG. 10, memory class 2 comprises: memory level M2 (in FIG. 10); memory level M3 (in FIG. 10) used as a Page File Cache (in FIG. 10); memory level M4 (in FIG. 10) used as a Page File RAM Disk (in FIG. 10); memory level D1 (in FIG. 10) used as a Data RAM Disk (in FIG. 10).

In one embodiment, a RAM disk may include software (e.g. a software driver, Microsoft Windows .dll file, etc.) used to perform the functions of a small disk in memory (e.g. emulate a disk, etc.). A RAM disk may be used (e.g. in an embedded system, for data recovery, at boot time, etc.) to implement small but high-speed disks, etc. A RAM Disk may be implemented using any combination of memory, software, etc. and does not have to include RAM and does not have to perform conventional disk functions.

The use of one or more RAM disks in System 1000 is purely for convenience of existing software, hardware and OS design. For example, most OS use a disk for the page file. If a portion of memory is used to emulate a disk, it may be easier for the OS to use that portion of memory for a page file and swap space without modification of the OS.

For example, systems using an OS (e.g. Microsoft Windows, Linux, other well as other OS, etc.) may require a C drive (in FIG. 10) (or equivalent in Linux etc.) to hold the OS files (e.g. boot loader, etc.) and other files required at boot time. In one embodiment, memory class 2 (or a portion of it) may be non-volatile memory to provide a C drive. In another embodiment, memory class 2 may be a volatile memory technology but backed (e.g. by battery, supercapacitor, etc.). In other embodiments, memory class 2 may be a volatile memory technology but contents copied to a different memory class that is non-volatile on system shut-down and restored before boot for example.

In FIG. 10, the Data RAM disk is assigned drive letter C, the Page File RAM disk is assigned drive letter D (in FIG. 10), the Page File Cache is assigned letter E (in FIG. 10), and the (optional) Disk is assigned drive letter F (in FIG. 10).

In FIG. 10, the use of a separate Page File Cache in memory may be compatible with existing cache systems (e.g. ReadyBoost in Microsoft Windows, etc.).

As shown the disks C, D and E are accessible independently over I/O Bus #1. In FIG. 10, the disk D is dedicated as a page file and contains the page file and is used as swap space. In other embodiments, the CPU 1002 may use data disk C as well as or instead of D for page files (e.g. swap space, etc.).

In the context of the present description, Microsoft Windows drive letters (e.g. volume, labels, etc.) have been utilized, such as C and D etc., for illustrative purposes, to simplify the description and to more easily and clearly refer to memory regions used for data, memory regions used for swap space, etc. For example, these regions (e.g. portions of memory, etc.) may equally be labeled as /data and /swap in Linux, etc. Of course, other similar functions for different regions of memory etc. may be used in a similar fashion in many other different types and versions of operating systems.

It should be noted that the number, location and use of the memory regions (e.g. C, D, etc.) may be different from that shown in FIG. 10 or in any other embodiment without altering the essential functions. In some embodiments, one may separate the page file and swap space from data space as this may improve VMy performance. In other embodiments, swap space and data space may be combined (e.g. to reduce cost, to simplify software, reduce changes required to an OS, to work with existing hardware, etc.).

FIG. 10 shows system 1000 using a Page File Cache. In FIG. 10, the Page File Cache may be used for access to the Page File RAM Disk. In some embodiments, the Page File Cache may not be present and the CPU may access the Page File RAM Disk directly.

The internal architecture of the Memory will be described in detail below but it should be noted that in various embodiments of the system shown in FIG. 10: (a) C and D may be on the same bus internal to the Memory, with E on a separate bus (b) D and E may be on the same bus, with C on a separate bus, (c) other similar permutations and/or combinations, etc.

In other alternative embodiments (e.g. for a cell phone, etc.), some data (e.g. additional VMY, database, etc.) may be stored remotely and accessed over a wired or wireless link Such a link (e.g. to remote storage etc.) is indicated by the optional (as indicated by dotted line(s) in FIG. 10) Bus #2 and optional Disk #1 in FIG. 10.

It should be noted that not all of C, D and E have to be in memory class 2. For example, any one more, combination, or all of C, D and E may be in memory class 1 or other memory class (not shown in FIG. 10, but that may be present in other embodiments etc.), etc.

It should be noted that C, D and E functions may move (e.g. migrate, switch, etc.) between memory class 1 and memory class 2 or any other memory class (not shown in FIG. 10, but that may be present in other embodiments etc.).

In some embodiments, Data RAM Disk C may be included as well as optional Disk F (e.g. HDD, SSD, cloud storage etc.) because Disk F may be larger and cheaper than a RAM disk.

In some embodiments, the OS may be stored on a disk F (e.g. permanent media, etc.) rather than a volatile RAM disk, for example.

Figure 11:
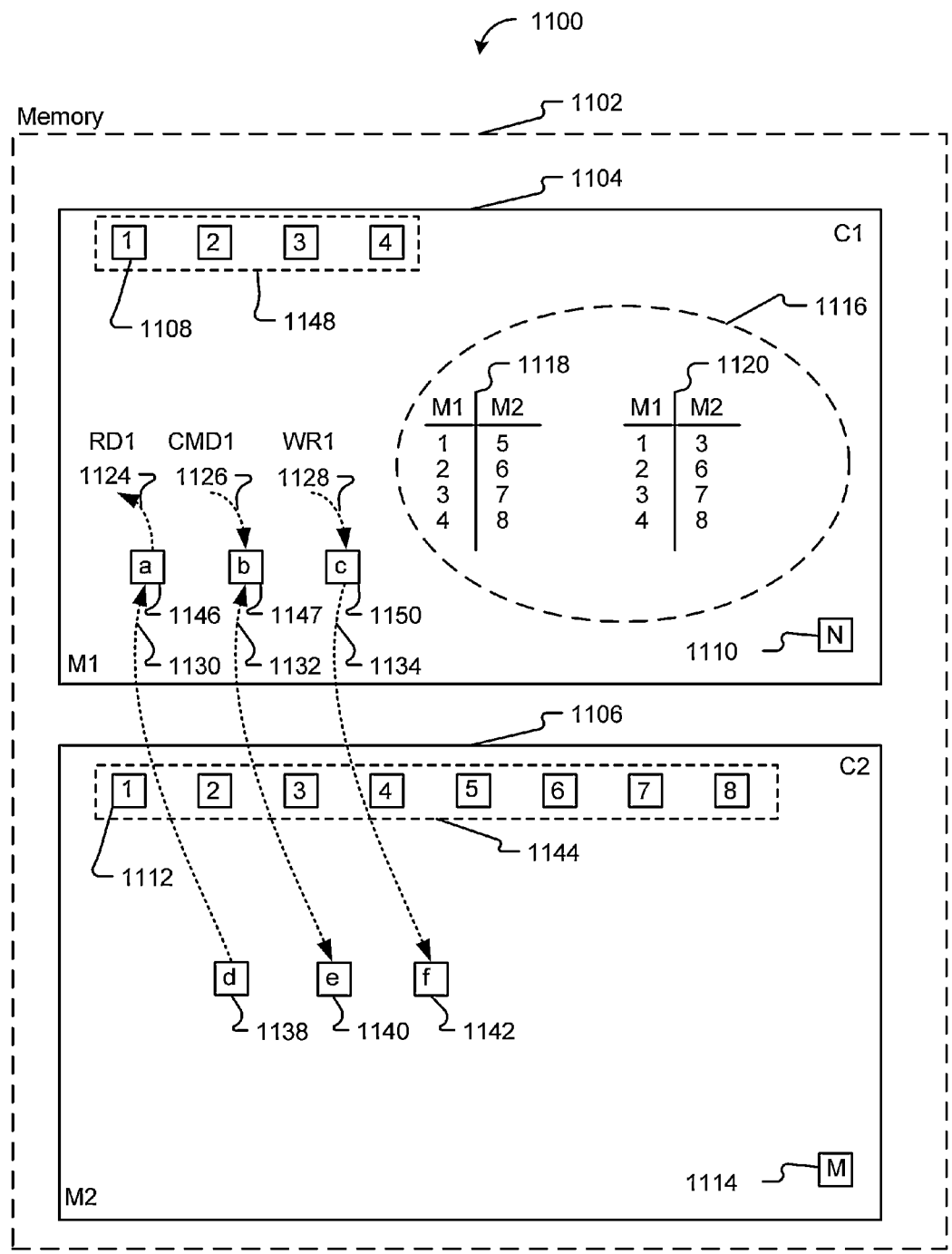
FIG. 11 shows a memory system with two memory classes containing pages, in accordance with another embodiment.

FIG. 11 shows a memory system with two memory classes containing pages, in accordance with another embodiment. As an option, the exemplary system of FIG. 11 may be implemented in the context of the architecture and environment of the previous Figure(s), or any subsequent Figure(s). Of course, however, the exemplary system of FIG. 11 may be implemented in the context of any desired environment.

FIG. 11 shows a Memory System 1100 with Memory 1102. Memory 1102 comprises pages distributed between M1.C1 1104 and M2.C2 1106.

In FIG. 11, memory M1.C1 1104 e.g. level M1 memory of memory class C1 (e.g. DRAM in some embodiments, SRAM in some embodiments, etc.) may have a capacity of N pages (e.g. Page 1 1108, Page 2, etc., Page N 1110) as shown in FIG. 11. M1.1 may be a few gigabytes in size.

In FIG. 11, memory M2.C2 1106 [e.g. level M2 memory of memory class C2 (e.g. DRAM in some embodiments if M1 is SRAM, NAND flash in some embodiments if M1 is DRAM, etc.] may have a larger capacity than M1 of M pages (e.g. Page 1 1112, Page 2, etc., Page M 1114) as shown in FIG. 11. In some embodiments, M2.C2 may be several terabytes or larger in size.

In one embodiment, a page size may be 4 kB. A 4 GB memory system could then hold up to 1M pages. In the 2011 timeframe a disk that is part of secondary storage and normally used to hold a page file as part of VMy may hold up to 2 TB. Thus, the disk may hold up to 2 TB/4 kB or 500M pages. It may be desirable to at least match that capability in a system such as FIG. 11 using multiple memory classes. Such a large memory capacity may be useful, for example, to hold very large in-memory databases or multiple virtual machines (VMs).

One potential issue is how to address such a large memory. A standard JEDEC DDR memory address bus may not have enough address bits to address all available memory (e.g. a standard memory address bus is not wide enough).

The potential addressing issue is similar to an office building having four incoming phone lines or circuits but eight office phones. Suppose are four incoming phone numbers. This potential issue may be solved by giving each office phone an extension number. Four phone numbers may address eight phone extension numbers, but with the limitation that only four extensions can be used at any one time. The four incoming phone numbers provide a continuously changing window to the eight extension numbers.

FIG. 11 shows one embodiment that allows the addressing of a memory M2 using an address bus that is too narrow (e.g. too few bits). The Inset 1116 shows the contents of a single look-up table at two points in time, Table 1118 and Table 1120. At time t1 Table 1118 provides a mapping between address in M1 and corresponding addresses in M2. For simplicity, in Table 1118 only four addresses are shown for M1 (though there are N). These four addresses map to four addresses in M2. At time t1 address 1 in M1 maps to address 5 in M2, etc. At time t2 the mapping changes to that shown in Table 1120. Note that now address 1 in M1 corresponds to address 3 in M2.

Thus, four pages in M1.C1 1104, Pages 1148 are effectively mapped to eight pages in M2.C2 1106, Pages 1144.

In different embodiments (a) the CPU and VMM including page tables, etc. may be used to handle the address mapping; (b) logic in the memory system may be used; (c) or both may be used.

In the current embodiment, the page (memory page, virtual page) may include a fixed-length or fixed size block of main memory that is contiguous in both PM addressing and VMy addressing. A system with a smaller page size uses more pages, requiring a page table that occupies more space. For example, if a 2^32 virtual address space is mapped to 4 kB (2^12 bytes) pages, the number of virtual pages is 2^20 (=2^32/ 2^12). However, if the page size is increased to 32 KB (2^15 bytes), only 2^17 pages are required. The current trend is towards larger page sizes. Some instruction set architectures can support multiple page sizes, including pages significantly larger than the standard page size of 4 kB.

Starting with the Pentium Pro processor, the IA-32 (x86) architecture supports an extension of the physical address space to 64 GBytes with a maximum physical address of FFFFFFFFFH. This extension is invoked in either of two ways: (1) using the physical address extension (PAE) flag (2) using the 36-bit page size extension (PSE-36) feature (starting with the Pentium III processors). Starting with the Intel Pentium Pro, x86 processors support 4 MB pages using Page Size Extension (PSE) in addition to standard 4 kB pages. Processors using Physical Address Extension (PAE) and a 36-bit address can use 2 MB pages in addition to standard 4 kB pages. Newer 64-bit IA-64 (Intel 64, x86-64) processors, including AMD's newer AMD64 processors and Intel's Westmere processors, support 1 GB pages.

Intel provides a software development kit (SDK) PSE36 that allows the system to use memory above 4 GB as a RAM disk for a paging file. Some Windows OS versions use an application programming interface (API) called Address Windowing Extensions (AWE) to extend memory space above 4 GB.

AWE is a set of Microsoft APIs to the memory manager functions that enables programs to address more memory than the 4 GB that is available through standard 32-bit addressing. AWE enables programs to reserve physical memory as non-paged memory and then to dynamically map portions of the non-paged memory to the program's working set of memory. This process enables memory-intensive programs, such as large database systems, to reserve large amounts of physical memory for data without necessarily having to be paged in and out of a paging file for usage. Instead, the data is swapped in and out of the working set and reserved memory is in excess of the 4 GB range. Additionally, the range of memory in excess of 4 GB is exposed to the memory manager and the AWE functions by PAE. Without PAE, AWE cannot necessarily reserve memory in excess of 4 GB.

OS support may, in some embodiment, also required for different page sizes. Linux has supported huge pages since release 2.6 using the hugetlbfs filesystem. Windows Server 2003 (SP1 and newer), Windows Vista and Windows Server 2008 support large pages. Windows 2000 and Windows XP support large pages internally, but are not exposed to applications. Solaris beginning with version 9 supports large pages on SPARC and the x86. FreeBSD 7.2-RELEASE supports superpages.

As costs and performance of the memory technologies vary (e.g. DRAM, flash, disk), then the capacities allocated to different memory levels, M1, M2 etc, may change.

In the embodiment shown in FIG. 11 it may be desirable to allow: (a) the CPU to address and read/write from/to memory M1.C1 1104 and from/to memory M2.C2 1106; (b) to perform copy operations between M1 and M2 (and between M2 and M1); (c) perform table updates etc; (d) send and receive status information etc. In the embodiment of FIG. 11, three simple commands are shown that may be sent from CPU to Memory 1102: RD1 1124; CMD1 1126; WR1 1128.

In FIG. 11, at time t1 command RD1 1124 from the CPU performs a read from Page a 1146. If Page a is already in M1.C1 1104 the read completes at t2. If not, then Page d is fetched via an operation shown as Read 1130 from Page d 1138 and the read completes at t3. The embodiments described below will describe how the memory bus may handle read completions that may occur at variable times (e.g. either at t2 or at t3, etc.). It should be noted now that several embodiments are possible, such as: (a) one embodiment may use a split-transaction bus (e.g. PCI-E, etc.); (b) another embodiment may use a retry signal; (c) another embodiment may exchange status messages with the CPU; (d) a combinations of these, etc.

In FIG. 11, at time t4 command CMD1 1124 from the CPU initiates an operation etc. Suppose that CMD1 is a Swap 1132 operation. Then Page b 1147 in M1.C1 1104 and Page e 1140 in M2.C2 1106 are swapped as shown in FIG. 11. The embodiments described below describe how logic in Memory 1102 may perform such operations (e.g. swap operation(s), command(s), etc.). It should be noted that such commands may include: updating tables in M1.C1 1104; updating tables in M2.C2 1106; updating tables in logic of Memory 1102; operations to swap, move, transfer, copy, etc; operations to retrieve status from Memory 1102; etc.

In FIG. 11, at time t5 command WR1 1124 from the CPU performs a write to Page c 1150. Depending on how addressing is handled, in one embodiment for example, a table such as Table 1120 may then be read by logic in Memory 1102. As a result of the mapping between addresses in M1 and addresses in M2, a further operation Write 1134 from page c 1150 in M1.C1 1104 to Page f 1142 in M2.C2 1106.

Figure 12:
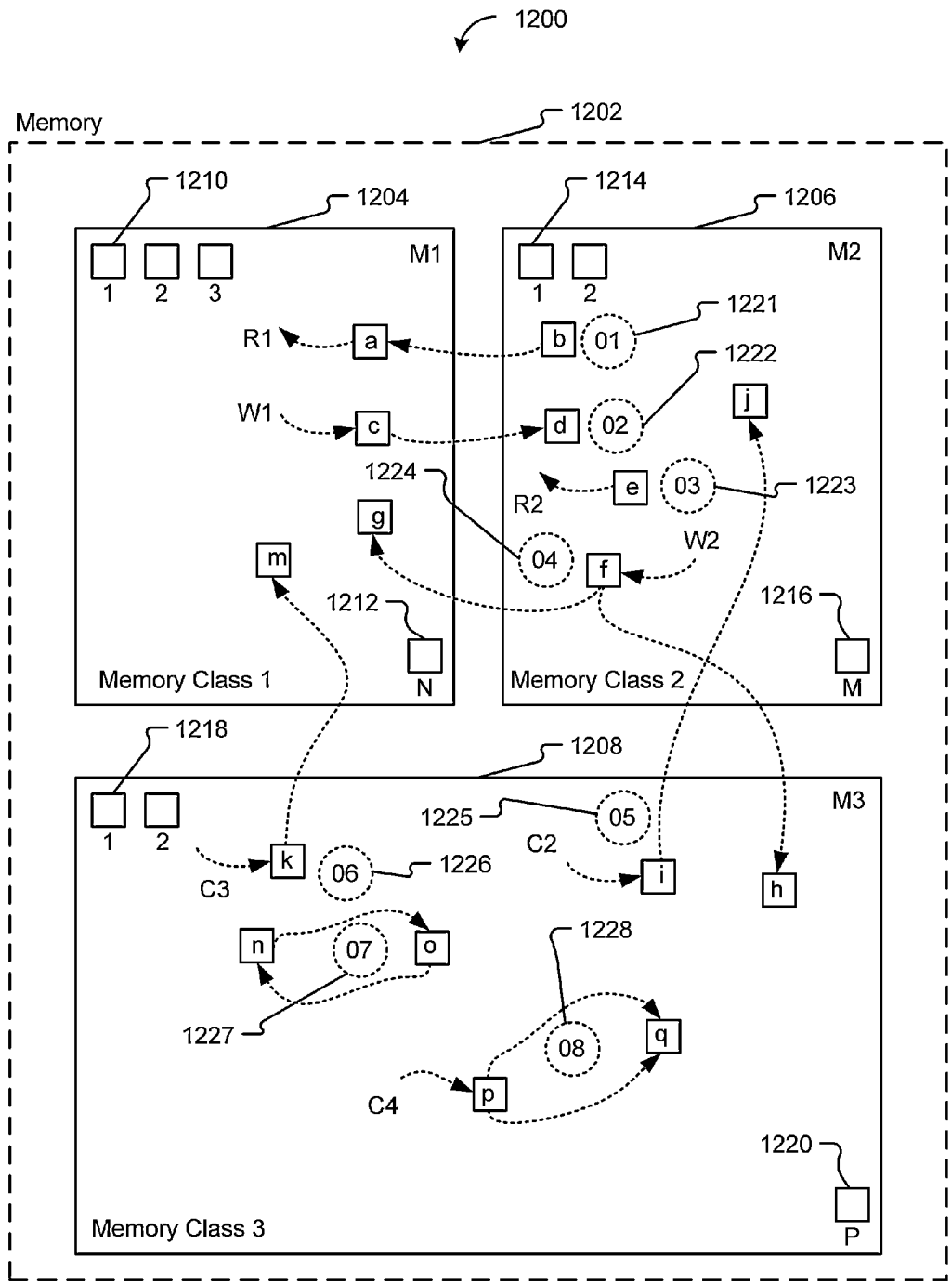
FIG. 12 shows a memory system with three memory classes containing pages, in accordance with another embodiment.

FIG. 12 shows a memory system with three memory classes containing pages, in accordance with another embodiment. As an option, the exemplary system of FIG. 12 may be implemented in the context of the architecture and environment of the previous Figure(s), or any subsequent Figure(s). Of course, however, the exemplary system of FIG. 12 may be implemented in the context of any desired environment.

FIG. 12 shows a Memory System 1200 with Memory 1202. Memory 1202 comprises pages distributed between M1.C1 1204, M2.C2 1206, and M3.C3 1208

In FIG. 12, memory M1.C1 1204 [e.g. level M1 memory of memory class C1 (e.g. SRAM in some embodiments, embedded DRAM in some embodiments, etc.)] may have a capacity of N pages (e.g. Page 1 1210, Page 2, etc., to Page N 1212) as shown in FIG. 11. In one embodiment, M1.1 may be a few megabytes in size.

In FIG. 12, memory M2.C2 1206 [e.g. level M2 memory of memory class C2 (e.g. DRAM in some embodiments if M1 is embedded DRAM, NAND flash in some embodiments if M1 is DRAM, etc.)] may have a larger capacity than M1 of M pages (e.g. Page 1 1214, Page 2, etc., to Page M 1216) as shown in FIG. 11. In some embodiments, M2.C2 may be a few gigabytes or larger in size.

In FIG. 12, memory M3.C3 1208 (e.g. level M3 memory of memory class C3 (e.g. NAND flash in some embodiments if M1 is SRAM, M2 is DRAM, etc.) may have a much larger capacity than M2 of P pages (e.g. Page 1 1218, Page 2, . . . , to Page P 1220) as shown in FIG. 11. In some embodiments, M3.C3 may be many gigabytes in size or even much larger (e.g. terabytes, etc.) in size.

In FIG. 12, operations that may be performed in one embodiment are shown: Operation 1221; Operation 1222; Operation 1223; Operation 1224; Operation 1225; Operation 1226; Operation 1227; Operation 1228.

In FIG. 12, Operation 1221 corresponds to a read R1 from the CPU. If M1 is acting as a DRAM cache (e.g. M1 may be SRAM, and M2 DRAM, etc.), for example, then Page a may be read from M1 if already present. If not then Page b is fetched from M2.

In FIG. 12, Operation 1222 corresponds to a write W1 from the CPU. Page c may be written to M1 and then copied to Page d in M2.

In FIG. 12, Operation 1223 corresponds to a read R2 from the CPU of Page e from M2 where Page e is already present in M2.

In FIG. 12, Operation 1224 corresponds to a write W2 from the CPU to Page f of M2. Depending on the embodiment, Page f may be copied to Page g in M1 so that it may be read faster in future; Page f may also be copied (and/or moved) to Page h in M3.

In FIG. 12, Operation 1225 corresponds to a command C2 from the CPU to copy or move etc. Page i in M3 to Page j in M2. In one embodiment, this may be a CPU command that prepares M2 for a later read of Page j.

In FIG. 12, Operation 1226 corresponds to a command C3 from the CPU to copy Page k in M3 to Page m in M1. This may in some embodiments be a CPU command that prepares M1 for a later read of Page m.

In FIG. 12, Operation 1227 corresponds to a swap of Page n and Page o in M3 initiated without CPU command. In certain embodiments that use NAND flash technology etc. for M3, this may be to provide wear-leveling etc.

In FIG. 12, Operation 1228 corresponds to a swap of Page p and Page q in M3 initiated by CPU command C4. In certain embodiments, that use NAND flash technology etc. for M3 this may be to provide wear-leveling under CPU (or OS etc.) control etc.

Figure 13:
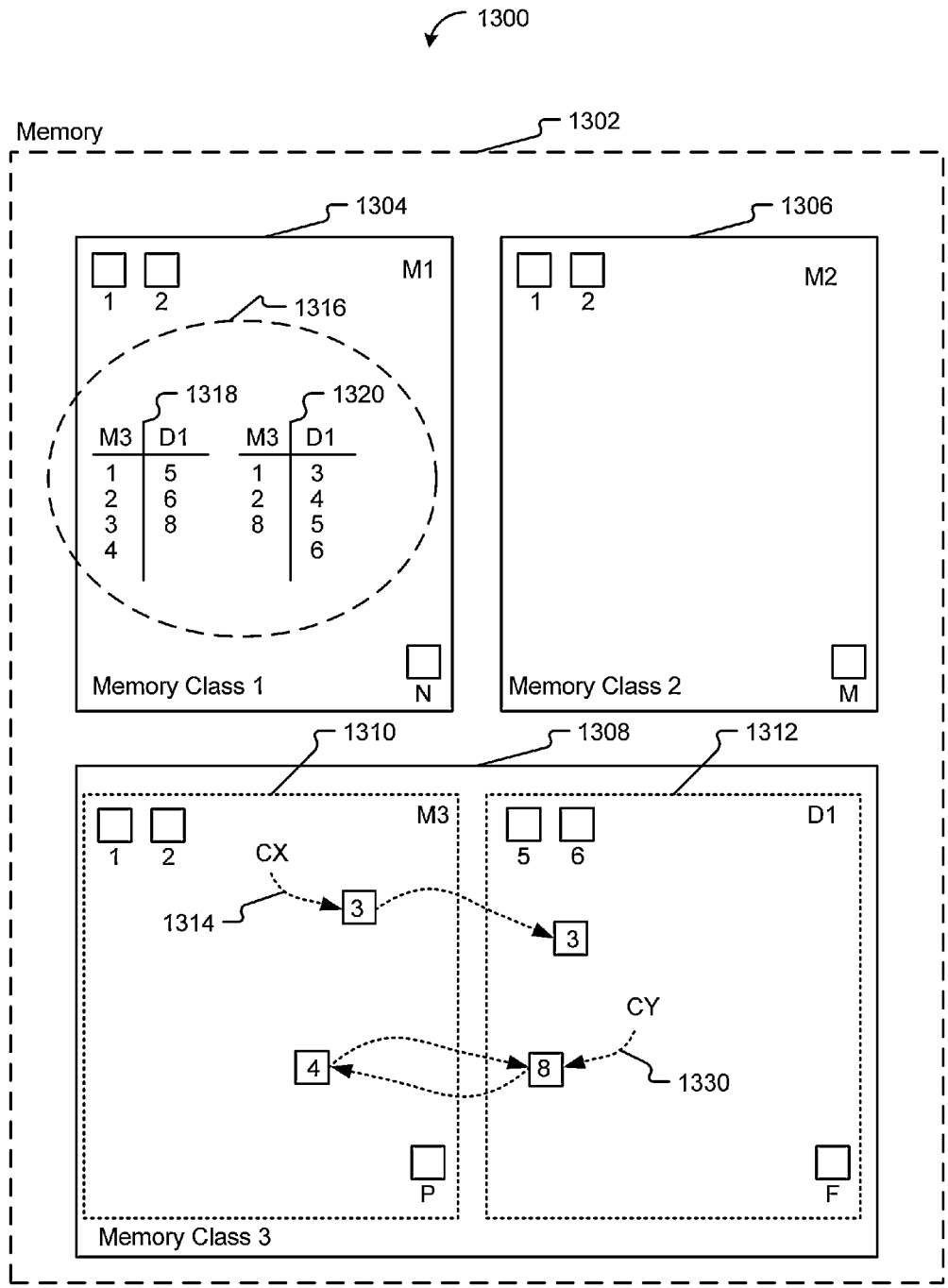
FIG. 13 shows a memory system with three memory classes containing memory pages and file pages, in accordance with another embodiment.

FIG. 13 shows a memory system with three memory classes containing memory pages and file pages, in accordance with another embodiment. As an option, the exemplary system of FIG. 13 may be implemented in the context of the architecture and environment of the previous Figure(s), or any subsequent Figure(s). Of course, however, the exemplary system of FIG. 13 may be implemented in the context of any desired environment.

FIG. 13 shows a Memory System 1300 with Memory 1302. Memory 1302 comprises pages distributed between M1.C1 1304, M2.C2 1306, and M3.C3 1308.

In FIG. 13, memory M1.C1 1304 [e.g. level M1 memory of memory class C1 (e.g. SRAM in some embodiments, embedded DRAM in some embodiments, etc.)] may have a capacity of N pages. M1.1 may be a few megabytes in size.

In FIG. 13, memory M2.C2 1306 (e.g. level M2 memory of memory class C2 (e.g. DRAM in some embodiments if M1 is embedded DRAM, NAND flash in some embodiments if M1 is DRAM, etc.) may have a larger capacity than M1 of M pages.

In FIG. 13, memory C3 1308 [e.g. memory class C3 (e.g. NAND flash in some embodiments if M1 is SRAM, M2 is DRAM, etc.)] may have a much larger capacity than M2 of P pages. In some embodiments, M3.C3 may be a many gigabytes or even much larger (terabytes) in size. In the embodiment of FIG. 13 memory C3 1308 is partitioned into M3.C3 1310 and D1.C3 1312. The structure of M3.C3 1310 is memory pages managed by the VMM. The structure of D1.C3 1312 may also be pages but managed by the filesystem (e.g. of the OS. etc.). Thus D1 may be thought of as a disk in memory or RAM disk.

The Inset 1316 shows the contents of a single table at two points in time, Table 1318 and Table 1320. At time t1 Table 1318 is a list (e.g. inventory, pointers, etc.) of pages in M3 and pages in D1. For simplicity in Table 1318 only a few pages are shown for M3 (though there are P pages in M3) and for D1 (though there are F pages in D1). At time t1 there are four pages in M3 (1, 2, 3, 4) and four pages in D1 (5, 6, 7, 8), etc. Suppose the Memory 1302 receives a command CX 1314 that would result in a page being copied or moved from M3 to D1. An example of such a command would be a write from memory M3 to the RAM disk D1. In order to perform that operation Table 1318 may be updated. Suppose Memory 1302 receives a command or commands CY 1330 that would result in a page being copied or moved from M3 to D1 and a page being moved or copied from D1 to M3. Again, examples would be a read/write to/from M3 from/to D1. Again, in one embodiment, these operations may be performed by updating Table 1318. Table 1320 shows the results. At time t2 there are three pages in M3 (1, 2, 8) and five pages in D1 (3, 4, 5, 6), etc. In one embodiment, these operations may be performed without necessarily moving data. In this case, the boundaries that define M3 and D1 may be re-organized.

Figure 14:
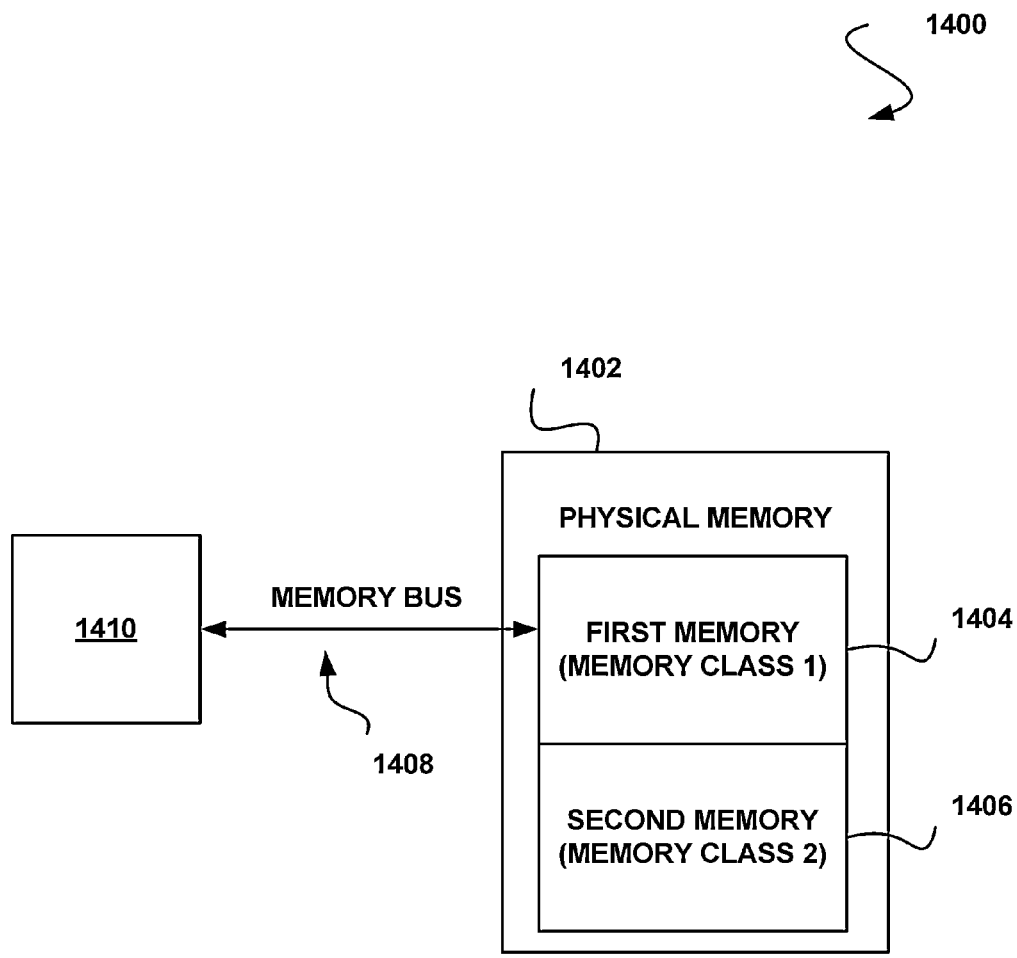
FIG. 14 shows a multi-class memory apparatus for dynamically allocating memory functions between different classes of memory, in accordance with one embodiment.

FIG. 14 shows a multi-class memory apparatus 1400 for dynamically allocating memory functions between different classes of memory, in accordance with one embodiment. As an option, the apparatus 1400 may be implemented in the context of the architecture and environment of the previous Figures, or any subsequent Figure(s). Of course, however, the apparatus 1400 may be implemented in the context of any desired environment. It should also be noted that the aforementioned definitions may apply during the present description.

As shown, a physical memory sub-system 1402 is provided. In various embodiments, the physical memory sub-system 1402 may include a monolithic memory circuit, a semiconductor die, a chip, a packaged memory circuit, or any other type of tangible memory circuit. In one embodiment, the physical memory sub-system 1402 may take the form of a DRAM circuit.

As shown, the physical memory sub-system 1402 includes a first memory 1404 of a first memory class and a second memory 1406 of a second memory class. In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory 1404 or the second memory 1406 may include RAM (e.g. DRAM, SRAM, etc.) and the other one of the first memory 1404 or the second memory 1406 may include NAND flash. In another embodiment, one of the first memory 1404 or the second memory 1406 may include RAM (e.g. DRAM, SRAM, etc.) and the other one of the first memory 1404 or the second memory 1406 may include NOR flash. Of course, in various embodiments, any number of combinations of memory classes may be utilized.

The second memory 1406 is communicatively coupled to the first memory 1404. In one embodiment, the second memory 1406 may be communicatively coupled to the first memory 1404 via direct contact (e.g. a direct connection, etc.) between the two memories. In another embodiment, the second memory 1406 may be communicatively coupled to the first memory 1404 via a bus. In yet another embodiment, the second memory 1406 may be communicatively coupled to the first memory 1404 utilizing a through-silicon via.

As another option, the communicative coupling may include a connection via a buffer device. In one embodiment, the buffer device may be part of the physical memory sub-system 1402. In another embodiment, the buffer device may be separate from the physical memory sub-system 1402.

In one embodiment, the first memory 1404 and the second memory 1406 may be physically separate memories that are communicatively coupled utilizing through-silicon via technology. In another embodiment, the first memory 1404 and the second memory 1406 may be physically separate memories that are communicatively coupled utilizing wire bonds. Of course, any type of coupling may be implemented that functions to allow the second memory 1406 to be communicatively coupled to the first memory 1404.

The physical memory sub-system 1402 is configured to dynamically allocate one or more memory functions from the first memory 1404 of the first memory class to the second memory 1406 of the second memory class. The memory functions may include any number of memory functions and may include any function associated with memory.

For example, in one embodiment, the one or more memory functions may include a cache function. In another embodiment, the memory functions may include a page-related function. A page-related function refers to any function associated with a page of memory. In various embodiments page-related functions may include one or more of the following operations and/or functions (but are not limited to the following): a memory page copy simulating (e.g. replacing, performing, emulating, etc.) for example a software bcopy( ) function; page allocation; page deallocation; page swap; simulated I/O via page flipping (e.g. setting or modifying status or other bits in page tables etc.); etc.

In another embodiment, the memory functions may include a file-related function. A file-related function refers to any function associated with a file of memory. In various embodiments file-related functions may include one or more of the following operations and/or functions (but are not limited to the following): file allocation and deallocation; data deduplication; file compression and decompression; virus scanning; file and filesystem repair; file and application caching; file inspection; watermarking; security operations; defragmentation; RAID and other storage functions; data scrubbing; formatting; partition management; filesystem management; disk quota management; encryption and decryption; ACL parsing, checking, setting, etc; simulated file or buffer I/O via page flipping (e.g. setting or modifying status or other bits in page tables etc.); combinations of these; etc. In yet another embodiment, the memory functions may include a copy operation or a write operation. Still yet, in one embodiment, the memory functions may involve a reclassification of at least one portion of the first memory 1404 of the first memory class.

In one embodiment, the dynamic allocation of the one or more memory functions from the first memory 1404 to the second memory 1406 may be carried out in response to a CPU instruction. For example, in one embodiment, a CPU instruction from a CPU 1410 may be received via a single memory bus 1408. In another embodiment, the dynamic allocation may be carried out independent of at least one aspect of the CPU operation.

As an option, the dynamic allocation of the one or more memory functions may be carried out utilizing logic. In one embodiment, the logic may side on the first memory 1404 and/or the second memory 1406. In another embodiment, the logic may reside on a buffer device separate from the first memory 1404 and the second memory 1406.

Furthermore, in one embodiment, the apparatus 1400 may be configured such that the dynamic allocation of the one or more memory functions includes allocation of the one or more memory functions to the second memory 1406 during a first time period, and allocation of the one or more memory functions back to the first memory 1404 during a second time period. In another embodiment, the apparatus may be configured such that the dynamic allocation of the one or more memory functions includes allocation of the one or more memory functions to the second memory 1406 during a first time period, and allocation of the one or more memory functions to a third memory of a third memory class during a second time period.

More illustrative information will now be set forth regarding various optional architectures and features with which the foregoing techniques discussed in the context of any of the present or previous figure(s) may or may not be implemented, per the desires of the user. For instance, various optional examples and/or options associated with the configuration/operation of the physical memory sub-system 1402, the configuration/operation of the first and second memories 1404 and 1406, the configuration/operation of the memory bus 1408, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

Figure 15:
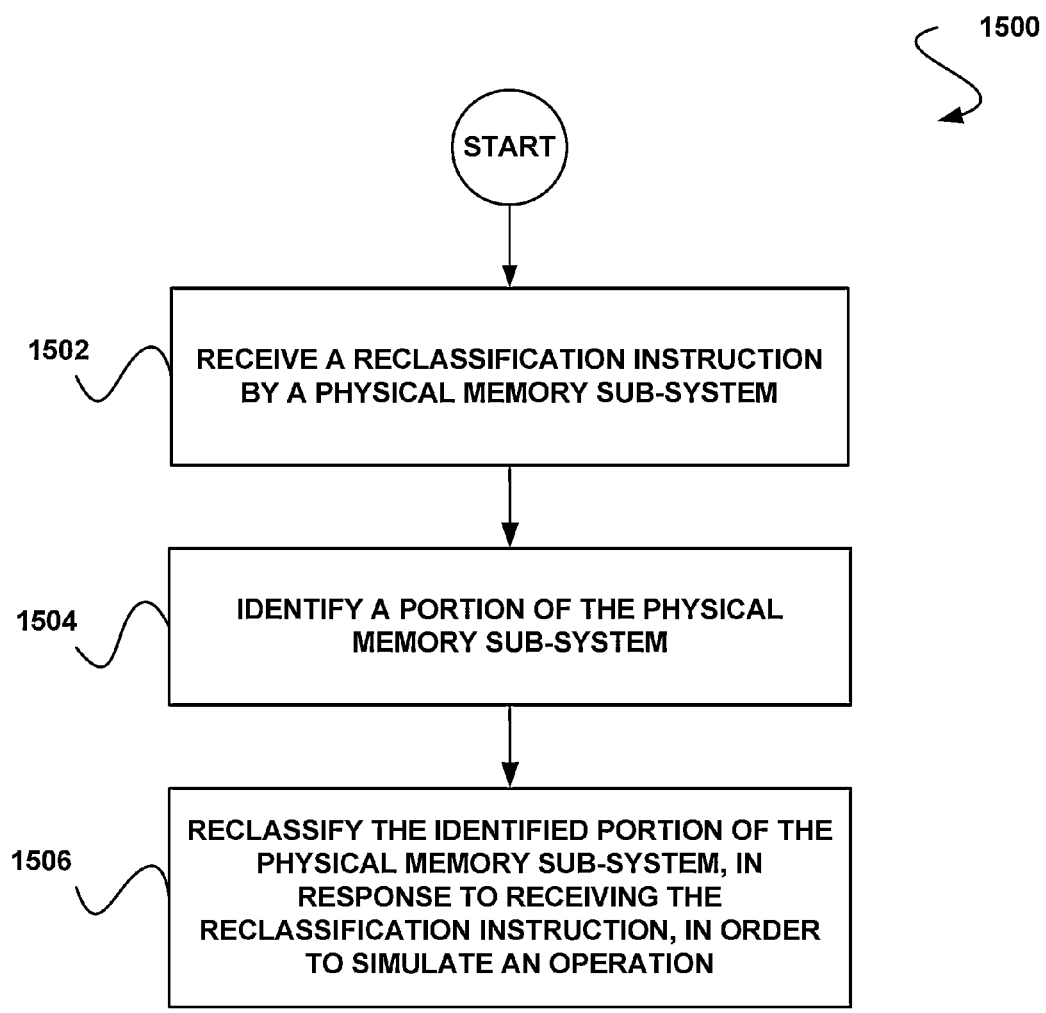
FIG. 15 shows a method for reclassifying a portion of memory, in accordance with one embodiment.

FIG. 15 shows a method 1500 for reclassifying a portion of memory, in accordance with one embodiment. As an option, the method 1500 may be implemented in the context of the architecture and environment of the previous Figures, or any subsequent Figure(s). Of course, however, the method 1500 may be implemented in the context of any desired environment. It should also be noted that the aforementioned definitions may apply during the present description.

As shown, a reclassification instruction is received by a physical memory sub-system. See operation 1502. In the context of the present description, a reclassification instruction refers to any instruction capable of being utilized to initiate the reclassification of memory, a portion of memory, or data stored in memory. For example, in various embodiments, the reclassification instruction may include one or more copy instructions, one or more write instructions, and/or any other instruction capable of being utilized to initiate a reclassification.

As shown further, a portion of the physical memory sub-system is identified. See operation 1504. Further, the identified portion of the physical memory sub-system is reclassified, in response to receiving the reclassification instruction, in order to simulate an operation. See operation 1506.

The simulated operation may include any operation associated with memory. For example, in one embodiment, the identified portion of the physical memory sub-system may be reclassified in order to simulate a copy operation. In various embodiments the copy operation may be simulated without necessarily reading the portion of the physical memory sub-system and/or without necessarily writing to another portion of the physical memory sub-system.

Furthermore, various reclassifications may occur in response to the reclassification instruction. For example, in one embodiment, the identified portion of the physical memory sub-system may be reclassified from a page in memory to a file in the memory. In another embodiment, the identified portion of the physical memory sub-system may be reclassified from a file in memory to a page in the memory.

In one embodiment, the identified portion of the physical memory sub-system may be reclassified by editing metadata associated with the identified portion of the physical memory sub-system. The metadata may include any data associated with the identified portion of the physical memory sub-system. For example, in one embodiment, the metadata may include a bit. As an option, the metadata may be stored in a table.

In one embodiment, the identified portion of the physical memory sub-system may be reclassified independent of at least one aspect of a CPU operation. In another embodiment, the identified portion of the physical memory sub-system may be reclassified in response to a CPU instruction. As an option, the CPU instruction may be received via a single memory bus.

For example, in one embodiment, the method 1500 may be implemented utilizing the apparatus 1A-100 or 1400. In this case, the identified portion of the physical memory sub-system may be reclassified utilizing logic residing on the first memory and/or on the second memory. Of course, in another embodiment, the logic may be resident on a buffer device separate from the first memory and the second memory or on any other device.

More illustrative information will now be set forth regarding various optional architectures and features with which the foregoing techniques discussed in the context of any of the present or previous figure(s) may or may not be implemented, per the desires of the user. For instance, various optional examples and/or options associated with the operation 1502, the operation 1504, the operation 1506, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

Figure 16:
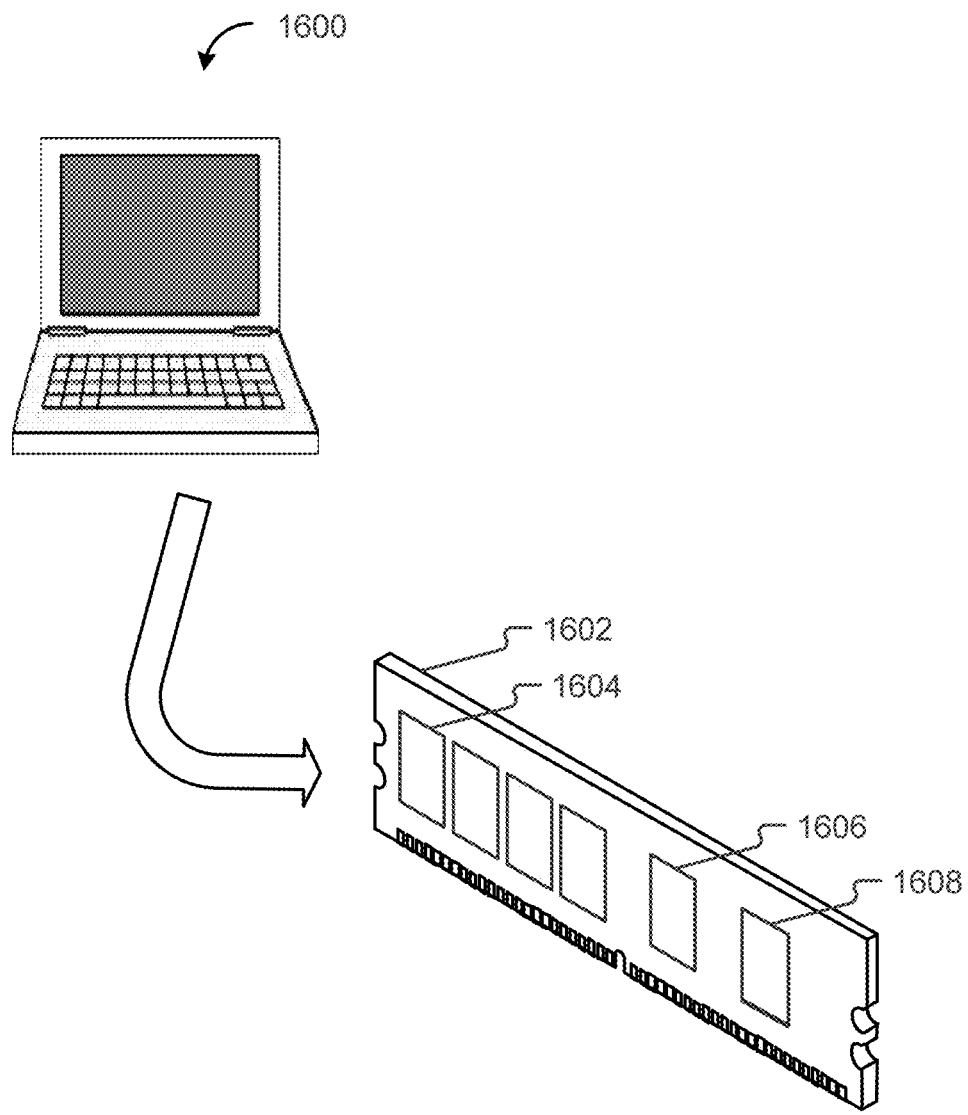
FIG. 16 shows a DIMM using multiple memory classes, in accordance with another embodiment.

FIG. 16 shows a DIMM using multiple memory classes, in accordance with another embodiment. As an option, the exemplary system of FIG. 16 may be implemented in the context of the architecture and environment of the previous Figure(s), or any subsequent Figure(s). Of course, however, the exemplary system of FIG. 16 may be implemented in the context of any desired environment.

FIG. 16 shows a laptop 1600 and illustrates a computing platform using a dual-in-line memory module (DIMM) 1602 with multiple memory classes as a memory system In FIG. 16 DIMM 1602 comprises one or more of Component 1604 (e.g. integrated circuit, chip, package, etc.) comprising memory level M1 (e.g. DRAM in one embodiment, etc.); one or more of Component 1606 (e.g. integrated circuit, chip, package, etc.) comprising memory level M2 (e.g. NAND flash in one embodiment if M1 is DRAM, etc.); one or more of Component 1608 (e.g. integrated circuit, chip, package, etc.) comprising memory logic (e.g. buffer chip, etc.).

In different embodiments DIMM 1602 may be an SO-DIMM, UDIMM, RDIMM, etc.

Figure 17:
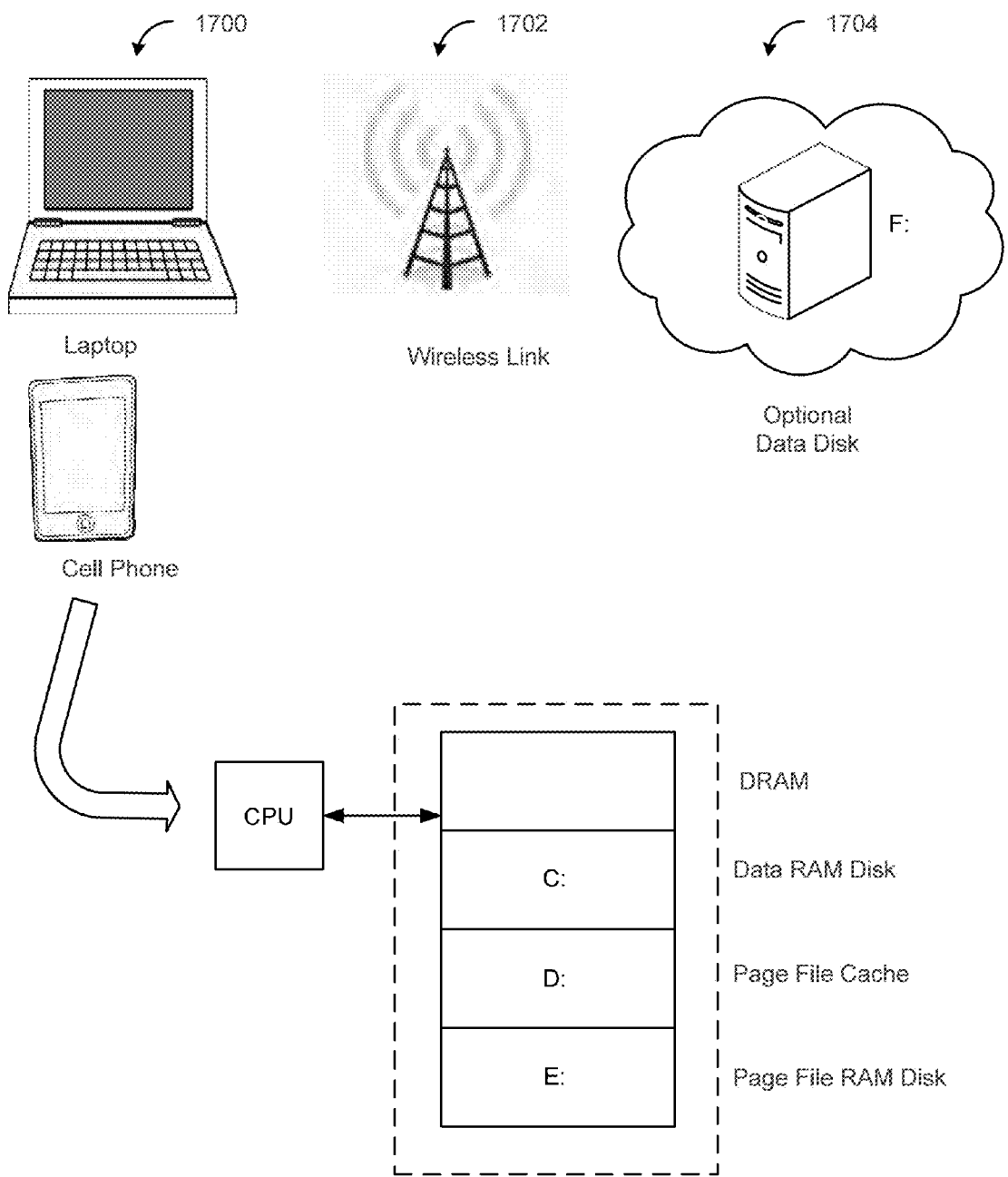
FIG. 17 shows a computing platform employing a memory system with multiple memory classes included on a DIMM, and capable of coupling to an Optional Data Disk, in accordance with another embodiment.

FIG. 17 shows a computing platform 1700 employing a memory system with multiple memory classes included on a DIMM, and capable of coupling to an Optional Data Disk, in accordance with another embodiment. As an option, the exemplary system of FIG. 17 may be implemented in the context of the architecture and environment of the previous Figure(s), or any subsequent Figure(s). Of course, however, the exemplary system of FIG. 17 may be implemented in the context of any desired environment.

The memory system includes DRAM and NAND flash comprising: a Page File Cache, a PageFile RAM Disk and a Data RAM Disk. Other embodiments may use other configurations of multiple memory classes combined into a single component and coupled to a CPU using a single bus.

Figure 18:
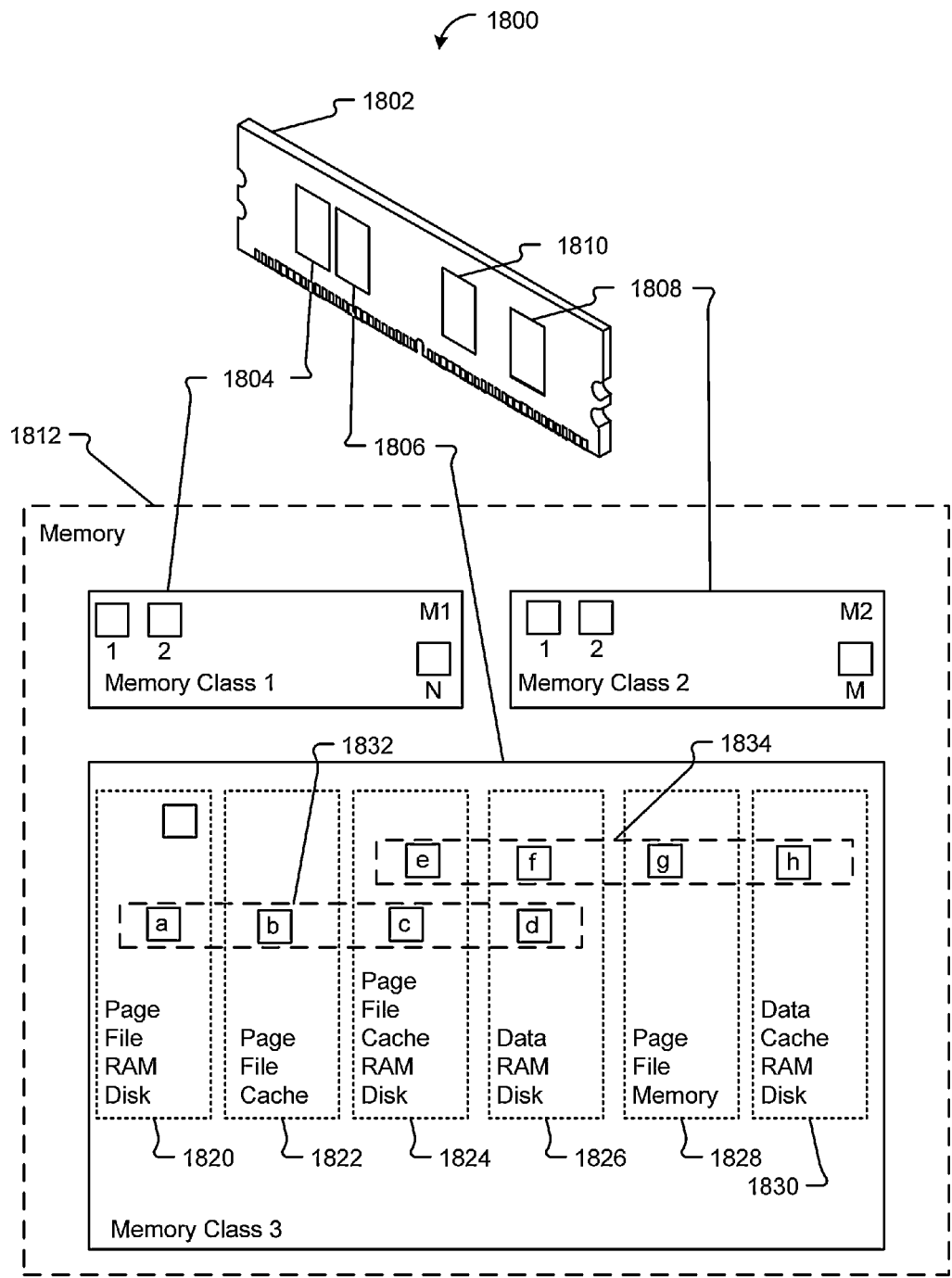
FIG. 18 shows a memory module containing three memory classes, in accordance with another embodiment.

FIG. 18 shows a memory module containing three memory classes, in accordance with another embodiment. As an option, the exemplary system of FIG. 18 may be implemented in the context of the architecture and environment of the previous Figure(s), or any subsequent Figure(s). Of course, however, the exemplary system of FIG. 18 may be implemented in the context of any desired environment.

FIG. 18 illustrates a computing platform using a Memory Module 1802 (e.g. DIMM, SO-DIMM, UDIMM, RDIMM, etc.) with three different memory classes: M1.C1 1804 (e.g. SRAM, etc.), M2.C2 1808 (e.g. DRAM, etc.), and memory class 3 1806 (e.g. NAND flash, etc.). In FIG. 18, Memory Module 1802 also comprises one or more of Component 1810 memory logic (e.g. buffer chip, etc.).

In FIG. 18, memory class 3 1806 is partitioned into six portions (e.g. block, region, part, set, partition, slice, rank, bank, etc.) that include a Page File RAM Disk 1820, a Page File Cache 1822, a Page File Cache RAM Disk 1824, a Data RAM Disk 1826, a Page File Memory 1828, a Data Cache RAM Disk 1830. Different embodiments may use different combination of these portions. Also, in various embodiments, different applications may use different combinations of these portions.

In FIG. 18 Application 1 1832 uses a first portion of memory class 3 1806 portions: a Page File RAM Disk 1820, a Page File Cache 1822, a Page File Cache RAM Disk 1824, a Data RAM Disk 1826. In FIG. 18 Application 3 1834 uses a second, different, portion of memory class 3 1806 portions: a Page File Cache RAM Disk 1824, a Data RAM Disk 1826, a Page File Memory 1828, a Data Cache RAM Disk 1830.

In different embodiments the portions of memory class 3 1806 corresponding to applications (e.g. Application 1 1832, Application 3 1834, etc.) may be separately manipulated (e.g. by the CPU, by the OS, by the Component 1810 memory logic, etc.).

In one embodiment, the portions of memory class 3 1806 corresponding to applications (e.g. Application 1 1832, Application 3 1834, etc.) may correspond to virtual machines (VMs) and the VMs may then easily be swapped in and out of Memory 1812 (e.g. to secondary storage, other device (laptop, desktop, docking station, etc), cloud storage, etc.

In other embodiments, groups of portions (e.g. Application 1 1832, and Application 3 1834 together, etc.) may be manipulated as bundles of memory.

Figure 19:
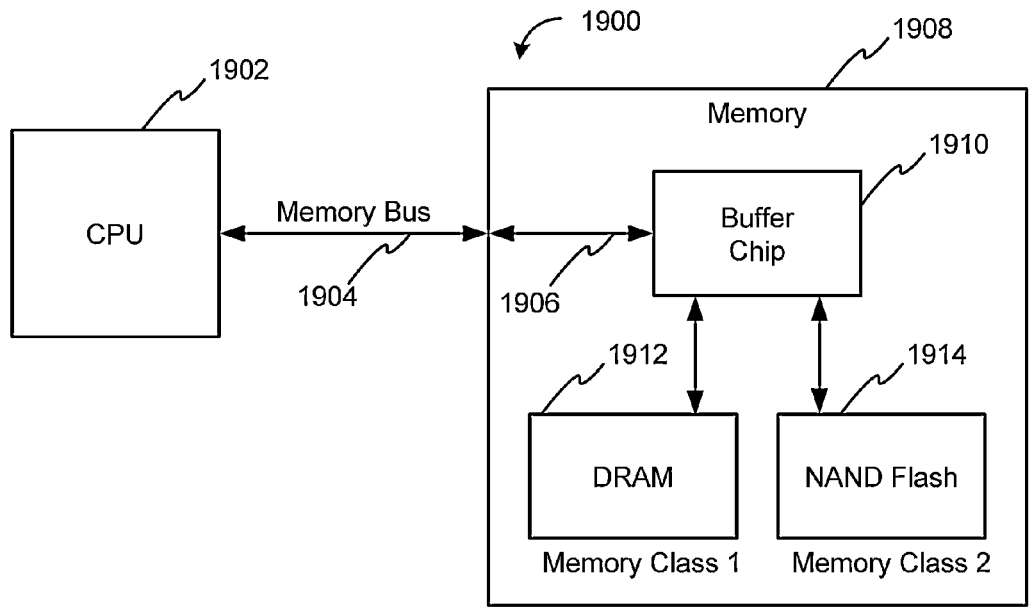
FIG. 19 shows a system coupled to multiple memory classes using only a single memory bus, and using a buffer chip, in accordance with another embodiment.

FIG. 19 shows a system coupled to multiple memory classes using only a single memory bus, and using a buffer chip, in accordance with another embodiment. As an option, the exemplary system of FIG. 19 may be implemented in the context of the architecture and environment of the previous Figure(s), or any subsequent Figure(s). Of course, however, the exemplary system of FIG. 19 may be implemented in the context of any desired environment.

In FIG. 19, System 1900 comprises a CPU 1902 and Memory 1908. In FIG. 19, CPU 1902 is coupled to a buffer chip 1910 (e.g. memory buffer, interface circuit, etc.). In FIG. 19, the CPU 1902 is coupled to Memory 1908 using a Memory Bus 1904. The Memory 1908 comprises a buffer chip 1910 coupled with a component of a memory class 1 1912 and a second component of memory class 2 1914. Note that in such a configuration, a page in a component of memory class 1 could be copied into a component of memory class 2 by the buffer chip 1910 without necessarily using bandwidth of the Memory Bus 1904 or resources of CPU 1902. In one embodiment, some or all of the VMy operations may be performed by the buffer chip 1910 without necessarily using bandwidth of the Memory Bus 1904.

In FIG. 19 Memory Bus 1904 may be of a different width (or may have other different properties, etc.) than the Memory Internal Bus 1906 that couples CPU 1902 to the buffer chip 1910.

Figure 20:
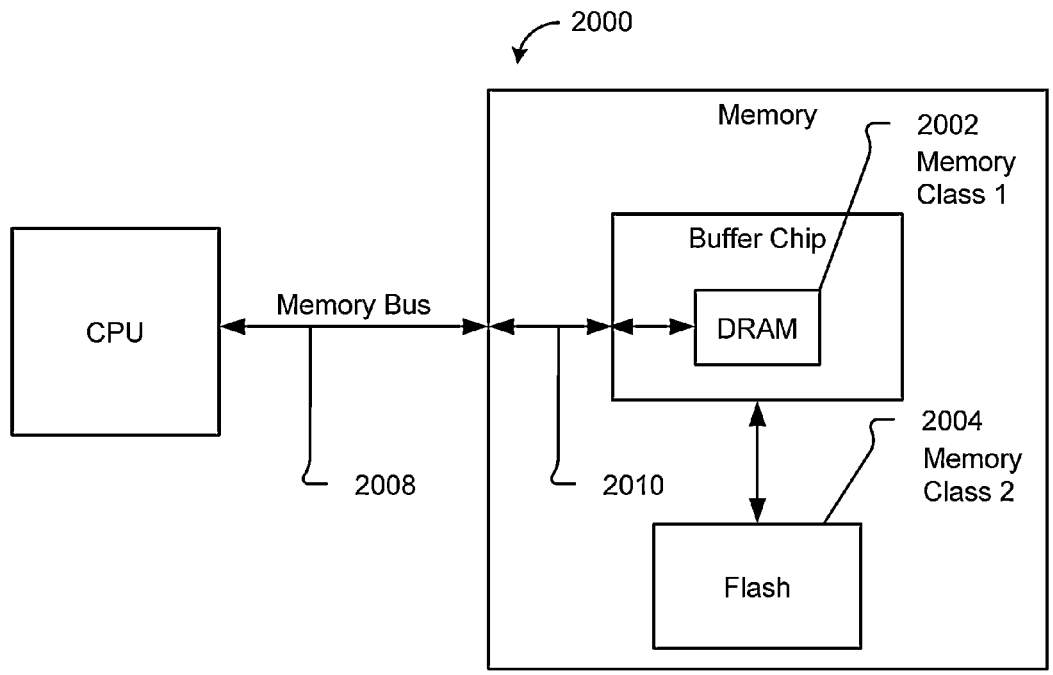
FIG. 20 shows a CPU coupled to a Memory using multiple different memory classes using only a single Memory Bus, and employing a buffer chip with embedded DRAM memory, in accordance with another embodiment.

FIG. 20 shows a system 2000 comprising a CPU (in FIG. 20) coupled to a Memory (in FIG. 20) using multiple different memory classes using only a single Memory Bus, and employing a buffer chip (in FIG. 20) with embedded DRAM memory, in accordance with another embodiment. As an option, the exemplary system of FIG. 20 may be implemented in the context of the architecture and environment of the previous Figure(s), or any subsequent Figure(s). Of course, however, the exemplary system of FIG. 20 may be implemented in the context of any desired environment.

In FIG. 20 Bus 2010 and Bus 2008 may have different widths.

In FIG. 20 Bus 2010 may be the same width as Bus 2008 outside the buffer chip but different widths inside the buffer chip.

In FIG. 20 multiple buffer chips may be used so that when they are all connected in parallel the sum of the all the Bus 2010 widths is equal to the Bus 2008 width. Similar alternative embodiments are possible with FIGS. 19, 21, 22.

In FIG. 20 memory Class 1 2002 may be SRAM, DRAM, etc.

With the same configuration as FIG. 20 there may be more than one memory class external to the buffer chip.

Figure 21:
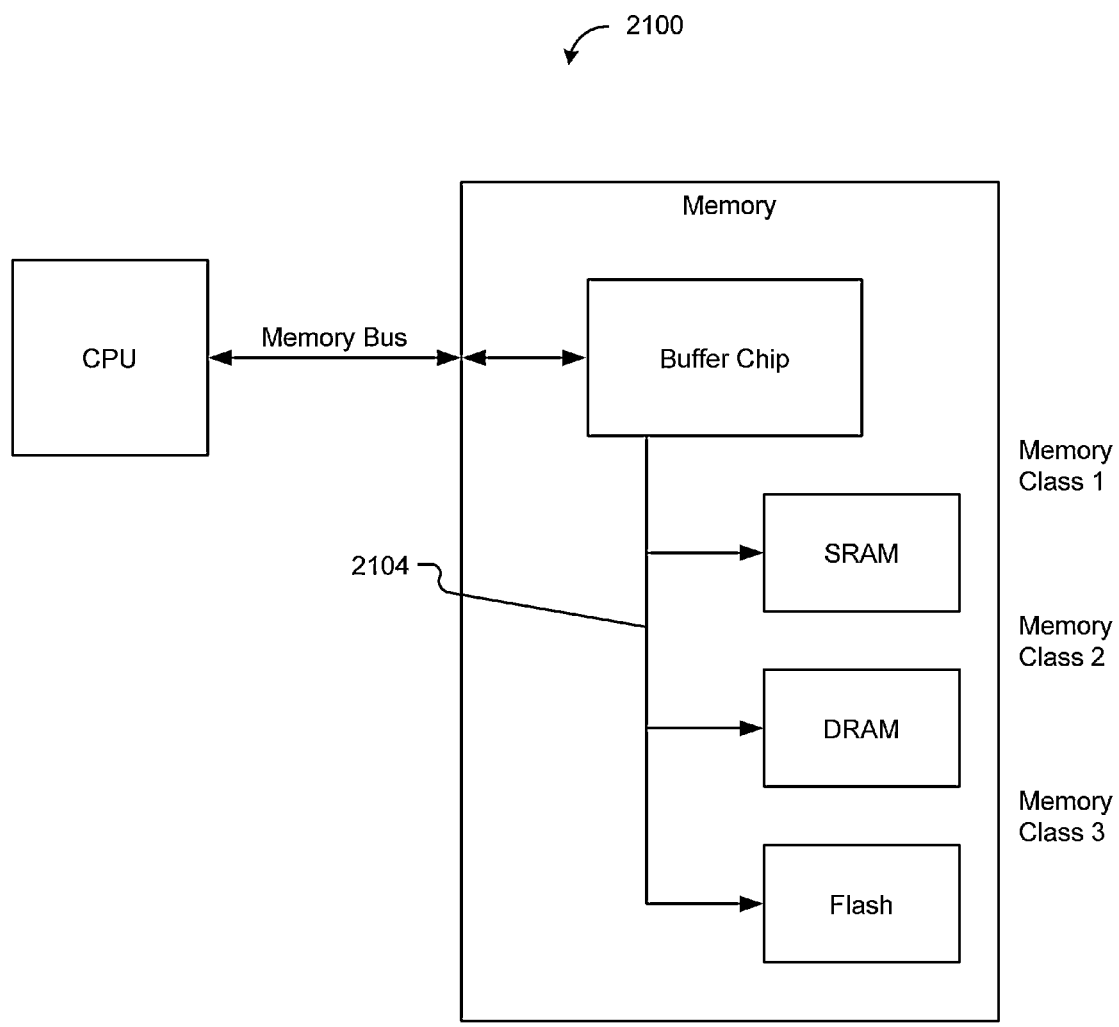
FIG. 21 shows a system with a buffer chip and three memory classes on a common bus, in accordance with another embodiment.

FIG. 21 shows a system with a buffer chip (in FIG. 21) and three memory classes on a common bus, in accordance with another embodiment. As an option, the exemplary system of FIG. 21 may be implemented in the context of the architecture and environment of the previous Figure(s), or any subsequent Figure(s). Of course, however, the exemplary system of FIG. 21 may be implemented in the context of any desired environment.

In FIG. 21 System 2100 comprises CPU (in FIG. 21) and Memory (in FIG. 21). Memory uses multiple different memory classes with only a single Memory Bus. CPU is coupled to a buffer chip. buffer chip is coupled to multiple different memory components of different memory classes over a single Internal Memory Bus 2104.

In other embodiments, there may be one or more Internal Memory Bus 2104. That is, not all Memory Classes may be on the same bus in some embodiments.

In one embodiment, memory class 1 (in FIG. 21) and memory class 2 (in FIG. 21) may be on the same bus, and memory class 3 (in FIG. 21) may be on a separate bus.

In another embodiment, memory class 1 and memory class 3 may be on the same bus, and memory class 2 may be on a separate bus.

In some embodiments, there may be connections, communication, coupling etc. (control signals, address bus, data bus) between memory classes. In one embodiment, there may be three possible bi-directional (some may be unidirectional) connections: memory class 1 to memory class 3; memory class 1 to memory class 2; memory class 2 to memory class 3.

Figure 22:
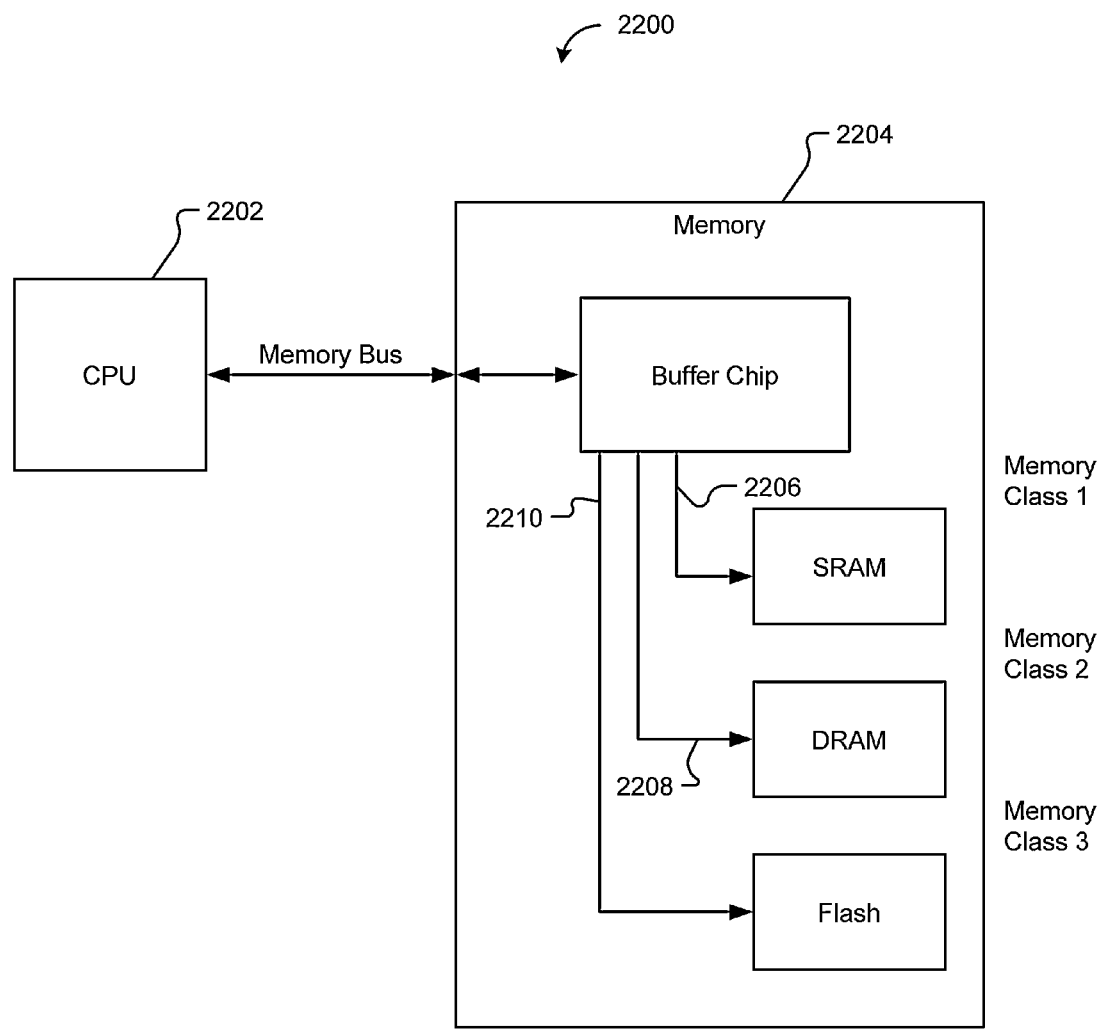
FIG. 22 shows a system with a buffer chip and three memory classes on separate buses, in accordance with another embodiment.

FIG. 22 shows a system with a buffer chip (in FIG. 22) and three memory classes on separate buses, in accordance with another embodiment. As an option, the exemplary system of FIG. 22 may be implemented in the context of the architecture and environment of the previous Figure(s), or any subsequent Figure(s). Of course, however, the exemplary system of FIG. 22 may be implemented in the context of any desired environment.

In FIG. 22 System 2200 comprises CPU 2202 and Memory 2204. Memory uses multiple different memory classes, CPU is coupled to a buffer chip. buffer chip is coupled to multiple different memory components of different memory classes using: Internal Memory Bus 2206; Internal Memory Bus 2208; Internal Memory Bus 2210.

In one embodiment, embedded DRAM (in FIG. 22) (on the buffer chip) may be used for memory class 1 (in FIG. 22). In another embodiment, four or more classes of memory may be utilized.

In some embodiments there may be connections, communication, coupling etc. (control signals, address bus, data bus) between memory classes. There are three possible bi-directional (some may be unidirectional) connections: memory class 1 to memory class 3 (in FIG. 22); memory class 1 to memory class 2 (in FIG. 22); memory class 2 to memory class 3.

Figure 23A:
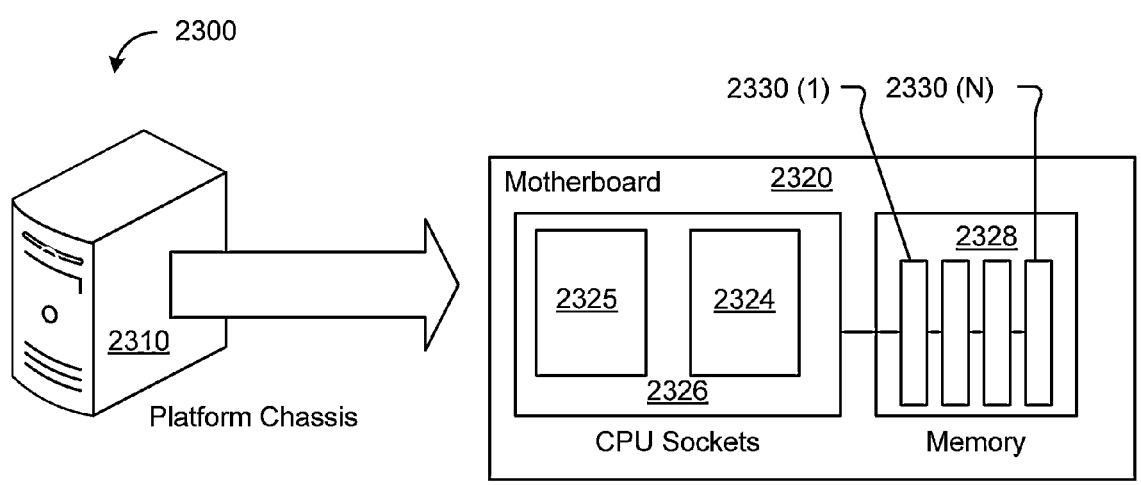
FIG. 23A shows a system, in accordance with another embodiment.

FIG. 23A shows a system, in accordance with another embodiment. As an option, the exemplary system of FIG. 23A may be implemented in the context of the architecture and environment of the previous Figure(s), or any subsequent Figure(s). Of course, however, the exemplary system of FIG. 23A may be implemented in the context of any desired environment.

FIG. 23A shows a computer platform 2300 that includes a platform chassis 2310, and at least one processing element that consists of or contains one or more boards, including at least one motherboard 2320. Of course, the platform 2300 as shown may comprise a single case and a single power supply and a single motherboard. However, other combinations may be implemented where a single enclosure hosts a plurality of power supplies and a plurality of motherboards or blades.

In one embodiment, the motherboard 2320 may be organized into several partitions, including one or more processor sections 2326 consisting of one or more processors 2325 and one or more memory controllers 2324, and one or more memory sections 2328. In one embodiment, the notion of any of the aforementioned sections is purely a logical partitioning, and the physical devices corresponding to any logical function or group of logical functions might be implemented fully within a single logical boundary, or one or more physical devices for implementing a particular logical function might span one or more logical partitions. For example, the function of the memory controller 2324 may be implemented in one or more of the physical devices associated with the processor section 2326, or it may be implemented in one or more of the physical devices associated with the memory section 2328.

Figure 23B:
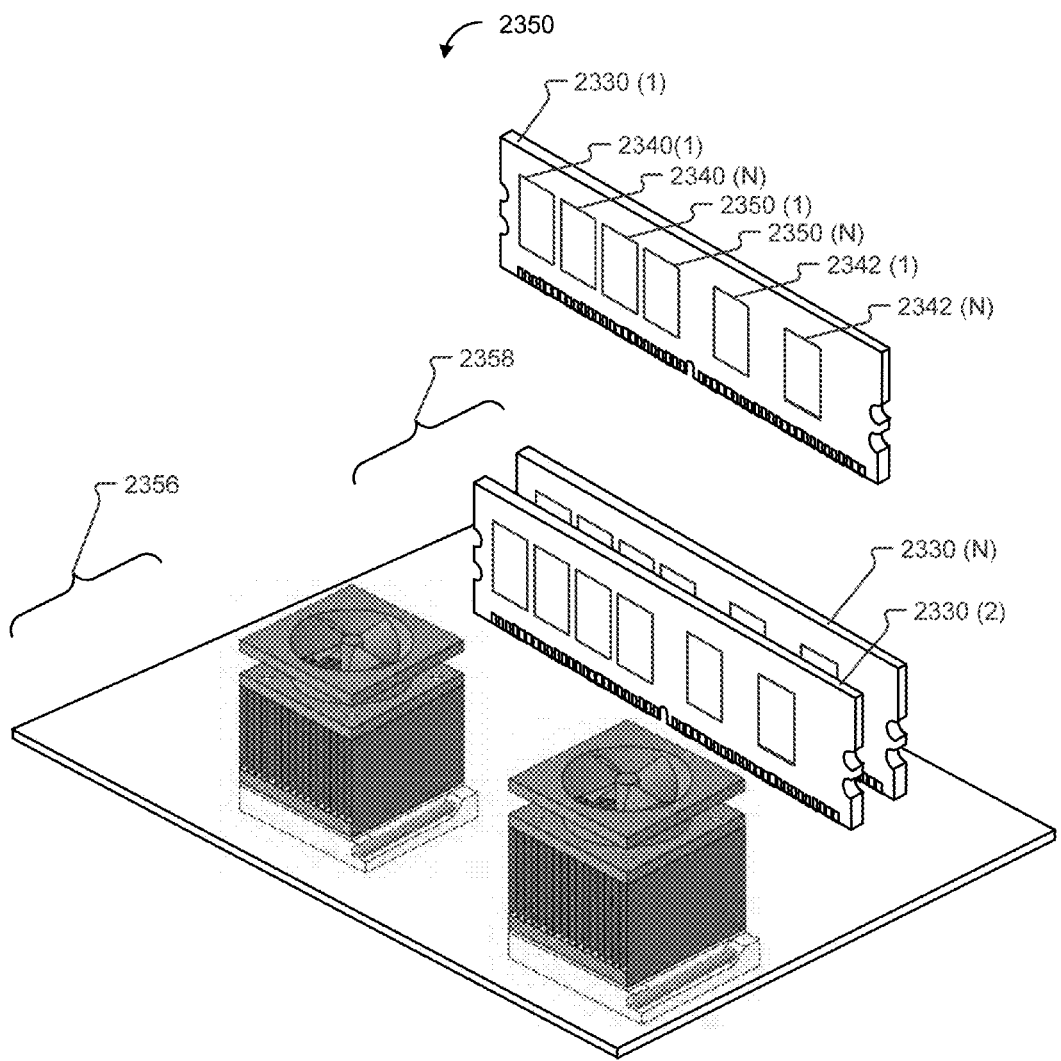
FIG. 23B shows a computer system with three DIMMs, in accordance with another embodiment.
Figure 23C:
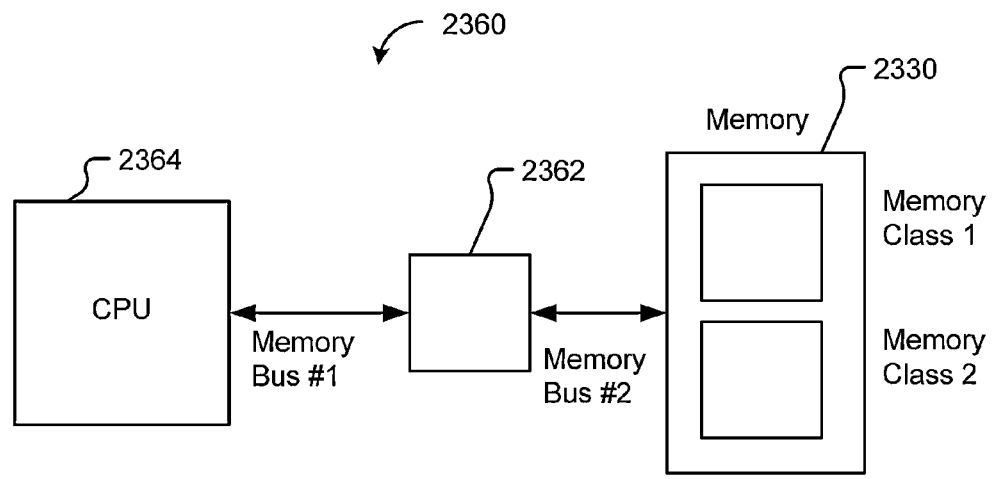
FIGS. 23C-23F show exemplary systems, in accordance with various embodiments.
Figure 23D:
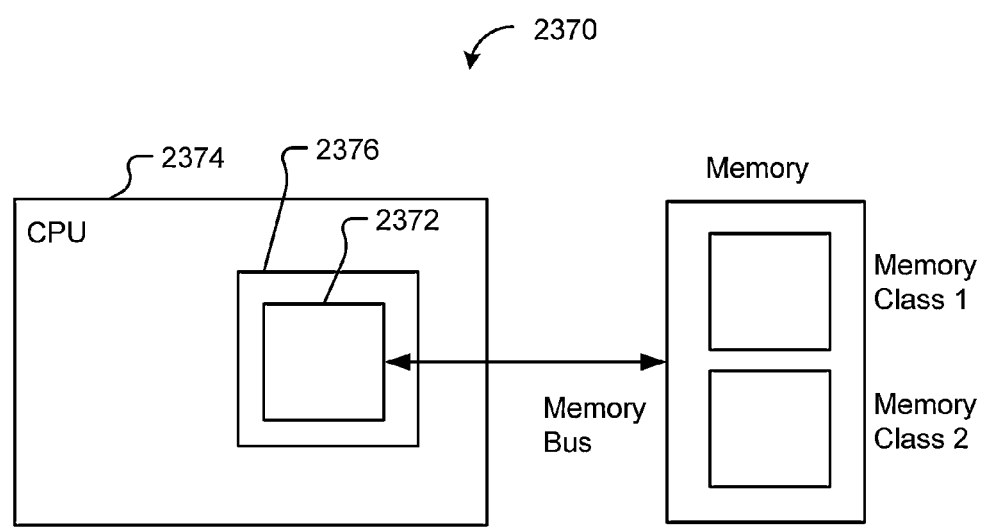
Figure 23E:
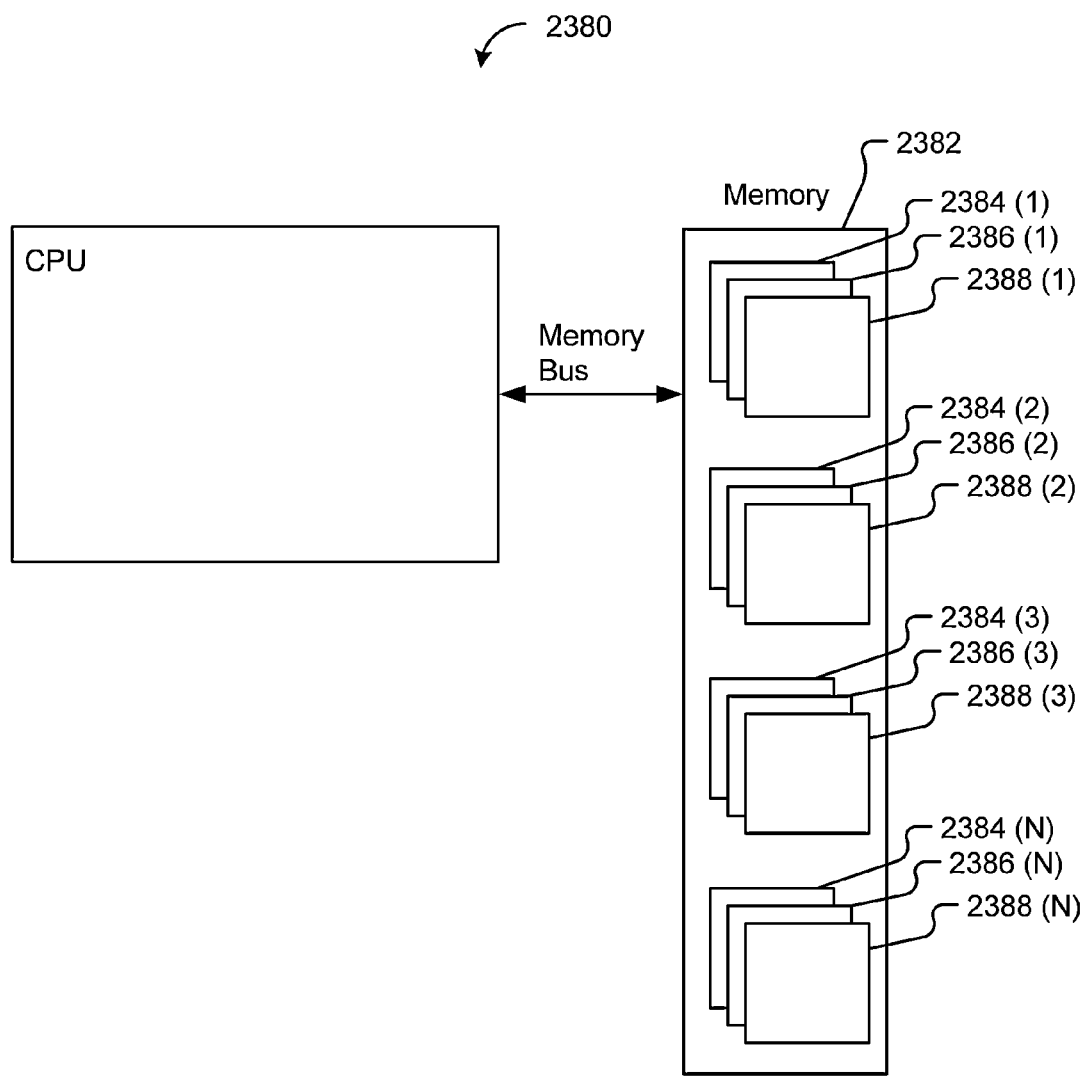
Figure 23F:
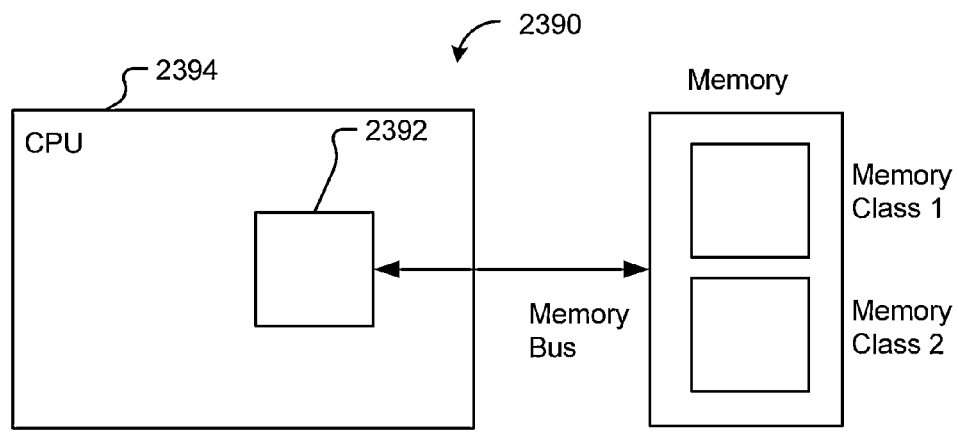

FIG. 23B shows a computer system with three DIMMs, in accordance with another embodiment. As an option, the exemplary system of FIG. 23B may be implemented in the context of the architecture and environment of the previous Figure(s), or any subsequent Figure(s). Of course, however, the exemplary system of FIG. 23B may be implemented in the context of any desired environment.

FIG. 23B illustrates an embodiment of a memory system, such as, for example, the Memory System 2358, in communication with a Processor System 2356. In FIG. 23B, one or more Memory Modules 2330(1)-2330 (N) each contain one or more Flash Chips 2340(1)-2340 (N), one or more buffer chips 2350(1)-2350(N), and one or more DRAMs 2342(1)-2342(N) positioned on (or within) a Memory Module 2330 (1).

Although the memory may be labeled variously in FIG. 23B and other figures (e.g. memory, memory components, DRAM, etc), the memory may take any form including, but not limited to, DRAM, synchronous DRAM (SDRAM), double data rate synchronous DRAM (DDR SDRAM, DDR2 SDRAM, DDR3 SDRAM, etc.), graphics double data rate synchronous DRAM (GDDR SDRAM, GDDR2 SDRAM, GDDR3 SDRAM, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), phase-change memory (PCM), flash memory, and/or any other class of volatile or non-volatile memory either separately or in combination.

FIGS. 23C-23F show exemplary systems, in accordance with various embodiments. Alternative embodiments to FIG. 23A, FIG. 23B, and other similar embodiments are possible, including: (1) positioning (e.g. functionally, logically, physically, electrically, etc.) one or more buffer chips 2362 between a Processor System 2364 and Memory 2330 (see, for example, System 2360 in FIG. 23C); (2) implementing the function of (or integrating, packaging, etc.) the one or more buffer chips 2372 within the Memory Controller 2376 of CPU 2374 (see, for example, System 2370 in FIG. 23D); (3) positioning (e.g. functionally, logically, physically, electrically, etc.) one or more buffer chips 2384(1)-2384 (N) in a one-to-one relationship with memory class 1 2386(1)-2386 (N) and memory class 2 2388(1)-2388 (N) in Memory 2382 (see, for example, System 2380 in FIG. 23E); (4) implementing (or integrating the function of, etc.) the one or more buffer chips 2392 within a CPU 2394 (e.g. processor, CPU core, etc.) (see, for example, System 2390 in FIG. 23F).

As an option, the exemplary systems of FIGS. 23C-23F may be implemented in the context of the architecture and environment of the previous Figure(s), or any subsequent Figure(s). Of course, however, the exemplary system of FIGS. 23C-23F may be implemented in the context of any desired environment.

It should be noted that in various embodiments other possible placements of buffer chips 2372 are possible (e.g. on motherboard, on DIMM, on CPU, packaged with CPU, packaged with DRAM or other memory, etc.).

Figure 24A:
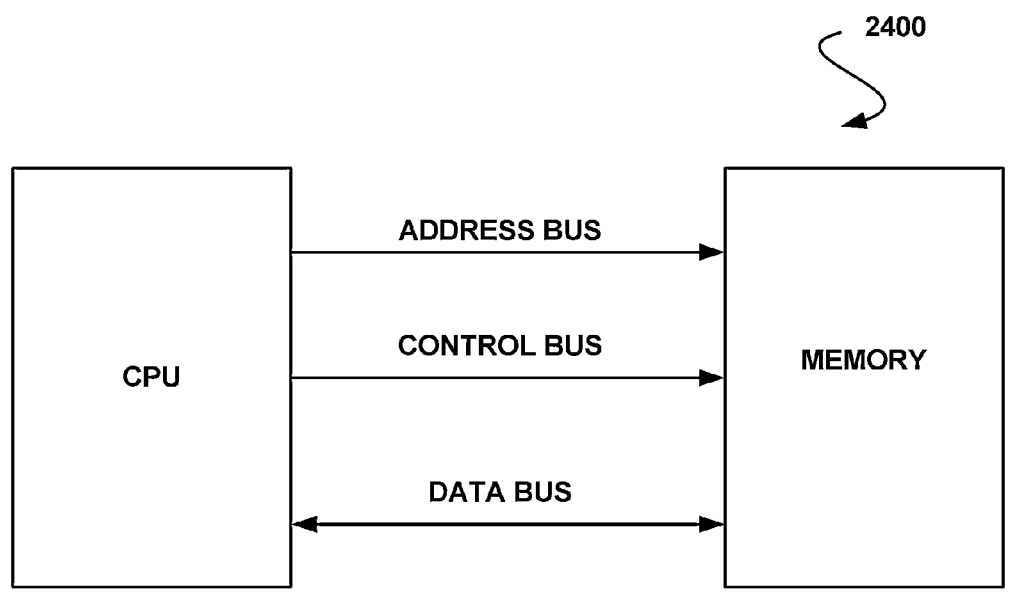
FIG. 24A shows a system using a Memory Bus comprising an Address Bus, Control Bus, and bidirectional Data Bus, in accordance with one embodiment.

FIG. 24A shows a system 2400 using a Memory Bus comprising an Address Bus (in FIG. 24A), Control Bus (in FIG. 24A), and bidirectional Data Bus (in FIG. 24A), in accordance with one embodiment. As an option, the exemplary system of FIG. 24A may be implemented in the context of the architecture and environment of the previous Figure(s), or any subsequent Figure(s). Of course, however, the exemplary system of FIG. 24A may be implemented in the context of any desired environment.

In one embodiment, additional signals may be added to the Memory Bus. The additional signals may be control, status, error, signaling, etc. signals that are in addition to standard (e.g. JEDEC standard DDR2, DDR23, DDR3, etc.) signals.

In one embodiment, the Control Bus may be bidirectional.

In one embodiment, there may be more than one Address Bus (e.g. for different memory classes, etc.).

In one embodiment, there may be more than one Control Bus (e.g. for different memory classes, etc.)

In one embodiment, there may be more than one Data Bus (e.g. for different memory classes, etc.).

In one embodiment, there may be additional buses and/or signals e.g. for control, status, polling, command, coding, error correction, power, etc.).

Figure 24B:
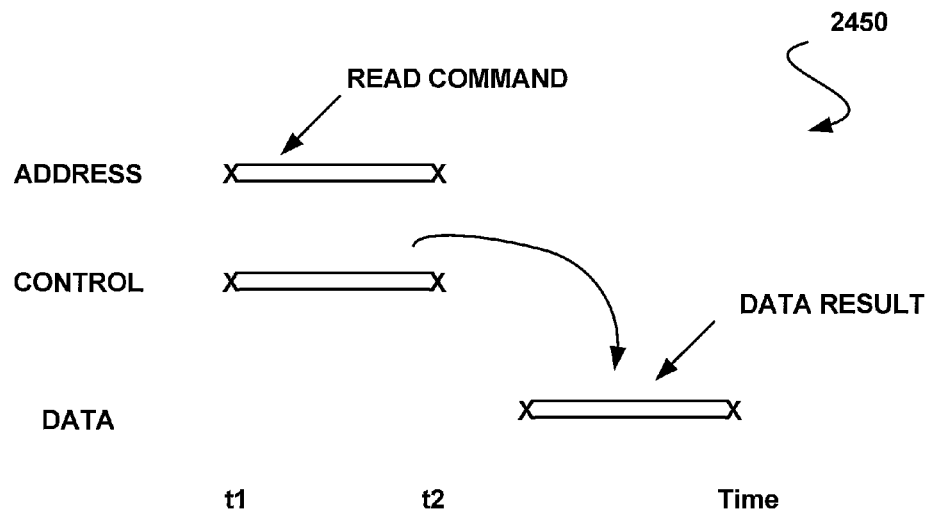
FIG. 24B shows a timing diagram for a Memory Bus (e.g., as shown in FIG. 24A, etc.), in accordance with one embodiment.

FIG. 24B shows a timing diagram for a Memory Bus (e.g., as shown in FIG. 24A, etc.), in accordance with one embodiment.

As an option, the exemplary system of FIG. 24B may be implemented in the context of the architecture and environment of the previous Figure(s), or any subsequent Figure(s). Of course, however, the exemplary system of FIG. 24B may be implemented in the context of any desired environment.

In FIG. 24B, a Read Command (in FIG. 24B) is placed on the Memory Bus at time t1. The Read Command may comprise address information on the Address Bus (in FIG. 24B) together with control information on the Control Bus (in FIG. 24B). At time t2 the memory places data (the Data Result (in FIG. 24B)) on the Data Bus (in FIG. 24B). The read latency of the memory is the difference in time, t2−t1.

Note that the timing diagram shown in FIG. 24B may vary in detail depending on the exact memory technology and standard used (if any), but in various embodiments the general relationship between signals and their timing may be similar to that shown in FIG. 24B.

Figure 25:
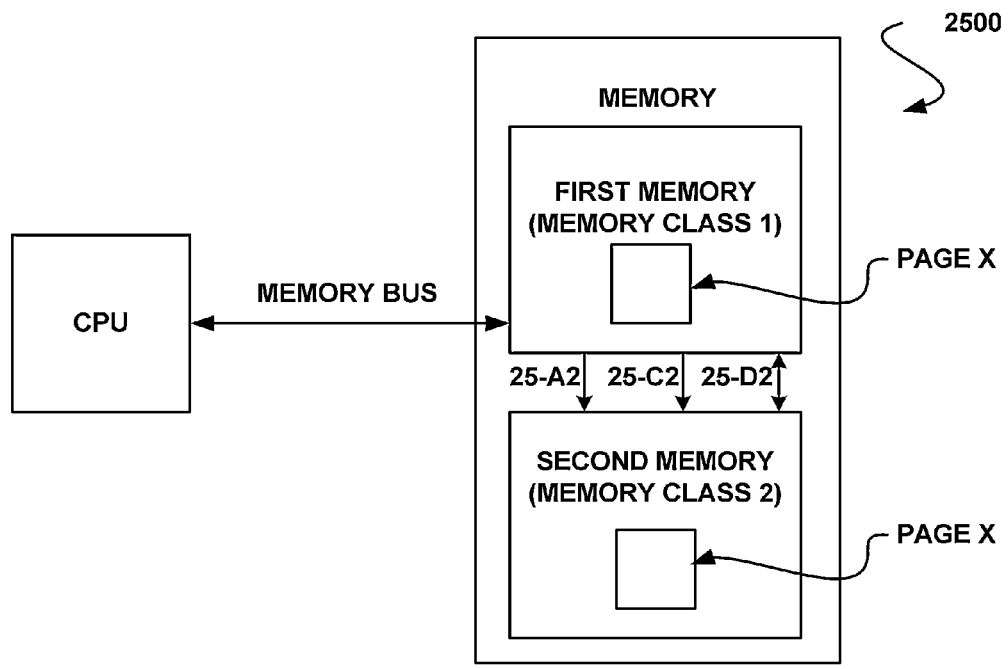
FIG. 25 shows a system with the PM comprising memory class 1 and memory class 2, in accordance with one embodiment.

FIG. 25 shows a system with the PM comprising memory class 1 and memory class 2, in accordance with one embodiment. As an option, the exemplary system of FIG. 25 may be implemented in the context of the architecture and environment of the previous Figure(s), or any subsequent Figure(s). Of course, however, the exemplary system of FIG. 25 may be implemented in the context of any desired environment.

In FIG. 25, a first Memory Bus (in FIG. 25) is used to couple the CPU (in FIG. 25) and the memory system. In FIG. 25, a second Memory Bus is used to couple memory class 1 (in FIG. 25) and memory class 2 (in FIG. 25). The second Memory Bus comprises Address Bus A2 (in FIG. 25), Control Bus C2 (in FIG. 25), and bidirectional Data Bus D2 (in FIG. 25).

Note that FIG. 25 does not show details of the coupling between the Memory Bus, the memory system, memory class 1 and memory class 2. The coupling may include, for example, one or more buffer chips or other circuits that are described in detail below.

In FIG. 25, memory class 1 and memory class 2 are shown containing Page X (in FIG. 25). In one embodiment, memory class 1 may serve as a cache (e.g. temporary store, de-staging mechanism, etc.) memory for memory class 2. In one embodiment, a page may be written first to memory class 1 and then subsequently written to memory class 2. In one embodiment, after a page is copied (e.g. moved, transferred, etc.) from memory class 1 to memory class 2 the page may be kept in memory class 1 or may be removed. In different embodiments the CPU may only be able to read from memory Class 1 or may be able to read from both memory class 1 and memory class 2. In one embodiment, the CPU may request that a page be copied from memory class 2 to memory class 1 before being read from memory class 1, etc. Of course, these embodiments, as well as other similar embodiments, as well as different combinations of these and other similar embodiments may be used.

It should thus be noted that the exemplary system of FIG. 25 may be implemented in the context of the architecture and environment of the previous Figure(s), or any subsequent Figure(s) with or without the use of buffer chips (e.g. interface chips, interface circuits, etc.).

Figure 26:
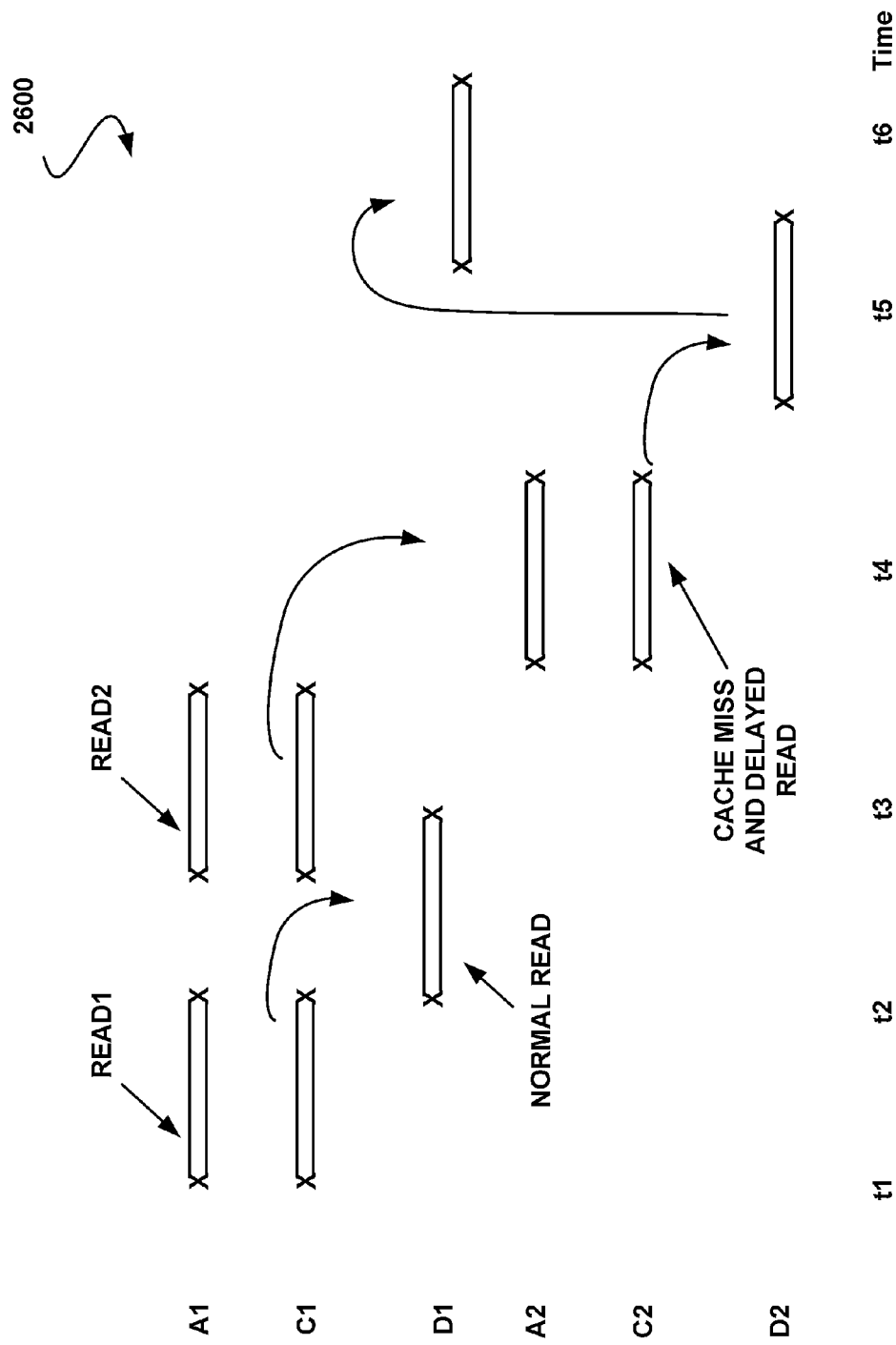
FIG. 26 shows a timing diagram for read commands, in accordance with one embodiment.

FIG. 26 shows a timing diagram for read commands, in accordance with one embodiment.

In FIG. 26, a normal (e.g. JEDEC standard, other standard, etc.) read (READ1 (in FIG. 26)) is placed on the Address Bus A1 and Control Bus C1 at time t1. In one embodiment, a normal read command may correspond to a request for data that is present in memory class 1. At time t2, if the requested data is present in memory class 1, the requested data from memory class 1 is placed on Data Bus D1. At time t3 a second read command (READ2 (in FIG. 26)) is placed on Address Bus A1 and Control Bus C1. In one embodiment, this read command requests data that is not present in memory class 1 and may result, for example, in a read command for (e.g. addressed to, etc.) memory class 2 being placed on bus A2 and C2 at time t4 (labeled as a Cache Miss and Delayed Read in FIG. 26). At time t5, the requested data from memory class 2 is placed on bus D2. At time t6, the requested data is placed on bus D1.

In one embodiment, the protocol on Memory Bus may be changed to allow the timing to break (e.g. violate, exceed, non-conform to, deviate from, etc.) a JEDEC standard (e.g. DDR2, DDR3, DDR4, etc.) or other standard etc.

In another embodiment, the Memory Bus may use a JEDEC standard (e.g. DDR2, DDR3, DDR4, etc.) or other standard.

In other embodiments, the operation of the memory system may be changed from a standard (e.g. JEDEC, etc.), examples of which will be described below.

Figure 27:
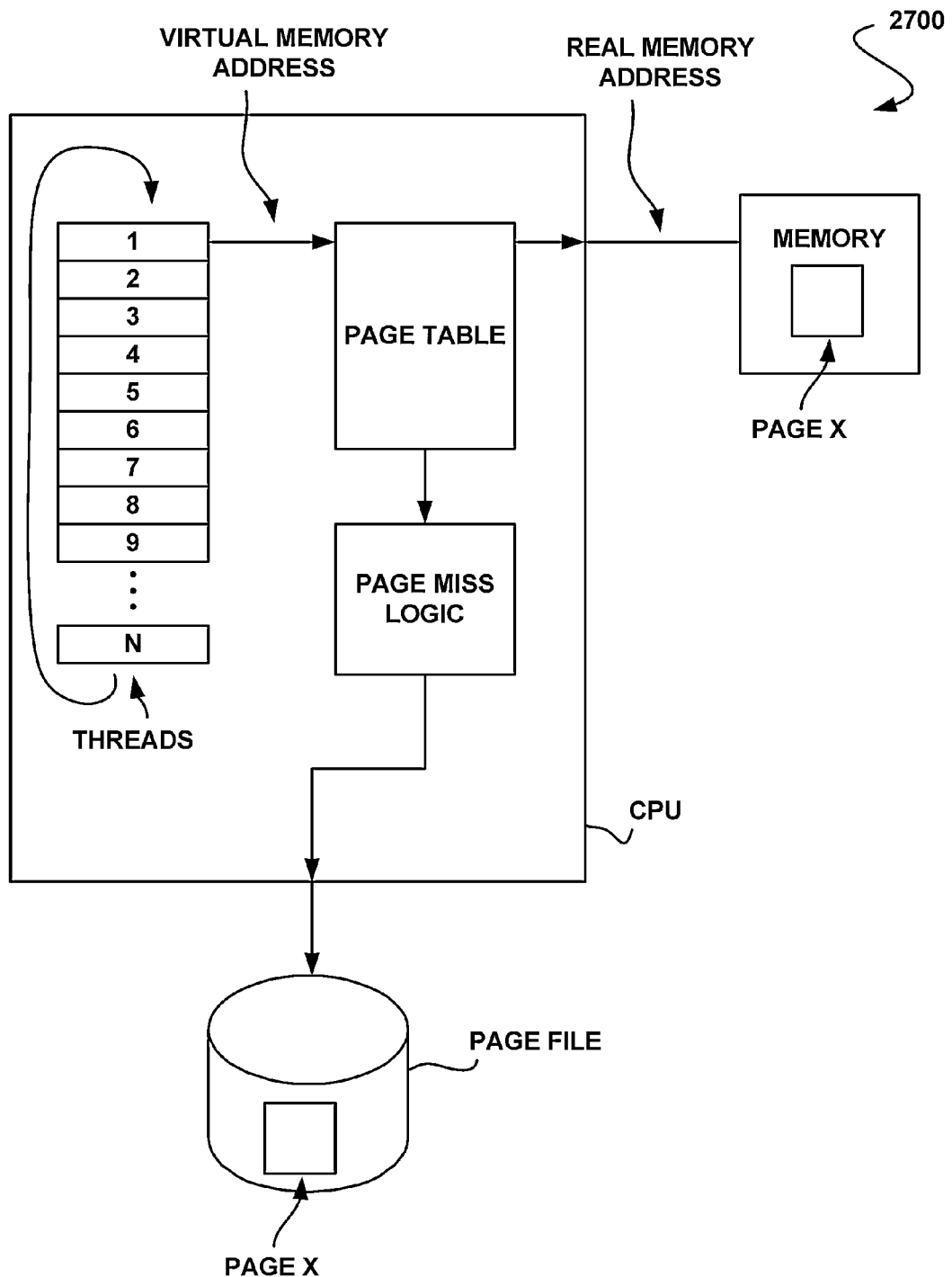
FIG. 27 shows a computing system with memory system and illustrates the use of a virtual memory address (or virtual address, VA), in accordance with one embodiment.

FIG. 27 shows a computing system with memory system and illustrates the use of a virtual memory address (in FIG. 27) (or virtual address, VA), in accordance with one embodiment. The dispatch queue contains a list of threads (in FIG. 27) (1, 2, . . . , N) running on the CPU (in FIG. 27). The Page Table (in FIG. 27) may be used to translate a VA to a PA. In FIG. 27, Page Miss Logic (in FIG. 27) is used to retrieve Page X (in FIG. 27) from the Page File (in FIG. 27) on a page miss.

In other embodiments, the memory address translation and page table logic corresponding to that shown in FIG. 27 may be more complex (e.g. more detailed, more complicated, more levels of addressing, etc.) than shown in FIG. 27 and may include other features (e.g. multiple CPUs, multiple cores, nested page tables, hierarchical addresses, hierarchical page tables, multiple page tables, some features implemented in hardware, some features implemented in hardware, intermediate caches, multiple modes of addressing, etc.), but the basic principles may remain as shown in FIG. 27.

Figure 28:
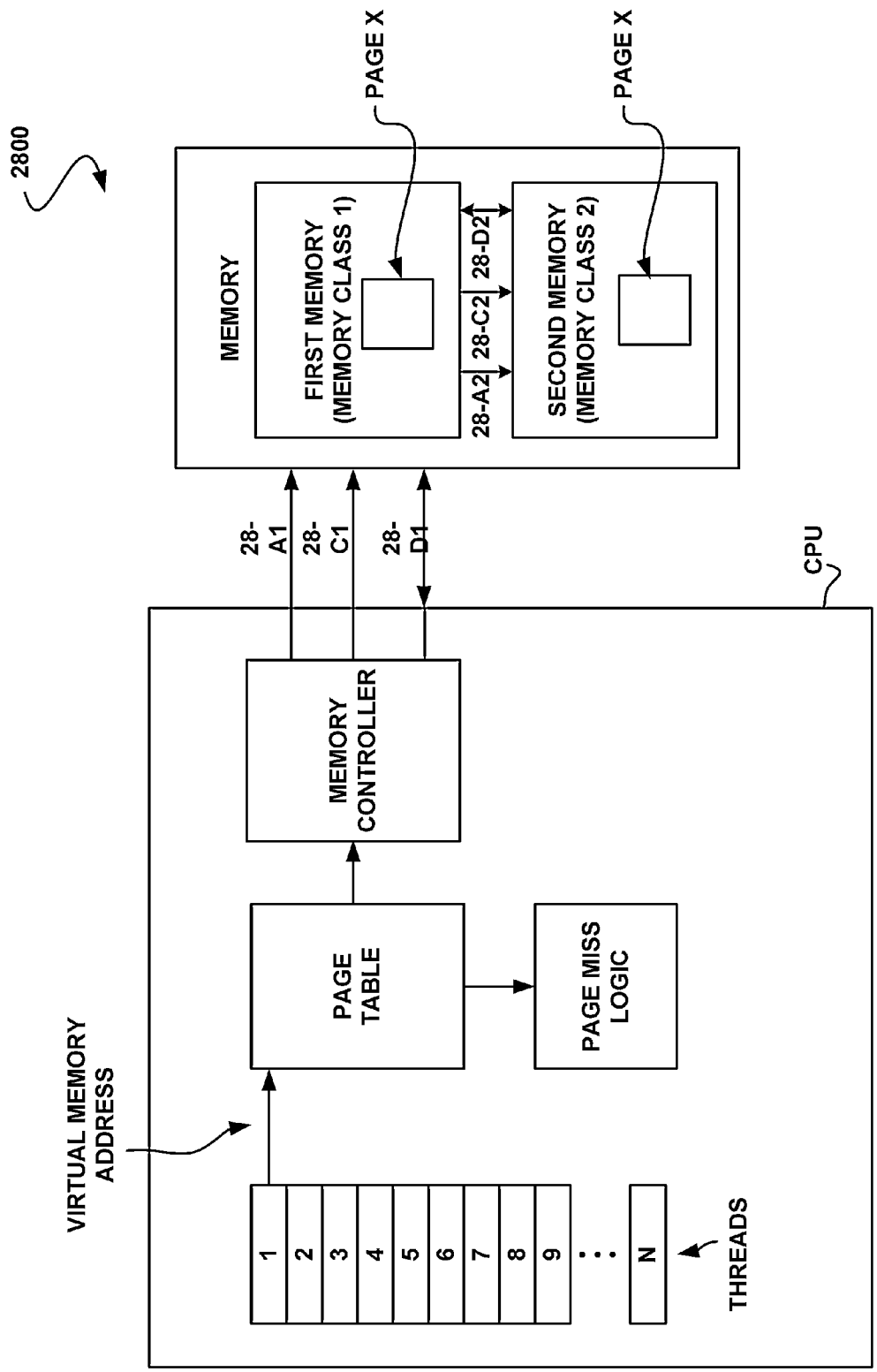
FIG. 28 shows a system with the PM comprising memory class 1 and memory class 2 using a standard memory bus, in accordance with one embodiment.

FIG. 28 shows a system with the PM comprising memory class 1 (in. FIG. 28) and memory class 2 (in FIG. 28) using a standard memory bus, in accordance with one embodiment. As an option, the exemplary system of FIG. 28 may be implemented in the context of the architecture and environment of the previous Figure(s), or any subsequent Figure(s). Of course, however, the exemplary system of FIG. 28 may be implemented in the context of any desired environment. Thus, for example, in one embodiment additional signals may be added to either memory bus shown in FIG. 28. In some embodiments the Control Bus 28-C1 and/or Control Bus 28-C2 may be bidirectional In FIG. 28, the standard memory bus comprises: Address Bus 28-A1, Data Bus 28-D1, and Control Bus 28-C1. In FIG. 28 a second memory bus comprises: Address Bus 28-A2, Data Bus 28-D2, and Control Bus 28-C2. In FIG. 28, the Page Miss Logic (in FIG. 28) is used to instruct the Memory Controller (in FIG. 28) that a page miss has occurred. The Memory Controller places a command on the Memory Bus to instruct the PM to copy Page X (in FIG. 28) from memory class 2 to memory class 1.

In one embodiment, the CPU (in FIG. 28) uses multiple threads. In one embodiment, the system uses time between executions of threads to fetch (e.g. command, retrieve, move, transfer, etc.) pages (e.g. Page X), as necessary, from memory class 2.

In one embodiment, the fetching of page(s) may be performed in software using hypervisor(s) and virtual machine (s). In other embodiments, the fetching of pages may be performed in hardware. In other embodiments, the fetching of pages may be performed in hardware and/or software.

In one embodiment, memory class 1 may be faster than memory class 2 e.g. (1) memory class 1=DRAM, memory class 2=NAND flash; (2) memory class 1=SRAM, memory class 2=NAND flash; (3) etc.

Figure 29:
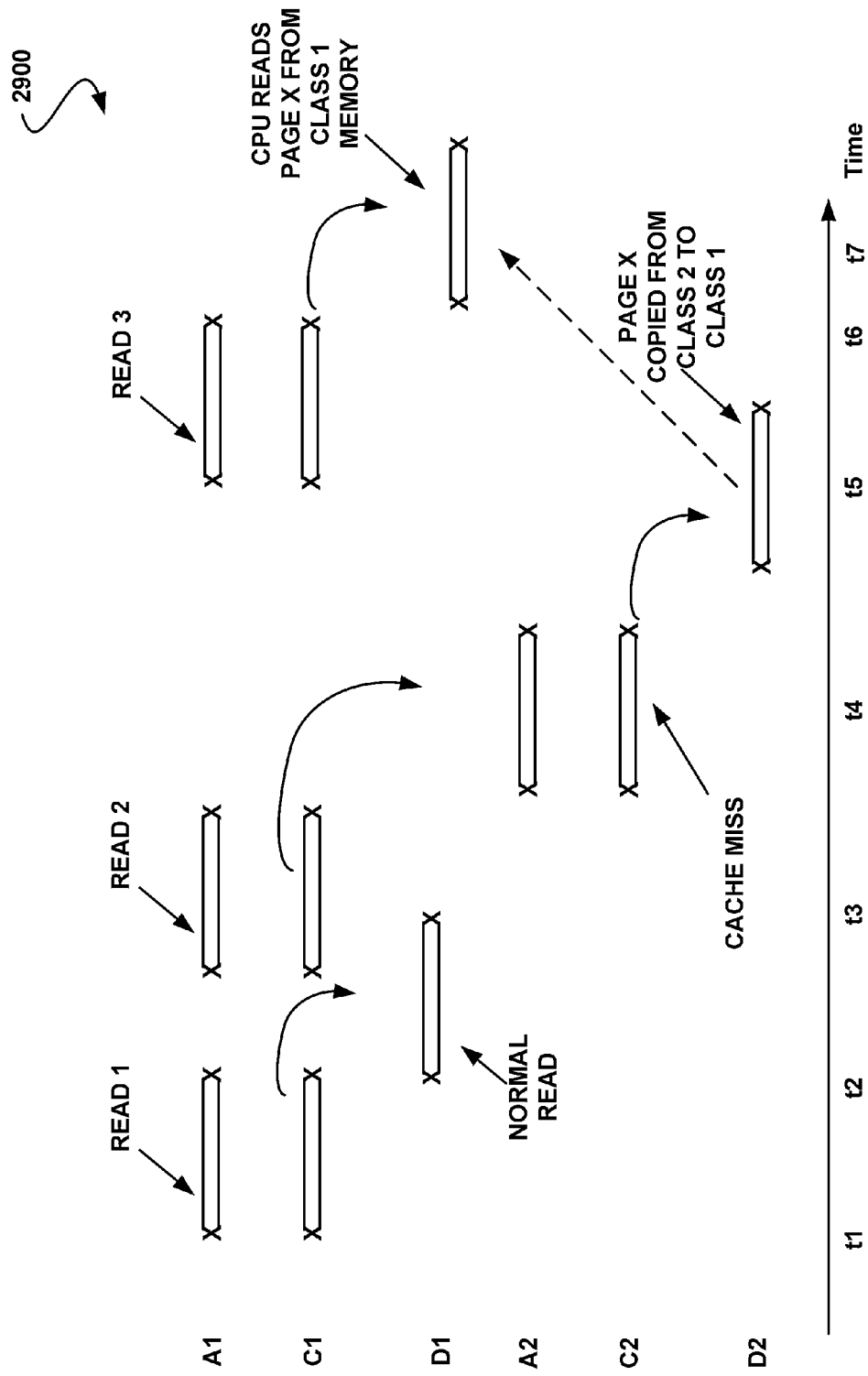
FIG. 29 shows a timing diagram for a system employing a standard memory bus (e.g. DDR2, DDR3, DDR4, etc.), in accordance with one embodiment.

FIG. 29 shows a timing diagram for a system employing a standard memory bus (e.g. DDR2, DDR3, DDR4, etc.), in accordance with one embodiment. As an option, the timing diagram of FIG. 29 may be altered depending on the context of the architecture and environment of systems shown in the previous Figure(s), or any subsequent Figure(s) without altering the function.

In FIG. 29, a normal (e.g. JEDEC standard, etc.) read (READ1 (in FIG. 29)) is placed on the Address Bus A1 and Control Bus C1 at time t1. At time t2 the data from memory class 1 is placed on Data Bus D1. At time t3 a second special [e.g. containing special data (e.g. control, command, status, etc.), non-standard, etc.] read command (READ2 (in FIG. 29)) is placed on bus A1 and C1 as a result of a page miss in the CPU. This special read command READ2 may result in a read command for memory class 2 being placed on bus A2 and C2 at time t4 (labeled Cache Miss in FIG. 29). At time t5 (labeled as Page X copied from memory class 2 to memory Class 1 in FIG. 29), the requested data (copied from memory class 2) is placed on bus D2. At time t6 (labeled as READ3 in FIG. 29), the CPU issues another read command (READ3). This read command is a normal read command and results in the requested data from memory class 1 (e.g. copied from memory class 2, transferred from memory class 2, etc.) being placed on bus D1 at time t7 (labeled as CPU reads Page X from memory class 1 in FIG. 29).

In one embodiment, the CPU and memory hardware may be standard (e.g. unaltered from that which would be used with a memory system comprising a single memory class) and the memory bus may also be standard (e.g. JEDEC standard, etc.).

In other embodiments, the read command READ2 may be a different special command (e.g. write command, etc.). Examples of such embodiments are described below.

In other embodiments, the read command READ2 may be one or more commands (e.g. combinations of one or more standard/special write commands and/or one or more standard/special read commands, etc.). Examples of such embodiments are described below.

Figure 30:
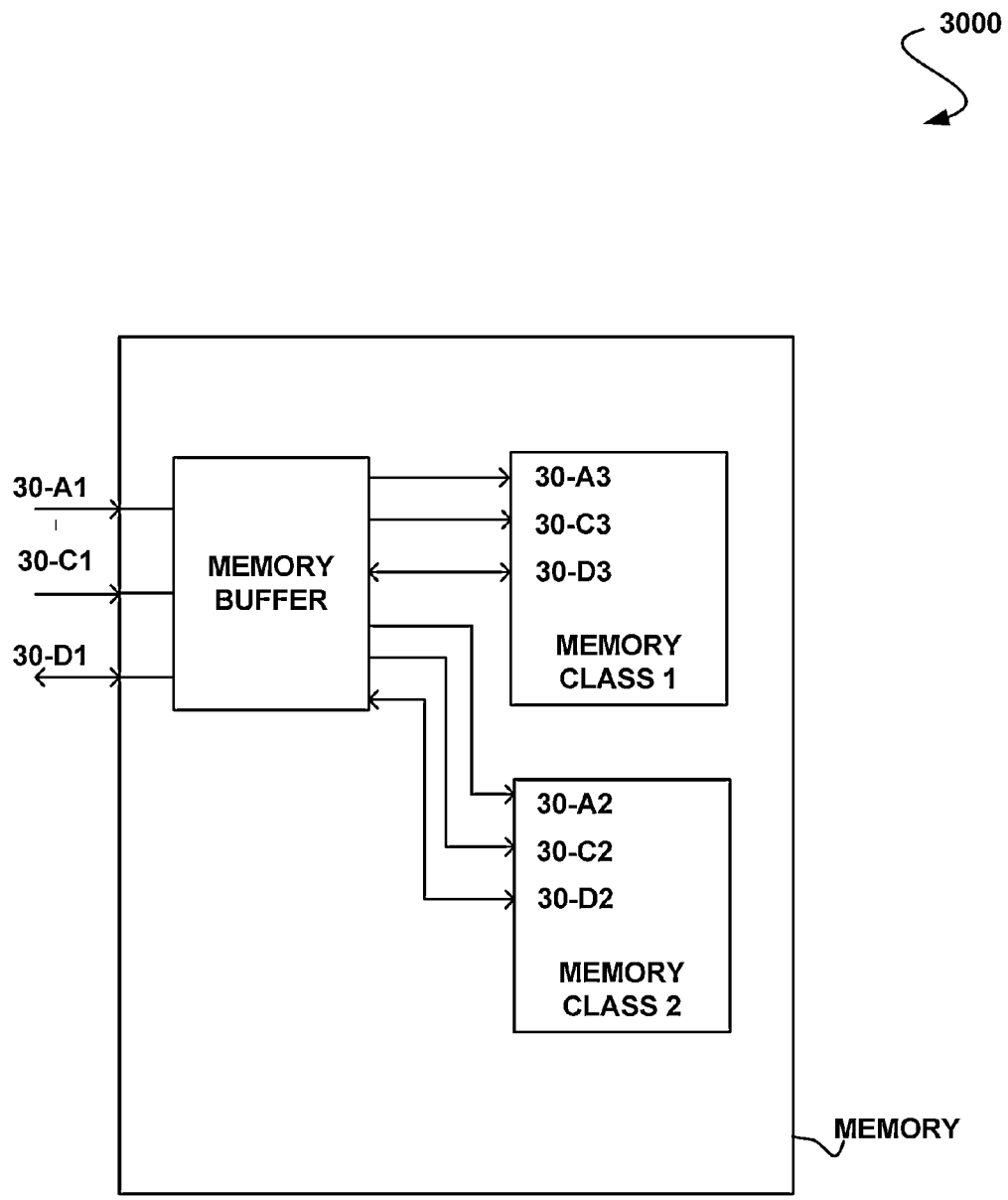
FIG. 30 shows a memory system where the PM comprises a buffer chip, memory class 1 and memory class 2, in accordance with one embodiment.

FIG. 30 shows a memory system where the PM comprises a memory buffer (e.g. buffer, buffer chip, etc.) (in FIG. 30), memory class 1 (in FIG. 30) and memory class 2 (in FIG. 30), in accordance with one embodiment.

As an option, the exemplary system of FIG. 30 may be implemented in the context of the architecture and environment of the previous Figure(s), or any subsequent Figure(s). Of course, however, the exemplary system of FIG. 30 may be implemented in the context of any desired environment.

In FIG. 30, the memory bus (30-A1, 30-C1, and 30-D1) may use a standard bus protocol (e.g. DDR2, DDR3, DDR4, etc.). In FIG. 30, the buffer chip may be coupled to memory class 1 and memory class 2 using standard (e.g. JEDEC standard, etc.) buses: (30-A2, 30-C2, 30-D2) and (30-A3, 30-C3, 30-D3).

In other embodiments, bus (30-A1, 30-C1, 30-D1) and/or (30-A2, 30-C2, 30-D2) and/or bus (30-A3, 30-C3, 30-D3) (or components (e.g. parts, signals, etc.) of these buses, e.g. 30-A1, 30-C1, 30-D1, etc.) may be non-standard buses (e.g. modified standard, proprietary, different timing, etc.).

In other embodiments, the buffer chip may comprise one or more buffer chips connected in series, parallel, series/parallel, etc.

Figure 31:
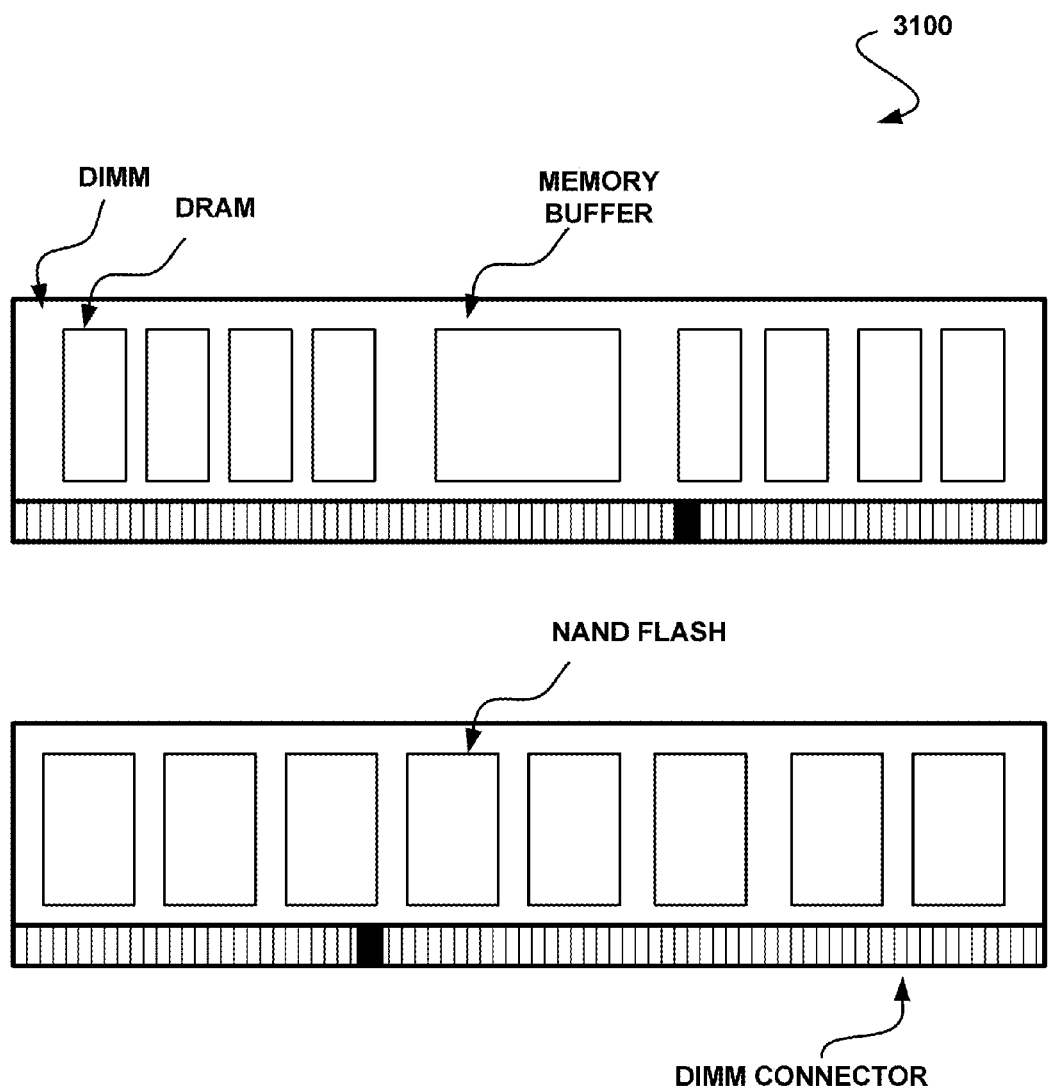
FIG. 31 shows the design of a DIMM that is constructed using a single buffer chip with multiple DRAM and NAND flash chips, in accordance with one embodiment.

FIG. 31 shows the design of a DIMM (in FIG. 31) that is constructed using a single memory buffer (e.g. buffer, buffer chip, etc.) (in FIG. 31) with multiple DRAM (in FIG. 31) and NAND flash chips (in FIG. 31), in accordance with one embodiment.

As an option, the exemplary design of FIG. 31 may be implemented in the context of the architecture and environment of the previous Figure(s), or any subsequent Figure(s). Of course, however, the exemplary design of FIG. 31 may be implemented in the context of any desired environment.

In FIG. 31, a first memory class is packaged in individual chips on a first side of the DIMM. In FIG. 31, a second memory class is packaged in individual chips on the second side of the DIMM. In FIG. 31, a memory buffer is packaged in an individual chip on the first side of the DIMM.

In one embodiment the DIMM may be a standard design (e.g. standard JEDEC raw card, etc.). In such an embodiment, the space constraints may dictate the number and placement (e.g. orientation, location, etc.) of the memory packages. In such an embodiment, the space constraints may also dictate the number and placement of the memory buffer(s).

In other embodiments, the one or more memory classes may be packaged together (e.g. stacked, etc.).

In other embodiments, the one or more memory buffer(s) may be packaged together (e.g. stacked, etc.) with the one or more memory classes.

Figure 32A:
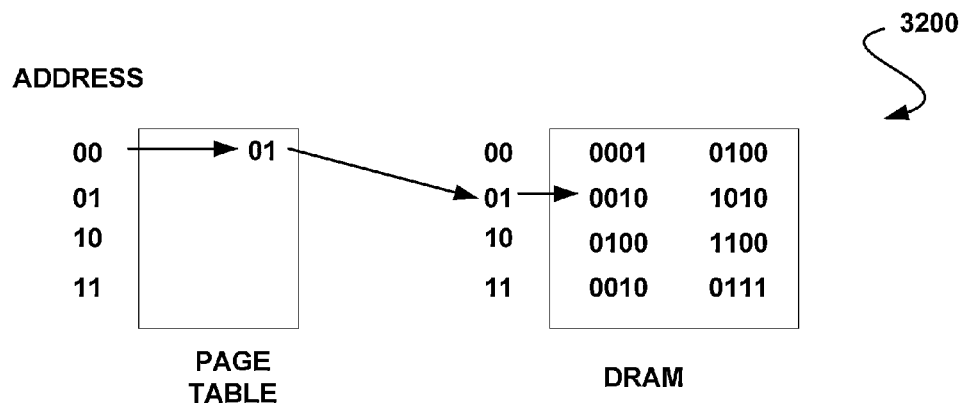
FIG. 32A shows a method to address memory using a Page Table, in accordance with one embodiment.

FIG. 32A shows a method to address memory using a Page Table (in FIG. 37A), in accordance with one embodiment.

In FIG. 32A, the Page Table contains the mappings from VA to PA. As shown in FIG. 32A, VA=00 maps to PA=01 and Page 01 in the Page Table. As shown in FIG. 32A, PA=01 and Page 01 contains data 0010_1010 in the DRAM (in FIG. 37A). As shown in FIG. 32A, the Page Table is 8 bits in total size, has 4 entries, each entry being 2 bits. As shown in FIG. 32A, the DRAM is 32 bits in size. As shown in FIG. 32A, the VA is 2 bits and the PA is 2 bits.

In one embodiment of a CPU architecture, the PA and VA may be different than that shown in FIG. 32A (e.g. 32 bits, 64 bits, different lengths, etc.). In a one embodiment of a memory system architecture, the DRAM may be different (e.g. much larger) than that shown in FIG. 32A (e.g. 1 GB-256 GB, 8 Gbit-2 Tbit, etc.). In one embodiment of a CPU architecture, the page table(s) (and surrounding logic, etc.) may be more complex than that shown in FIG. 32A [e.g. larger, nested, multi-level, combination of hardware/software, including caches, multiple tables, multiple modes of use, hierarchical, additional (e.g. status, dirty, modified, protection, process, etc.) bits, etc.] and may be a page table system rather than a simple page table.

In some embodiments, the page table system(s) may maintain a frame table and a page table. A frame, sometimes called a physical frame or a page frame, is a continuous region of physical memory. Like pages, frames are be page-size and page-aligned. The frame table holds information about which frames are mapped. In some embodiments, the frame table may also hold information about which address space a page belongs to, statistics information, or other background information.

The page table holds the mapping between a virtual address of a page and the address of a physical frame. In some embodiments, auxiliary information may also be kept (e.g. in the page table, etc.) about a page such as a present bit, a dirty bit, address space or process ID information, amongst others (e.g. status, process, protection, etc.).

In some system embodiments, secondary storage (e.g. disk, SSD, NAND flash, etc.) may be used to augment PM. Pages may be swapped in and out of PM and secondary storage. In some embodiments, a present bit may indicate the pages that are currently present in PM or are on secondary storage (the swap file), and may indicate how to access the pages (e.g. whether to load a page from secondary storage, whether to swap another page in PM out, etc.).

In some system embodiments, a dirty bit (or modified bit) may allow for performance optimization. A page on secondary storage that is swapped in to PM, then read, and subsequently paged out again does not need to be written back to secondary storage, since the page has not changed. In this case the dirty bit is not set. If the page was written to, the dirty bit is set. In some embodiments the swap file retains a copy of the page after it is swapped in to PM (thus the page swap operation is a copy operation). When a dirty bit is not used, the swap file need only be as large as the instantaneous total size of all swapped-out pages at any moment. When a dirty bit is used, at all times some pages may exist in both physical memory and the swap file.

In some system embodiments, address space information (e.g. process ID, etc.) is kept so the virtual memory management (VMM) system may associate a pages to a process. In the case, for example, that two processes use the same VA, the page table contains different mappings for each process. In some system embodiments, processes are assigned unique IDs (e.g. address map identifiers, address space identifiers, process identifiers (PIDs), etc.). In some system embodiments, the association of PIDs with pages may be used in the selection algorithm for pages to swap out (e.g. candidate pages, etc.). For example, pages associated with inactive processes may be candidate pages because these pages are less likely to be needed immediately than pages associated with active processes.

In some system embodiments, there may be a page table for each process that may occupy a different virtual-memory page for each process. In such embodiments, the process page table may be swapped out whenever the process is no longer resident in memory.

Thus it may be seen that, as an option, the exemplary design of FIG. 32A may be implemented in the context of the architecture and environment of the previous Figure(s), or any subsequent Figure(s). Of course, however, the exemplary design of FIG. 32A may be implemented in the context of any desired environment.

Figure 32B:
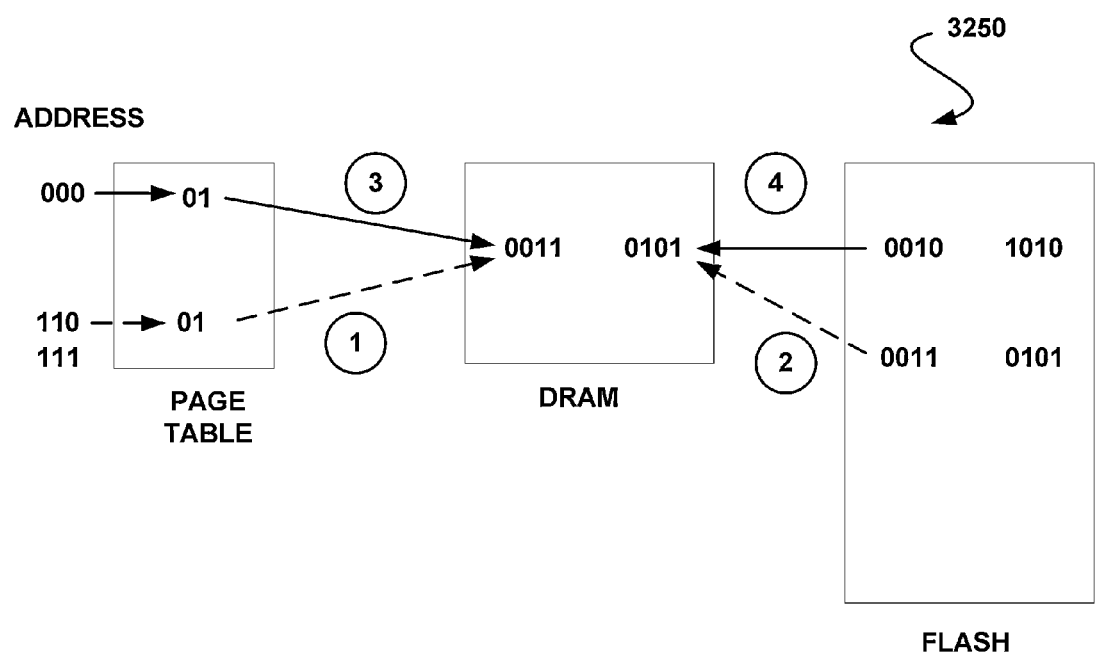
FIG. 32B shows a method to map memory using a window, in accordance with one embodiment.

FIG. 32B shows a method to map memory using a window, in accordance with one embodiment.

In FIG. 32B there are two memory classes: (1) memory class 1, DRAM (in FIG. 32B); (2) memory class 2, NAND flash (in FIG. 32B). In a system corresponding to the diagram of FIG. 32B that contains more than one memory class it is possible that there are insufficient resources (e.g. address space is too small, address bus is too small, software and/or hardware limitations, etc.) to allow the CPU to address all of the memory in the system.

In one embodiment, the method of FIG. 32B may have two distinct characteristics: (1) the memory class 2 address space (e.g. NAND flash size, etc.) may be greater than the address space of the memory bus; (2) data is copied from NAND flash to DRAM before it may be read by the CPU.

In FIG. 32B, a first memory class (e.g. DRAM, etc.) may be used as a movable (e.g. controllable, adjustable, etc.) window into a (larger) second memory class (e.g. NAND flash, etc.). The address space of the window is small enough that it may be addressed by the CPU. The window may be controlled (e.g. moved through the larger address space of the second memory class, etc.) using the page table in the CPU.

FIG. 32B has been greatly simplified to illustrate the method. In FIG. 32B, the Page Table (in FIG. 32B) contains the mappings from VA to PA. As shown in FIG. 32B the Page Table has 16 entries (000-111), each entry being 2 bits. As shown in FIG. 32A, the DRAM is 4 pages, or 32 bits in size. As shown in FIG. 32A, the NAND flash is 8 pages, or 64 bits in size. As shown in FIG. 32A, the VA is 2 bits and the PA is 2 bits. There are 2 bits of PA (corresponding to 4 addresses) so all 8 pages in NAND flash cannot be directly addressed by the CPU. As shown in FIG. 32B, VA=010 initially (indicated by the dotted arrow marked 1) maps to PA=01 and Page 01 in the Page Table. As shown in FIG. 32B, PA=01 and Page 01 contains data 0011_0101 in the DRAM. This data 0011_0101 was previously copied from the NAND flash, as shown (indicated by the dotted arrow marked 2) in FIG. 32B. At a later time the CPU uses VA=000 to access data that is not in DRAM (indicated by the solid arrow marked 3). As shown in FIG. 32B, VA=110 now maps to PA=01 and Page 01 in the Page Table. The old mapping at VA=000 in the Page Table is invalidated (e.g. removed, deleted, marked by using a bit in the page table, etc.). A copy operation is used to move the requested data 0010_1010 from NAND flash to DRAM (indicated by the solid arrow marked 4). The CPU is now able to read data 0010_1010 from the DRAM.

Thus in order to obtain data at VA (e.g. data corresponding to VA=110) the following steps are performed: (1) a page in DRAM is selected (e.g. Page=01) that may be used (e.g. replaced, ejected, etc.); (2) the data (e.g. 0010_1010 at address corresponding to VA=110) is copied from NAND flash to DRAM (e.g. Page=01 in DRAM); (3) the Page Table is updated (e.g. so that VA=110 maps to Page=01); (4) the old Page Table entry (e.g. VA=000) is invalidated; (5) the CPU performs a read to VA (e.g. VA=110); (6) the Page Table maps VA to PA (e.g. from VA=110 to PA=01 and Page=01 in the DRAM); (6) the data is read from PA (e.g. 0010_1010 from DRAM).

In FIG. 32B, the DRAM forms a 32-bit window into the 64-bit NAND flash. In one embodiment, the 32-bit window is divided into 4 sets. Each set may hold a word of 8 bits. Each set may hold one word from the NAND flash. In one embodiment a table (e.g. TLB) in hardware in the CPU or software (e.g. in the OS, in a hypervisor, etc.) keeps the mapping from VA to PA as a list of VAs. In one embodiment, the list of VAs may be a rolling list. For example, 8 VAs may map to 4 PAs, as in FIG. 32B. In such an embodiment, as PAs in the DRAM are used up a new map is added and the old one invalidated, thus forming the rolling list. Once all 8 spaces have been used, the list is emptied (e.g. TLB flushed, etc.) and the list started again.

In one embodiment (A), the CPU and/or OS and/or software (e.g. hypervisor, etc.) may keep track of which pages are in DRAM. In such an embodiment (A), a hypervisor may perform the VA to PA translation, determine the location of the PA, and may issue a command to copy pages from NAND flash to DRAM if needed.

In another embodiment (B), a region of NAND flash may be copied to DRAM. For example, in FIG. 32B, if an access is required to data that is in the upper 32 bits of the 64-bit NAND flash, a region of 32 bits may be copied from NAND flash to the 32-bit DRAM.

In other embodiments, combinations of embodiment (A) and embodiment (B), as just described, may be used.

In a one embodiment of a CPU architecture, the PA and VA may be different than that shown in FIG. 32B (e.g. 32 bits, 64 bits, different lengths, etc.). In a one embodiment of a memory system architecture, the DRAM may be different (e.g. much larger) than that shown in FIG. 32B (e.g. 1 GB-256 GB, 8 Gbit-2 Tbit, etc.). In a one embodiment of a CPU architecture, the page table(s) (and surrounding logic, etc.) may be more complex than that shown in FIG. 32B.

Thus, for example, in embodiments using multiple memory classes together with an existing CPU and/or OS architecture, the architecture may be more complex than that shown in FIG. 32B both in order to accommodate the existing architecture and because the architecture is inherently more complex than that shown in FIG. 32B.

In other embodiments, the page table(s) may be more complex than shown in FIG. 32B (e.g. larger, nested, multi-level, combination of hardware/software, include caches, use table lookaside buffer(s) (e.g. TLB, etc.), use multiple tables, have multiple modes of use, be hierarchical, use additional (e.g.

status, dirty, modified, protection, process, etc.) bits, or use combinations of any these, etc.). In some embodiments, the page table may be a page table system (e.g. multiple tables, nested tables, combinations of tables, etc.) rather than a simple page table.

In FIG. 32B, for the purposes of addressing the DRAM may also be viewed as a cache for the NAND flash. As such any addressing and caching scheme may be used in various alternative embodiments. For example, in some embodiments, the addressing scheme may use tags, sets, and offsets. In some embodiments, the address mapping scheme may use direct mapping, associative mapping, n-way set associative mapping, etc. In some embodiments, the write policy for the memory classes may be write back, write through, etc.

Thus it may be seen that, as an option, the exemplary design of FIG. 32B may be implemented in the context of the architecture and environment of the previous Figure(s), or any subsequent Figure(s). Of course, however, the exemplary design of FIG. 3B may be implemented in the context of any desired environment.

In some embodiments memory class 1 may be SRAM, memory class 2 may be DRAM, etc. In some embodiments memory may be of any technology (e.g. SDRAM, DDR, DDR2, DDR3, DDR4, GDDR, PRAM, MRAM, FeRAM, embedded DRAM, eDRAM, SRAM, etc.).

Figure 33:
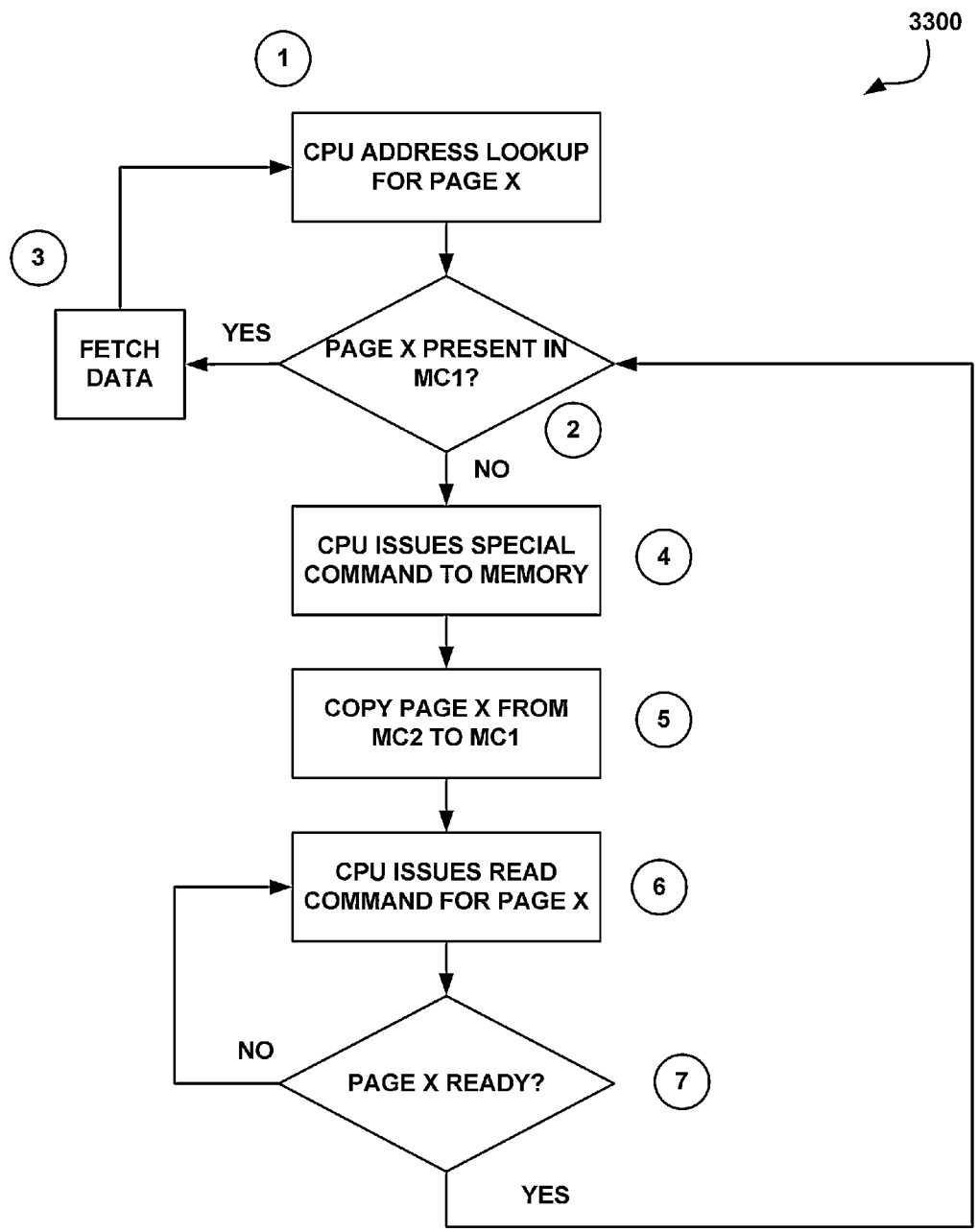
FIG. 33 shows a flow diagram that illustrates a method to access PM that comprises two classes of memory, in accordance with one embodiment.

FIG. 33 shows a flow diagram that illustrates a method to access PM that comprises two classes of memory, in accordance with one embodiment.

In other embodiments: (1) Step 2 may be performed by the CPU, by software (e.g. hypervisor, etc.) or by the memory system; (2) Step 4 may be a READ command that may trigger the memory system to copy from memory class 2 (MC2) to memory class 1 (MC1) if required; (3) Step 4 may be a WRITE command to a special location in PM that may trigger the memory system to copy from memory class 2 (MC2) to memory class 1 (MC1) if required; (4) Step 6 may be a retry mechanism (either part of a standard e.g. JEDEC, etc. or non-standard); (5) Step 4 may be a READ command to which the PM may respond (e.g. with a special code, status, retry, etc.); (6) Step 6 may be a poll (e.g. continuous, periodic, repeating, etc.) from the CPU to determine if data has been copied to MC1 and is ready; (7) the PM may respond in various ways in step 7 (e.g. retry, special data with status, expected time to complete, etc.).

Figure 34:
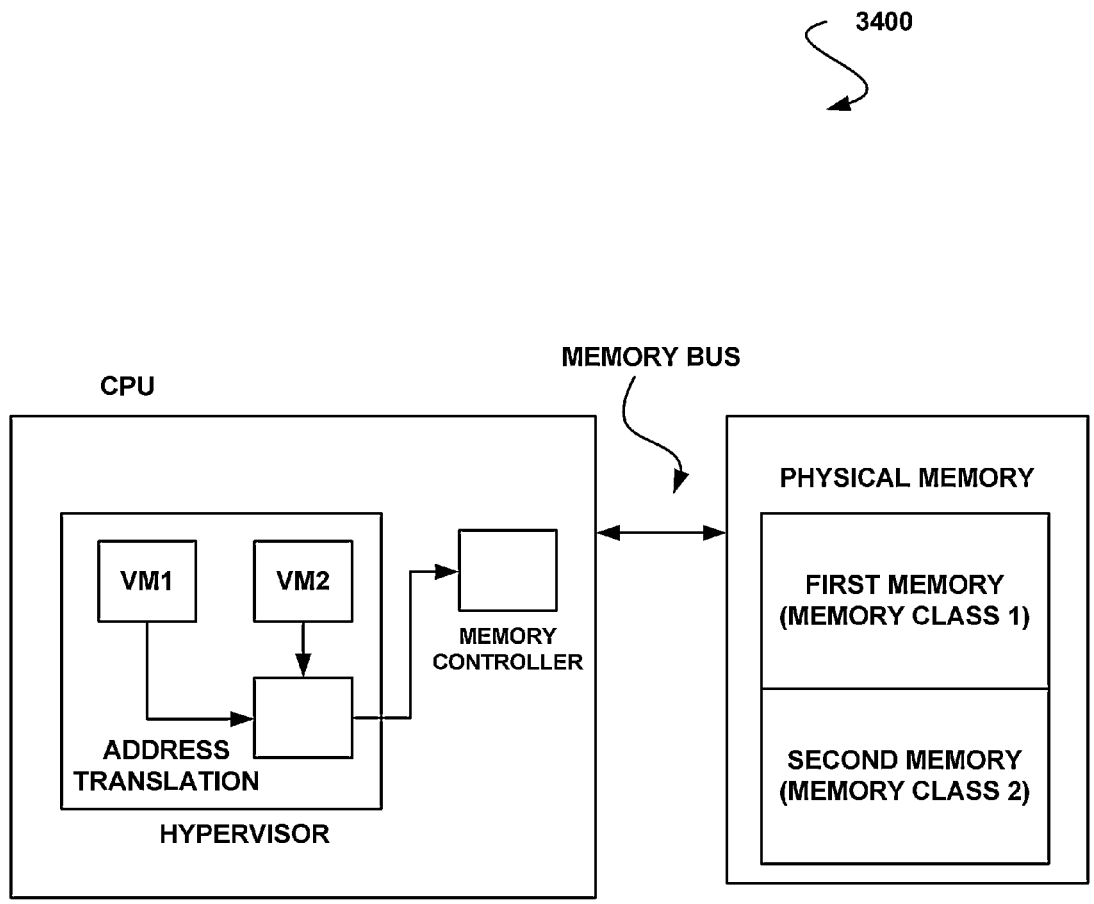
FIG. 34 shows a system to manage PM using a hypervisor, in accordance with one embodiment.

FIG. 34 shows a system to manage PM using a hypervisor, in accordance with one embodiment.

In FIG. 34, the Hypervisor (in FIG. 34) may be a software module and may allow the CPU (in FIG. 34) to run multiple VMs. In FIG. 34, the Hypervisor contains two VMs, VM1 (in FIG. 34) and VM2 (in FIG. 34). In FIG. 34 VM2 may make a request for VA1. The Address Translation (in FIG. 34) block in the Hypervisor translates this address to VA2. Using a custom address translation block may allow the Hypervisor to determine if VA2 is held in memory class 1 (MC1) (in FIG. 34) or in memory class 2 (MC2) (in FIG. 34). If the data is held in MC2 then one of the mechanisms or methods already described may be used to copy (or transfer, move, etc.) the requested data from MC2 to MC1.

In some embodiments, the Address Translation block may be in hardware. In other embodiments, the Address Translation block may be in software. In some embodiments, the Address Translation block may be a combination of hardware and software.

Figure 35:
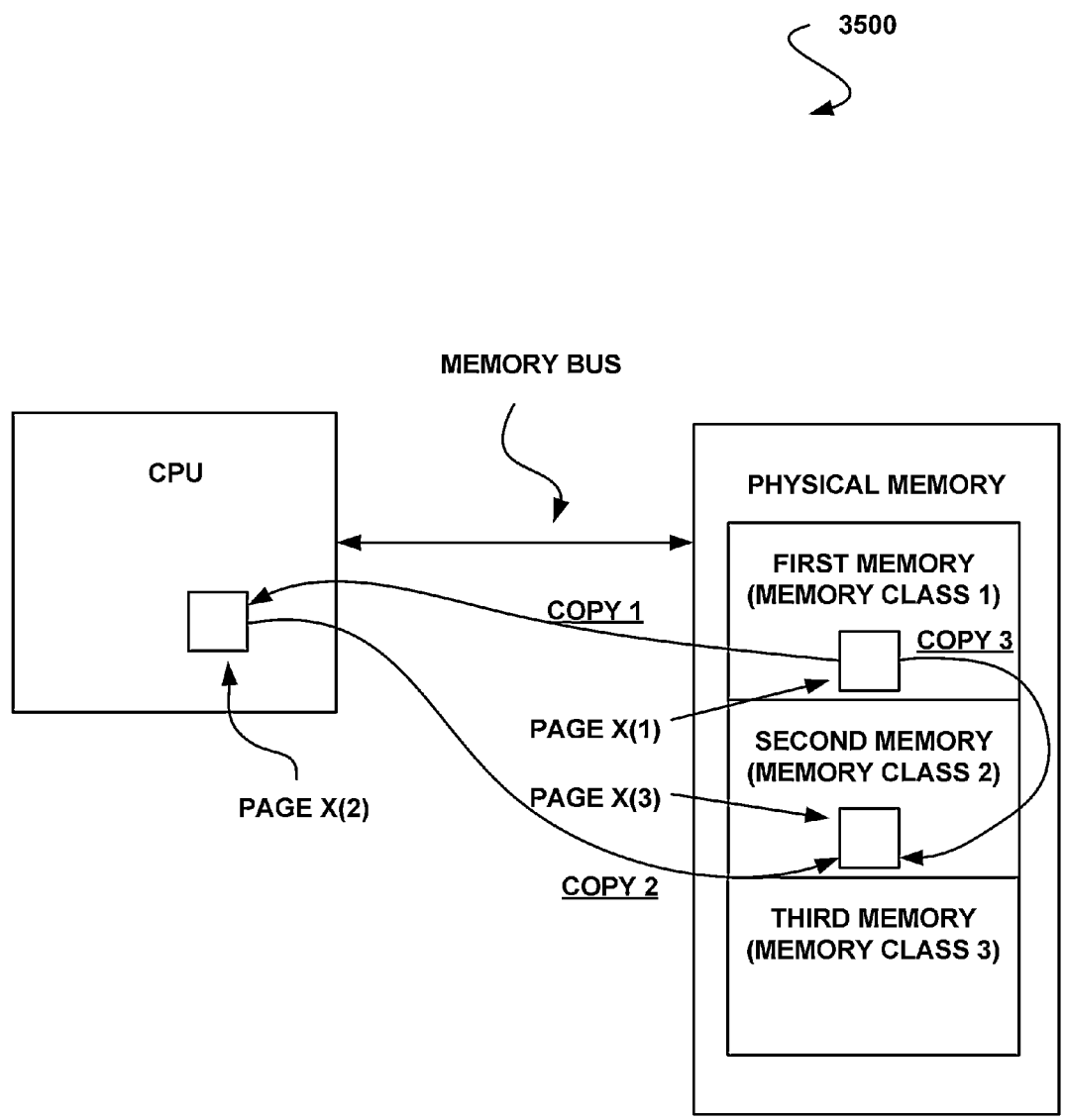
FIG. 35 shows details of copy methods in a memory system that comprises multiple memory classes, in accordance with one embodiment.

FIG. 35 shows details of copy methods in a memory system that comprises multiple memory classes, in accordance with one embodiment.

As an option, the exemplary methods of FIG. 35 may be implemented in the context (e.g. in combination with, as part of, together with, etc.) of the architecture and environment of the previous Figure(s), or any subsequent Figure(s).

In a memory system with multiple memory classes, copies between two (or more) memory classes may be performed using several methods (or combinations of methods, etc.).

A first method is shown in FIG. 35 and uses two steps: Copy 1 and Copy 2. In this method Copy 1 copies Page X (1) (in FIG. 35) from memory class 1 (in FIG. 35) to Page X (2) (in FIG. 35) in the CPU (in FIG. 35) using the Memory Bus (in FIG. 35). In one embodiment, the CPU may perform Copy 1. Other methods of performing Copy 1 include, but are not limited to: (1) use of direct cache injection; (2) use of a DMA engine; (3) other hardware or software copy methods; (4) combinations of the above. Copy 2 then copies Page X (2) to Page X (3) (in FIG. 35) using the Memory Bus. The CPU may also perform Copy 2, although other methods of performing Copy 2 are possible. Copy 1 and Copy 2 do not have to use the same methods, but they may.

A second method in FIG. 35 uses a single step (Copy 3) and does not necessarily require the use of the Memory Bus. In one embodiment, the Memory Bus may be a high-bandwidth and constrained resource. In some embodiments, use of the Memory Bus for CPU traffic may be maximized while use for other purposes may be minimized. For example, some embodiments may avoid using the Memory Bus for copies between memory classes.

In FIG. 35 the step labeled Copy 3 copies Page X (1) in memory class 1 directly to Page X (3) in memory class 2 (in FIG. 35). The step Copy 3 may be initiated by the CPU using a command over the Memory Bus. The step Copy 3 may also be initiated by a memory controller (not shown in FIG. 35) in the memory system. The memory controller or memory controllers may be located anywhere in the system as shown in several previous embodiments: (1) e.g. in a buffer chip located on a DIMM, motherboard, etc; (2) embedded on one or more of the chips, packages etc. that contain one or more of the memory classes shown in FIG. 35; (3) part of the CPU; (4) a combination of the above.

In FIG. 35, one or more triggers (e.g. commands, signals, etc.) for the memory controller to initiate a copy may include: (1) wear-leveling of one of the memory classes; (2) maintenance of free space in one of the memory classes; (3) keeping redundant copies in multiple memory classes for reliability; (4) de-staging of cached data from one memory class to another; (5) retrieval of data on a CPU command; (6) other triggers internal to the memory system; (6) other external triggers e.g. from the CPU, OS, etc; (7) other external triggers from other system components or software; (8) combinations of any of the above.

In FIG. 35, during the step Copy 3 in some embodiments the memory controller may also perform an operation on the Memory Bus during some or all of the period of step Copy 3. In one embodiment, the following sequence of steps may be performed, for example: (1) disconnect the Memory Bus from the CPU; (2) raise a busy flag (e.g. assert a control signal, set a status bit, etc.); (3) issue a command to the CPU; (4) alter the normal response, protocol, or other behavior; (5) any combination of the above.

In FIG. 35, in some embodiments, the memory controller may also interact with the CPU before, during, or after the step Copy 3 using a control signal (e.g. sideband signal, etc.) separate from the main Memory Bus or part of the Memory Bus. The control signal (not shown in FIG. 35) may use: (1) a separate wire; (2) separate channel; (3) multiplexed signal on the Memory Bus; (4) alternate signaling scheme; (5) a combination of these, etc.

In some embodiments, one copy method may be preferred over another. For example, in a system where performance is important an embodiment may use a single copy that avoids using the Memory Bus. In a system where power is important an embodiment may use a slow copy using the Memory Bus that may use less energy.

The choice of embodiments and copy method(s) may depend on the relative power consumption of the copy method(s) and other factors. It is also possible, for example, that a single copy without the use of the Memory Bus consumes less power than a copy that does require the use of the Memory Bus. Such factors may change with time, user and/or system preferences, or other factors etc. For example, in various embodiments, the choice of copy method(s) may depend on: (1) whether the system is in "sleep", power down, or other special power-saving mode (e.g. system failure, battery low, etc.) or other performance mode etc; (2) the length (e.g. file size, number of pages, etc.), type (e.g. contiguous, sequential, random, etc.), etc. of the copy; (3) any special requirements from the user, CPU, OS, system, etc. (e.g. low latency required for real-time transactions (e.g. embedded system, machine control, business, stock trading, etc.), games, audio, video or other multi-media content, etc.). In some embodiments, the system may modify (e.g. switch, select, choose, change, etc.) the copy method either under user and/or system control in a manual and/or automatic fashion. In some embodiments, the system may modify copy methods during a copy.

Figure 36:
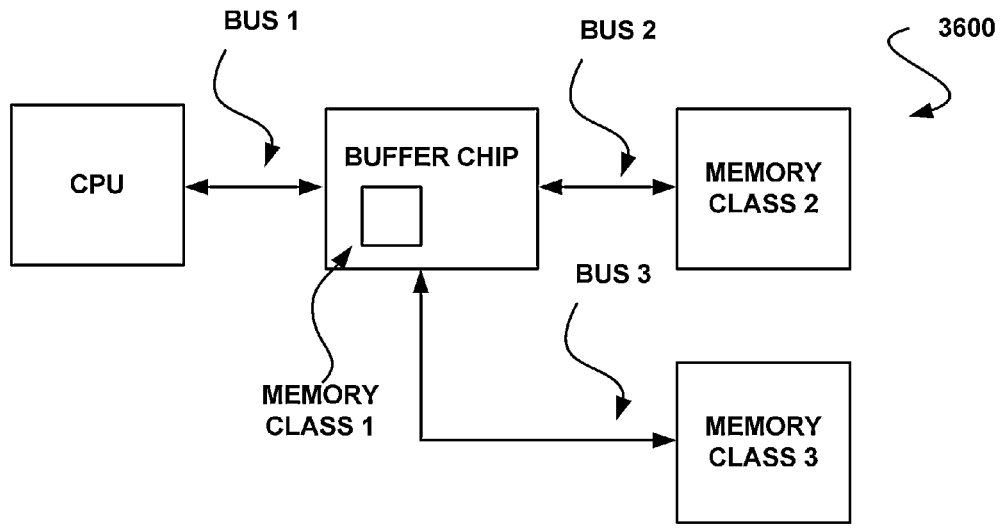
FIG. 36 shows a memory system architecture comprising multiple memory classes and a buffer chip with memory, in accordance with one embodiment.

FIG. 36 shows a memory system architecture comprising multiple memory classes and a buffer chip with memory, in accordance with one embodiment. As an option, the exemplary architecture of FIG. 36 may be implemented in the context (e.g. in combination with, as part of, together with, etc.) of the architecture and environment of the previous Figure(s), or any subsequent Figure(s).

As shown in FIG. 36, the buffer chip (in FIG. 36) may be connected between the CPU (in FIG. 36) and multiple memory classes. In FIG. 36, the buffer chip is shown connected to memory class 2 (in FIG. 36) using Bus 2 (in FIG. 36) and connected to memory class 3 (in FIG. 36) using Bus 3 (in FIG. 36).

In one embodiment, memory class 1 (in FIG. 36) may be used as a cache for the rest of the memory system (comprising memory class 2 and memory class 3). In such an embodiment the PA from the CPU etc. may be divided into tag, block and offset to determine if requested data is present in the cache. In various embodiments, the type of cache mapping (e.g. direct mapping, fully associative, k-way associative, etc.) and the cache policy (e.g., write back, write through, etc.) may be implemented in any desired manner.

Other embodiments may include (but are not limited to) the following variations: (1) more than two memory classes may be connected to the buffer chip; (2) less than two memory classes may be connected to the buffer chip (3); the memory classes may be any memory technology (e.g. DRAM, NAND flash, etc); (4) Bus 2 and Bus 3 may be combined or separate as shown; (5) alternative bus arrangements may be used: e.g. a common bus, multi-drop bus, multiplexed bus, bus matrix, switched bus, split-transaction bus, PCI bus, PCI Express bus, HyperTransport bus, front-side bus (FSB), DDR2/DDR3/DDR4 bus, LPDDR bus, etc; (6) memory class 2 and memory class 3 may be combined on the same chip or in the same package; (7) memory class 2 may be embedded, contained or part of memory class 3; (8) memory class 1 may be located in a different part of the system physically while still logically connected to the buffer chip; (9) any combination of the above. In FIG. 36, the buffer chip is shown as containing memory class 1. memory class 1 may be a special class of memory e.g. fast memory, such as SRAM or embedded DRAM for example, used as a cache, scratchpad or other working memory etc. that the buffer chip may use to hold data that needs to be fetched quickly by the CPU for example. Other examples of use for memory class 1 (or any of the other memory classes separately or in combination with memory class 1) may include: (1) test, repair, re-mapping, look-aside etc. tables listing, for example, bad memory locations in one or more of the memory classes; (2) page tables; (3) other memory address mapping functions; (4) cache memory holding data that later be de-staged to one or more of the other memory classes; (5) timing parameters used by the system and CPU; (6) code and data that may be used by the buffer chip; (7) power management (e.g. the buffer chip, OS, CPU etc. may turn off other parts of the system while using memory class 1 to keep energy use low etc.); (8) log files for memory-mapped storage in one or more of the memory classes; (9) combinations of the above.

Figure 37:
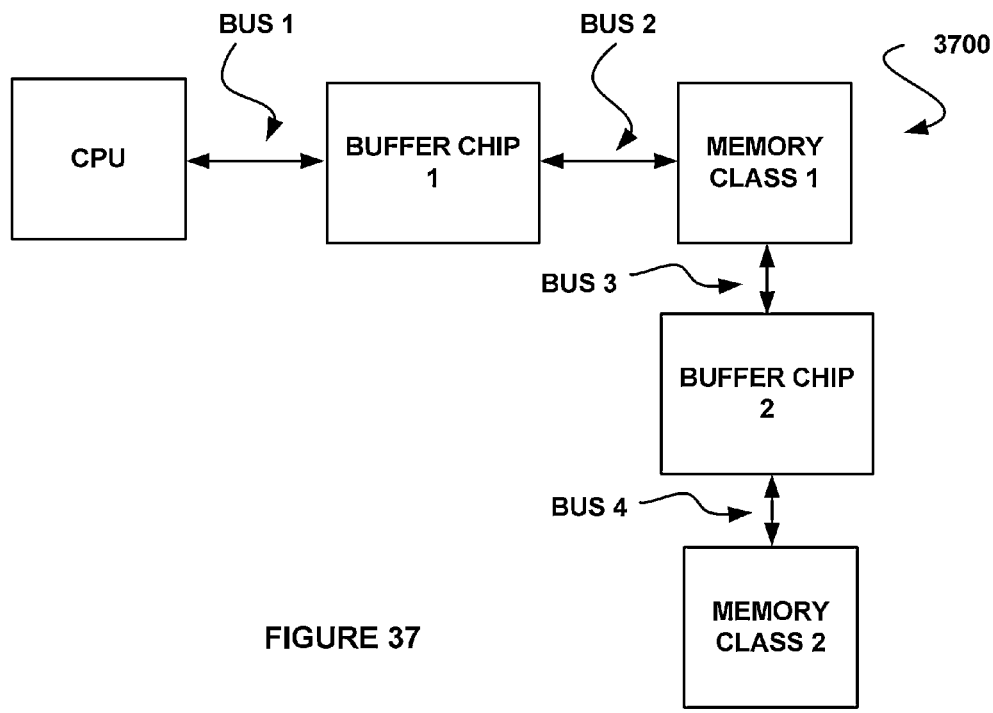
FIG. 37 shows a memory system architecture comprising multiple memory classes and multiple buffer chips, in accordance with one embodiment.

FIG. 37 shows a memory system architecture comprising multiple memory classes and multiple buffer chips, in accordance with one embodiment. As an option, the exemplary architecture of FIG. 37 may be implemented in the context (e.g. in combination with, as part of, together with, etc.) of the architecture and environment of the previous Figure(s), or any subsequent Figure(s).

In FIG. 37, buffer chip 1 (in FIG. 37) interfaces the CPU (in FIG. 37) and memory class 1 (in FIG. 37) and buffer chip 2 (in FIG. 37) interfaces memory class 1 and memory class 2 (in FIG. 37). For example in one embodiment, Bus 1 (in FIG. 37) may be a standard memory bus such as DDR4. memory class 1 may be a fast memory such as SRAM. In such an embodiment Bus 2 (in FIG. 37) may be different (e.g. use a different protocol, timing etc.) than Bus 1. In FIG. 37, buffer chip 1 may perform a conversion of timing, protocol etc. In FIG. 37, memory class 1 is shown as separate from buffer chip 1 and memory class 1.

In alternative embodiments, memory class 1 may be: (1) part of buffer chip 1; (2) part of buffer chip 2; (3) embedded with one or more other parts of the system; (4) packaged with one or more other parts of the system (e.g. in the same integrated circuit package).

In FIG. 37, memory class 1 is shown as using more than one bus e.g. Bus 2 and Bus 3 (in FIG. 37). In one embodiment, memory class 1 is an embedded DRAM or SRAM that is part of one or more of the buffer chips. In alternative embodiments, memory class 1 may not use a shared bus.

In other embodiments: (1) memory class 1 may use a single bus shared between buffer chip 1 and buffer chip 2 for example; (2) buffer chip 1 and buffer chip 2 may be combined and share a single bus to interface to memory class 1; (3) buffer chip 2 may interface directly to buffer chip 1 instead of (or in addition to) memory Class 1; (4) any combinations of the above.

In one embodiment, memory class 1 may be a fast, small memory (such as SRAM, embedded DRAM, SDRAM, etc.) and able to quickly satisfy requests from the CPU. In such an embodiment, memory class 2 may be a larger and cheaper but slower memory (such as NAND flash, SDRAM, etc.).

The various optional features of the architectures based on that shown in FIG. 37 (and other similar architectures presented in other Figure(s) here) include (but are not limited to): (1) low power (e.g. using the ability to shut down memory class 2 in low-power modes, etc.); (2) systems design flexibility (e.g. while still using an existing standard memory bus for Bus 1 with new technology for remaining parts of the system, or using a new standard for Bus 1 and/or other system components while using existing standards for the rest of the system, etc.); (3) low cost (e.g. mixing high performance but high cost memory class 1 with lower performance but lower cost memory class 2, etc.); (4) upgrade capability, flexibility with (planned or unplanned) obsolescence (e.g. using an old/new CPU with new/old memory, otherwise incompatible memory and CPU, etc.); (5) combinations of the above.

In alternative embodiments, Bus 1 and Bus 2 (or any combination Bus X and Bus Y of the bus connections shown in FIG. 37, such as Bus 3 and Bus 4 (in FIG. 37), Bus 2 and Bus 3, or other combinations of 2, 3, or 4 buses etc.) may use: (1) the same protocol; (2) the same protocol but different timing versions (e.g. DDR2, DDR3, DDR4 but with a different timing, etc.); (3) different data widths (e.g. Bus X may use 64 bits of data and Bus Y may use 512 bits etc.); (4) different physical versions of the same protocol (e.g. Bus X may be a JEDEC standard DDR3 bus with a 72-bit wide bus with ECC protection intended for registered DIMMs; Bus Y may be the same JEDEC standard DDR3 bus but with a 64-bit wide data bus with no ECC protection intended for unbuffered DIMMs, etc.); (5) other logical or physical differences such as type (multi-drop, multiplexed, parallel, split transaction, packet-based, PCI, PCI Express, etc.); (6) combinations of the above.

Figure 38:
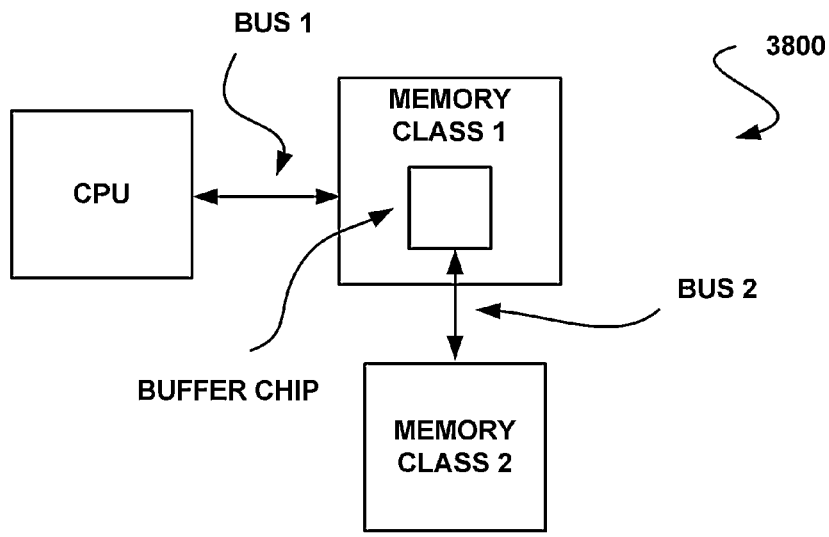
FIG. 38 shows a memory system architecture comprising multiple memory classes and an embedded buffer chip, in accordance with one embodiment.

FIG. 38 shows a memory system architecture comprising multiple memory classes and an embedded buffer chip, in accordance with one embodiment. As an option, the exemplary architecture of FIG. 36 may be implemented in the context (e.g. in combination with, as part of, together with, etc.) of the architecture and environment of the previous Figure(s), or any subsequent Figure(s).

In FIG. 38, the buffer chip (in FIG. 38) is shown as embedded in memory class 1 (in FIG. 38). In alternative embodiments: (1) the buffer chip (or multiple buffer chips) may be packaged with one or more chips, die, etc. comprising one or more components of memory class 1; (2) one or more buffer chips may be connected to one or more of memory class 1 chips, die, components etc. using through-silicon vias (TSV) or other advanced high-density interconnect (HDI) techniques (e.g. chip on board, stacked, wire-bond, etc.); (3) combinations of the above.

In FIG. 38, Bus 1 (in FIG. 38), the memory bus, is shown as connected to memory class 1, but in various embodiments may be connected to the buffer chip, or may be connected to both the buffer chip and memory class 1. In FIG. 38, Bus 2 (in FIG. 38) is shown as connecting the buffer chip and memory Class 2 (in FIG. 38), but in various embodiments may connect memory class 2 to memory class 1 or may connect memory class 2 to both memory Class 1 and the buffer chip. In other embodiments there may be more than two memory classes or a single memory class (omitting memory class 1 or memory class 2).

Some embodiments may emulate the appearance that only a single memory class is present. For example, in one embodiment there may be system modes that require certain features (e.g. low-power operation, etc.) and such an embodiment may modify Bus 2 (e.g. disconnect, shut off, power-down, modify mode, modify behavior, modify speed, modify protocol, modify bus width, etc.) and memory class 2 (shut-off, change mode, power-down, etc.). In other embodiments memory class 2 may be remote or appear to be remote (e.g. Bus 2 may be wireless, memory class 2 may be in a different system, Bus 2 may involve a storage protocol, Bus 2 may be WAN, etc.).

In some embodiments, the system configuration (e.g. number and type of buses, number and technology of memory classes, logical connections, etc.) may, for example, be functionally changed from a two-class memory system to a conventional single-class memory system.

In some embodiments, based on FIG. 38, in which there may be more than two memory classes for example, the system configuration may be changed from n-class to m-class (e.g. from 3 memory classes to 1, 3 classes to 2, 2 classes to 3, etc.) depending on different factors (e.g. power, speed, performance, etc.). Such factors may vary with time and in some embodiments changes to configuration may be made "on the fly" in response for example to the cost of an operation (e.g. length of time, energy cost, battery life, tariffs on cell phone data rate, costs based on data transferred, rates based on time, fees based on copies performed remotely, etc.) and/or the type of operation or operations being performed (e.g. watching a movie, long file copy, long computation, low battery, performing a backup, or combination of these).

In one embodiment, one operation O1 may be started at time t1 on a consumer electronics device (tablet, laptop, cell phone) that requires low performance with high memory capacity but for a short time. The memory configuration may be configured at t1 to use two classes of memory (a 2C system). Then a second operation O2 is started at time t2 (before the first operation O1 has finished) and O2 would ideally use a single-class memory system (1C system). The system, OS, CPU or buffer chip etc. may then decide at t2 to change (e.g. switch, modify, etc.) to a 1C system.

In other embodiments, given certain factors (e.g. speed required, CPU load, battery life remaining, video replay quality, etc.) the system may remain as 2C, as configured at t1. At time t3 the first operation O1 completes. Again at t3 the system may make a decision to change configuration. In this case the system may decide at t3 to switch from 2C to 1C.

Figure 39:
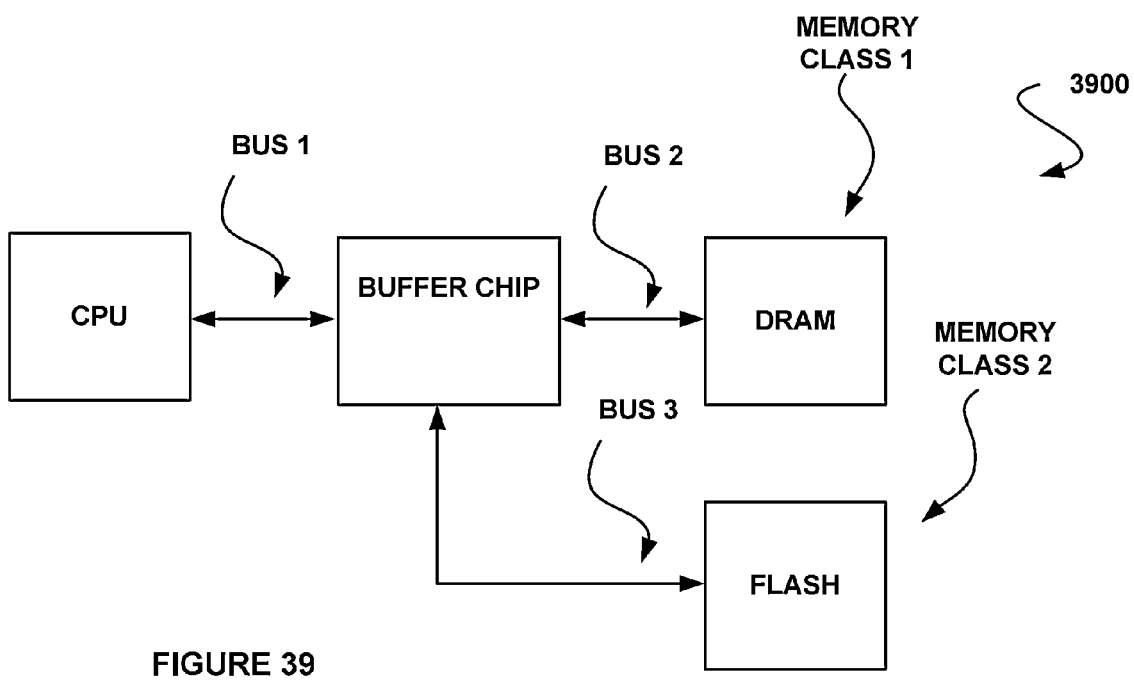
FIG. 39 shows a memory system with two-classes of memory: DRAM and NAND flash, in accordance with one embodiment.

FIG. 39 shows a memory system with two-classes of memory: DRAM (in FIG. 39) and NAND flash (in FIG. 39), in accordance with one embodiment. As an option, the exemplary architecture of FIG. 39 may be implemented in the context (e.g. in combination with, as part of, together with, etc.) of the architecture and environment of the previous Figure(s), or any subsequent Figure(s).

Figure 44:
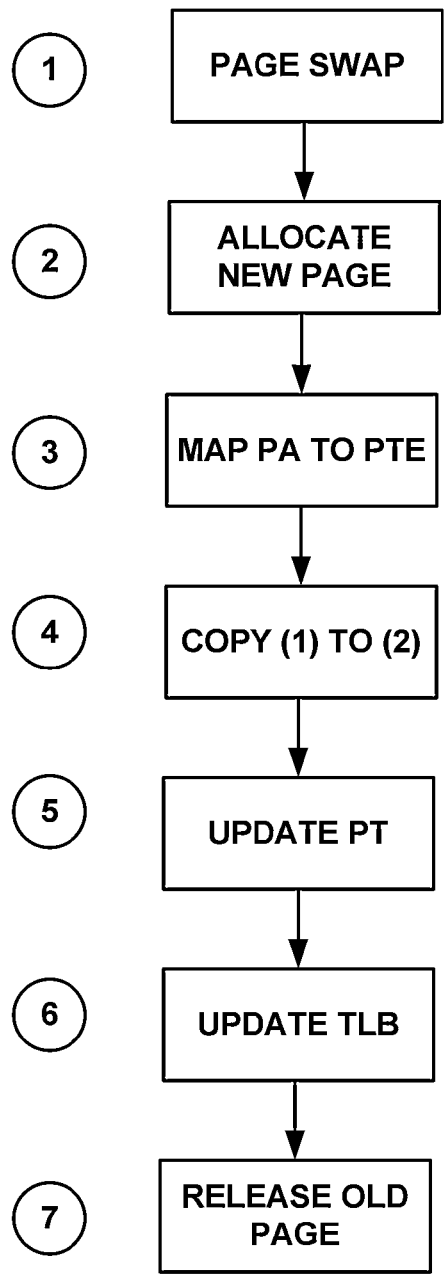
FIG. 44 shows a technique for copy involving modification of the CPU page table, in accordance with one embodiment.

In FIG. 44, the buffer chip (in FIG. 39) is shown separate from memory class 1 (in FIG. 39) and memory class 2 (in FIG. 39). In FIG. 39, the CPU (in FIG. 39) is connected to the buffer chip using Bus 1 (in FIG. 39), the memory system bus; the buffer chip is connected to memory Class 1 using Bus 2 (in FIG. 39); and the buffer chip is connected to memory class 2 using Bus 3 (in FIG. 39). In FIG. 39, memory class 1 is shown as DRAM, and memory class 2 is shown as flash.

In other embodiments: (1) memory class 1 may be any other form of memory technology (e.g. SDRAM, DDR, DDR2, DDR3, DDR4, GDDR, PRAM, MRAM, FeRAM, embedded DRAM, eDRAM, SRAM, etc.); (2) memory class 2 may also be any form of memory technology; (3) memory class 1 and memory class 2 may be the same memory technology but different in: (1) die size or overall capacity (e.g. memory class 1 may be 1 GB and memory class 2 may be 16 GB); (2) speed (e.g. memory class 1 may be faster than memory class 2); (3) bus width or other bus technology; (4) other aspect; (5) a combination of these.

In other embodiments, Bus 1, Bus 2 and Bus 3 may use one or more different bus technologies depending on the memory technology of memory class 1 and memory class 2. Although two memory classes are shown in FIG. 39, in some embodiments the buffer chip may have the capability to connect to more than two memory class technologies. In FIG. 39, memory class 1 and memory class 2 are shown as single blocks in the system diagram.

In some embodiments, both memory class 1 and memory class 2 may each be composed of several packages, components or die. In FIG. 39 both Bus 2 and Bus 3 are shown as a single bus. Depending on how many packages, components or die are used for memory class 1 and memory class 2, in some embodiments both Bus 1 and Bus 3 may be composed of several buses. For example Bus 2 may be composed of several buses to several components in memory class 1. In an embodiment, for example, that memory class 1 is composed of four 1 Gb DRAM die, there may be four buses connecting the buffer chip to memory class 1. In such an embodiment, these four buses may share some signals, for example: (1) buses may share some, all or none of the data signals (e.g. DQ, etc.); (2) buses may share some, all or none of the control signals and command signals (e.g. CS, ODT, CKE, CLK, DQS, DM, etc.); (3) buses may share some, all, or none of the address signals (e.g. bank address, column address, row address, etc.). Sharing of the bus or other signals may be determined by various factors, including but not limited to: (1) routing area and complexity (e.g. on a DIMM, on a motherboard, in a package, etc.); (2) protocol violations (e.g. data collision on a shared bus, timing violations between ranks determined by CS, etc.); (3) signal integrity (e.g. of multiple adjacent lines, caused by crosstalk on a bus, etc.); (4) any combination of these.

Figure 40:
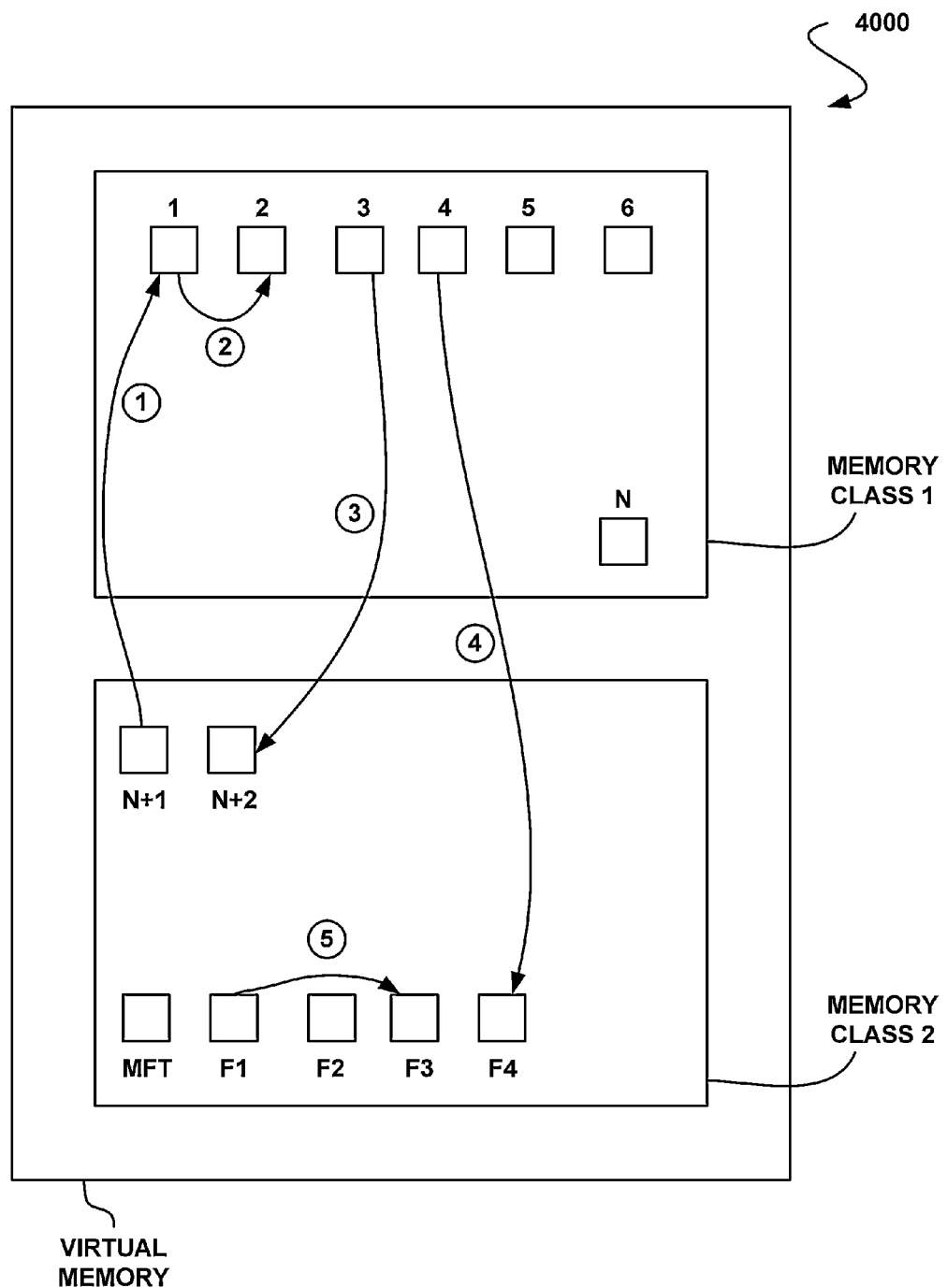
FIG. 40 shows details of page copying methods between memory classes in a memory system with multiple memory classes, in accordance with one embodiment.

FIG. 40 shows details of page copying methods between memory classes in a memory system with multiple memory classes, in accordance with one embodiment.

As an option, the exemplary methods of FIG. 40 may be implemented in the context (e.g. in combination with, as part of, together with, etc.) of the architecture and environment of the previous Figure(s), or any subsequent Figure(s).

In FIG. 40 several examples of methods to copy pages are shown. Not all possible copying options, copying methods, or copying techniques are shown in FIG. 40, but those that are shown are representative of the options, methods, techniques etc. that may be employed in various embodiments.

In FIG. 40, memory class 1 (in FIG. 40) contains pages marked 1 to N. In FIG. 40, in one embodiment, memory class 2 (in FIG. 40) contains pages marked N+1, N+2, etc., as well as pages that are marked MFT, F1, F2, etc. In one embodiment, Page MFT represents a Master File Table or equivalent table that is part of an OS file system. In such an embodiment, the MFT may (and, in some embodiment, may) span more than one page but has been represented as a single page in FIG. 40 for simplicity. In FIG. 40, Page F1, Page F2, etc. represent files that may be in memory class 2 for one or more purposes (e.g. part of a memory-mapped filesystem, for demand paging, part of a filesystem cache, etc.). In FIG. 40, Page F1 (or Page F2, Page F3, etc.) may be a single file, part of a file or contain multiple files. Although only memory class 2 is shown in FIG. 40 as containing files and related tables, one or more files and related tables could also be present in memory class 1, but that has not been shown in FIG. 40 for simplicity.

In FIG. 40, step Copy 1 shows a page being copied from memory class 2 to memory class 1. In FIG. 40, step Copy 2 shows a page being copied, moved, or duplicated in memory class 1. In FIG. 40, step Copy 3 shows a page being copied from memory class 1 to memory class 2. In FIG. 40, step Copy 4 shows a copy from a page in memory class 1 to a file in memory class 2. In FIG. 40, step Copy 5 shows a file being copied, moved or duplicated in memory class 2.

In different embodiments the copy operations described may be triggered by various mechanisms including, but not limited to: (1) using commands from the CPU (or OS, etc.); (2) using commands from one or more buffer chips; (3) combinations of these.

Figure 41:
FIG. 41 shows the timing equations and relationships for the connections between a buffer chip and a DDR2 SDRAM for a write to the SDRAM as shown in FIG. 48, in accordance with one embodiment.
Figure 48:
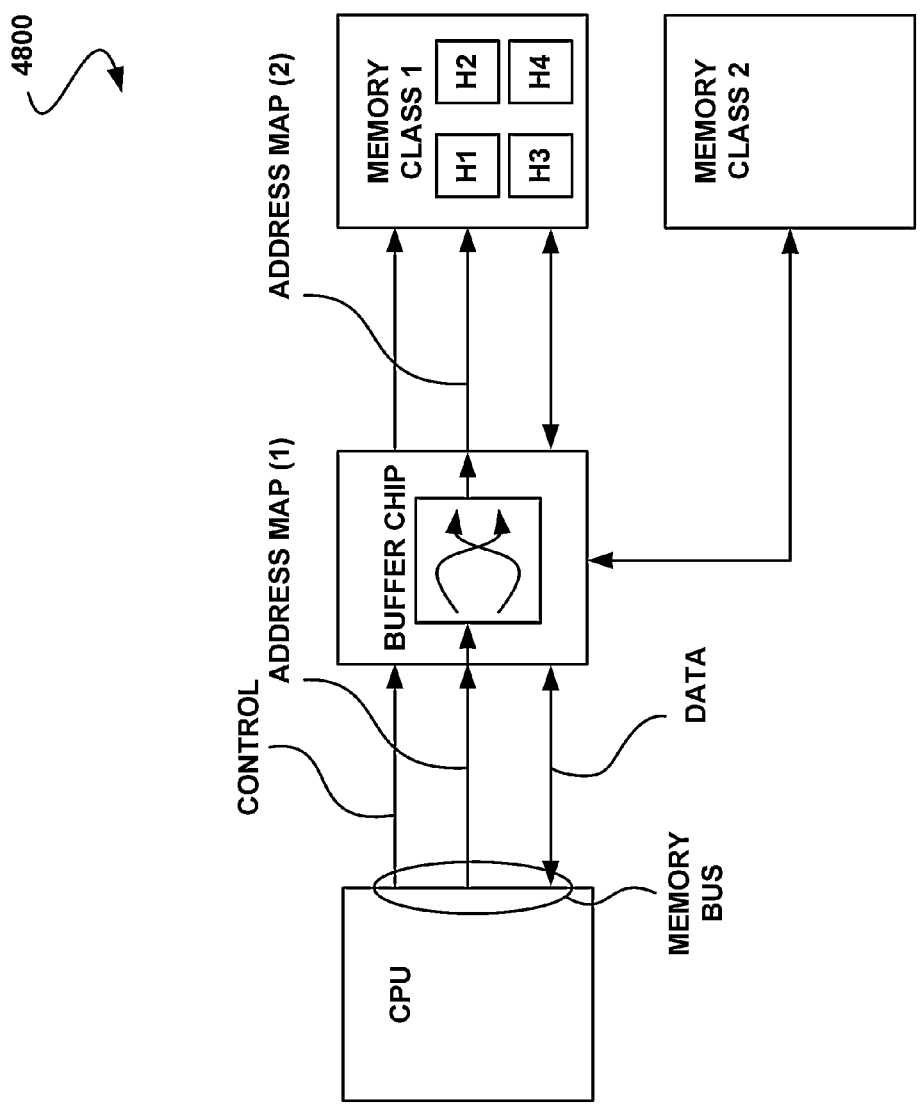
FIG. 48 shows a memory system that alters address mapping functions, in accordance with one embodiment.

FIG. 41 shows the timing equations and relationships for the connections between a buffer chip and a DDR2 SDRAM for a write to the SDRAM as shown in FIG. 48, in accordance with one embodiment.

In FIG. 41, the memory controller in the CPU (not shown) may be configured to operate with DDR2 SDRAM. In FIG. 41, the relationship between read latency of a DDR2 SDRAM (RL, or CL for CAS latency) and the write latency (WL, or CWL) is fixed as follows: WL=RL−1. In this equation "1" represents one clock cycle and the units of RL and WL are clock cycles. The read latency of the DDR2 SDRAM is represented by d2=RL. Then the read latency as seen by the CPU, RLD, can be written in terms of RL and the delays of the buffer chip as follows: RLD=RL+d1+d3. In this equation, d1 represents the delay of the buffer chip for the address bus for reads. The write latency as of the DDR2 SDRAM, WL, can be written in terms of the write latency as seen by the CPU, WLD, and delays of the buffer chip: WL=WLD+d3−d4. In this equation d4 represents the delay of the buffer chip for the address bus for writes. The CPU enforces the same relationship between WLD and RLD as is true for the SDRAM values WL and RL: WLD=RLD−1. Thus, the following equation is true for the protocol between the buffer chip and DDR2 SDRAM: d4=2d3+d1.

This equation implies that the delay of the address bus (and control bus) depends on the type of command (e.g. read, write, etc.). Without this command-dependent delay, the interface between buffer chip and SDRAM may violate standard (e.g. JEDEC standard, etc.) timing parameters of the DDR2 SDRAM.

In various embodiments, logic that introduces a delay may be included in any of the buffer chips present in any designs that are described in other Figure(s) and that interface (e.g. connect, couple, etc.) the CPU to DDR2 SDRAM. In one embodiment, the memory controller and/or CPU may be designed to account for any timing issue caused by the presence of the buffer chip (and thus the equation relating WLD to RLD may no longer be a restriction). In such an embodiment, using a potentially non-standard design of CPU and/or memory controller, the design of the buffer chip may be simplified.

In other embodiments, the logic in the buffer chip may be used to alter the delay(s) of the bus(es) in order to adhere (e.g. obey, meet timing, etc.) to standard (e.g. JEDEC standard, etc.) timing parameters of the DDR2 SDRAM.

Figure 42:
FIG. 42 shows the timing equations and relationships for the connections between a buffer chip and a DDR3 SDRAM for a write to the SDRAM as shown in FIG. 48, in accordance with one embodiment.

FIG. 42 shows the timing equations and relationships for the connections between a buffer chip and a DDR3 SDRAM for a write to the SDRAM as shown in FIG. 48, in accordance with one embodiment.

In FIG. 42, the relationship between write latency and read latency is more complex than DDR2 and is as follows: WL=RL−K; where K is an integer (number of clock cycles). The relationship governing the buffer chip delays is then: d4=2d3+d1+(K−1). In various embodiments, the memory controller and/or CPU may follow the JEDEC DDR3 protocol, and in such embodiments the buffer chip may insert a command-dependent delay in the bus(es) (e.g. address bus, control bus, etc.) to avoid timing issues.

In other embodiments one or more buffer chips may be used. Such buffer chips may be the same or different. In such embodiments, for example, delays may be introduced by more than one buffer chip or by combinations of delays in different buffer chips.

In other embodiments, the delays may be inserted in one or more buses as relative delays (e.g. delay inserting a delay da in all buses but one with that one bus being delayed instead by a delay of (da+db) may be equivalent to (e.g. viewed as, logically equivalent to, etc.) a relative delay of db, etc.).

Figure 43:
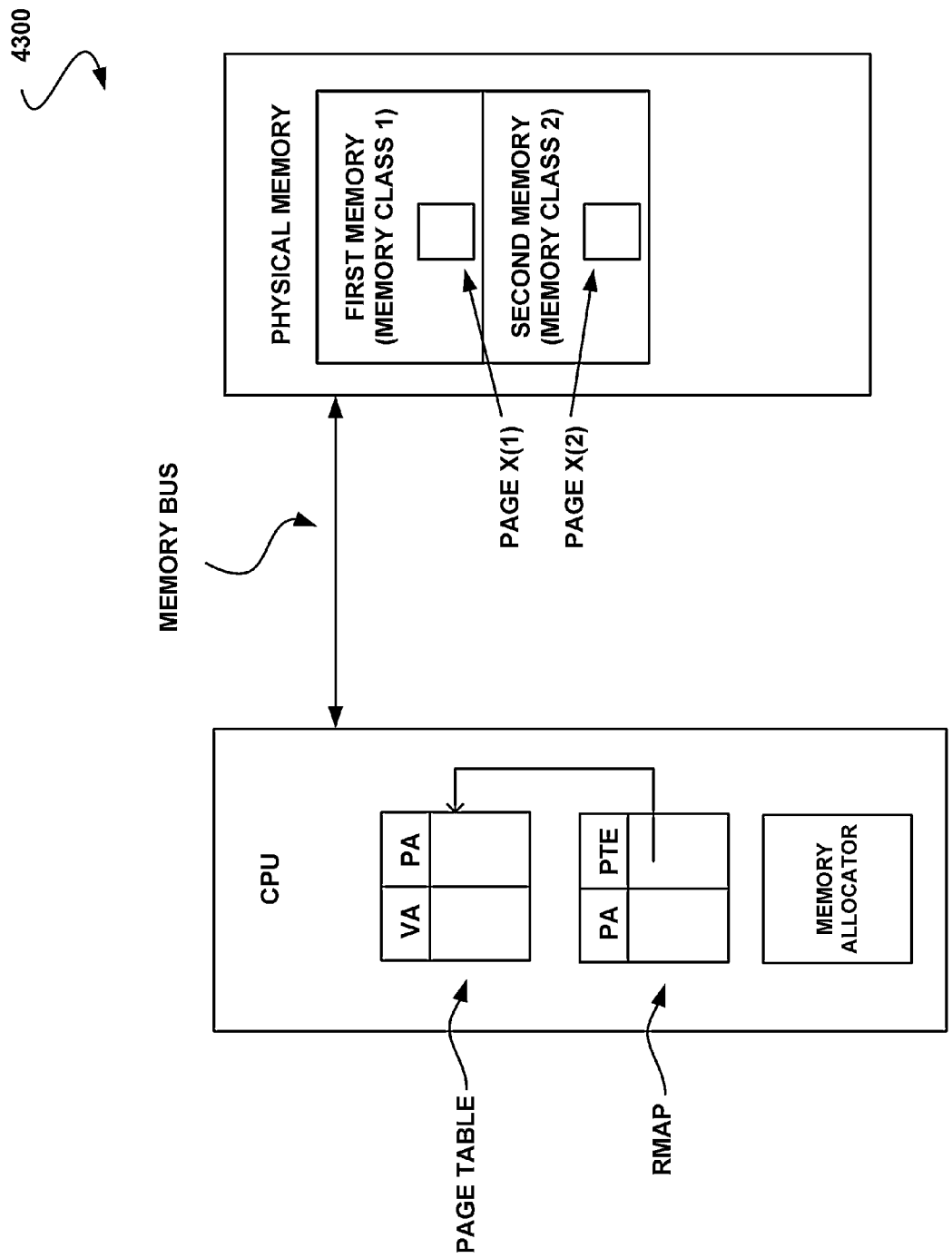
FIG. 43 shows a system including components used for copy involving modification of the CPU page table, in accordance with one embodiment.

FIG. 43 shows a system including components used for copy involving modification of the CPU page table, in accordance with one embodiment.

In FIG. 43, the memory system comprises two memory classes. In FIG. 43, Page X (1) (in FIG. 43) is being copied to Page X (2) (in FIG. 43). In FIG. 43, the CPU (in FIG. 43) contains a Page Table (in FIG. 43). The Page Table contains a map from Virtual Address (VA) (in FIG. 43) to Physical Address (PA) (in FIG. 43). In FIG. 43, the CPU contains an RMAP Table (in FIG. 43). In Linux a reverse mapping (RMAP) is kept in a table (an RMAP table) that maintains a linked list containing pointers to the page table entries (PTEs) of every process currently mapping a given physical page. The Microsoft Windows OS versions contain a similar structure. The RMAP table essentially maintains the reverse mapping of a page to a page table entry (PTE) (in FIG. 43) and virtual address. In an OS, the RMAP table is used by the OS to speed up the page unmap path without necessarily requiring a scan of the process virtual address space. Using the RMAP table improves the unmapping of shared pages (because of the availability of the PTE mappings for shared pages), reduces page faults (because PTE entries are unmapped only when required), reduces searching required during page replacement as only inactive pages are touched, and there is only a low overhead involved in adding this reverse mapping during fork, page fault, mmap and exit paths. This RMAP table may be used, if desired, to find a PTE from a physical page number or PA. In FIG. 43, the CPU contains a Memory Allocator (in FIG. 43). The Memory Allocator may be used, if desired, to allocate a new page in the memory system.

FIG. 44 shows a technique for copy involving modification of the CPU page table, in accordance with one embodiment.

In FIG. 44, the copy is triggered by a request from the memory system to the CPU to perform a copy. This is just one example of a copy. Other copy operations may be: (1) triggered by the CPU and passed to the memory system as a command with the copy being executed autonomously by the memory system; (2) triggered by the memory system and executed autonomously by the memory system; (3) triggered by the CPU and executed by the CPU; (4) combinations of these. FIG. 44 shows the following steps: (1) Step 1 is the entry to a method to swap two pages in the memory system (the same process may be used for other operations e.g. move, copy, transfer, etc.); (2) Step 2 uses the memory allocator in the CPU to allocate a new page in the memory system with address VA1. The new page could be in any of the memory classes in the memory system; (3) Step 3 maps the physical address (e.g. page number, etc.) of the page to be swapped (e.g. copied, moved, etc.) to the PTE using the RMAP table and determines address VA2; (4) Step 4 swaps (e.g. moves, copies, transfers, etc.) Page (1) to Page (2) using VA 1 and VA2; (5) Step 5 updates the Page Table; (6) Step 6 updates the Page Table cache or TLB; (7) Step 7 releases Page (1) for move, swap, etc. operations where the old page is no longer required.

Figure 45:
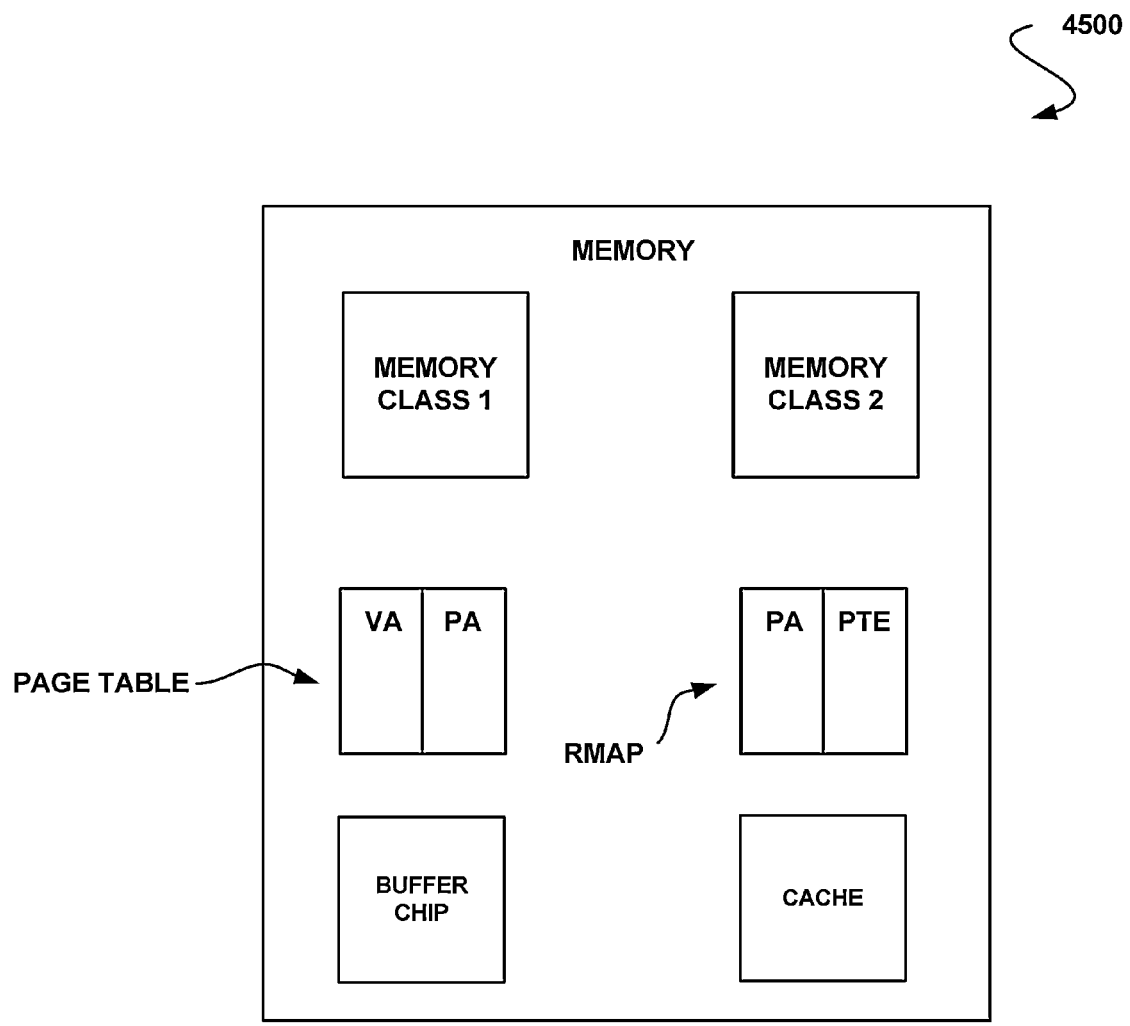
FIG. 45 shows a memory system including Page Table, buffer chip, RMAP Table, and Cache, in accordance with one embodiment.

FIG. 45 shows a memory system including Page Table (in FIG. 45), buffer chip (in FIG. 45), RMAP Table (in FIG. 45), and Cache (in FIG. 45), in accordance with one embodiment.

In FIG. 45 in one embodiment the Page Table and RMAP Table may be integrated into the memory system. In FIG. 45 these components have been shown as separate from the buffer chip, memory class 1 (in FIG. 45) and memory class 2 (in FIG. 45). In one embodiment the Page Table, RMAP Table and Cache are integrated with the buffer chip. In other embodiments these components may be integrated with (or separate from) one or more of the following components shown in FIG. 45: (1) memory class 1; (2) memory class 2; (3) buffer chip.

In some embodiments, the Cache may be used to hold information contained in the Page Table and/or RMAP Table.

In FIG. 45, the presence of the Page Table allows the memory system to autonomously (e.g. without help from the CPU, OS, etc.) perform a mapping of VA (in FIG. 45) to PA (in FIG. 45). In FIG. 45 the presence of the RMAP Table allows the memory system to autonomously perform a mapping of PA to VA. These mapping functions are useful in page operations (e.g. move, copy, swap, transfer, etc.) that may be performed, for example, by the buffer chip.

Figure 46:
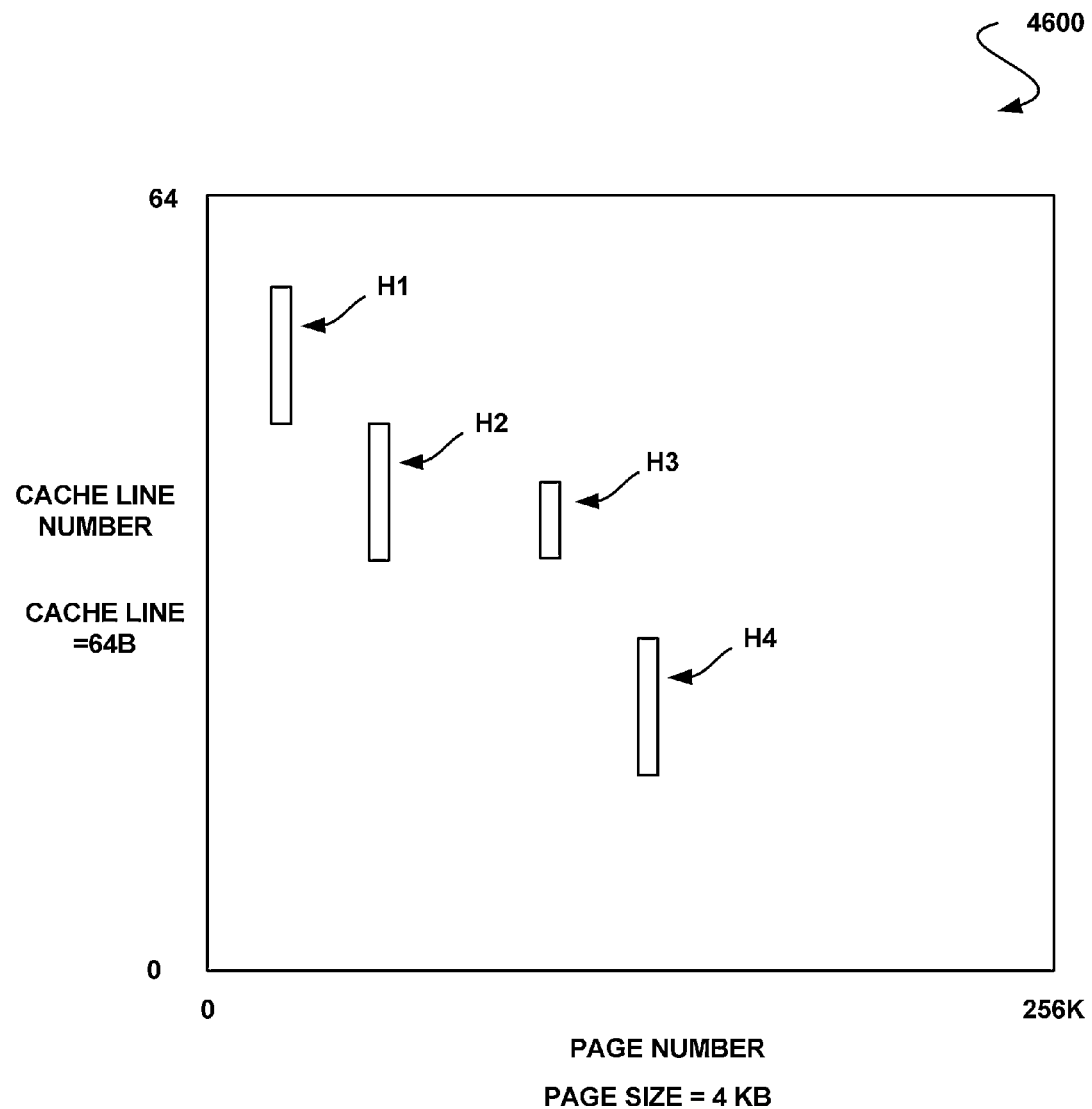
FIG. 46 shows a memory system access pattern, in accordance with one embodiment.

FIG. 46 shows a memory system access pattern, in accordance with one embodiment.

In FIG. 46, patterns of access to certain memory locations in a memory system are diagrammed. In FIG. 46, the X-axis represents page number within the memory system (with a page size of 4 kBytes). In FIG. 46, the X-axis represents the cache line number within a page (with a cache line size of 64 Bytes there are 64 cache lines in a 4-kByte page). By running memory traces it is often found there are certain hot spots in memory, marked in FIG. 46 by hot spots H1, H2, H3, and H4. Each of these hot spots represent a sequence of cache lines that are repeatedly accessed (e.g. frequently executed code routines, frequently accessed data, etc.) more frequently than other areas of memory.

Figure 47:
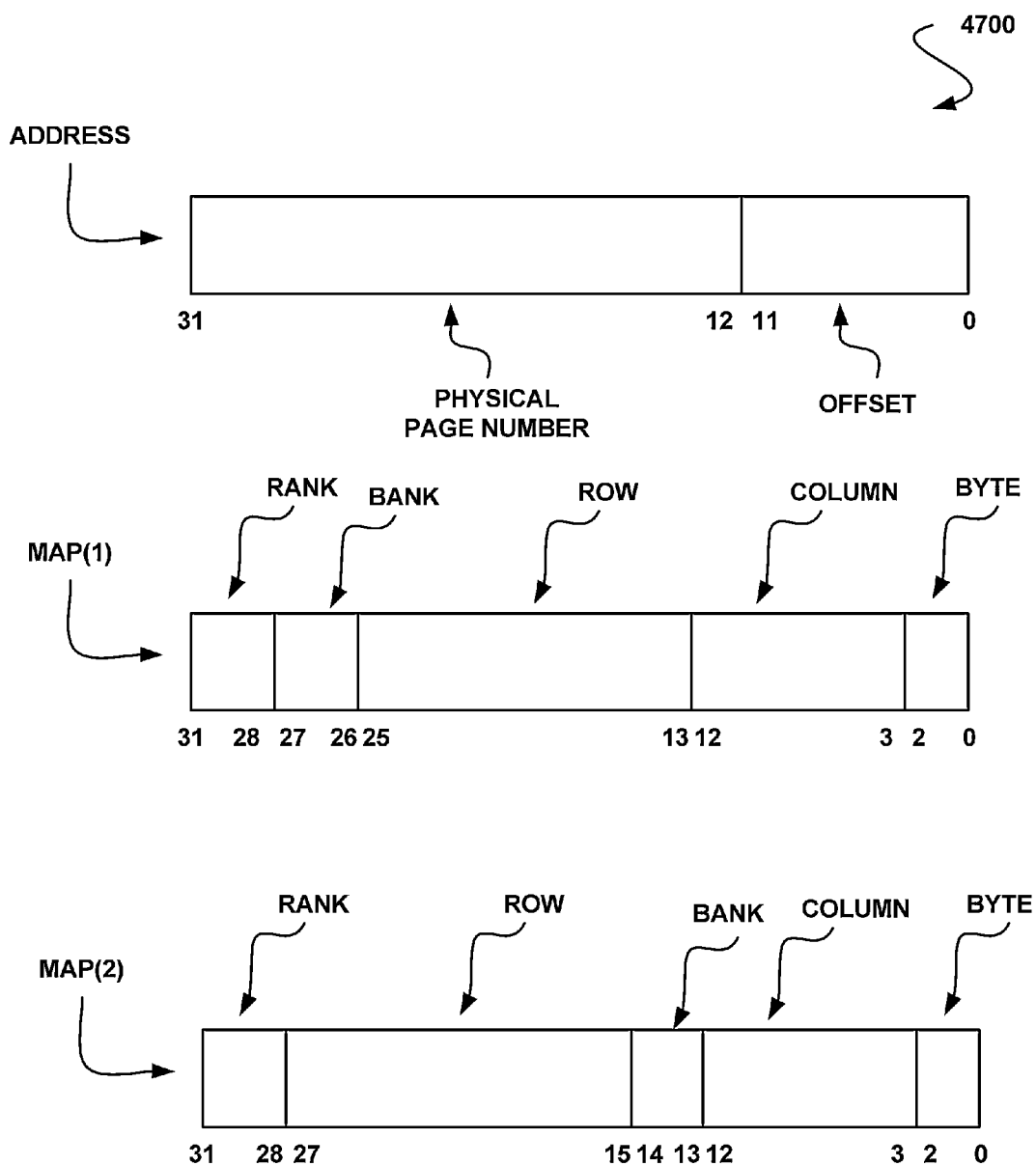
FIG. 47 shows memory system address mapping functions, in accordance with one embodiment.

FIG. 47 shows memory system address mapping functions, in accordance with one embodiment.

In FIG. 47, the 32-bit Address (in FIG. 47) in a 32-bit system (e.g. machine (physical or virtual), CPU, OS, etc.) is shown divided into a 12-bit Offset and 30-bit Physical Page Number.

In FIG. 47, one embodiment of an address mapping uses Map (1) (in FIG. 47) shows how the Address may be mapped to the memory system. In FIG. 47, Map (1) the bits are as follows: (1) bits 0-2 correspond (e.g. map, or are used as, etc.) to the Byte Address (in FIG. 47) of the memory system; (2) bits 3-12 correspond to the Column Address (in FIG. 47) of the memory system; (3) bits 13-25 correspond to the Row Address (in FIG. 47) of the memory system; (4) bits 26-27 correspond to the Bank (in FIG. 47) of the memory system; and bits 28-31 correspond to the Rank (in FIG. 47) of the memory system.

In FIG. 47, Map (2) shows an embodiment that uses an alternative system address mapping to the memory system (e.g. the Bank address has moved in position from that shown in Map (1) in FIG. 47). Depending on several factors (e.g. type of memory access, type of program being executed, data patterns, etc.) the memory access patterns may favor one address mapping over another address mapping. For example, in some programs (e.g. modes of operation, etc.) Map (1) of FIG. 47 combined with the access pattern shown in FIG. 46 may result in better performance of the memory system (e.g. lower power, higher speed, etc.). This may be especially true when the memory system comprises multiple memory classes and, for example, it may be desired that the hot spots (as described in FIG. 46 for example) should remain in one class of memory.

In various embodiments, the address mapping function may thus be controlled as described, especially for memory systems with multiple memory classes.

FIG. 48 shows a memory system that alters address mapping functions, in accordance with one embodiment.

In FIG. 48, the buffer chip (in FIG. 48) contains logic that may receive an address from the CPU (in FIG. 48) (e.g. from memory controller, etc.) and is capable of changing (e.g. swizzling, re-mapping, altering, etc.) the address mapping. In one embodiment, the address from the CPU may use Map (1) (in FIG. 48). In another embodiment, the buffer chip may change Map (1) to Map (2) (in FIG. 48).

The ability to change address mapping may be used in several ways. For example, if memory class 1 in FIG. 48 is a small but fast class of memory relative to the larger but slower memory class 2 (in FIG. 48), then, in one embodiment for example, one type of map may keep hot spots (as described in FIG. 46 and marked H1 to H4 in FIG. 48) in memory class 1.

In alternative embodiments: (1) the CPU (e.g. machine (virtual or physical), OS, etc.) may instruct (e.g. based on operating mode, by monitoring memory use, by determining memory hot spots, by pre-configured statistics for certain programs, etc.) the buffer chip to alter from Map (x) to Map (y), where Map (x) and Map (y) are arbitrary address mappings; (2) the buffer chip may configure the address mapping to Map (x) (where Map (x) is an arbitrary address map) based on memory use and/or other factors (e.g. power, wear-leveling of any or all memory classes, etc.); (3) different address maps may be used for any or all of the memory classes; (4) the memory classes may be identical but may use different memory maps; (5) and/or any combination of these.

Figure 49:
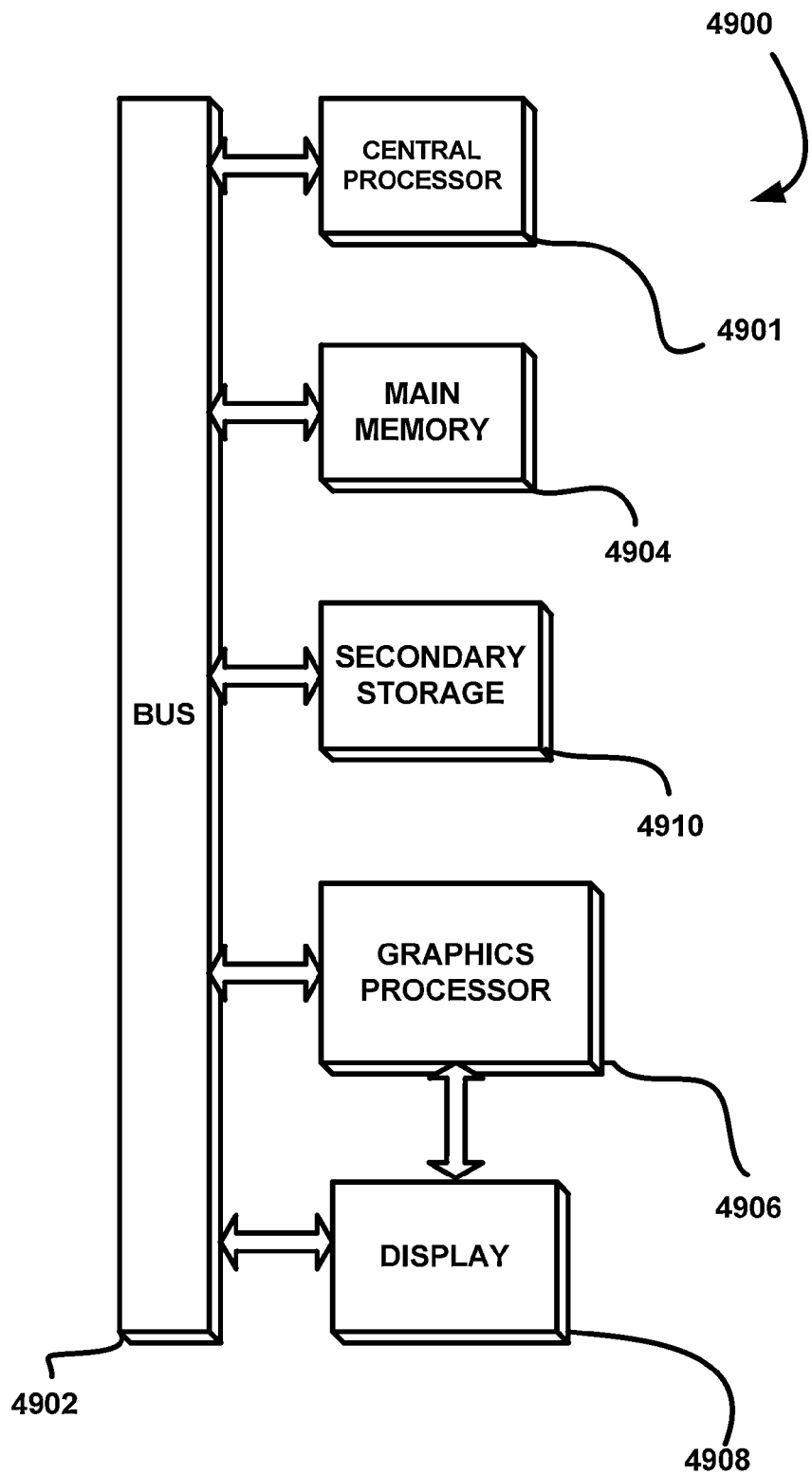
FIG. 49 illustrates an exemplary system in which the various architecture and/or functionality of the various previous embodiments may be implemented.

FIG. 49 illustrates an exemplary system 4900 in which the various architecture and/or functionality of the various previous embodiments may be implemented. As shown, a system 4900 is provided including at least one host processor 4901 which is connected to a communication bus 4902. The system 4900 also includes a main memory 4904. Control logic (software) and data are stored in the main memory 4904 which may take the form of random access memory (RAM).

The system 4900 also includes a graphics processor 4906 and a display 4908, e.g. a computer monitor.

The system 4900 may also include a secondary storage 4910. The secondary storage 4910 includes, for example, a hard disk drive and/or a removable storage drive, representing a floppy disk drive, a magnetic tape drive, a compact disk drive, etc. The removable storage drive reads from and/or writes to a removable storage unit in any desired manner.

Computer programs, or computer control logic algorithms, may be stored in the main memory 4904 and/or the secondary storage 4910. Such computer programs, when executed, enable the system 4900 to perform various functions. Memory 4904, storage 4910 and/or any other storage are possible examples of computer-readable media.

In one embodiment, the architecture and/or functionality of the various previous figures may be implemented in the context of the host processor 4901, graphics processor 4906, a chipset (e.g. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 4900 may take the form of a desktop computer, lap-top computer, and/or any other type of logic. Still yet, the system 4900 may take the form of various other devices including, but not limited to, a personal digital assistant (PDA) device, a mobile phone device, a television, etc.

Further, while not shown, the system 4900 may be coupled to a network [e.g. a telecommunications network, local area network (LAN), wireless network, wide area network (WAN) such as the Internet, peer-to-peer network, cable network, etc.] for communication purposes.

As used herein, the singular forms (e.g. a, an, the, etc.) are intended to include the plural forms as well, unless the context clearly indicates otherwise.

The terms comprises and/or comprising, when used in this specification, specify the presence of stated features, integers, steps, operations, elements, and/or components, but do not preclude the presence or addition of one or more other features, integers, steps, operations, elements, components, and/or groups thereof.

In the following description and claims, the terms include and comprise, along with their derivatives, may be used, and are intended to be treated as synonyms for each other.

In the following description and claims, the terms coupled and connected may be used, along with their derivatives. It should be understood that these terms are not necessarily intended as synonyms for each other. For example, connected may be used to indicate that two or more elements are in direct physical or electrical contact with each other. Further, coupled may be used to indicate that that two or more elements are in direct or indirect physical or electrical contact. For example, coupled may be used to indicate that that two or more elements are not in direct contact with each other, but the two or more elements still cooperate or interact with each other.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a circuit, component, module or system. Furthermore, aspects of the present invention may take the form of a computer program product embodied in one or more computer readable medium(s) having computer readable program code embodied thereon.

In different embodiments, emphasis and/or de-emphasis may be performed at the designated driver(s) in a multiple die stack [e.g. the transmitter, driver, re-driver on a buffer etc. both for the upstream memory bus(es) or downstream memory bus(es), etc.]. Additionally, in different embodiments, emphasis and/or de-emphasis may be performed at the designated receivers(s) in a multiple die stack [e.g. the receiver(s) both for the upstream memory bus(es) or downstream memory bus(es), etc.]. Further, in different embodiments, emphasis and/or de-emphasis may be performed at the designated receivers(s) in a multiple die stack [e.g. the receiver(s) for the downstream memory bus(es), etc.] and/or at the designated driver(s) in a multiple die stack [e.g. the transmitter, driver, re-driver on a buffer etc. both for the upstream memory bus(es), etc.].

In various embodiments (e.g. including any of those embodiments mentioned previously or combinations of these embodiments, etc.), the emphasis and/or de-emphasis may be adjustable. In various embodiments, the emphasis and/or de-emphasis may be adjusted [e.g. tuned, varied, altered in function (e.g. by using more than one designated receiver and/or designated driver used for emphasis and/or de-emphasis, etc.), moved in position through receiver or driver configuration, etc.] based on various metrics (e.g. characterization of the memory channel, calculation, BER, signal integrity, etc.).

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
   a memory sub-system capable of being communicatively coupled to a standard memory bus communicatively coupled to a processing unit, the memory sub-system including:
   a first memory of a first memory class,
   a second memory of a second memory class,
   a first circuit communicatively coupled to the second memory, and
   a second circuit communicatively coupled to the first circuit and the first memory;
   wherein the apparatus is configured to, for a first thread:
   receive, at the first circuit, a first command that is a special command or includes special data from the processing unit via the standard memory bus, and
   in response to the first command and based on the special command or the special data, issue a second command from the first circuit to the second circuit for fetching at least a portion of first data from the first memory and transferring the at least portion of the first data from the first memory to the second memory;
   wherein the apparatus is further configured to, before completion of at least one of the fetching the at least portion of the first data or the transferring the at least portion of the first data, for a second thread:
   receive, at the first circuit, a third command from the processing unit via the standard memory bus that is capable of causing issuance of a fourth command from the first circuit to the second circuit for fetching at least a portion of second data from the first memory and transferring the at least portion of the second data from the first memory to the second memory;
   wherein the apparatus is further configured to:
   provide access to a status, and
   receiving a fifth command for reading the first data.

2. The apparatus of claim 1, wherein the apparatus is configured such that the second circuit includes the first memory, and the second command includes a single command.

3. The apparatus of claim 1, wherein the apparatus is configured such that the first thread and the second thread are associated with the processing unit.

4. The apparatus of claim 1, wherein the apparatus is configured such that the first command and the third command are non-standard commands and the second command and the fourth command are standard commands.

5. The apparatus of claim 1, wherein the apparatus is configured such that the first command and the third command include read commands.

6. The apparatus of claim 1, wherein the apparatus is configured such that the first command and the third command each initiate a random access data read.

7. The apparatus of claim 1, wherein the apparatus is configured such that the third command is received before the completion of the fetching the at least portion of the first data.

8. The apparatus of claim 1, wherein the apparatus is configured such that the third command is received before the completion of the transferring the at least portion of the first data.

9. The apparatus of claim 1, wherein the apparatus is configured such that at least one of the fetching the at least portion of the second data or the transferring the at least portion of the second data associated with the second thread is completed before the completion of at least one of the fetching the at least portion of the first data or the transferring the at least portion of the first data associated with the first thread.

10. The apparatus of claim 1, wherein the apparatus is configured such that for the first thread, the fifth command is received, at the first circuit, from the processing unit via the standard memory bus, for fetching the at least portion of the first data from the second memory.

11. The apparatus of claim 10, wherein the apparatus is configured such that the fetching the at least portion of the second data associated with the second thread is completed before the fifth command associated with the first thread is received.

12. The apparatus of claim 10, wherein the apparatus is configured such that the transferring the at least portion of the second data associated with the second thread is completed before the fifth command associated with the first thread is received.

13. The apparatus of claim 10, wherein the apparatus is configured such that the fetching the at least portion of the second data associated with the second thread is completed before the at least portion of the first data is fetched from the second memory in association with the first thread.

14. The apparatus of claim 10, wherein the apparatus is configured such that the transferring the at least portion of the second data associated with the second thread is completed before the at least portion of the first data is fetched from the second memory in association with the first thread.

15. A system including the apparatus of claim 1, and further comprising the standard memory bus.

16. The apparatus of claim 1, wherein the apparatus is configured such that at least one of:
said standard memory bus includes at least one of a DDR3 bus or a DDR4 bus;
said second memory includes at least one of static random access memory, dynamic random access memory, or embedded random access memory;
said first memory or said second memory is part of the first circuit;
said first memory or said second memory is part of the second circuit;
said first command is the special command;
said first command is the special command, and the special command is received from a driver;
said first command is the special command, and the special command results from a page miss;
said first command is the special command, and the special command results from an operating system request;
said first command is the special command, and the special command is special by virtue of including the special data;
said first command is the special command, and the special command is special by virtue of the at least portion of the first data being fetched from the first memory;
said first command is the special command, and the special command includes a non-standard command;
said first command includes the special data;
said first command includes the special data, and the special data includes at least one of control data, command data, or status data;
said second command is issued based on the special command; or
said second command is issued based on the special data.

17. An apparatus, comprising:
a memory sub-system capable of being communicatively coupled to a standard memory bus communicatively coupled to a processing unit, the memory sub-system including:
a first memory of a first memory class,
a second memory of a second memory class,
a first circuit communicatively coupled to the second memory, and
a second circuit communicatively coupled to the first circuit and the first memory;
wherein the apparatus is configured, in connection with a first thread, for:
receiving, at the first circuit, a first command that is a special command or includes special data from the processing unit via the standard memory bus,
in response to the first command and as a function of the special command or the special data, issuing a second command from the first circuit to the second circuit for fetching at least a portion of first data from the first memory and transferring the at least portion of the first data from the first memory to the second memory, and
receiving, at the first circuit, a third command from the processing unit via the standard memory bus, for fetching the at least portion of the first data from the second memory;
wherein the apparatus is further configured, in connection with a second thread, before completion of the fetching the at least portion of the first data from the second memory, for:
receiving, at the first circuit, a fourth command from the processing unit via the standard memory bus that is capable of causing issuance of a fifth command from the first circuit to the second circuit for fetching at least a portion of second data from the first memory and transferring the at least portion of the second data from the first memory to the second memory.

18. An apparatus, comprising:
a memory sub-system capable of being communicatively coupled to a standard memory bus communicatively coupled to a processing unit, the memory sub-system including:
a first memory of a first memory class,
a second memory of a second memory class,
a first circuit communicatively coupled to the second memory, and
a second circuit communicatively coupled to the first circuit and the first memory;
wherein the apparatus is configured, in connection with a first thread, for:
receiving, at the first circuit, a first command that is special from the processing unit via the standard memory bus,
in response to the first command, issuing a second command from the first circuit to the second circuit for fetching at least a portion of first data from the first memory and transferring the at least portion of the first data from the first memory to the second memory, and
receiving, at the first circuit, a third command from the processing unit via the standard memory bus, for fetching the at least portion of the first data from the second memory;
wherein the apparatus is further configured, in connection with a second thread, before receiving the third command, for:
receiving, at the first circuit, a fourth command from the processing unit via the standard memory bus that is capable of causing issuance of a fifth command from the first circuit to the second circuit for fetching at least a portion of second data from the first memory and transferring the at least portion of the second data from the first memory to the second memory.

19. The apparatus of claim 18, wherein the first memory includes flash memory, the second memory includes random access memory, and the apparatus is operable such that the first command is special by virtue of enabling DDR protocol-compliant communication of control information via the standard memory bus for controlling the second circuit to effect one or more results that are undescribed in a DDR protocol specification.

20. The apparatus of claim 18, wherein the first memory includes flash memory, the second memory includes random access memory, and the apparatus is operable such that the first command is special by virtue of including data of which a portion is used in connection with a corresponding command associated with the second circuit.

* * * * *